(12) United States Patent  
Teig et al.

(10) Patent No.: US 9,148,151 B2  
(45) Date of Patent: Sep. 29, 2015

(54) CONFIGURABLE STORAGE ELEMENTS

(75) Inventors: Steven Teig, Menlo Park, CA (US); Christopher D. Ebeling, San Jose, CA (US); Martin Voogel, Los Altos, CA (US); Andrew Caldwell, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 290 days.

(21) Appl. No.: 13/549,405

(22) Filed: Jul. 13, 2012

(65) Prior Publication Data

US 2013/0093462 A1   Apr. 18, 2013

Related U.S. Application Data

(63) Continuation-in-part of application No. 13/540,591, filed on Jul. 2, 2012, and a continuation-in-part of application No. 13/540,596, filed on Jul. 2, 2012.

(60) Provisional application No. 61/507,510, filed on Jul. 13, 2011, provisional application No. 61/525,153, filed on Aug. 18, 2011, provisional application No. 61/667,411, filed on Jul. 2, 2012.

(51) Int. Cl.
*H03K 19/173* (2006.01)
*H03K 19/177* (2006.01)

(52) U.S. Cl.
CPC ...... *H03K 19/1736* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 4,873,459 A | 10/1989 | El Gamal et al. | |
| 4,980,577 A | 12/1990 | Baxter | |
| 5,191,241 A | 3/1993 | McCollum et al. | |
| 5,258,668 A | 11/1993 | Cliff et al. | |
| 5,291,489 A | 3/1994 | Morgan et al. | |

(Continued)

FOREIGN PATENT DOCUMENTS

WO PCT/US2013/026398    2/2013
WO PCT/US2013/026398    5/2013

(Continued)

OTHER PUBLICATIONS

Portions of prosecution history of U.S. Appl. No. 13/540,591, filed Nov. 19, 2012, Voogel, Martin et al.

(Continued)

*Primary Examiner* — Alexander H Taningco
*Assistant Examiner* — Nelson Correa

(57) ABSTRACT

A low power sub-cycle reconfigurable conduit is provided. The low power reconfigurable conduit is a clocked storage element that consumes less power when performing low-throughput operations that do not require sub-cycle rate. The low power conduit includes a first configurable routing multiplexer that is reconfigurable to select one of several inputs at a first clock rate. The low power conduit also includes an array of storage elements for storing output data from the configurable routing multiplexer at the first clock rate. Each storage element in the array of storage elements operate at a second clock rate that is slower than the first clock rate. Each storage element receives a different phase of a clock that operates at the second clock rate. The low power conduit also includes a second configurable routing multiplexer that is reconfigurable to select from the array of storage elements at the first clock rate.

19 Claims, 72 Drawing Sheets

(56) References Cited

U.S. PATENT DOCUMENTS

| | | |
|---|---|---|
| 5,357,153 A | 10/1994 | Chiang et al. |
| 5,365,125 A | 11/1994 | Goetting et al. |
| 5,426,378 A | 6/1995 | Ong |
| 5,596,743 A | 1/1997 | Bhat et al. |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,656,950 A | 8/1997 | Duong et al. |
| 5,692,147 A | 11/1997 | Larsen et al. |
| 5,701,441 A | 12/1997 | Trimberger |
| 5,732,246 A | 3/1998 | Gould et al. |
| 5,737,235 A | 4/1998 | Kean et al. |
| 5,760,602 A | 6/1998 | Tan |
| 5,761,483 A | 6/1998 | Trimberger |
| 5,796,268 A | 8/1998 | Kaplinsky |
| 5,811,985 A | 9/1998 | Trimberger et al. |
| 5,815,726 A | 9/1998 | Cliff |
| 5,825,662 A | 10/1998 | Trimberger |
| 5,883,525 A | 3/1999 | Tavana et al. |
| 5,914,616 A | 6/1999 | Young et al. |
| 5,920,712 A | 7/1999 | Kuijsten |
| 5,940,603 A | 8/1999 | Huang |
| 5,944,813 A | 8/1999 | Trimberger |
| 5,982,655 A | 11/1999 | Doyle |
| 6,018,559 A | 1/2000 | Azegami et al. |
| 6,020,758 A | 2/2000 | Patel et al. |
| 6,091,263 A | 7/2000 | New et al. |
| 6,163,168 A | 12/2000 | Nguyen et al. |
| 6,184,707 B1 | 2/2001 | Norman et al. |
| 6,255,849 B1 | 7/2001 | Mohan |
| 6,292,019 B1 | 9/2001 | New et al. |
| 6,346,824 B1 | 2/2002 | New |
| 6,348,813 B1 | 2/2002 | Agrawal et al. |
| 6,396,303 B1 | 5/2002 | Young |
| 6,404,224 B1 | 6/2002 | Azegami et al. |
| 6,421,784 B1 | 7/2002 | Chu et al. |
| 6,430,736 B1 | 8/2002 | Levi et al. |
| 6,441,642 B1 | 8/2002 | Jones et al. |
| 6,466,051 B1 | 10/2002 | Jones et al. |
| 6,469,540 B2 | 10/2002 | Nakaya |
| 6,480,954 B2 | 11/2002 | Trimberger et al. |
| 6,487,709 B1 | 11/2002 | Keller et al. |
| 6,496,918 B1 | 12/2002 | DeHon et al. |
| 6,515,505 B1 | 2/2003 | Rees |
| 6,515,509 B1 | 2/2003 | Baxter |
| 6,529,040 B1 | 3/2003 | Carberry et al. |
| 6,545,505 B1 | 4/2003 | Chan et al. |
| 6,593,771 B2 | 7/2003 | Bailis et al. |
| 6,603,330 B1 | 8/2003 | Snyder |
| 6,611,153 B1 | 8/2003 | Lien et al. |
| 6,703,861 B2 | 3/2004 | Ting |
| 6,717,436 B2 | 4/2004 | Kress et al. |
| 6,720,813 B1 | 4/2004 | Yee et al. |
| 6,731,133 B1 | 5/2004 | Feng et al. |
| 6,732,068 B2 | 5/2004 | Sample et al. |
| 6,738,456 B2 | 5/2004 | Wrona et al. |
| 6,798,240 B1 | 9/2004 | Pedersen |
| 6,806,730 B2 | 10/2004 | Bailis et al. |
| 6,810,513 B1 | 10/2004 | Vest |
| 6,829,756 B1 | 12/2004 | Trimberger |
| 6,831,479 B2 | 12/2004 | Lo |
| 6,838,902 B1 | 1/2005 | Elftmann et al. |
| 6,894,527 B1 | 5/2005 | Donlin et al. |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 * | 4/2006 | Agrawal et al. ............. 326/41 |
| 7,030,651 B2 | 4/2006 | Madurawe |
| 7,061,941 B1 | 6/2006 | Zheng |
| 7,064,577 B1 | 6/2006 | Lee |
| 7,075,333 B1 | 7/2006 | Chaudhary et al. |
| 7,080,226 B1 | 7/2006 | Patterson |
| 7,084,666 B2 | 8/2006 | Madurawe |
| 7,088,136 B1 | 8/2006 | Lewis |
| 7,109,752 B1 | 9/2006 | Schmit et al. |
| 7,116,131 B1 | 10/2006 | Chirania et al. |
| 7,126,372 B2 | 10/2006 | Vadi et al. |
| 7,126,373 B1 | 10/2006 | Schmit et al. |
| 7,129,746 B1 | 10/2006 | Balasubramanian et al. |
| 7,132,851 B2 | 11/2006 | Young |
| 7,138,827 B1 | 11/2006 | Trimberger |
| 7,149,996 B1 | 12/2006 | Lysaght et al. |
| 7,154,299 B2 | 12/2006 | Swami et al. |
| 7,157,933 B1 | 1/2007 | Schmit et al. |
| 7,167,025 B1 | 1/2007 | Schmit et al. |
| 7,193,440 B1 | 3/2007 | Schmit et al. |
| 7,224,181 B1 | 5/2007 | Schmit et al. |
| 7,245,150 B2 * | 7/2007 | Goel et al. ............. 326/46 |
| 7,274,235 B2 | 9/2007 | Nicolaidis |
| 7,276,933 B1 | 10/2007 | Teig et al. |
| 7,317,331 B2 | 1/2008 | Teig et al. |
| 7,342,415 B2 * | 3/2008 | Teig et al. ............. 326/41 |
| 7,372,297 B1 | 5/2008 | Pugh et al. |
| 7,408,382 B2 | 8/2008 | Schmit et al. |
| 7,420,389 B2 | 9/2008 | Schmit et al. |
| 7,425,841 B2 | 9/2008 | Schmit et al. |
| 7,428,721 B2 | 9/2008 | Rohe |
| 7,439,766 B2 | 10/2008 | Schmit et al. |
| 7,521,959 B2 * | 4/2009 | Teig ............. 326/38 |
| 7,525,342 B2 | 4/2009 | Teig et al. |
| 7,525,344 B2 | 4/2009 | Teig et al. |
| 7,532,032 B2 | 5/2009 | Schmit et al. |
| 7,616,027 B2 | 11/2009 | Schmit et al. |
| 7,656,188 B2 | 2/2010 | Teig et al. |
| 7,667,486 B2 | 2/2010 | Schmit et al. |
| 7,746,111 B1 | 6/2010 | Gaide et al. |
| 7,797,497 B1 * | 9/2010 | Schmit et al. ............. 711/149 |
| 7,822,881 B2 | 10/2010 | Vorbach et al. |
| 7,825,685 B2 * | 11/2010 | Chandler et al. ............. 326/38 |
| 7,872,496 B2 | 1/2011 | Schmit et al. |
| 7,917,559 B2 | 3/2011 | Redgrave |
| 7,948,266 B2 | 5/2011 | Schmit et al. |
| 8,089,300 B2 | 1/2012 | Redgrave |
| 8,183,882 B2 | 5/2012 | Teig et al. |
| 8,193,830 B2 | 6/2012 | Schmit et al. |
| 8,248,110 B1 * | 8/2012 | Lai et al. ............. 327/99 |
| 8,305,110 B2 | 11/2012 | Schmit et al. |
| 8,429,579 B2 | 4/2013 | Hutchings et al. |
| 8,456,190 B2 * | 6/2013 | Redgrave et al. ............. 326/38 |
| 8,458,629 B2 | 6/2013 | Caldwell et al. |
| 8,638,119 B2 | 1/2014 | Schmit et al. |
| 8,760,193 B2 * | 6/2014 | Voogel et al. ............. 326/38 |
| 8,810,277 B2 | 8/2014 | Schmit et al. |
| 2001/0007428 A1 | 7/2001 | Young et al. |
| 2002/0008541 A1 | 1/2002 | Young et al. |
| 2002/0089349 A1 | 7/2002 | Barbier et al. |
| 2002/0113619 A1 | 8/2002 | Wong |
| 2002/0125910 A1 | 9/2002 | New et al. |
| 2002/0125914 A1 | 9/2002 | Kim |
| 2002/0157071 A1 | 10/2002 | Schiefele et al. |
| 2002/0163357 A1 | 11/2002 | Ting |
| 2002/0169990 A1 | 11/2002 | Sherburne, Jr. |
| 2003/0001613 A1 | 1/2003 | Nakaya |
| 2003/0042931 A1 | 3/2003 | Ting |
| 2003/0184339 A1 | 10/2003 | Ikeda et al. |
| 2004/0008055 A1 | 1/2004 | Khanna et al. |
| 2004/0010767 A1 | 1/2004 | Agrawal et al. |
| 2004/0041610 A1 | 3/2004 | Kundu |
| 2004/0098630 A1 | 5/2004 | Masleid |
| 2004/0103265 A1 | 5/2004 | Smith |
| 2004/0113655 A1 | 6/2004 | Curd et al. |
| 2004/0123167 A1 | 6/2004 | Chapuis |
| 2004/0124881 A1 | 7/2004 | Thadikaran et al. |
| 2004/0178818 A1 | 9/2004 | Crotty et al. |
| 2004/0196066 A1 | 10/2004 | Ting |
| 2004/0222817 A1 | 11/2004 | Madurawe |
| 2004/0225980 A1 | 11/2004 | Cappelli et al. |
| 2005/0134308 A1 | 6/2005 | Okada et al. |
| 2005/0231235 A1 | 10/2005 | Crotty et al. |
| 2005/0246520 A1 | 11/2005 | Vadi et al. |
| 2006/0164119 A1 | 7/2006 | Nowak-Leijten |
| 2006/0176075 A1 | 8/2006 | Or-Bach |
| 2006/0186920 A1 | 8/2006 | Feng et al. |

(56) References Cited

U.S. PATENT DOCUMENTS

| | | | |
|---|---|---|---|
| 2006/0220678 | A1 | 10/2006 | Rozas et al. |
| 2006/0220716 | A1 | 10/2006 | Nicolaidis |
| 2007/0143577 | A1 | 6/2007 | Smith |
| 2007/0214445 | A1 | 9/2007 | Dehon et al. |
| 2009/0172351 | A1 | 7/2009 | Vorbach et al. |
| 2010/0014357 | A1 | 1/2010 | Landry et al. |
| 2010/0122105 | A1 | 5/2010 | Arslan et al. |
| 2011/0031999 | A1 | 2/2011 | Beat |
| 2012/0098568 | A1 | 4/2012 | Redgrave et al. |
| 2012/0124541 | A1 | 5/2012 | Amundson et al. |
| 2013/0093460 | A1 | 4/2013 | Voogel et al. |
| 2013/0093461 | A1 | 4/2013 | Voogel et al. |
| 2013/0099819 | A1 | 4/2013 | Schmit et al. |
| 2013/0135008 | A1 | 5/2013 | Zhang et al. |
| 2014/0333345 | A1 | 11/2014 | Voogel et al. |

FOREIGN PATENT DOCUMENTS

| | | |
|---|---|---|
| WO | PCT/US2013/026398 | 7/2013 |
| WO | WO 2014/007845 | 1/2014 |

OTHER PUBLICATIONS

Portions of prosecution history of U.S. Appl. No. 13/540,596, filed Nov. 19, 2012, Voogel, Martin et al.
Portions of prosecution history of U.S. Appl. No. 10/882,583, filed Aug. 21, 2006, Schmit, Herman, et al.
Portions of prosecution history of U.S. Appl. No. 11/565,592, filed Jun. 27, 2008, Schmit, Herman, et al.
Portions of prosecution history of U.S. Appl. No. 10/883,276, filed Apr. 24, 2006, Schmit, Herman, et al.
Portions of prosecution history of U.S. Appl. No. 11/467,918, filed Dec. 31, 2008, Schmit, Herman, et al.
Portions of prosecution history of U.S. Appl. No. 10/883,486, filed Aug. 12, 2008, Schmit, Herman, et al.
Portions of prosecution history of U.S. Appl. No. 12/200,867, filed Dec. 3, 2010, Schmit, Herman, et al.
Portions of prosecution history of U.S. Appl. No. 12/965,812, filed May 7, 2012, Schmit, Herman, et al.
Portions of prosecution history of U.S. Appl. No. 13/476,203, filed Sep. 16, 2013, Schmit, Herman, et al.
Portions of prosecution history of U.S. Appl. No. 10/882,946, filed Sep. 28, 2006, Schmit, Herman, et al.
Portions of prosecution history of U.S. Appl. No. 11/617,671, filed Jun. 23, 2009, Schmit, Herman, et al.
Portions of prosecution history of U.S. Appl. No. 10/882,839, filed Sep. 13, 2006, Schmit, Herman, et al.
Portions of prosecution history of U.S. Appl. No. 11/535,058, filed Jul. 10, 2008, Schmit, Herman, et al.
Portions of prosecution history of U.S. Appl. No. 10/883,051, filed Sep. 7, 2006, Schmit, Herman, et al.
Portions of prosecution history of U.S. Appl. No. 11/608,790, filed Sep. 30, 2009, Schmit, Herman, et al.
Portions of prosecution history of U.S. Appl. No. 12/685,673, filed Apr. 8, 2011, Schmit, Herman, et al.
Portions of prosecution history of U.S. Appl. No. 13/083,491, filed Oct. 10, 2012, Schmit, Herman, et al.
Portions of prosecution history of U.S. Appl. No. 13/621,145, filed Dec. 19, 2013, Schmit, Herman, et al.
Portions of prosecution history of U.S. Appl. No. 11/081,877, filed Oct. 10, 2007, Teig, Steven, et al.
Portions of prosecution history of U.S. Appl. No. 11/871,944, filed Sep. 14, 2009, Teig, Steven, et al.
Portions of prosecution history of U.S. Appl. No. 12/644,008, filed Apr. 13, 2012, Teig, Steven, et al.
Portions of prosecution history of U.S. Appl. No. 11/082,196, filed Aug. 10, 2007, Teig, Steven, et al.
Portions of prosecution history of U.S. Appl. No. 11/840,963, filed Dec. 15, 2008, Teig, Steven, et al.
Portions of prosecution history of U.S. Appl. No. 11/082,201, filed Jan. 4, 2007, Schmit, Herman, et al.
Portions of prosecution history of U.S. Appl. No. 11/733,158, filed May 30, 2008, Schmit, Herman, et al.
Updated portions of prosecution history of U.S. Appl. No. 13/540,591, filed May 16, 2014, Voogel, Martin, et al.
Updated portions of prosecution U.S. Appl. No. 13/540,596, filed May 21, 2014, Voogel, Martin, et al.
Author Unknown, "§3 Programmable Logic Devices," Digital System Design, 2001 Month N/A, slides 3.1-3.28.
Author Unknown, "Unifying Sequential and Spatial Computing with a Single Instruction Set Architecture," ISCA '04, Jun. 19-23, 2004, 10 pages, ACM, Munchen, Oberbayern, Germany.
Caspi, E., et al., "Stream Computations Organized for Reconfigurable Execution (SCORE): Introduction and Tutorial," Aug. 25, 2000, pp. 1-31, Version 1.0.
Compton, K., et al., "An Introduction to Reconfigurable Computing," IEEE Computer, Apr. 2000, 9 pages.
Compton, K., et al., "Reconfigurable Computing: A Survey of Systems and Software," ACM Computing Surveys, Jun. 2002, pp. 171-210, vol. 34, No. 2, ACM, New York, NY.
Dehon, A., "Balancing Interconnect and Computation in a Reconfigurable Computing Array (or, why don't you really want 100% LUT utilization)," Proceedings of the International Symposium on Field Programmable Gate Arrays, Feb. 1999, pp. 1-10.
Dehon, A., "DPGA Utilization and Application," Proceedings of the 1996 ACM Fourth International Symposium on Field-Programmable Gate Arrays FPGA, Feb. 11-13, 1996, 7 pages, Monterey, California, USA.
Dehon, A., "Dynamically Programmable Gate Arrays: A Step Toward Increased Computational Density," Proceedings of the Fourth Canadian Workshop on Field-Programmable Devices, May 13-14, 1996, 8 pages.
Dehon, A., "Reconfigurable Architectures for General-Purpose Computing," A.I. Technical Report No. 1586, Oct. 1996, pp. i-353.
Dehon, A., "The Density Advantage of Configurable Computing," IEEE, Apr. 2000, pp. 41-49.
Dehon, A., "Transit Note #121: Notes on Programmable Interconnect," M.I.T. Transit Project, Feb. 1995, pp. 1-13.
Dehon, A., et al., "Design Patterns for Reconfigurable Computing," Proceedings of the IEEE Symposium on Field-Programmable Custom Computing Machines, Apr. 2004, pp. 1-11.
Dehon, A., et al., "DPGA-Coupled Microprocessors: Commodity ICs for the Early $21^{st}$ Century," FCCM '94-IEEE Workshop on FPGAs for Custom Computing Machines, Apr. 1994, 9 pages, Napa Valley, California, USA.
Dehon, A., et al., "Reconfigurable Computing: What, Why, and Implications for Design Automation," DAC 1999, Jun. 1999, 6 pages, ACM, New Orleans, Louisiana.
Deokar, R.B., et al., "A Fresh Look at Retiming via Clock Skew Optimization," 32nd ACM/IEEE Design Automation Conference, 1995, 6 pages, ACM.
Enzler, R., et al., "Virtualizing Hardware with Multi-Context Reconfigurable Arrays," Lecture Notes in Computer Science, Sep. 2003, pp. 151-160.
Goldstein, S.C., et al., "PipeRench: A Reconfigurable Architecture and Compiler," IEEE, Apr. 2000, pp. 70-77.
Hauck, S., et al., "Totem: Domain-Specific Reconfigurable Logic," IEEE Transactions on VLSI Systems, 2006 Month N/A, pp. 1-25.
Hauser, J., et al., "Garp: A MIPS Processor with a Reconfigurable Coprocessor", FPGAs for Custom Computing Machines, 1997. Proceedings., The 5th Annual IEEE Symposium on FPGA-Based Custom Computing Machines, Apr. 16-18, 1997, pp. 12-21.
Keutzer, K., "Overview of *configurable* architectures," Feb. 28, 2002, slides 1-29.
Kudlugi, M., et al., "Static Scheduling of Multidomain Circuits for Fast Functional Verification", IEEE Transactions on Computer-Aided Design of Integrated Circuits and Systems, vol. 21, No. 11, Nov. 2002, pp. 1253-1268.
Lehn, D.I., et al., "Evaluation of Rapid Context Switching on a CSRC Device," Proceedings of the International Conference on Engineering of Reconfigurable Systems and Algorithms, Jun. 24-27, 2002, 7 pages.

(56) References Cited

OTHER PUBLICATIONS

Leiserson, C., et al., "Retiming Synchronous Circuitry," Digital Systems Research Center; Aug. 20, 1986, pp. 1-42, Palo Alto, CA.
Lertora, F., et al., "Handling Different Computational Granularity by a Reconfigurable IC Featuring Embedded FPGAs and a Network-On-Chip," 13th Annual IEEE Symposium on Field-Programmable Custom Computing Machines (FCCM 2005) 2005, Apr. 18-20, 2005, 10 pages.
Luk, W., et al., "Compilation Tools for Run-Time Reconfigurable Designs," FPGAs for Custom Computing Machines, 1997. Proceedings., The 5th Annual IEEE Symposium on FPGA-Based Custom Computing Machines, Apr. 16-18, 1997, pp. 56-65.
Markovskiy, Y., et al., "Analysis of Quasi-Static Scheduling Techniques in a Virtualized Reconfigurable Machine," FPGA '02, Feb. 24-26, 2002, 10 pages, ACM, Monterey, California, USA.
Master, P., "The Next Big Leap in Reconfigurable Systems," A Technology Vision Whitepaper, Apr. 28, 2004 but © 2003, pp. 1-8, QuickSilver Technology, Inc., San Jose, California.
Mirsky, E., et al., "MATRIX: A Reconfigurable Computing Architecture with Configurable Instruction Distribution and Deployable Resources," Proceedings of the IEEE Workshop on FPGAs for Custom Computing Machines, Apr. 1996, 10 pages.
Mirsky, E., et al., "MATRIX: A Reconfigurable Computing Device with Configurable Instruction Distribution and Deployable Resources (Extended Abstract)," Hot Chips Symposium 1997, Aug. 1997, pp. 1-3.
Nelson, B.E., "Reconfigurable Computing: An Introduction and Overview," Sep. 23, 1998, pp. 1-43.
Niedzielski, D., "An Overview of Reconfigurable Computing," NPL Date Unknown, 26 pages.
Ochotta, E.S., et al., "A Novel Predictable Segmented FPGA Routing Architecture," FPGA 98, Feb. 1998, pp. 3-11, ACM, Monterey, CA, USA.
Pedram, M., "IEEE Circuits and Systems Society Distinguished Lecturer Program," 2003-2004 Month N/A, 28 pages.
Perissakis, S., et al., "Embedded DRAM for a Reconfigurable Array," Proceedings of the 1999 Symposium on VLSI Circuits, Jun. 1999, slides 1-24.
Perissakis, S., et al., "Embedded DRAM for a Reconfigurable Array," Proceedings of the 1999 Symposium on VLSI Circuits, Jun. 1999, 4 pages.
Plunkett, B., et al., "Adapt2400 ACM Architecture Overview," A Technology Whitepaper, 2004 Month N/A, pp. 1-9, QuickSilver Technology, Inc.
Quicksilver Technology, Inc., "Adapt2000 ACM System Platform," Apr. 2004, pp. 1-39, QuickSilver Technology, Inc., San Jose, California, USA.
Rahman, A., et al., "Wiring Requirement and Three-Dimensional Integration Technology for Field Programmable Gate Arrays," IEEE Transactions on Very Large Scale Integration (VLSI) Systems, Feb. 2003, pp. 44-54, vol. 11, No. 1, IEEE.
Scalera, S., et al., "The Design and Implementation of a Context Switching FPGA", FPGAs for Custom Computing Machines, 1998. Proceedings. IEEE Symposium on FPGAs for Custom Computing Machines, Apr. 15-17, 1998, 8 pages.
Schaumont, P., et al., "A Quick Safari Through the Reconfiguration Jungle," 38th Design Automation Conference, Jun. 2001, 7 pages, Las Vegas, Nevada, USA.
Schmit, H., "Incremental Reconfiguration for Pipelined Applications," Proceedings of the 5th IEEE Symposium on FPGA-Based Custom Computing Machines, Apr. 16-18, 1997, 9 pages.
Schmit, H., et al., "FPGA Switch Block Layout and Evaluation," FPGA '02, Feb. 24-26, 2002, 8 pages, ACM, Monterey, California, USA.
Schmit, H., et al., "PipeRench: A Virtualized Programmable Datapath in 0.18 Micron Technology," Proceedings of the IEEE 2002 Custom Integrated Circuits Conference, May 12-15, 2002, pp. 63-66.
Schmit, H., et al., "Queue Machines: Hardware Compilation in Hardware," Proceedings of the 10th Annual IEEE Symposium on Field-Programmable Custom Computing Machines, Apr. 22-24, 2002, 9 pages.
Slade, A.L., et al., "Reconfigurable Computing Application Frameworks," 11th Annual IEEE Symposium on Field-Programmable Custom Computer Machines, Apr. 9-11, 2003, 10 pages.
Snider, G., "Performance-Constrained Pipelining of Software Loops onto Reconfigurable Hardware," FPGA '02, Feb. 24-26, 2002, pp. 177-186, ACM, Monterey, California, USA.
Soviani, C., et al., "Optimizing Sequential Cycles through Shannon Decomposition and Retiming", Design, Automation, and Test in Europe, Mar. 10, 2006, pp. 1085-1090.
Tau, E., et al., "A First Generation DPGA Implementation," Proceedings of the Third Canadian Workshop on Field-Programmable Devices, May 1995, pp. 138-143.
Tau, E., et al., "Transit Note #114: A First Generation DPGA Implementation," M.I.T. Transit Project, Jan. 1995, pp. 1-8.
Teifel, J., et al., "Highly Pipelined Asynchronous FPGAs," Proceedings of the 2004 ACM/SIGDA 12th International Symposium on Field Programmable Gate Arrays, Feb. 22-24, 2004, 10 pages, Monterey, California, USA.
Tsu, W., et al., "HSRA: High-Speed, Hierarchical Synchronous Reconfigurable Array," Proceedings of the International Symposium on Field Programmable Gate Arrays, Feb. 1999, pp. 1-10.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.
Updated portions of prosecution history of U.S. Appl. No. 13/621,145, filed Jul. 1, 2014, Schmit, Herman, et al.
Portions of prosecution history of U.S. Appl. No. 14/281,775, filed Aug. 4, 2014, Tabula, Inc.
Updated portions of prosecution history of U.S. Appl. No. 13/540,596, filed Sep. 3, 2014, Voogel, Martin, et al.

* cited by examiner

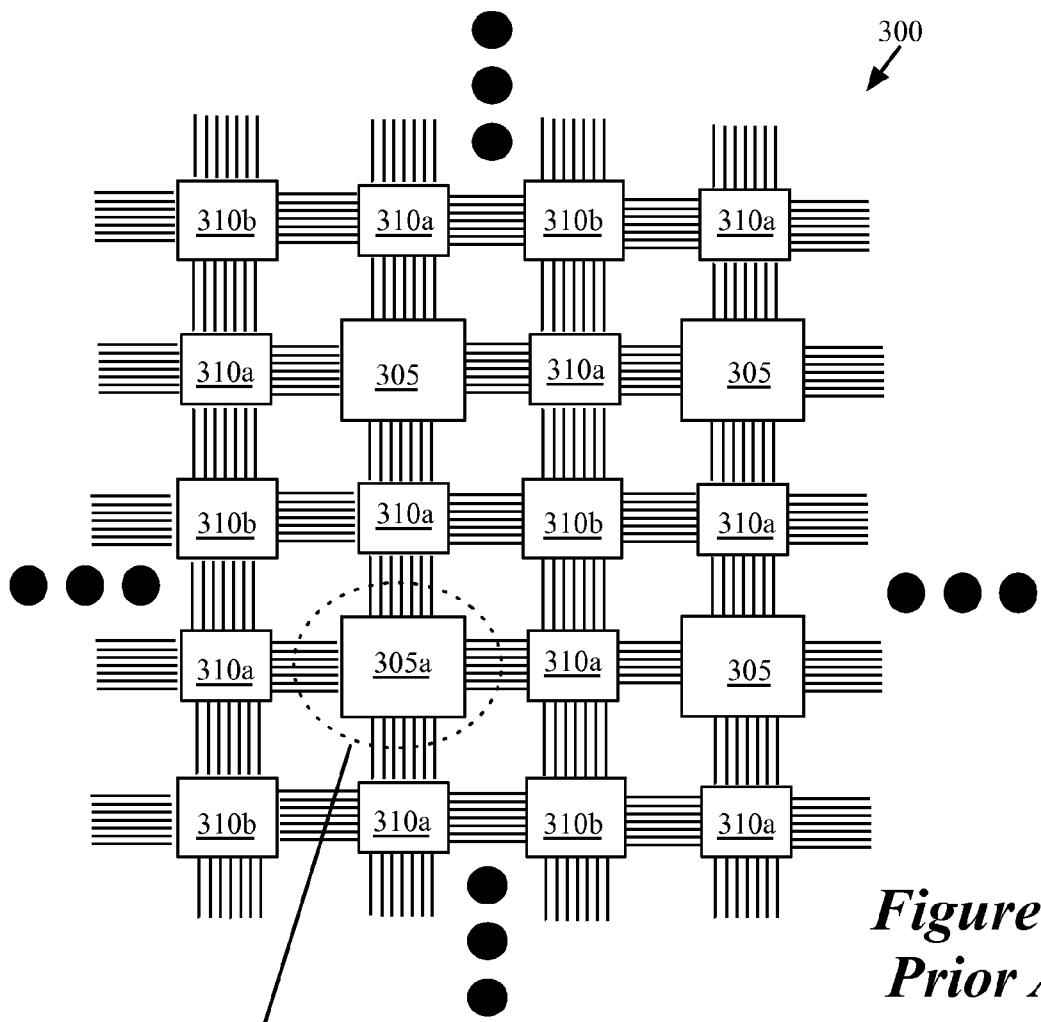
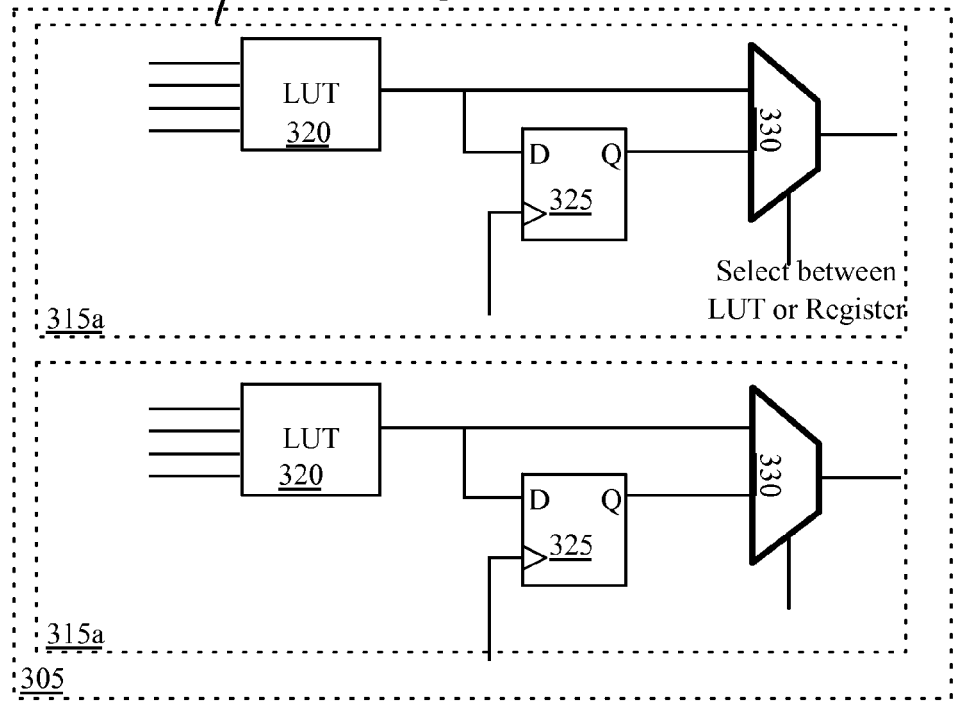
*Figure 3A*
*Prior Art*

CONFIGURABLE STORAGE ELEMENTS

CLAIM OF BENEFIT TO PRIOR APPLICATIONS

This present Application claims the benefit of U.S. Provisional Patent Application 61/507,510, filed Jul. 13, 2011. The present Application also claims the benefit of U.S. Provisional Patent Application 61/525,153, filed Aug. 18, 2011. The present Application also claims the benefit of U.S. Provisional Patent Application 61/667,411 filed on Jul. 2, 2012. This application is a continuation-in-part application of U.S. patent application Ser. No. 13/540,591 entitled "Configurable Storage Elements" filed Jul. 2, 2012. This application is also a continuation-in-part application of U.S. patent application Ser. No. 13/540,596 entitled "Configurable Storage Elements" filed Jul. 2, 2012. U.S. Provisional Patent Applications 61/507,510, 61/525,153, and 61/667,411 are incorporated herein by reference.

FIELD OF INVENTION

The present invention is directed towards configurable ICs having a circuit arrangement with storage elements for performing routing and storage operations.

BACKGROUND

The use of configurable integrated circuits ("ICs") has dramatically increased in recent years. One example of a configurable IC is a field programmable gate array ("FPGA"). An FPGA is a field programmable IC that often has logic circuits, interconnect circuits, and input/output ("I/O") circuits. The logic circuits (also called logic blocks) are typically arranged as an internal array of repeated arrangements of circuits. These logic circuits are typically connected together through numerous interconnect circuits (also called interconnects). The logic and interconnect circuits are often surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data 215 that are stored in a set of SRAM cells 220. The configuration data specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3A illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a.

In some cases, the IC 300 includes numerous logic circuits 305 and interconnect circuits 310 (e.g., hundreds, thousands, hundreds of thousands, etc. of such circuits). As shown in FIG. 3A, each logic circuit 305 includes additional logic and interconnect circuits. Specifically, FIG. 3A illustrates a logic circuit 305a that includes two sections 315a that together are called a slice. Each section includes a look-up table ("LUT") 320, a user register 325, a multiplexer 330, and possibly other circuitry (e.g., carry logic) not illustrated in FIG. 3A.

The multiplexer 330 is responsible for selecting between the output of the LUT 320 or the user register 325. For instance, when the logic circuit 305a has to perform a computation through the LUT 320, the multiplexer 330 selects the output of the LUT 320. Alternatively, this multiplexer selects the output of the user register 325 when the logic circuit 305a or a slice of this circuit needs to store data for a future computation of the logic circuit 305a or another logic circuit.

FIG. 3B illustrates an alternative way of constructing half a slice in a logic circuit 305a of FIG. 3A. Like the half-slice 315a in FIG. 3A, the half-slice 315b in FIG. 3B includes a LUT 320, a user register 325, a multiplexer 330, and possibly other circuitry (e.g., carry logic) not illustrated in FIG. 3B. However, in the half-slice 315b, the user register 325 can also be configured as a latch. In addition, the half-slice 315b also includes a multiplexer 350. In half-slice 315b, the multiplexer 350 receives the output of the LUT 320 instead of the register/latch 325, which receives this output in half-slice 315a. The multiplexer 350 also receives a signal from outside of the half-slice 315b. Based on its select signal, the multiplexer 350 then supplies one of the two signals that it receives to the register/latch 325. In this manner, the register/latch 325 can be used to store (1) the output signal of the LUT 320 or (2) a signal from outside the half-slice 315b.

The use of user registers to store such data is at times undesirable, as it typically requires data to be passed at a clock's rising edge or a clock's fall edge. In other words, registers often do not provide flexible control over the data passing between the various circuits of the configurable IC. In addition, the placement of a register or a latch in the logic circuit increases the signal delay through the logic circuit, as it requires the use of at least one multiplexer 330 to select between the output of a register/latch 325 and the output of a LUT 320. The placement of a register or a latch in the logic circuit further hinders the design of an IC as the logic circuit becomes restricted to performing either storage operations or logic operations, but not both.

Accordingly, there is a need for a configurable IC that has a more flexible approach for storing data and passing data that utilizes and is compatible with the IC's existing routing pathways and circuit array structures. More generally, there is a need for more flexible storage and routing mechanisms in configurable ICs.

SUMMARY OF THE INVENTION

Some embodiments provide a configurable integrated circuit (IC) having a routing fabric that includes configurable storage element in its routing fabric. In some embodiments, the configurable storage element includes a parallel distributed path for configurably providing a pair of transparent storage elements. The pair of configurable storage elements can configurably act either as non-transparent (i.e., clocked) storage elements or transparent configurable storage elements.

In some embodiments, the configurable storage element in the routing fabric performs both routing and storage operations by a parallel distributed path that includes a clocked storage element and a bypass connection. In some embodiments, the configurable storage element perform both routing and storage operations by a pair of master-slave latches but without a bypass connection. The routing fabric in some embodiments supports the borrowing of time from one clock cycle to another clock cycle by using the configurable storage element that can be configure to perform both routing and storage operations in different clock cycles. In some embodiments, the routing fabric provide a low power configurable storage element that includes multiple storage elements that operates at different phases of a slower running clock.

In addition to having storage elements, the configurable routing fabric of some embodiments further includes arithmetic elements that can configurably perform arithmetic operations such as add and compare. The arithmetic element in some embodiments does use any configurable logic circuits outside of the routing fabric to perform its arithmetic operation.

The routing fabric in some embodiments provides a run-time power-saving circuit that forces configurable routing circuits in the fabric to select a quiet path. In some embodiments, the run-time flicker prevention circuit provides a "consort" signal that, when asserted, forces a row of configurable circuits into their "init" state. Some embodiments identify the "consort" signal as a user signal is able to indicate whether the row of configurable circuits is active during certain clock cycles.

BRIEF DESCRIPTION OF THE DRAWINGS

The novel features of the invention are set forth in the appended claims. However, for the purpose of explanation, several embodiments of the invention are set forth in the following figures.

FIG. 3A illustrates a portion of a prior art configurable IC.

DETAILED DESCRIPTION

Figure 1:
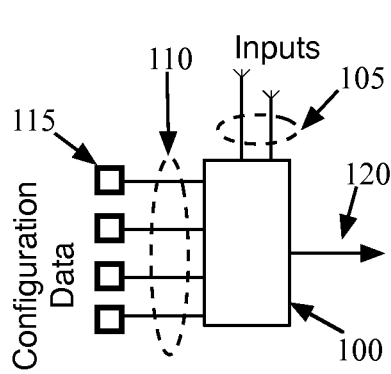
FIG. 1 illustrates an example of a configurable logic circuit.
Figure 2:
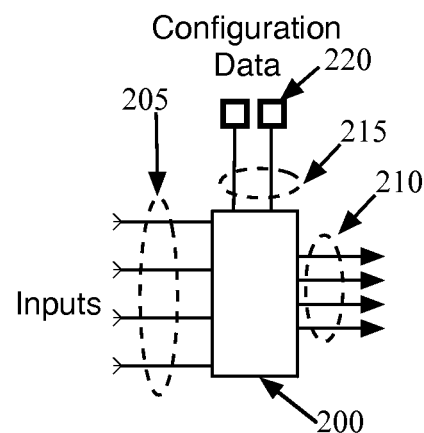
FIG. 2 illustrates an example of a configurable interconnect circuit.
Figure 3B:
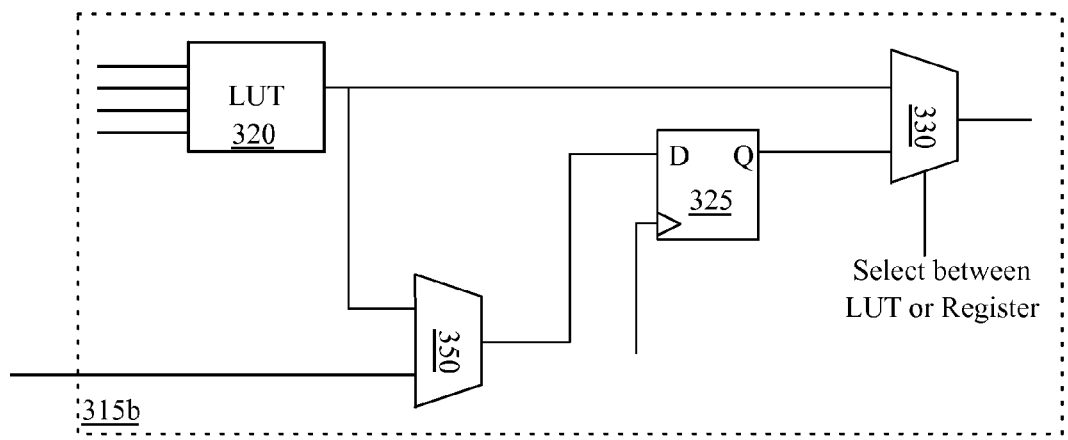
FIG. 3B illustrates an alternative way of constructing half a slice in a logic circuit of FIG. 3A.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

Some embodiments provide a configurable integrated circuit ("IC") that includes a configurable routing fabric with storage elements. Examples of such storage elements include transparent storage elements (e.g., latches) and non-transparent storage elements (e.g., registers). A latch is a storage element that can operate transparently, not needing, for example, a clock signal. Specifically, based on an enable signal, a latch either holds its output constant (i.e., is closed) or passes its input to its output (i.e., is open). For instance, a latch (1) might pass a signal on its input terminal to its output terminal when the enable signal is not active (e.g., when the signal on the enable terminal is logic low) and (2) might store a value and hold its output constant at this value when the enable signal is active (e.g., when the signal is logic high). Such a latch typically stores the value that it was receiving when the enable signal transitions from its inactive state (e.g., low) to its active state (e.g., high). Some latches do not include a separate enable signal, instead the input signal (or combination of input signals) to the latch acts as an enable signal.

A register is a storage element that cannot operate transparently. For instance, some registers operate based on a control signal (e.g., a periodic clock signal) received on the control terminal. Based on this signal, the register either holds its output constant or passes its input to its output. For instance, when the control signal makes a transition (e.g., goes from logic low to logic high), the register samples its input. Next, when the control signal is constant or makes the other transition, the register provides at its output the value that it most recently sampled at its input. In a register, the input data typically must be present a particular time interval before and after the active clock transition. A register is often operated by a clock signal that causes the register to pass a value every clock cycle, while a latch is often controlled by a control signal, but this is not always have to be the case.

The IC of some embodiments also includes other configurable circuits for configurably performing operations (e.g., logic operations). In some of these embodiments, the configurable circuits of the IC are arranged in a particular manner, e.g., in groups of the circuits (or "tiles") that include multiple inputs and outputs. In some embodiments, the configurable circuits and/or storage elements are sub-cycle reconfigurable circuits and/or storage elements that may receive different configuration data in different sub-cycles. A sub-cycle in some embodiments is a fraction of another clock cycle (e.g., a user design cycle). In some embodiments, the configurable circuits described above and below reconfigure at a different rate than the sub-cycle rate. For instance, in some embodiments, these circuits reconfigure at the user-design clock rate or any arbitrary reconfiguration cycle rate that is smaller than the sub-cycle or user-design clock rate. Accordingly, reconfigurable circuits generally reconfigure at a reconfiguration rate associated with a reconfiguration cycle.

In some embodiments, the routing fabric provides a communication pathway that routes signals to and from source and destination components (e.g., to and from configurable circuits of the IC). The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

In some embodiments, the routing fabric includes configurable interconnect circuits, the wire segments (e.g., the metal or polysilicon segments) that connect to the interconnect circuits, and/or vias that connect to these wire segments and to the terminals of the interconnect circuits. In some of these embodiments, the routing fabric also includes buffers for achieving one or more objectives (e.g., maintaining the signal strength, reducing noise, altering signal delay, etc.) with respect to the signals passing along the wire segments. In conjunction with or instead of these buffer circuits, the routing fabric of some of these embodiments might also include one or more non-configurable circuits (e.g., non-configurable interconnect circuits).

Different embodiments place storage elements at different locations in the routing fabric or elsewhere on the IC. Examples of such locations include storage elements coupled to or within the input stage of interconnect circuits, storage elements coupled to or within the output stage of interconnect circuits, storage elements coupled to, cross-coupled to, or adjacent to buffer circuits in the routing fabric, and storage elements at other locations of the routing fabric or elsewhere on the IC.

In some embodiments, the routing fabric includes interconnect circuits with at least one storage element located at their input stage. For a particular interconnect circuit that connects a particular source circuit to a particular destination circuit, the input of the particular interconnect circuit's storage element connects to an output of the source circuit. When enabled, the storage element holds the input of the interconnect circuit for a particular duration (e.g., for one or more user design clock cycles or one or more sub-cycles). Such a storage element may be used to hold the value at the input of the interconnect circuit while the interconnect circuit is not being used to route data, while the interconnect circuit is being used to route data that is being held by the storage element, or while the interconnect circuit is being used to route data that the interconnect circuit receives along another one of its inputs.

In some embodiments, the storage elements are configurable storage elements that are controlled by configuration data. In some of these embodiments, each configurable storage element is controlled by a separate configuration data signal, while in other of these embodiments, multiple configurable storage elements are controlled by a single configuration data signal. In some embodiments, the storage elements are configurable storage elements that can controllably store data for arbitrary durations of time. In other words, some or all of these storage elements are configurable storage elements whose storage operation is controlled by a set of configuration data stored in the IC. For instance, in some embodiments, the set of configuration bits determines the configuration cycles in which a storage element receives and/or stores data. In some embodiments, some or all of these transparent storage elements may also be at least partly controlled by a clock signal or a signal derived from a clock signal.

In addition to the transparent storage elements described above, in some embodiments, the routing fabric includes clocked storage elements. In some embodiments, each clocked storage element includes at least one input, at least one output, and a series of clocked delay elements connected sequentially. In some embodiments, each clocked delay element has at least one data input and at least one data output, where the data supplied to the input is stored during one clock cycle (or sub-cycle, etc.) and the stored data is provided at the output one clock cycle later.

In some embodiments, some or all of the clocked storage elements described above may be at least partly controlled by user design signals. In some embodiments, some or all of these clocked storage elements are configurable storage elements whose storage operation is at least partly controlled by a set of configuration data stored in configuration data storage of the IC. For instance, in some embodiments, the set of configuration bits determines the number of clock cycles in which a clocked storage element presents data at its output. In some embodiments, the clocked storage element receives a signal derived from a clock signal that at least partly controls its storage operation.

In addition to the structure and operation of the storage elements circuits above, some embodiments reduce power consumption during the operation of the IC by using any idle storage elements, interconnect circuits, and/or other circuits to eliminate unnecessary toggling of signals in the IC. For instance, the configurable storage element described above that includes multiple storage elements built in the output stage of a configurable interconnect circuit may be used for power savings when one or more of the storage elements located at its outputs is not needed for a routing or storage operation. The configurable storage element's unused output(s) may be configured to hold its previous output value in order to eliminate switching at the output, and at any wires or other circuitry connected to the output (e.g., at the input of an interconnect circuit, buffer, etc.). Several processes to achieve reduced power consumption utilizing the storage elements discussed above are described below.

Some embodiments provide a configurable integrated circuit (IC) having a routing fabric that includes configurable storage element in its routing fabric. In some embodiments, the configurable storage element includes a parallel distributed path for configurably providing a pair of transparent storage elements. The pair of configurable storage elements can configurably act either as non-transparent (i.e., clocked) storage elements or transparent configurable storage elements.

In some embodiments, the configurable storage element in the routing fabric performs both routing and storage operations by a parallel distributed path that includes a clocked storage element and a bypass connection. In some embodiments, the configurable storage element perform both routing and storage operations by a pair of master-slave latches but without a bypass connection. The routing fabric in some embodiments supports the borrowing of time from one clock cycle to another clock cycle by using the configurable storage element that can be configure to perform both routing and storage operations in different clock cycles. In some embodiments, the routing fabric provide a low power configurable storage element that includes multiple storage elements that operates at different phases of a slower running clock.

In addition to having storage elements, the configurable routing fabric of some embodiments further includes arithmetic elements that can configurably perform arithmetic operations such as add and compare. The arithmetic element in some embodiments does use any configurable logic circuits outside of the routing fabric to perform it arithmetic operation.

Some embodiments configure an IC that includes multiple reconfigurable circuits, where several of the reconfigurable circuits are reconfigurable storage elements and each of the reconfigurable storage elements has an association with another reconfigurable circuit. In some embodiments, a reconfigurable storage element has an association with a reconfigurable circuit when an output (or input) of the reconfigurable circuit is directly connected to an input (or output) of the reconfigurable storage element. As further described below, a direct connection in some embodiments may include multiple wires, vias, and/or buffers. It may also include in some embodiments non-configurable circuits but does not include intervening configurable circuits. In some embodiments, a reconfigurable storage element may be configured, based on a configuration data, to either pass-through a value during a particular reconfiguration cycle, or hold a value that it was outputting during a previous reconfiguration cycle.

In some embodiments, several of the reconfigurable circuits are reconfigurable interconnect circuits. In some embodiments, each reconfigurable interconnect circuit has a set of inputs, a set of select lines, and at least one output. The reconfigurable interconnect circuit of some embodiments selects an input from the set of inputs based on data supplied to the set of select lines. In some embodiments, the reconfigurable interconnect circuit is controlled by configuration data supplied to its select lines.

Several more detailed embodiments of the invention are described in the sections below. Before describing these embodiments further, an overview of the configurable IC architecture used by some embodiments to implement the routing fabric with storage elements is given in Section I below. This discussion is followed by the discussion in Section II of an overview of the reconfigurable IC architecture used by some embodiments to implement the routing fabric with storage elements. Next, Section III describes various implementations of a configurable IC that includes transparent storage elements in its routing fabric. This description is followed by the discussion in Section IV of various implementations of a configurable IC that includes clocked storage elements. Section V describes various arithmetic elements in the routing fabric. Next, Section VI describes power reduction in a configurable IC. Last, Section VII describes the IC architecture of some embodiments, along with packaging for the IC, the electronic systems that use the IC, and the computer system that defines the configuration data sets for the IC.

I. Configurable IC Architecture

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit that has configurable circuits. A configurable circuit is a circuit that can "configurably" perform a set of operations. Specifically, a configurable circuit receives a configuration data set that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 4:
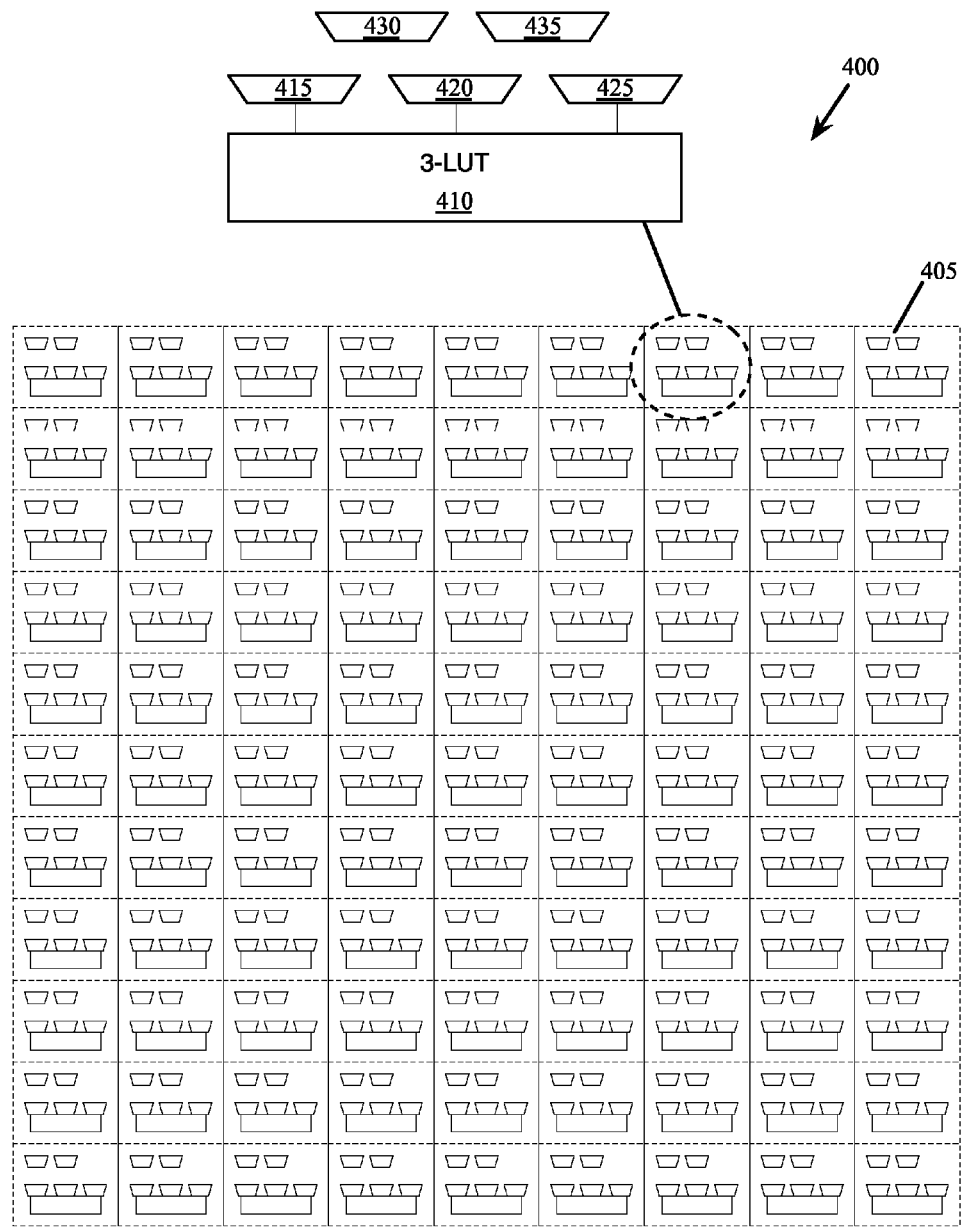
FIG. 4 illustrates a configurable circuit architecture that is formed by numerous configurable tiles that are arranged in an array with multiple rows and columns of some embodiments.
Figure 5:
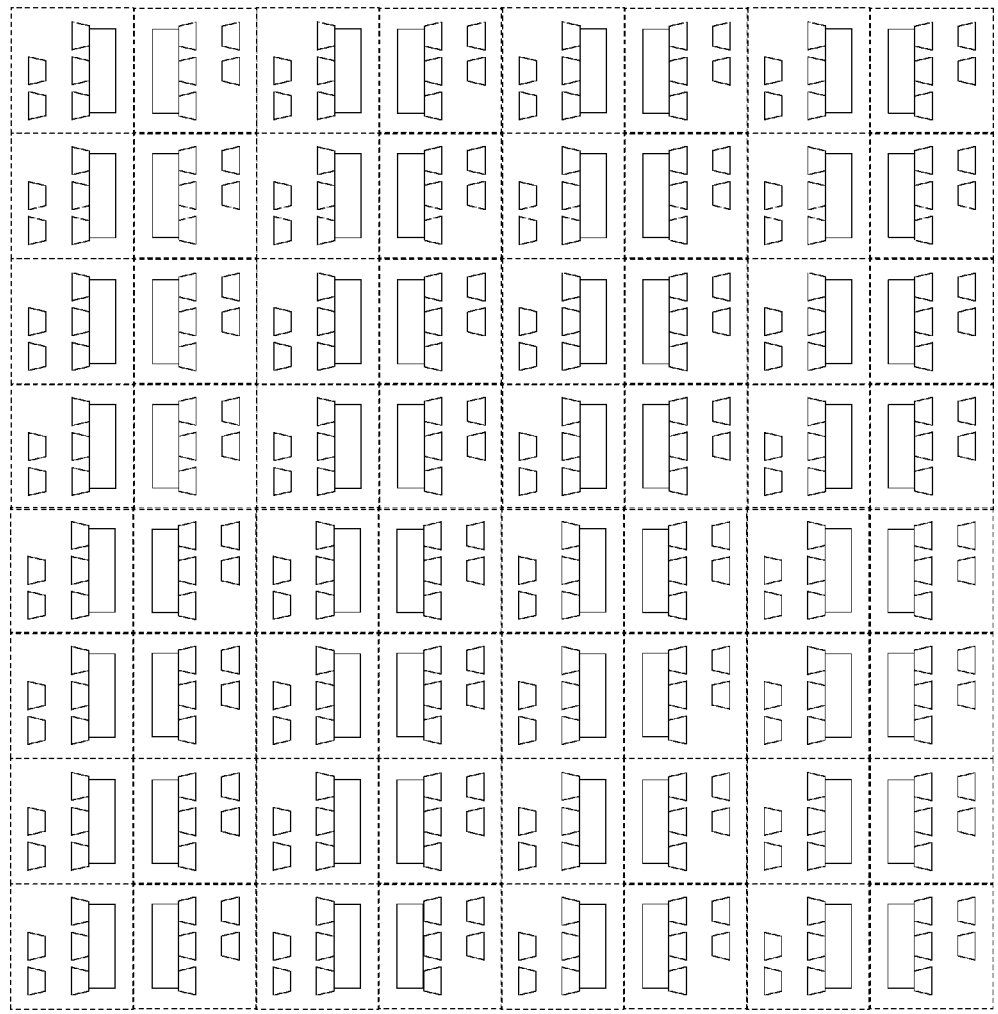
FIG. 5 provides one possible physical architecture of the configurable IC illustrated in FIG. 4 of some embodiments.
Figure 6:
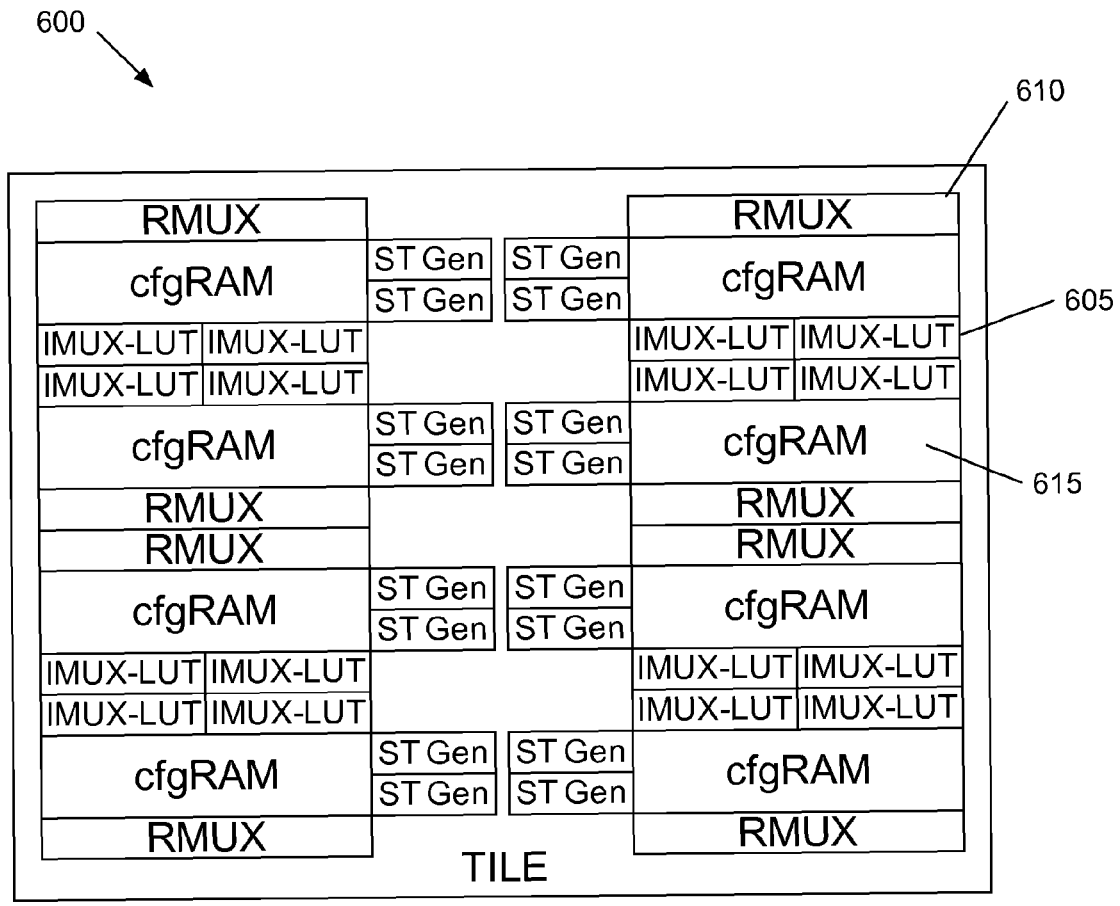
FIG. 6 illustrates the detailed tile arrangement of some embodiments.

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 4-6 illustrate several configurable circuit arrangements/architectures that include the invention's circuits. One such architecture is illustrated in FIG. 4.

The architecture of FIG. 4 is formed by numerous configurable tiles 405 that are arranged in an array with multiple rows and columns. In FIG. 4, each configurable tile includes a configurable three-input LUT 410, three configurable input-select multiplexers 415, 420, and 425, and two configurable routing multiplexers 430 and 435. Different embodiments have different number of configurable interconnect circuits 430. For instance, some embodiments may have eight configurable interconnect circuits while others may have more or less such circuits. For each configurable circuit, the configurable IC 400 includes a set of storage elements (e.g., a set of SRAM cells) for storing a set of configuration data bits. Note that storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 4, an input-select multiplexer (also referred to as an "IMUX") 415 is an interconnect circuit associated with the LUT 410 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 4, a routing multiplexer (also referred to as an RMUX) 430 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 4 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments. Various wiring architectures can be used to connect the RMUXs, IMUXs, and LUTs. Several examples of the wire connection scheme are described in U.S. Pat. No. 7,295,037.

Several embodiments are described below by reference to a "direct connection." In some embodiments, a direct connection is established through a combination of one or more wire segments, and potentially one or more vias, but no intervening circuit. In some embodiments, a direct connection does not include any intervening configurable circuits. In some embodiments, a direct connection might however include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direction connection. Also, some connections are referred to below as configurable connections and some circuits are described as configurably connected. Such references signifies that the circuits are connected through a configurable interconnect circuit (such as a configurable routing circuit).

In some embodiments, the examples illustrated in FIG. 4 represent the actual physical architecture of a configurable IC. However, in other embodiments, the examples illustrated in FIG. 4 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 5 provides one possible physical architecture of the configurable IC 400 illustrated in FIG. 4.

Having the aligned tile layout with the same circuit elements of FIG. 5 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 6 illustrates an alternative tile structure that is used in some embodiments. This tile 600 has four sets 605 of 4-aligned LUTs along with their associated IMUXs. It also includes eight sets 610 of RMUXs and eight banks 615 of configuration RAM storage. Each 4-aligned LUT tile shares one carry chain. One example of which is described in U.S. Pat. No. 7,295,037. One of ordinary skill in the art would appreciate that other organizations of LUT tiles may also be used in conjunction with the invention and that these organizations might have fewer or additional tiles.

II. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 7:
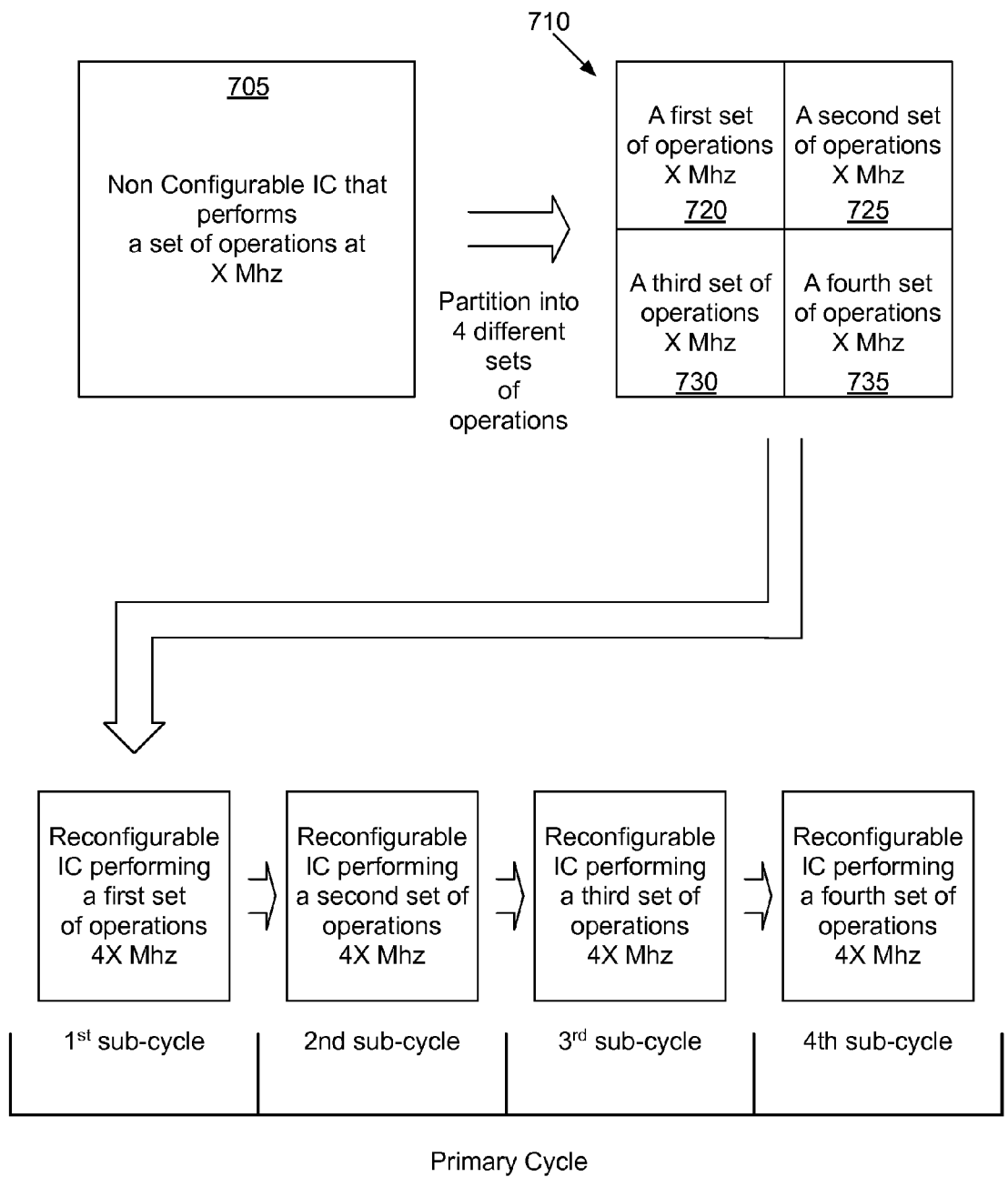
FIG. 7 illustrates an example of a sub-cycle reconfigurable IC of some embodiments.

FIG. 7 conceptually illustrates an example of a sub-cycle reconfigurable IC (i.e., an IC that is reconfigurable on a sub-cycle basis). In this example, the sub-cycle reconfigurable IC implements an IC design 715 that operates at a clock speed of X MHz. The operations performed by the components in the IC design 715 can be partitioned into four sets of operations 720-735, with each set of operations being performed at a clock speed of X MHz.

FIG. 7 then illustrates that these four sets of operations 720-735 can be performed by one sub-cycle reconfigurable IC 710 that operates at 4×MHz. In some embodiments, four cycles of the 4×MHz clock correspond to four sub-cycles within a cycle of the X MHz clock. Accordingly, this figure illustrates the reconfigurable IC 710 reconfiguring four times during four cycles of the 4×MHz clock (i.e., during four sub-cycles of the X MHz clock). During each of these reconfigurations (i.e., during each sub-cycle), the reconfigurable IC 710 performs one of the identified four sets of operations. In other words, the faster operational speed of the reconfigurable IC 710 allows this IC to reconfigure four times during each cycle of the X MHz clock, in order to perform the four sets of operations sequentially at a 4×MHz rate instead of performing the four sets of operations in parallel at an X MHz rate.

Some embodiments use configuration retrieval circuits to retrieve configuration data for the reconfigurable circuits. In some embodiments, configuration retrieval circuit includes multiplexers that include an "init" input that is tied to a fixed polarity (e.g., ground). When the "init" input is selected, a row of configurable circuits is forced into a known initial state, since the configuration data retrieved by the configuration retrieval circuit is forced to zero. Some embodiments select such an "init" inputs at these multiplexers to force configurable circuits into a known initial state prior to the IC being configured. Some embodiments also selects the "init" input during operation of the IC to minimize power consumption. For some embodiments, FIGS. 8-11 illustrates multiplexers with init inputs in configuration retrieval circuits.

Figure 8:
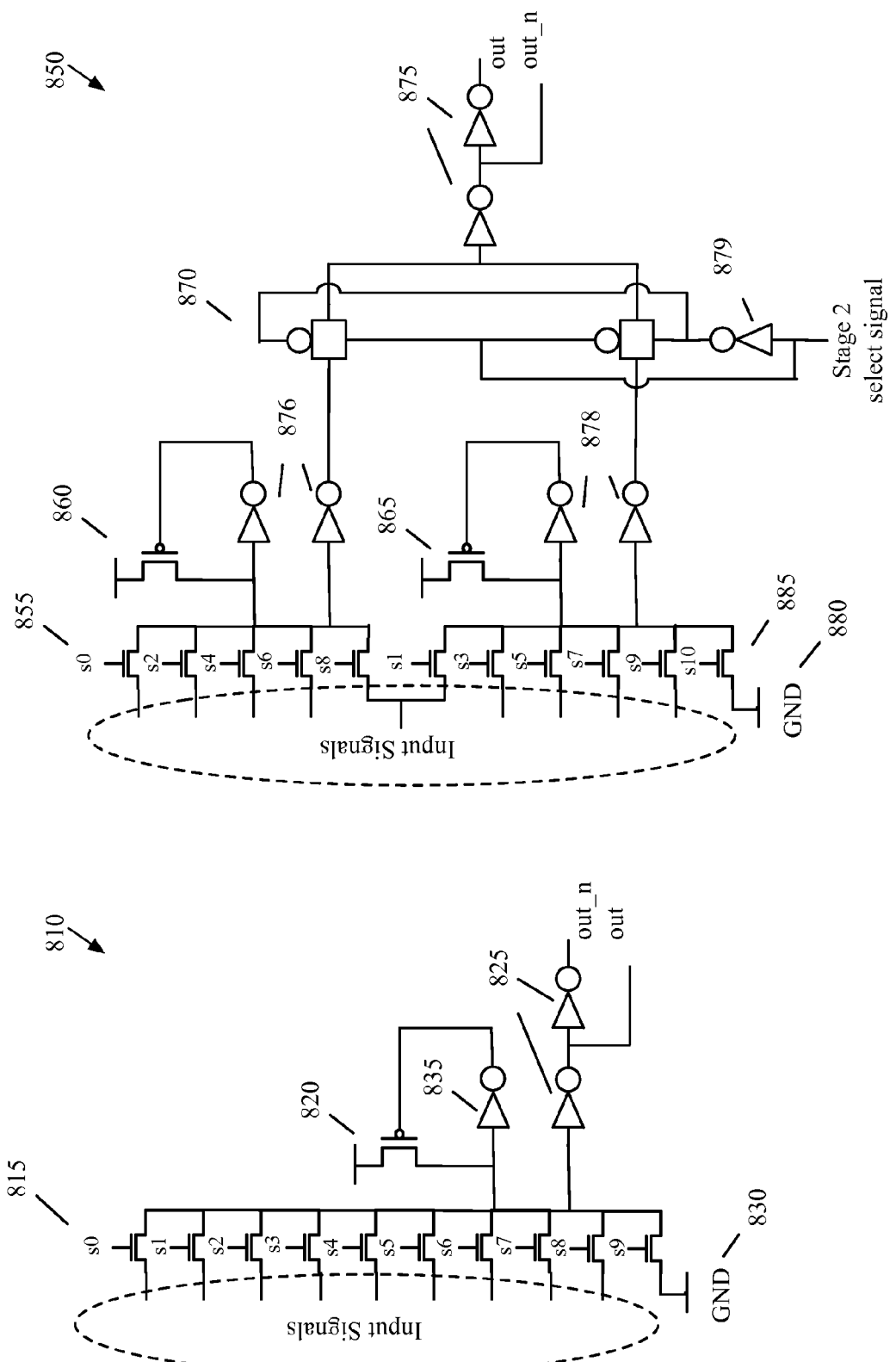
FIG. 8 illustrates two multiplexers of some embodiments used for retrieving configuration data.

FIG. 8 illustrates two multiplexers 810 and 850 for retrieving configuration data in some embodiments. As shown in the figure, the circuit 810 includes a set of NMOS pass gate transistors 815, a pull-up PMOS transistor 820, and several inverting buffers 825 and 835. The circuit 850 includes two sets 855 and 885 of NMOS pass gate transistors, a set of CMOS pass gate transistors 870, two pull-up PMOS transistors 860 and 865, and several inverting buffers 875-879.

The circuit 810 is a ten-to-one multiplexer that receives nine input signals from a set of configuration storage elements (not shown) and one input signal that is tied to ground 830 to provide an "init" input. The "init" inputs of configuration retrieval multiplexers such as the multiplexer 810 keep storage elements in the routing fabric at a known state before the chip is configured. The set of NMOS pass gate transistors 815 receives a set of "one-hot" enable bits s0-s8, where only one of enable bits s0-s8 is "hot" (active) while the other eight configuration bits are "cold" (inactive). As a result, one of the nine input signals is selected and passed on as the output of the multiplexer 810. When the configuration bit s9 is asserted, the multiplexer 810 will output zero. In some embodiments, the zero output of the multiplexers 810 is used to force a row of configurable circuits into sleep at the same time to save power, as described in detail below by reference to FIGS. 58-64.

Because NMOS pass gate transistors pass the value "1" slower than passing the value "0", there can be reconfiguration skews in the output of the multiplexer 810. Some embodiments therefore include the pull-up PMOS transistor 820 to quickly pull-up the output of the multiplexer 810 and to regenerate the voltage levels at the output that have been degenerated by the NMOS threshold drops. In other words, the pull-up PMOS transistor 820 is used because the NMOS pass transistors are slower than PMOS transistors in pulling an output signal to a high voltage.

The inverting buffers 825 are used to isolate the circuit 810 from its load. These buffers include more than one inverter in some embodiments. The outputs of these buffers are the final output of the multiplexer 810. In some embodiments, the output buffers 825 are followed by multiple inverters.

The circuit 850 is an eleven-to-one multiplexer that receives ten input signals from a set of configuration storage elements (not shown) and one input signal that is tied to ground 880 to provide an "init" input. The init inputs of configuration retrieval multiplexers keep storage elements in the routing fabric at a known state before the chip is configured. Each of the two sets of NMOS pass gate transistors 855 and 885 receives a set of "one-hot" enable bits. Specifically, the first set of NMOS pass gate transistors 855 receives "one-hot" enable bits s0, s2, s4, s6, and s8, while the second set of NMOS pass gate transistors 885 receives "one-hot" enable bits s1, s3, s5, s7, and s9. As a result, two of the ten input signals are selected and provided as inputs to the set of CMOS pass gate transistors 870. The CMOS pass gate transistors 870 are controlled by a "stage-2" selection signal. At any given time, only one of the CMOS pass gate transistors 870 is enabled to pass the signal it receives to the output of the multiplexer 850.

When the init input (i.e., the grounded input) is selected, the multiplexer 850 will output zero. In some embodiments, the zero outputs of multiplexers 850 are used to force a row of configurable circuits into sleep at the same time to save power, as described in detail below by reference to FIGS.

58-64. Because the CMOS pass gate transistors 870 pass the value "1" with the same delay as passing the value "0", there are less reconfiguration skews in the output of the multiplexer 850 than the multiplexer 810.

The pull-up PMOS transistors 860 and 865 are used to quickly pull-up the outputs of the two groups of NMOS pass gate transistors and to regenerate the voltage levels at the output of the two groups of NMOS pass gate transistors that have been degenerated by the NMOS threshold drops. In other words, the pull-up PMOS transistors 860 and 865 are used because the NMOS pass transistors are slower than PMOS transistors in pulling an output signal to a high voltage.

The inverting buffers 875 are used to isolate the circuit 850 from its load. These buffers include more than one inverter in some embodiments. The outputs of these buffers are the final output of the multiplexer 850. In some embodiments, the output buffers 875 are followed by multiple inverters.

Figure 9:
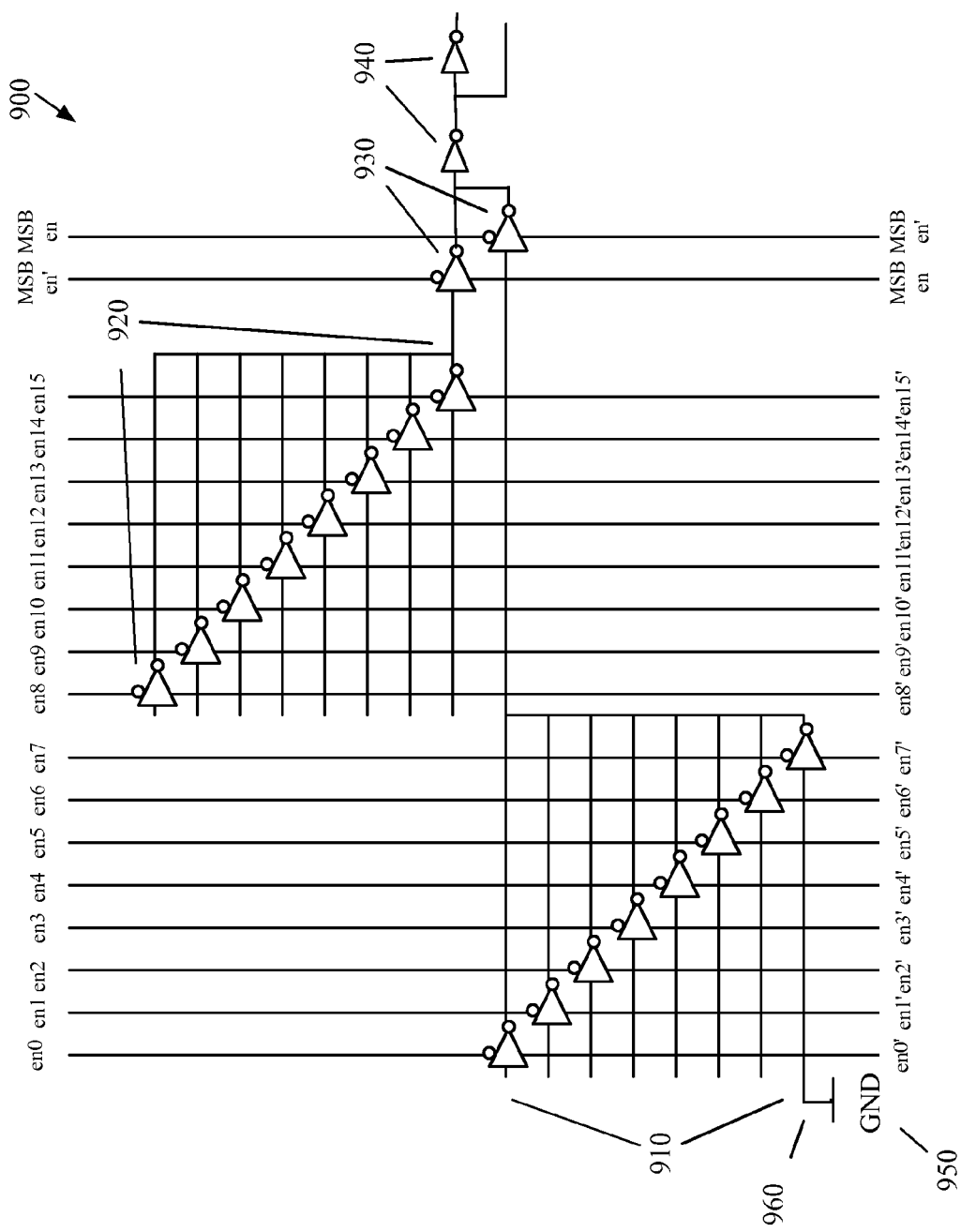
FIG. 9 illustrates a multiplexer of some embodiments that uses tri-state inverters.

The multiplexers described above use NMOS pass gate transistors in selecting signals. In some embodiments, tri-state inverters are used for selecting signals instead. FIG. 9 illustrates a multiplexer 900 of some embodiments that uses tri-state inverters for signal selection. As shown in this figure, the circuit 900 includes three sets 910-930 of tri-state inverters and two inverting output buffers 940.

The circuit 900 is a sixteen-to-one multiplexer that receives fifteen input signals from a set of configuration storage elements (not shown) and one input signal 960 that is tied to ground 950 to provide an "init" input. The init inputs of configuration retrieval multiplexers keep storage elements in the routing fabric at a known state before the chip is configured. Each of the two sets of tri-state inverters 910 and 920 receives a set of "one-hot" enable bits. As a result, two of the sixteen input signals are selected and provided as inputs to the third set of tri-state inverters 930. At any given time, only one of tri-state inverter in the set 930 is enabled and passes the signal it receives to the output of the multiplexer 900. When the init input 960 is selected, the multiplexer 900 will output zero. In some embodiments, the zero outputs of multiplexers 900 are used to force a row of configurable circuits into sleep at the same time to save power, as described in detail below by reference to FIGS. 58-64.

The inverting buffers 940 are used to isolate the circuit 900 from its load. These buffers include more than one inverter in some embodiments. The outputs of the buffers 940 are the final output of the multiplexer 900. In some embodiments, the output buffers 940 are followed by multiple inverters. In some embodiments, the output of the circuit 900 is latched.

Figure 10:
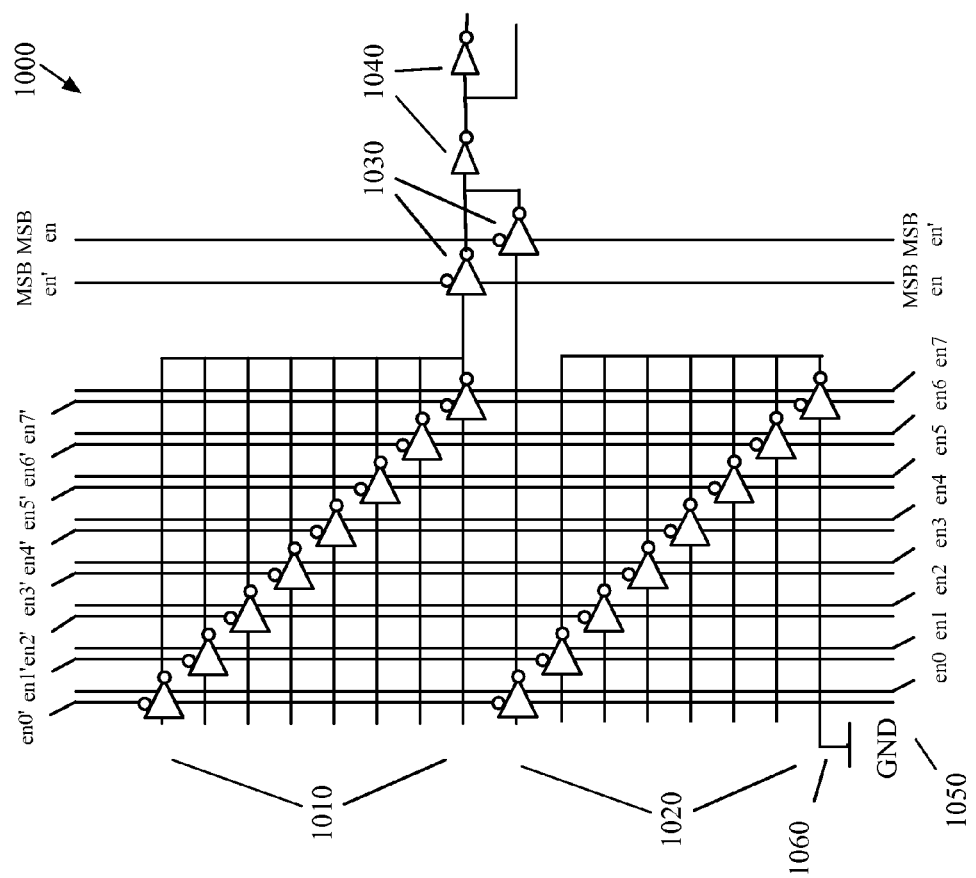
FIG. 10 illustrates a multiplexer of some embodiments that uses tri-state inverters with shared control signals.

FIG. 10 illustrates a multiplexer of some embodiments that uses tri-state inverters with shared control signals. As shown in this figure, the circuit 1000 includes three sets 1010-1030 of tri-state inverters and two inverting output buffers 1040.

The circuit 1000 is a sixteen-to-one multiplexer that receives fifteen input signals from a set of configuration storage elements (not shown) and one input signal 1060 that is tied to ground 1050 to provide an "init" input. The init inputs of configuration retrieval multiplexers keep storage elements in the routing fabric at a known state before the chip is configured. The two sets of tri-state inverters 1010 and 1020 share the same set of 8-bit "one-hot" enable bits. As a result, two of the sixteen input signals are selected and provided as inputs to the third set of tri-state inverters 1030. At any given time, only one of the third set of tri-state inverters 1030 is enabled to pass the signal it receives to the output of the multiplexer 1000. When the init input 1060 is selected, the multiplexer 1000 will output zero. In some embodiments, the zero outputs of multiplexers 1000 are used to force a row of configurable circuits into sleep at the same time to save power, as described in detail below by reference to FIGS. 58-64.

The inverting buffers 1040 are used to isolate the circuit 1000 from its load. These buffers include more than one inverter in some embodiments. The outputs of these buffers are the final output of the multiplexer 1000. In some embodiments, the output buffers 1040 are followed by multiple inverters. In some embodiments, the output of the circuit 1000 is latched.

Figure 11A:
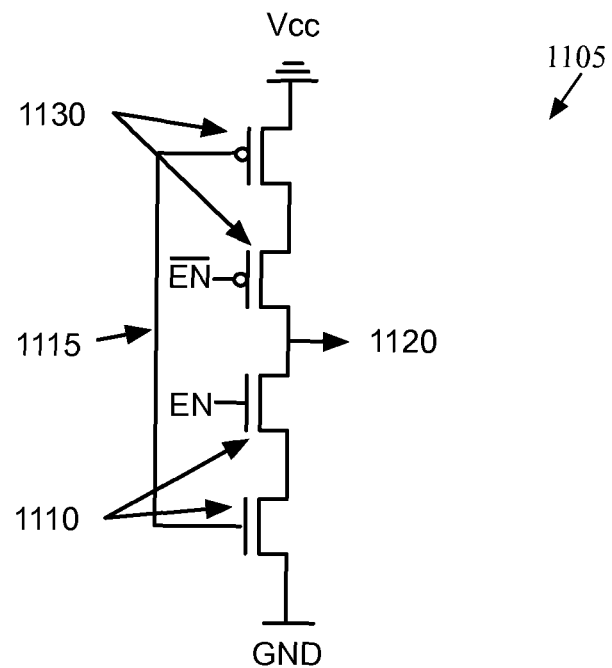
FIGS. 11A and 11B illustrate circuit level representations for tri-state inverters of some embodiments.

If the enable signal to a tri-state inverter in the sets of tri-state inverters 1010, 1020, and 1030 is low, the tri-state inverter would not pass and invert the signal that it receives. Instead, the tri-state inverter would prevent the received signals from being outputted by the multiplexer 1000. FIG. 11A illustrates a circuit level circuit representation for a tri-state inverter of some embodiments. The tri-state inverter 1105 includes two NMOS transistors 1110, one receiving the input 1115 and one receiving the enable signal. The tri-state inverter further includes two PMOS transistors 1130, one which receives the input 1115 and the other which receives the complement of the enable signal. In FIG. 11A, the tri-state inverter 1105 inverts the input 1115 when the enable signal is high and acts as an open circuit (e.g., open switch) when the enable signal is low.

Figure 11B:
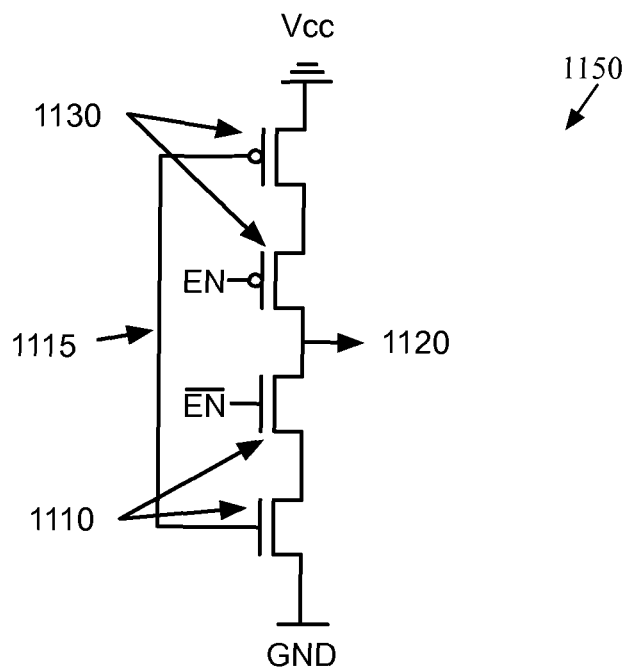

FIG. 11B illustrates a circuit level representation for a different tri-state inverter 1150. Unlike the tri-state inverter 1105, the second tri-state inverter 1150 is activated by a low enable signal. By swapping the enable signal and the complement to the enable signal, the tri-state inverter 1150 has the opposite functionality to that of the tri-state inverter 1105. Therefore, the tri-state inverter 1150 acts as an open switch when the enable is high and acts as an inverter when the enable is low.

III. Transparent Storage Elements

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes configurable storage elements.

Having the storage elements within the routing fabric is highly advantageous. For instance, such storage elements obviate the need to route data computed by a source component to a second component that stores the computed data before routing the data to a destination component that will use the data. Instead, such computed data can be stored optimally within storage elements located along the existing routing paths between source and destination components, which can be logic and/or interconnect circuits within the IC.

Such storage functionality within the routing fabric is ideal when in some embodiments the destination component is unable to receive or process the signal from the source component during a certain time period. This functionality is also useful in some embodiments when a signal from a source component has insufficient time to traverse the defined route to reach the destination within a single clock cycle or sub-cycle and needs to be temporarily stored along the route before reaching the destination in a later clock cycle (e.g., user-design clock cycle) or in a later sub-cycle in case of a sub-cycle reconfigurable IC. By providing storage within the routing fabric, the source and destination components continue to perform operations (e.g., computational or routing) during the required storage time period.

Figure 12:
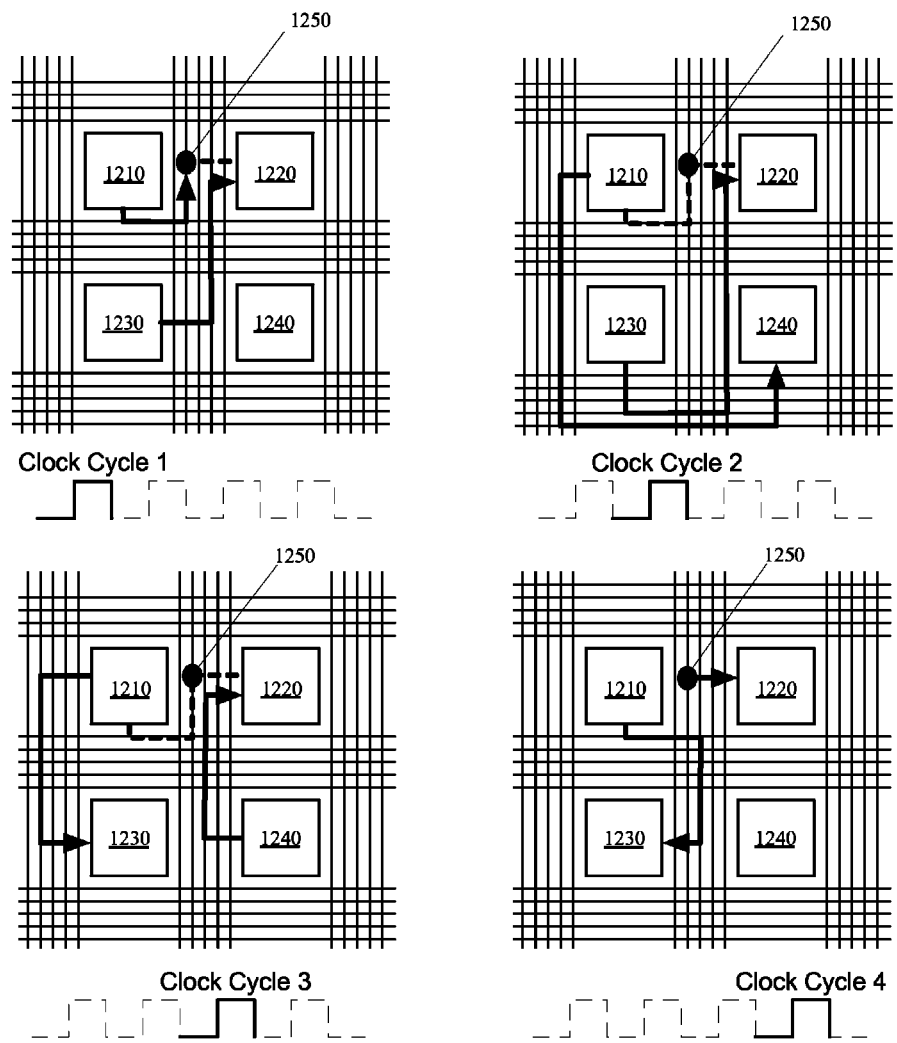
FIG. 12 illustrates the operations of storage elements within the routing fabric of a configurable IC of some embodiments.

FIG. 12 illustrates the operations of storage elements within the routing fabric of a configurable IC. In FIG. 12, a component 1210 is outputting a signal for processing by component 1220 at clock cycle 1. However, component 1220 is receiving a signal from component 1230 at clock cycles 1 and 2 and a signal from component 1240 at clock cycle 3. Therefore, the signal from 1210 may not be routed to 1220 until clock cycle 4. Hence, the signal is stored within the storage element 1250 located within the routing fabric. By storing the signal from 1210 within the routing fabric during clock cycles 1 through 3, components 1210 and 1220 remain free to perform other operations during this time period. At clock cycle 4, 1220 is ready to receive the stored signal and therefore the storage element 1250 releases the value. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

Figure 13:
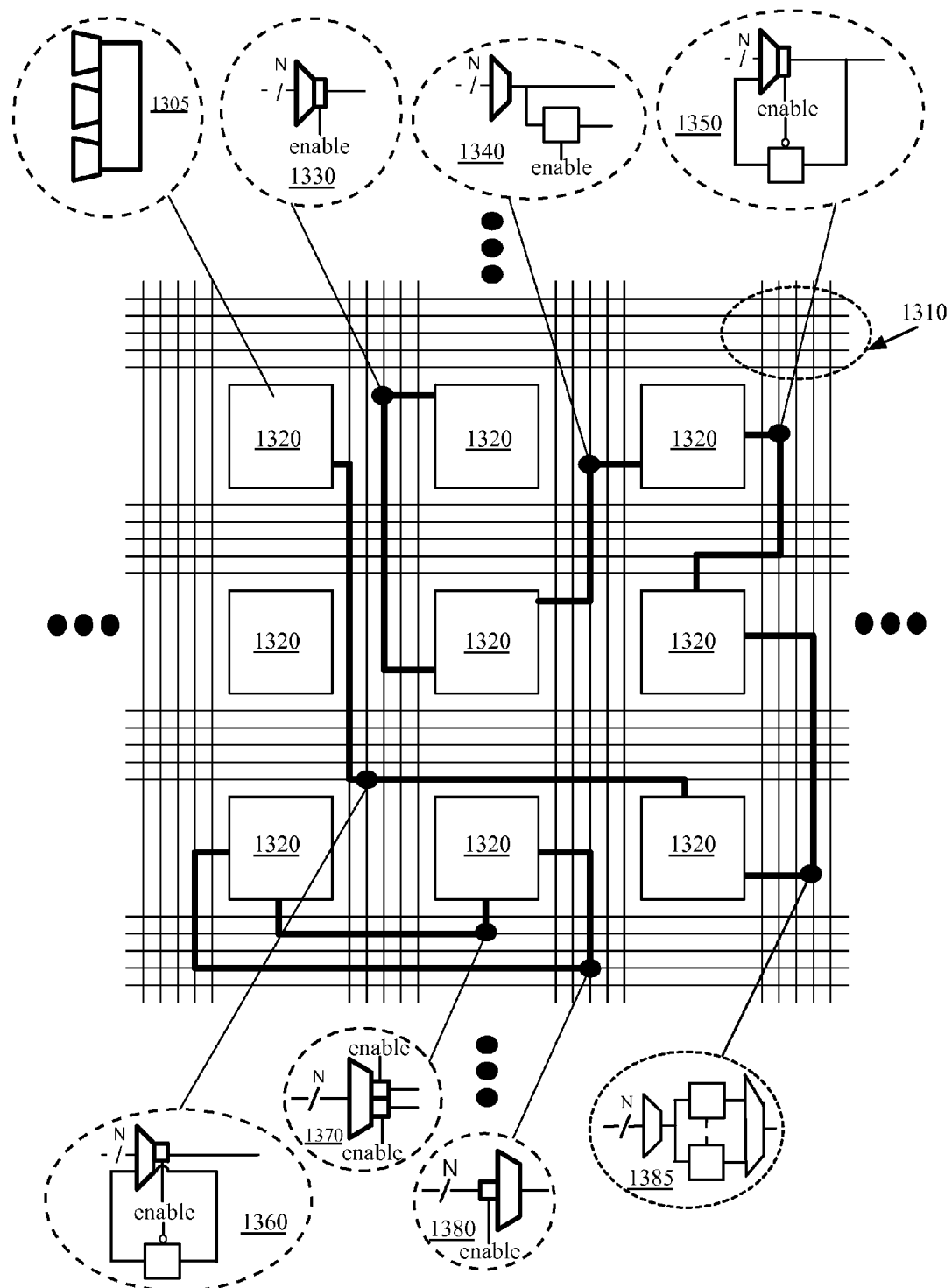
FIG. 13 illustrates placement of storage elements within the routing fabric of a configurable IC of some embodiments.

FIG. 13 illustrates several examples of different types of controllable storage elements 1330-1380 that can be located throughout the routing fabric 1310 of a configurable IC. Each of storage elements 1330-1380 can be controllably enabled to store an output signal from a source component that is to be routed through the routing fabric to some destination component. In some embodiments, some or all of these storage elements are configurable storage elements whose storage operation is controlled by a set of configuration data stored in configuration data storage of the IC. U.S. Pat. No. 7,342,415 describes a two-tiered multiplexer structure for retrieving enable signals on a sub-cycle basis from configuration data storage for a particular configurable storage. It also describes building the first tier of such multiplexers within the output circuitry of the configuration storage that stores a set of configuration data. Such multiplexer circuitry can be used in conjunction with the configurable storage elements described above and below. U.S. Pat. No. 7,342,415 is incorporated herein by reference.

As illustrated in FIG. 13, outputs are generated from the circuit elements 1320. The circuit elements 1320 are configurable logic circuits (e.g., 3-input LUTs and their associated IMUXs as shown in expansion 1305), while they are other types of circuits in other embodiments. In some embodiments, the outputs from the circuit elements 1320 are routed through the routing fabric 1310 where the outputs can be controllably stored within the storage elements 1330-1380 of the routing fabric. Storage element 1330 is a storage element that is coupled to the output of a routing multiplexer. This storage element will be further described below by reference to FIGS. 14 and 15. Storage element 1340 includes a routing circuit with a parallel distributed output path in which one of the parallel distributed paths includes a storage element. This storage element will be further described below by reference to FIG. 20. Storage elements 1350 and 1360 include a routing circuit with a set of storage elements in which a second storage element is connected in series or in parallel to the output path of the routing circuit. Storage elements 1350 and 1360 are further described in International publication No. WO 2010/033263, which is incorporated herein by reference. Storage element 1370 has multiple storage elements coupled to the output of a routing multiplexer. Storage element 1370 will be further described below by reference to FIGS. 16 and 17. Storage element 1380 is a storage element that is coupled to the input of a routing multiplexer. Storage element 1380 will be further described below by reference to FIGS. 18-19.

One of ordinary skill in the art will realize that the depicted storage elements within the routing fabric sections of FIG. 13 only present some embodiments of the invention and do not include all possible variations. Some embodiments use all these types of storage elements, while other embodiments do not use all these types of storage elements (e.g., some embodiments use only one or two of these types of storage elements). Some embodiments may place the storage elements at locations other than the routing fabric (e.g., between or adjacent to the configurable logic circuits within the configurable tiles of the IC).

A. Storage Elements at Output of a Routing Circuit

Figure 14:
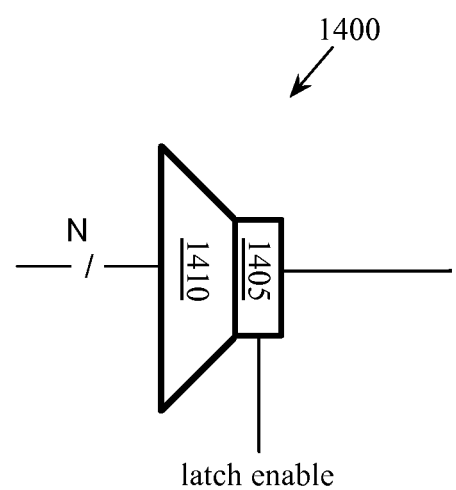
FIG. 14 illustrates routing circuit with a storage element at its output stage for some embodiments.

FIG. 14 illustrates routing circuit 1400 with a storage element 1405 at its output stage for some embodiments. The storage element 1405 is a latch that is built in or placed at the output stage of a multiplexer 1410. The latch 1405 receives a latch enable signal. When the latch enable signal is inactive, the circuit 1400 simply acts as a routing circuit. On the other hand, when the latch enable signal is active, the routing circuit 1400 acts as a latch that outputs the value that the circuit was previously outputting while serving as a routing circuit. Accordingly, when another circuit in a second later configuration cycle needs to receive the value of circuit 1400 in a first earlier configuration cycle, the circuit 1400 can be used. The circuit 1400 may receive and latch the value in a cycle before the second later configuration cycle (e.g., in the first earlier cycle) and output the value to the second circuit in the second later sub-cycle.

Figure 15:
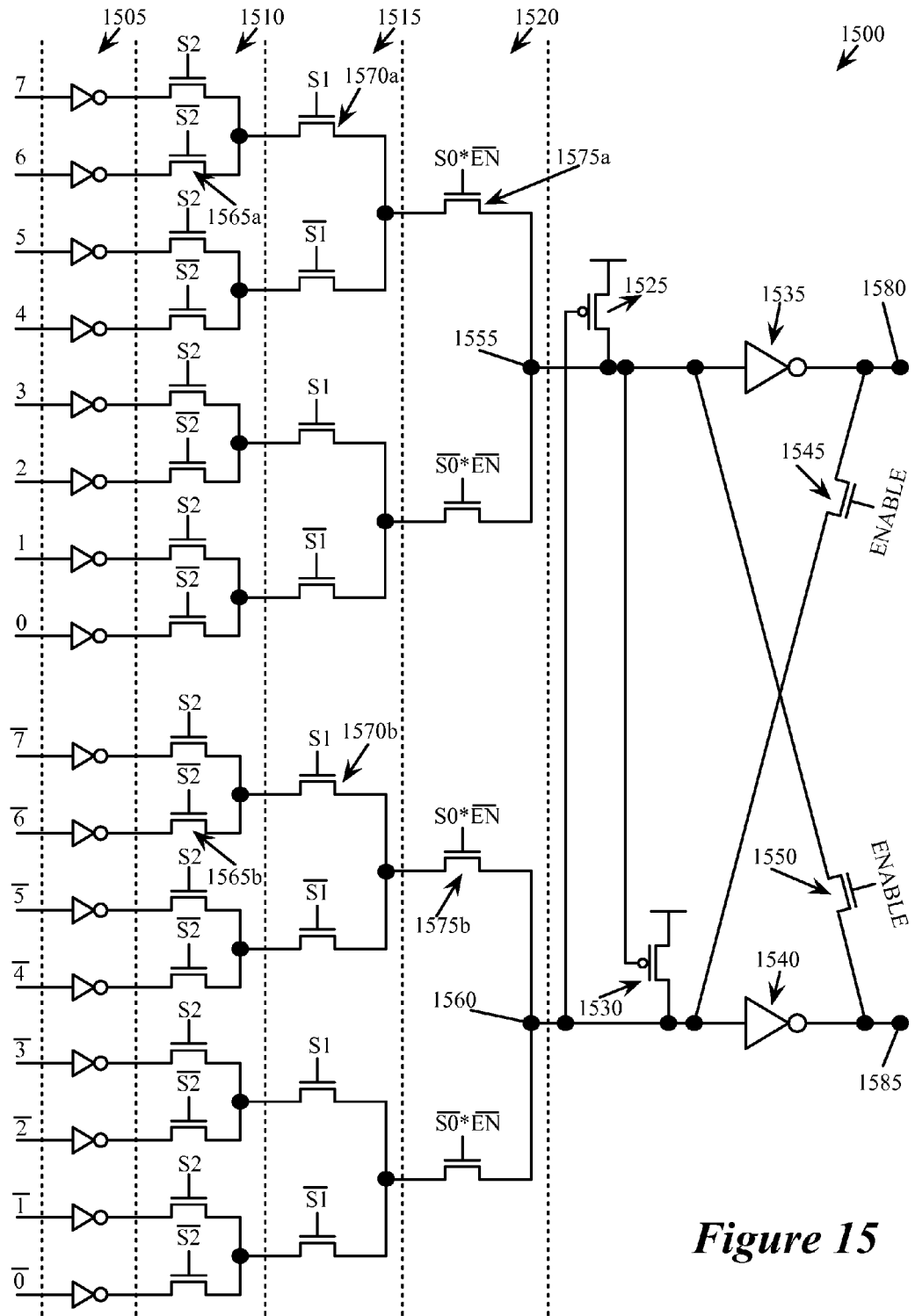
FIG. 15 illustrates a circuit level implementation of a routing circuit with a storage element at its output stage.

FIG. 15 illustrates a circuit level implementation 1500 of the routing circuit 1400. The storage element 1405 includes a latch that is built into the output stage of the multiplexer 1410 by using a pair of cross-coupling transistors. As shown in this figure, the circuit 1500 includes (1) one set of input buffers 1505, (2) three sets 1510, 1515, and 1520 of NMOS pass gate transistors, (3) two pull-up PMOS transistors 1525 and 1530, (4) two inverting output buffers 1535 and 1540, and (5) two cross-coupling transistors 1545 and 1550.

The circuit 1500 is an eight-to-one multiplexer that can also serve as a latch. The inclusions of the two transistors 1545 and 1550 that cross couple the two output buffers 1535 and 1540 and the inclusion of the enable signal with a signal that drives the last set 1520 of the pass transistors of the eight-to-one multiplexer allow the eight-to-one multiplexer 1500 to act as a storage element whenever the enable signal is active (which, in this case, means whenever the enable signal is high).

In a complementary pass-transistor logic ("CPL") implementation of a circuit, a complementary pair of signals represents each logic signal, where an empty circle at or a bar over the input or output of a circuit denotes the complementary input or output of the circuit in the figures. In other words, the circuit receives true and complement sets of input signals and provides true and complement sets of output signals. Accordingly, in the multiplexer 1500 of FIG. 15, one subset of the input buffers 1505 receives eight input bits (0-7), while another subset of the input buffers 1505 receives the complement of the eight inputs bits. These input buffers serve to buffer the first set 1510 of pass transistors.

The first set 1510 of pass transistors receive the third select bit S2 or the complement of this bit, while the second set 1515 of pass transistors receive the second select bit S1 or the complement of this bit. The third set 1520 of pass transistors receive the first select bit or its complement after this bit has been "AND'ed" by the complement of the enable signal. When the enable bit is not active (i.e., in this case, when the enable bit is low), the three select bits S2, S1, and S0 cause the pass transistors to operate to pass one of the input bits and the complement of this input bit to two intermediate output nodes 1555 and 1560 of the circuit 1500. For instance, when the enable signal is low, and the select bits are 011, the pass transistors 1565*a*, 1570*a*, 1575*a*, and 1565*b*, 1570*b*, and 1575*b* turn on to pass the 6 and $\bar{6}$ input signals to the intermediate output nodes 1555 and 1560.

In some embodiments, the select signals S2, S1, and S0 as well as the enable signal are a set of configuration data stored in configuration data storage of the IC. In some embodiments, the configuration data storage stores multiple configuration data sets. The multiple configuration data sets define the operation of the storage elements during differing clock cycles, where the clock cycles of some embodiments include user design clock cycles or sub-cycles of a user design clock cycle of a reconfigurable IC. Circuitry for retrieving a set of configuration data bits from configuration data storage is disclosed in U.S. Pat. No. 7,342,415.

The pull-up PMOS transistors 1525 and 1530 are used to pull-up quickly the intermediate output nodes 1555 and 1560, and to regenerate the voltage levels at the nodes that have been degenerated by the NMOS threshold drops, when these nodes need to be at a high voltage. In other words, these pull-up transistors are used because the NMOS pass transistors are slower than PMOS transistors in pulling a node to a high voltage. Thus, for instance, when the 6th input signal is high, the enable signal is low, and the select bits are 011, the pass transistors 1565-1575 start to pull node 1555 high and to push node 1560 low. The low voltage on node 1560, in turn, turns on the pull-up transistor 1525, which, in turn, accelerates the pull-up of node 1555.

The output buffer inverters 1535 and 1540 are used to isolate the circuit 1500 from its load. Alternatively, these buffers may be formed by more than one inverter, but the feedback is taken from an inverting node. The outputs of these buffers are the final output 1580 and 1585 of the multiplexer/latch circuit 1500. It should be noted that, in an alternative implementation, the output buffers 1535 and 1540 are followed by multiple inverters.

The output of each buffer 1535 or 1540 is cross-coupling to the input of the other buffer through a cross-coupling NMOS transistor 1545 or 1550. These NMOS transistors are driven by the enable signal. Whenever the enable signal is low, the cross-coupling transistors are off, and hence the output of each buffer 1535 or 1540 is not cross-coupling with the input of the other buffer. Alternatively, when the enable signal is high, the cross-coupling transistors are ON, which cause them to cross-couple the output of each buffer 1535 or 1540 to the input of the other buffer. This cross-coupling causes the output buffers 1535 and 1540 to hold the value at the output nodes 1580 and 1585 at their values right before the enable signal went active. Also, when the enable signal goes active, the signal that drives the third set 1520 of pass transistors (i.e., the "AND'ing" of the complement of the enable signal and the first select bit S0) goes low, which, in turn, turns off the third pass-transistor set 1520 and thereby turns off the multiplexing operation of the multiplexer/latch circuit 1500.

In some embodiments (e.g., some embodiments that are not runtime reconfigurable), the latch enable signal of FIG. 14 or 15 (referred to as Latch Enable in FIG. 14 and ENABLE in FIG. 15) is one configuration data bit for all clock cycles. In other embodiments (e.g., some embodiments that are runtime reconfigurable), this enable signal corresponds to multiple configuration data sets, with each set defining the operation of the storage elements 1405 and 1590 during differing clock cycles. These differing clock cycles might be different user design clock cycles, or different sub-cycles of a user design clock cycle or some other clock cycle.

In FIGS. 14 and 15, the operations of the multiplexers 1410 and 1505-1520 are controlled by configuration data retrieved from configuration data storage. In some embodiments (e.g., some embodiments that are not runtime reconfigurable), the configuration data for each multiplexer is one configuration data set for all clock cycles. In other embodiments (e.g., some embodiments that are runtime reconfigurable), this configuration data corresponds to multiple configuration data sets, with each set defining the operation of the multiplexer during differing clock cycles, which might be different user design clock cycles, or different sub-cycles of a user design clock cycle or some other clock cycle. U.S. Pat. No. 7,342,415 discloses circuitry for retrieving configuration data sets from configuration data storage in order to control the operation of interconnects and storage elements.

Figure 16:
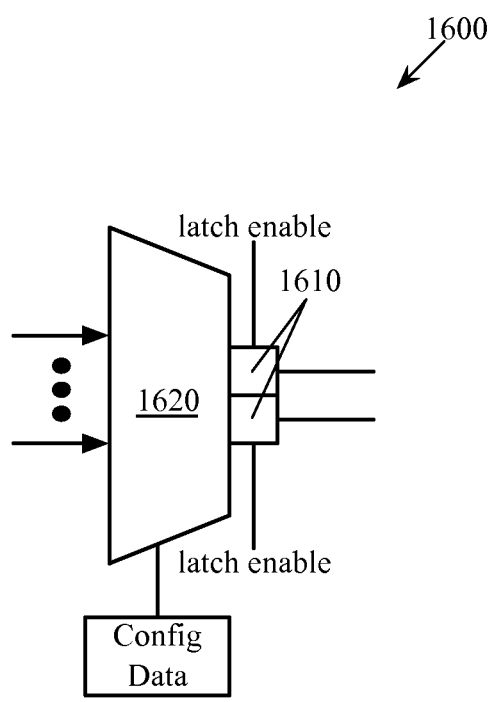
FIG. 16 illustrates a routing circuit with two storage elements at its output stage for some embodiments.

FIG. 16 illustrates a routing circuit 1600 with two storage elements at its output stage for some embodiments. The routing circuit 1600 has multiple latches 1610 that are built in or placed at or near the output stage of a multiplexer 1620. The latches 1610 each receive a latch enable signal. When the latch enable signals are inactive, the circuit simply acts as a routing circuit, passing the input signal through both latches. When one latch enable signal is inactive and one latch enable signal is active, the circuit acts as both a routing circuit and a latch that outputs the value that the circuit was previously outputting while serving as a routing circuit. When both latch enable signals are active, the circuit acts as a pair of latches where each outputs the value that the circuit was previously outputting while the latch was serving as a routing circuit. Since each latch enable signal may be activated independently and asynchronously, the storage element 1370 may store a different value in each latch, or store the same value in each latch. In some embodiments, the multiple latch of the routing circuit 1600 provides simultaneous routing and storage capability. The multiple latches or the routing circuit 1600 also allow storing of multiple values in some embodiments.

Accordingly, when other circuits in later configuration cycles need to receive the value (or values) of circuit 1600 in an earlier configuration cycle (or cycles), the circuit 1600 can be used. Alternatively, if no other circuits need to receive the value (or values) of circuit 1600 in an earlier configuration cycle (or cycles), the circuit 1600 can be used to hold the value (or values) at its outputs to prevent bit flicker on the wires or circuits that are connected to the output of the circuit 1600, thus conserving power. The circuit 1600 may receive and latch multiple values in multiple cycles before the later configuration cycle and output multiple values to circuits in the later sub-cycles. One of ordinary skill will recognize that the routing circuit 1600 is not limited to two latches in its output stage. In fact, any number of latches may be placed at the output depending on the needs and constraints of the configurable IC.

In some embodiments, the controls for the multiplexer 1620 and the latches 1610 are derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 1610 and 1620 during different clock cycles. These different clock cycles might be different user design clock cycles, or different sub-cycles of a user design clock cycle or some other clock cycle. In other words, the circuits 1610 and 1620 can be reconfigured to perform a different operation in every clock cycle of a set (e.g., 3 or more) of consecutive clock cycles.

Figure 17:
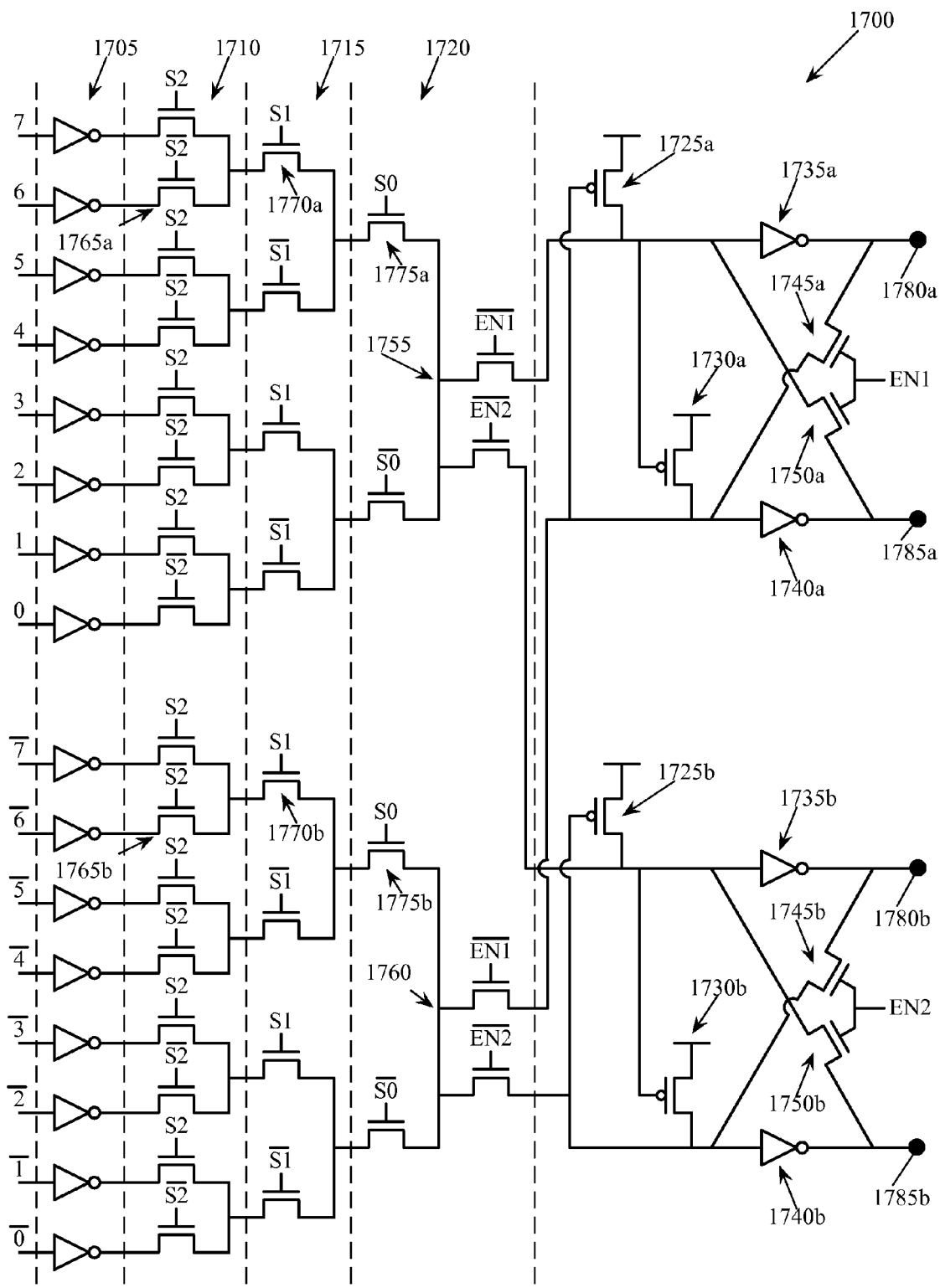
FIG. 17 illustrates a circuit level implementation of a routing circuit with two storage elements at its output stage.

FIG. 17 illustrates a circuit level implementation 1700 of the routing circuit 1600, where the latches are built into the output stage of the multiplexer 1620 by using pairs of cross-coupling transistors. As shown in this figure, the circuit 1700 includes (1) one set of input buffers 1705, (2) three sets 1710, 1715, and 1720 of NMOS pass gate transistors, (3) four pull-up PMOS transistors 1725 and 1730, (4) four inverting output buffers 1735 and 1740, and (5) four cross-coupling transistors 1745 and 1750.

The circuit 1700 is an eight-to-one multiplexer that can also serve as multiple latches. The inclusions of the four transistors 1745 and 1750 that cross couple the four output buffers 1735 and 1740 and the inclusion of the enable signals with a signal that drives the last set 1720 of the pass transistors of the eight-to-one multiplexer allow the eight-to-one multiplexer 1700 to act as multiple storage elements whenever the enable signals are active (which, in this case, means whenever the enable signals are high). The operation of the multiplexer and latches was described in relation to FIG. 15 above.

In FIG. 17, the transistors 1745 and 1750 are cross-coupled at the output stage of the routing circuit. Alternatively, as further described in International publication No. WO 2010/033263, which is incorporated herein by reference, some embodiments place the cross-coupled transistors 1745 and 1750 in the routing fabric to establish a configurable storage element within the routing fabric outside of the routing multiplexer (such as multiplexer 1500).

In some embodiments (e.g., some embodiments that are not runtime reconfigurable), the latch enable signal of FIG. 16 or 17 (referred to as Config Data in FIG. 16 and ENABLE in FIG. 17) is one configuration data bit for all clock cycles. In other embodiments (e.g., some embodiments that are runtime reconfigurable), this enable signal corresponds to multiple configuration data sets, with each set defining the operation of the storage elements during differing clock cycles. These differing clock cycles might be different user design clock cycles, or different sub-cycles of a user design clock cycle or some other clock cycle.

B. Storage Elements at Input of Routing Circuit

Figure 18:
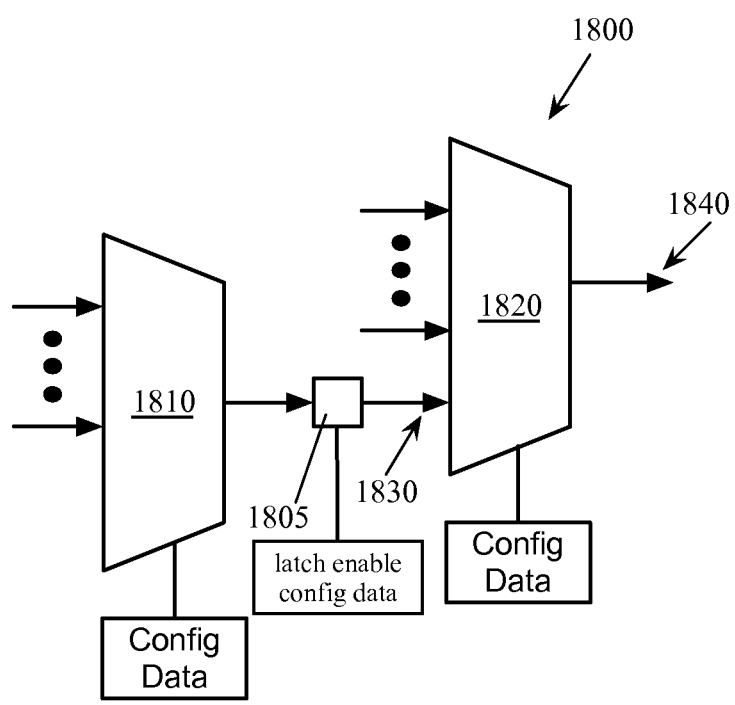
FIG. 18 illustrates a storage element at input of a routing circuit.

FIG. 18 illustrates a storage element 1805 at the input of a routing circuit 1800. In some embodiments, the storage element 1805 is a latch that is built in or placed at the input stage of a multiplexer 1820. In other embodiments, the latch 1805 is physically placed at the output of another circuit 1810 (either at the output stage of circuit 1810 or within the routing fabric outside of the routing multiplexer), or within the routing fabric of the IC, and is directly connected to the input of the multiplexer 1820. The latch 1805 receives a latch enable signal. When the latch enable signal is inactive, the circuit simply acts as a routing circuit. On the other hand, when the latch enable signal is active, the circuit acts as a latch that holds the value that an upstream circuit 1810 was previously outputting while the storage element 1805 was serving as a routing circuit. Accordingly, when the multiplexer 1820 is not being used to route a changing input, or to select among inputs, the circuit 1800 can be used. By using the circuit 1800 when the multiplexer 1820 is not being used for routing, the storage element 1805 eliminates bit flicker along the wire leading to the input of multiplexer 1820. Additionally, in some embodiments, to conserve power, the routing multiplexer may select the input 1830 where the latch 1805 has been placed, when the latch is enabled, which will eliminate bit flicker at the output 1840 of the multiplexer 1820, and consequently, wiring and/or any circuits connected to the output 1840 of the multiplexer 1820.

In some embodiments, the controls for the upstream circuit 1810, the storage element 1805, and the multiplexer 1820 are derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 1810, 1805, and 1820 during different clock cycles. These different clock cycles might be different user design clock cycles, or different sub-cycles of a user design clock cycle or some other clock cycle. In other words, the circuits 1810, 1805, and 1820 can be reconfigured to perform a different operation in every clock cycle of a set (e.g., 3 or more) of consecutive clock cycles.

Figure 19:
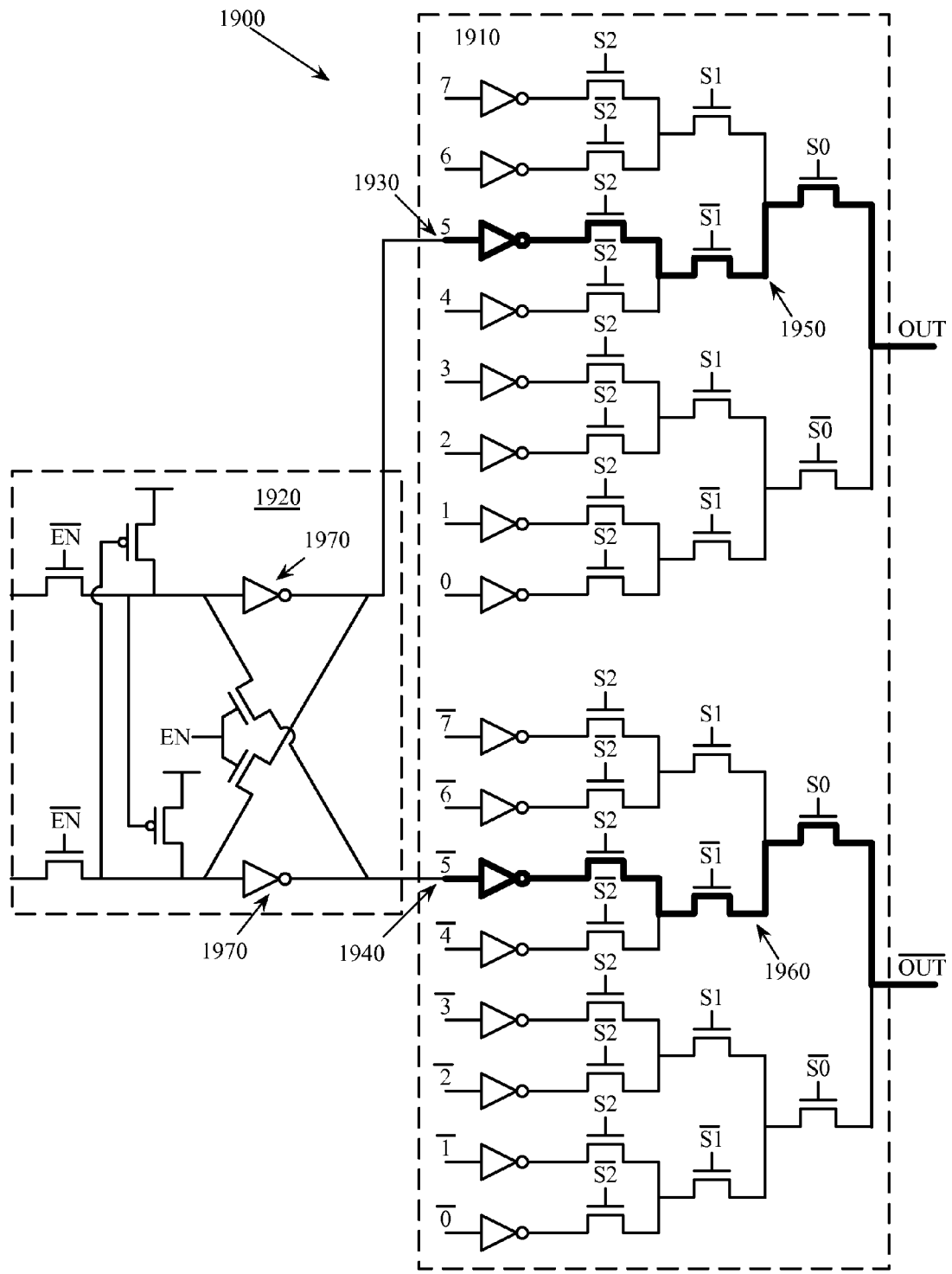
FIG. 19 illustrates a circuit level implementation of a routing circuit having a storage element at its input stage.

FIG. 19 illustrates a circuit level implementation of a routing circuit 1900 having a storage element at its input stage. The routing circuit 1900 has a latch 1920 that is placed at the input of a multiplexer 1910. In this example, the latch 1920 is placed at input 5 1930 of the multiplexer 1910. Alternatively, the latch could be routed to input 5 (or any other input) through the routing fabric or another signal path (e.g., an interconnect circuit, pass transistor, buffer, or wire). Likewise, the complementary output of the latch 1920 is placed at (or routed to) complementary input 5 1940 of the multiplexer 1910. In this example, the selection of input 5 1930 and complementary input 5 1940, the values stored in latch 1920 are carried along paths 1950 and 1960 to the outputs of multiplexer 1910. By holding a value in latch 1920 and selecting the corresponding inputs 1930 and 1940, bit flicker at the outputs of the multiplexer 1910 is eliminated (and at any circuits or wires connected to those outputs).

C. Storage Element in a Parallel Distributed Path

In some embodiments, the routing fabric includes parallel distributed paths (PDP). A PDP receives includes two paths that both directly connect to a same output of a source circuit and arrive at a same destination circuit. At least one of the two paths in a PDP includes a configurable storage element. The destination circuit can switchably receive from either one of the two paths in the PDP in any given clock cycle.

Figure 20:
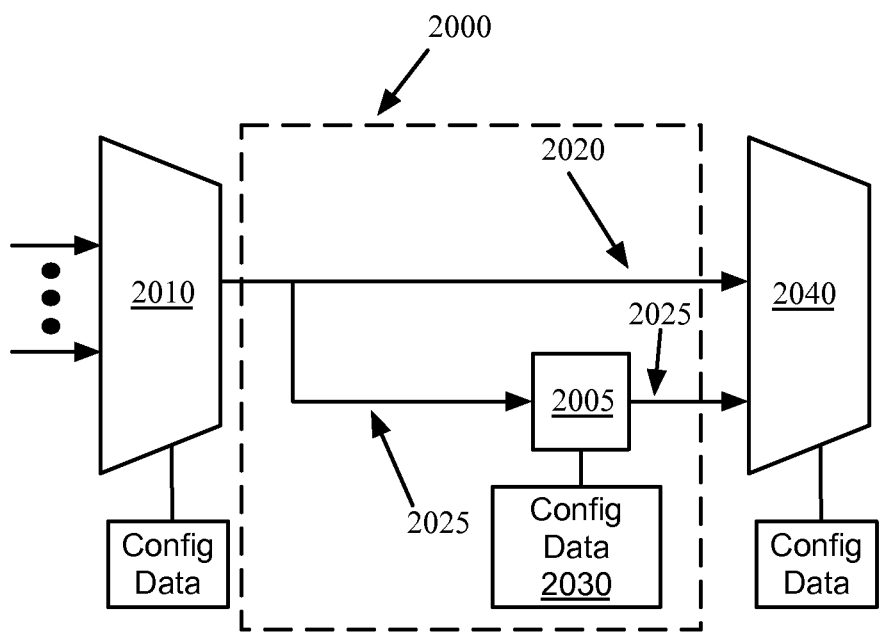
FIG. 20 illustrates a routing fabric section that includes a parallel distributed path.

FIG. 20 illustrates a routing fabric section 2000 that includes a parallel distributed path (PDP). The routing fabric section 2000 performs routing and storage operations by distributing an output signal of a routing circuit 2010 through a parallel distributed path to a first input of a destination 2040, which in some embodiments might be (1) an input-select circuit for a logic circuit, (2) a routing circuit, or (3) some other type of circuit. The PDP includes a first path and a second path. In some embodiments, the first path 2020 of the PDP directly connects the output of the routing circuit 2010 to the destination 2040 (i.e., the first path 2020 is a direct connection that routes the output of the routing circuit directly to the destination 2040).

In some embodiments, the second parallel path 2025 runs in parallel with the first path 2020 and passes the output of the routing circuit 2010 through a controllable storage element 2005, where the output may be optionally stored (e.g., when the storage element 2005 is enabled) before reaching a second input of the destination 2040. In some embodiments, the connection between the circuit 2010 and storage element 2005 and the connection between the storage element 2005 and the circuit 2040 are direct connections. The storage operation of the controllable storage element is enabled by a configuration data set 2030.

Because of the second parallel path, the routing circuit 2010 of FIG. 20 is used for only one clock cycle to pass the output into the controllable storage element 2005. Therefore, storage can be provided for during the same clock cycle in which the routing operation occurs. Moreover, the PDP allows the output stage of the routing circuit 2010 to remain free to perform routing operations (or a second storage operation) in subsequent clock cycles while storage occurs.

Some embodiments require the second parallel path of a PDP to reach (i.e., connect) to every destination that the first parallel path of the PDP reaches (i.e., connects). Some of these embodiments allow, however, the second parallel path to reach (i.e., to connect) destinations that are not reached (i.e., that are not connected to) by the first parallel path.

The controllable storage elements 2005 of FIG. 20 controllably store the value output from the routing circuit 2010. When the storage element 2005 is enabled (e.g., receives a high enable signal) by the set of configuration data 2030, the storage elements 2005 store the output of the routing circuit 2010. Storage may occur for multiple subsequent clock cycles as determined by the set of configuration data 2030. During storage, alternate output paths of the routing circuit 2010 remain unrestricted, therefore permitting the routing fabric section 2000 to simultaneously perform routing and storage operations. For instance, at a first clock cycle, the configuration data sets of the circuits 2005 and 2010 cause the routing circuit 2010 to output one of its inputs and cause the storage element 2005 to store this output of the routing circuit 2010. At a second clock cycle, the set of configuration data 2030 can cause the routing circuit 2010 to output another value from the same or different input than the input used in the first clock cycle, while the storage element 2005 continues storing the previous output. The output of the routing circuit 2010 generated during the second clock cycle is then routed to the destination 2040 via the first output path 2020 (which may also include a storage element 2005 in some embodiments).

Some embodiments use a CMOS implementation to implement the storage element 2005 of FIG. 20. In the CMOS implementation, the storage element 2005 includes a pair of CMOS inverters and a pair of tri-state inverters that are controlled by an enable signal and its complement. The CMOS implementation of the storage element 2005 is further described in International publication No. WO 2010/033263, which is incorporated herein by reference.

In some embodiments, the configuration data set 2030 for the storage element 2005 come at least partly from configuration data storage of the IC. In addition, the controls for the circuits 2010 and 2040 are derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 2005, 2010, and 2040 during different clock cycles. These different clock cycles might be different user design clock cycles, or different sub-cycles of a user design clock cycle or some other clock cycle. In other words, the circuits 2005, 2010, and 2040 can be reconfigured to perform a different operation in every clock cycle of a set (e.g., 3 or more) of consecutive clock cycles.

As shown in FIG. 20, the routing operations of the routing circuit 2010 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 2010 during different clock cycles. The different clock cycles might be different user design clock cycles, or different sub-cycles of a user design clock cycle or some other clock cycle. U.S. Pat. No. 7,342,415 discloses circuitry for retrieving configuration data sets from configuration data storage in order to control the operation of interconnects and storage elements.

While the above discussion has illustrated some embodiments of storage elements applicable to a configurable IC, it should be apparent to one of ordinary skill in the art that some embodiments of the storage elements and routing circuits are similarly applicable to a reconfigurable IC. Therein, some embodiments of the invention implement the components within FIG. 20 with multiple sets of configuration data to operate on a sub-cycle reconfigurable basis. For example, the storage elements for the sets of configuration data in these figures (e.g., a set of memory cells, such as SRAM cells) can be modified to implement switching circuits in some embodiments. The switching circuits receive a larger set of configuration data that are stored internally within the storage elements of the switching circuits. The switching circuits are controlled by a set of reconfiguration signals. Whenever the reconfiguration signals change, the switching circuits supply a different set of configuration data to the routing circuits, such as the multiplexers and the selectively enabled storage elements within the routing fabric sections.

The sets of configuration data then determine the connection scheme that the routing circuits 2010 of some embodiments use. Furthermore, the sets of configuration data determine the set of storage elements for storing the output value of the routing circuits. This modified set of switching circuits therefore adapts the routing fabric sections of FIG. 20 for performing simultaneous routing and storage operations within a sub-cycle reconfigurable IC.

While numerous storage element circuits have been described with reference to numerous specific details, one of ordinary skill in the art will recognize that such circuits can be embodied in other specific forms without departing from the spirit of the invention. For instance, several embodiments were described above by reference to particular number of circuits, storage elements, inputs, outputs, bits, and bit lines. One of ordinary skill will realize that these elements are different in different embodiments. For example, routing circuits and multiplexers have been described with n logical inputs and only one logical output, where n is greater than one. However, it should be apparent to one of ordinary skill in the art that the routing circuits, multiplexers, IMUXs, and other such circuits may include n logical inputs and m logical outputs where m is greater than one. Some examples of storage element circuits are further described in International publication No. WO 2010/033263, which is incorporated herein by reference.

Moreover, though storage elements have been described with reference to routing circuits (RMUXs), it will be apparent to one of ordinary skill in the art that the storage elements might equally have been described with reference to input-select multiplexers such as the interconnect circuits (IMUXs)

described above. Similarly, the routing circuits illustrated in the figures, such as the 8-to-1 multiplexer of FIG. 15, may alternatively be described with reference to IMUXs.

The storage elements of some embodiments are state elements that can maintain a state for one or more clock cycles (user-design clock cycles or sub-cycles). Therefore, when storing a value, the storage elements of some embodiments output the stored value irrespective of the value at its input. Even though some embodiments described above showed storage functionality at the output stage of the RMUXs, one of ordinary skill in the art will recognize that such functionality can be placed within or at the input stage of the RMUXs or within or at the input stage of IMUXs. Similarly, the source and destination circuits described with reference to the various figures can be implemented using IMUXs. Thus, one of ordinary skill in the art would understand that the invention is not to be limited by the foregoing illustrative details. Several additional configurable storage elements are described in International publication No. WO 2010/033263, which is incorporated herein by reference.

D. Hybrid Storage Elements

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes hybrid storage elements that can configurably act either as non-transparent (i.e., clocked) storage elements or transparent configurable storage elements.

Transparent storage elements have the advantage that signals can pass through them at times other than sub-cycle boundaries. Long combinatorial paths with multiple transparent storage elements can be strung together and signals can pass through them within a slow sub-cycle period. In other words, spatial reach is longer for slower frequencies. Transparent storage element also enables time borrowing, meaning that a signal that is passing through a transparent storage element that is going to close in the next sub-cycle can continue to travel past the transparent storage element during the current sub-cycle. Transparent storage elements have the disadvantage that when used as synchronizers, closing and opening them takes two sub-cycles, limiting signal bandwidth. Signals can only pass through every other sub-cycle.

Non-transparent (clocked) storage elements, also called conduits, have the advantage that signals can pass through every sub-cycle. Therefore signal bandwidth is double that of a transparent storage element. Conduits have the disadvantage that they cannot be transparent. Therefore spatial reach does not increase for slower frequencies for a path that includes conduits. No matter how slow the frequency, the signal will stop at the conduit until the next sub-cycle starts. For this same reason, time borrowing does not work with conduits. However, conduits are considered cheaper than transparent storage elements because transparent storage elements need one dynamic configuration memory bit. Conduits and clocked storage elements will be further described in Section IV below.

Having hybrid storage elements that can be either non-transparent or transparent is highly advantageous. For instance, such storage elements allow data to be stored every clock cycle (or sub-cycle, configuration cycle, reconfiguration cycle, etc.). In addition, such storage elements can be transparent to enable time borrowing as well as traveling longer distances at slower clock rates. These hybrid storage elements may be placed within the routing fabric or elsewhere on the IC.

In much of the discussion above, configurable storage elements that are either transparent or non-transparent were introduced and described. In this section, we introduce and describe hybrid storage elements. A hybrid storage element is one where either a clock signal or a configuration signal directly drives the storage operation. So a hybrid storage circuit necessarily changes either at transitions in the clock or by the state of supplied configuration data. Thus the hybrid storage circuit can behave either in a more arbitrary manner like a configurable storage element or in a more strict manner like a clocked storage circuit.

In different embodiments, hybrid storage elements can be defined at different locations in the routing fabric. FIGS. 21-26 illustrate several examples, though one of ordinary skill in the art will realize that it is, of course, not possible to describe every conceivable combination of components or methodologies for different embodiments of the invention. One of ordinary skill in the art will recognize that many further combinations and permutations of the invention are possible.

Figure 21:
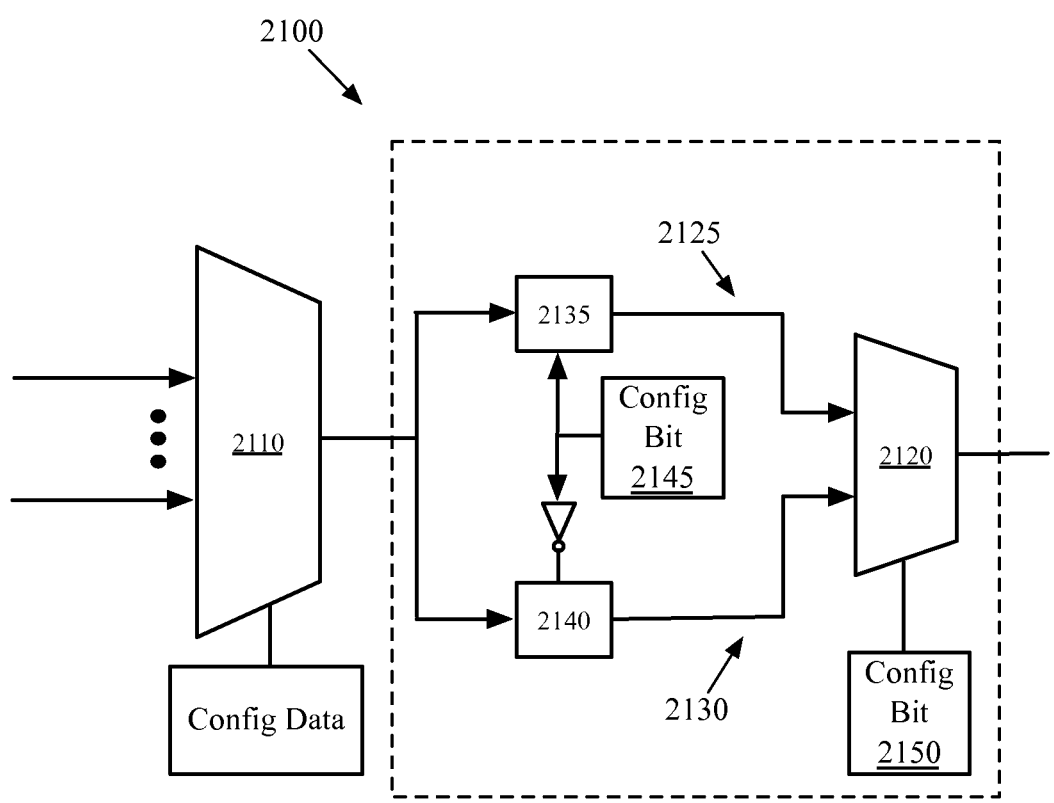
FIG. 21 illustrates a parallel distributed output path for configurably providing a pair of transparent storage elements.

For some embodiments, FIG. 21 illustrates a parallel distributed output path for configurably providing a pair of transparent storage elements. FIG. 21 illustrates a routing fabric section (or routing circuit) 2100 that performs routing and storage operations by distributing an output signal of a source circuit 2110 through a parallel path to inputs of a sub-cycle reconfigurable output multiplexer 2120. The output multiplexer 2120 in turn feeds one or more destination circuits (not illustrated) in the routing fabric (e.g., RMUX) and/or in the configurable tiles (e.g., LUTs).

The parallel path includes a first path 2125 and a second path 2130. The routing fabric section 2100 is called YMUX in some embodiments. In other words, the reconfigurable transparent storage elements 2135 and 2140, along with their parallel paths and the output multiplexer 2120 are referred to as a YMUX 2100 in some embodiments. In some embodiments, the source circuit 2110 is an RMUX. In some embodiments, RMUXs and YMUXs are paired to form routing resources, such as micro-level fabric as further described below by reference to FIG. 66.

In some embodiments, the first path 2125 passes the output of the source circuit 2110 through a configurable storage element 2135, where the output may be optionally stored (e.g., when the storage element 2135 is enabled) before reaching a first input of the output multiplexer 2120. In some embodiments, the connection between the source circuit 2110 and the storage element 2135 and the connection between the storage element 2135 and the output multiplexer 2120 are direct connections.

In some embodiments, the second path 2130 runs in parallel with the first path 2125 and passes the output of the source circuit 2110 through a configurable storage element 2140, where the output may be optionally stored (e.g., when the storage element 2140 is enabled) before reaching a second input of the output multiplexer 2120. In some embodiments, the connection between the source circuit 2110 and the storage element 2140 and the connection between the storage element 2140 and the output multiplexer 2120 are direct connections. In some embodiments, one or more of the connections between circuits 2110, 2135, 2140, and 2120 are configurable connections.

The same configuration bit 2145 controls both storage elements 2135 and 2140. The configuration bit 2145 controls storage element 2135 while the inverted version of the configuration bit 2145 controls storage element 2140. As a result, when one of the storage elements 2135 and 2140 is enabled (closed or storing a signal), the other one is disabled (open or passing a signal), and vice versa. A configuration bit 2150 selects either the first path 2125 or the second path 2130 as the output of output multiplexer 2120.

The routing fabric section 2100 can behave like a transparent storage element when the output multiplexer 2120 selects a path with an open storage element as input. This enables time borrowing by allowing signals to travel longer distance at slower clock rates. The routing fabric section 2100 can also behave like a conduit by selecting the input from a closed storage element and switching the configuration bits 2145 and 2150 simultaneously. It acts like a double edge triggered (DET) flip-flop.

The output multiplexer 2120 is illustrated as a 2:1 multiplexer requiring only one configuration bit. However, in some embodiments, the output multiplexer 2120 receives two or more configuration bits for selecting from among three or more paths.

In some embodiments, the configuration data 2145 and 2150 come at least partly from configuration data storage of the IC. In addition, the controls for the circuit 2110 are also derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 2110, 2120, 2135, and 2140 during different clock cycles. These different clock cycles might be different user design clock cycles, or different sub-cycles of a user design clock cycle or some other clock cycle. In other words, the circuits 2110, 2120, 2135, and 2140 can be reconfigured to perform a different operation in every clock cycle of a set (e.g., 3 or more) of consecutive clock cycles.

Figure 22:
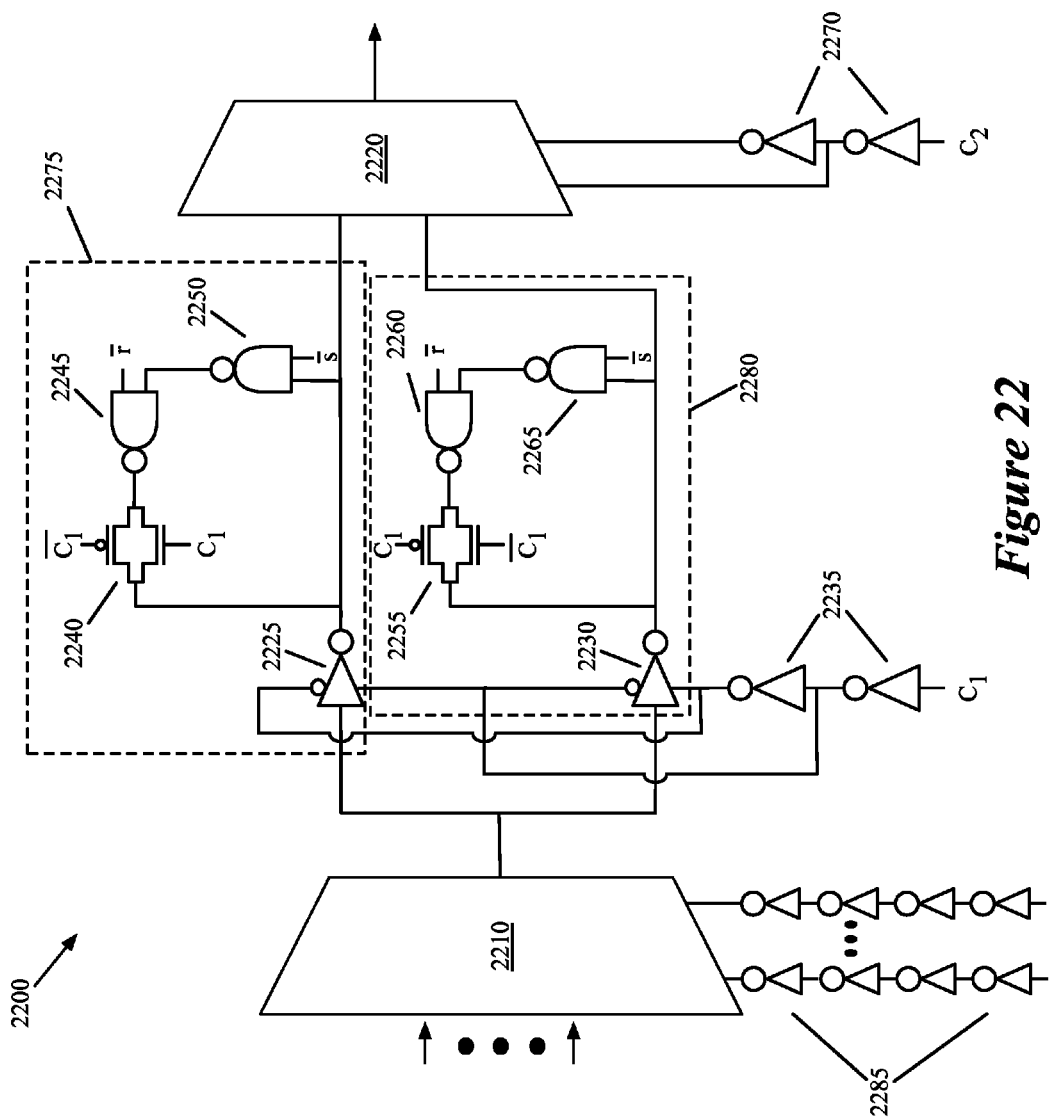
FIG. 22 illustrates an example implementation for the circuit of FIG. 21 of some embodiments.

FIG. 22 presents an example circuit implementation 2200 of the routing fabric section 2100 of FIG. 21. As shown in this figure, the circuit 2200 includes (1) a source circuit 2210, (2) an output multiplexer 2220, (3) tri-state inverters 2225 and 2230, (4) a first inverter pair 2235, (5) a first transmission gate 2240, (6) a first pair of NAND gates 2245 and 2250, (7) a second transmission gate 2255, (8) a second pair of NAND gates 2260 and 2265, (9) a second inverter pair 2270, and (10) a delay chain 2285. The source circuit 2210 can be a routing multiplexer (RMUX) or a LUT in some embodiments.

The sections 2275 and 2280 implement the configurable storage elements 2135 and 2140 on the two paths of circuit 2100 of FIG. 21. Specifically, the configurable storage element 2135 of FIG. 21 is implemented via the tri-state inverter 2225, the first transmission gate 2240, and the first pair of NAND gates 2245 and 2250. Similarly, the configurable storage element 2140 of FIG. 21 is implemented via the tri-state inverter 2230, the second transmission gate 2255, and the second pair of NAND gates 2260 and 2265.

In section 2275, the tri-state inverter 2225 drives the output of the source circuit 2210 to one of the inputs of NAND gate 2250, which in turn drives it to NAND gate 2245. The NAND gate 2250 has another input that is driven by an active-low set signal, while the NAND gate 2245 has another input that is driven by an active low reset signal. The NAND gate 2245 in turn drives the transmission gate 2240. The output of transmission gate 2240 shares the same wire as the output of tri-state inverter 2225 to form an input of the NAND gate 2250.

The first inverter pair 2235 supplies the original and the negative value of a configuration signal $C_1$ to the circuits in sections 2275 and 2280. The transmission gate 2240 is enabled by the configuration signal $C_1$. When the signal $C_1$ is high, the transmission gate 2240 conducts current. When the signal $C_1$ is low, the transmission gate 2240 is in high impedance state, effectively removing the output from the transmission gate 2240. The negative value of configuration signal $C_1$ controls tri-state inverter 2225. When the signal $C_1$ is low, the tri-state inverter 2225 is turned on. When the signal $C_1$ is high, the tri-state inverter 2225 is turned off.

Because the configuration signal $C_1$ enables the transmission gate 2240 while the inverted version of the configuration signal $C_1$ enables tri-state inverter 2225, the transmission gate 2240 and the tri-state inverter 2225 will not conduct current at the same time.

The section 2275 includes a storage element that is controlled by set and reset signals. When the set and reset signals are both high (i.e., de-asserted, since set and reset are both active low signals in this example), whatever value comes in as input of NAND gate 2250 will reach the input of transmission gate 2240. So for the configurable storage element in section 2275 to function normally (i.e., storing or passing signals from source to destination), the set and reset signals must remain high (i.e., inactive).

In section 2280, the tri-state inverter 2230 drives the output of the source circuit 2210 to one of the inputs of NAND gate 2265, which in turn drives it to NAND gate 2260. The NAND gate 2265 has another input that is driven by an active-low set signal, while the NAND gate 2260 has another input that is driven by an active-low reset signal. The NAND gate 2260 in turn drives the transmission gate 2255. The output of transmission gate 2255 shares the same wire as the output of tri-state inverter 2230 to form an input of the NAND gate 2265.

The transmission gate 2255 is enabled by the negative value of configuration signal $C_1$. When the signal $C_1$ is low, the transmission gate 2255 conducts current. When the signal $C_1$ is high, the transmission gate 2255 is in high impedance state, effectively removing the output from the transmission gate 2255. The original value of configuration signal $C_1$ controls tri-state inverter 2230. When the signal $C_1$ is high, the tri-state inverter 2230 is turned on. When the signal $C_1$ is low, the tri-state inverter 2230 is turned off.

Because the inverted version of the configuration signal $C_1$ enables the transmission gate 2255 while the configuration signal $C_1$ enables tri-state inverter 2230, the transmission gate 2255 and the tri-state inverter 2230 will not conduct current at the same time.

The section 2280 also includes a storage element that is controlled by set and reset signals. When the set and reset signals are both high (i.e., de-asserted, since set and reset are both active low signals in this example), whatever value comes in as input of NAND gate 2265 will reach the input of transmission gate 2255. So for the configurable storage element in section 2280 to function normally (i.e., storing or passing signals from source to destination), the set and reset signals must remain high.

When the configuration signal $C_1$ is changed to high, the tri-state inverter 2230 is enabled while the transmission gate 2255 is disabled. At the same time, the tri-state inverter 2225 is disabled while the transmission gate 2240 is enabled. As a result, the current output of the source circuit 2210 passes transparently through the circuit section 2280 and drives one input of the output multiplexer 2220, while the previous output (the one before $C_1$ turned high) of the source circuit 2210 is stored in the configurable storage element in section 2275 and drives another input of the output multiplexer 2220.

Similarly, when the configuration signal $C_1$ is changed to low, the tri-state inverter 2225 is enabled while the transmission gate 2240 is disabled. At the same time, the tri-state inverter 2230 is disabled while the transmission gate 2255 is enabled. As a result, the current output of the source circuit 2210 passes transparently through the circuit section 2275 and drives one input of the output multiplexer 2220, while the previous output (the one before $C_1$ turned low) of the source circuit 2210 is stored in the configurable storage element in section 2280 and drives another input of the output multiplexer 2220.

The output multiplexer 2220 is a 2:1 multiplexer. A configuration signal $C_2$ is supplied by the second inverter pair 2270 and controls the output of the output multiplexer 2220. The output of the output multiplexer 2220 is either the current output of the source circuit 2210 passed transparently through one of the configurable storage elements, or the previous output of the source circuit 2210 stored in another configurable storage element.

It will be evident to one of ordinary skill in the art that the various components and functionality of FIG. 22 may be implemented differently without diverging from the essence of the invention. For example, other implementations of a latch may replace the configurable storage elements described in sections 2275 and 2280.

In some ICs, the rising edge of the configuration signal $C_1$ is slower than its falling edge. For those ICs, closing the configurable storage element in section 2275 or 2280 on the rising edge of configuration signal $C_1$ will cause a hold time violation because the output of the source circuit 2210 would have already changed before the rising edge of $C_1$. Unfortunately, at any given time, one of the configurable storage elements in sections 2275 and 2280 will close on the rising edge of configuration signal $C_1$. In order to mitigate the potential hold time violation, a delay chain (e.g., one that includes one or more inverters) is inserted in some embodiments into the data path between the output of the source circuit 2210 and the inputs to tri-state inverters 2225 and 2230. In some embodiments, instead of inserting a delay chain into the data path following the output of the source circuit 2210, a delay chain 2285 is inserted into the configuration retrieval circuitry of the source circuit 2210.

Figure 23:
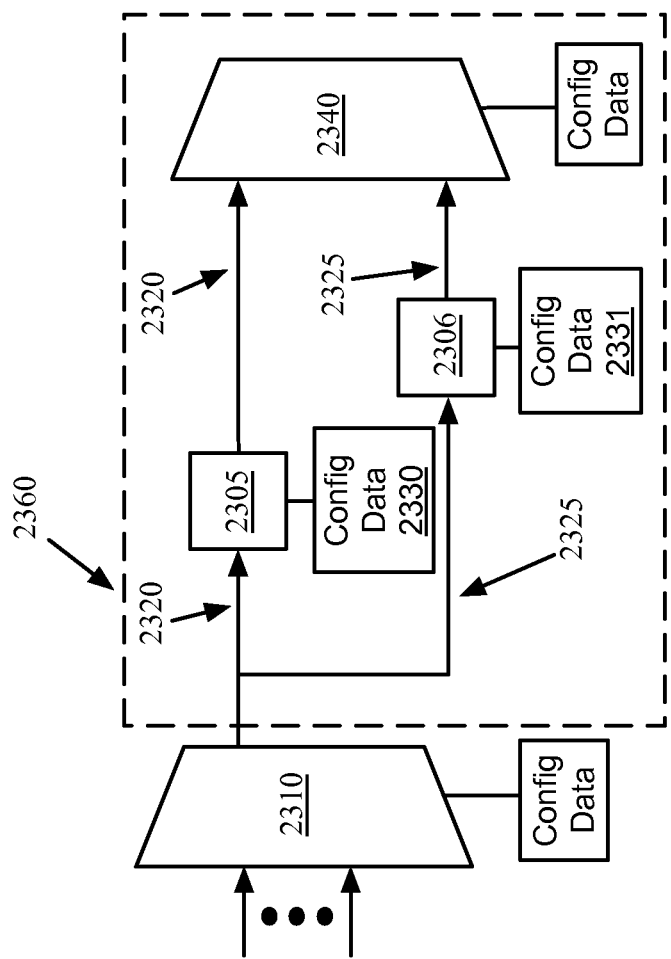
FIG. 23 illustrates a parallel distributed output path for configurably providing a pair of transparent storage elements that are control by different sets of configuration data.

FIG. 23 illustrates a parallel distributed output path for configurably providing a pair of transparent storage elements that are control by different set of configuration data. FIG. 23 illustrates a routing fabric section 2360 that performs routing and storage operations by distributing an output signal of a source circuit 2310 through a PDP to a first input of an output multiplexer 2340. The source circuit 2310 can be a routing multiplexer (RMUX) or a LUT in some embodiments. The output multiplexer 2340 in turn feeds one or more destination circuits (not illustrated) in the routing fabric (e.g., RMUX) and/or in the configurable tiles (e.g., LUTs).

The PDP includes a first path and a second path. The first path 2320 of the PDP passes the output of the source circuit 2310 through a reconfigurable transparent storage element 2305, where the output may be optionally stored (e.g., when the storage element 2305 is enabled) before reaching a first input of the destination 2340. The storage operation of the controllable storage element 2305 is controlled by a set of configuration data 2330. The second path 2325 of the PDP passes the output of the source circuit 2310 through a second reconfigurable transparent storage element 2306, where the output may be optionally stored (e.g., when the storage element 2306 is enabled) before reaching a second input of the destination 2340. The storage operation of the controllable storage element 2306 is controlled by a set of configuration data 2331. In some embodiments, the connection between the source circuit 2310 and storage elements 2305 and the connection between the storage elements 2305 and the circuit 2340 are direct connections.

The output multiplexer 2340 is illustrated as a 2:1 multiplexer requiring only one configuration bit. However, in some embodiments, the output multiplexer 2340 receives two or more configuration bits for selecting from among three or more paths.

The routing fabric section 2360 is also referred to as YMUX in some embodiments. In other words, the reconfigurable transparent storage elements 2305 and 2306, along with their parallel paths and the output multiplexer 2340 are referred to as a YMUX 2360 in some embodiments. In some embodiments, the source circuit 2310 is an RMUX. In some embodiments, RMUXs and YMUXs are paired to form routing resources, such as micro-level fabric as further described below by reference to FIG. 66.

As illustrated, the operations of the storage element 2305, 2306, the output multiplexer 2340, and the source circuit 2310 are controlled by configuration signals derived at least partly from configuration data storage of the IC such as 2330 and 2331. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 2305, 2306, 2340, and 2310 during different clock cycles. These different clock cycles might be different user design clock cycles, or different sub-cycles of a user design clock cycle or some other clock cycle. In other words, the circuits 2305, 2306, 2340, and 2310 can be reconfigured to perform a different operation in every clock cycle of a set (e.g., 3 or more) of consecutive clock cycles.

Unlike the routing fabric section 2100 of FIG. 21 in which the same configuration bit 2145 controls both storage elements 2135 and 2140 in the two parallel paths, the two storage elements 2305 and 2306 in the routing fabric section 2360 are independently controlled by different sets of configuration data 2330 and 2331. The two sets of configuration data 2330 and 2331 can be inverted version of each other such that the routing fabric section would behave like the fabric section 2100. The two sets of configuration data 2330 and 2331 can also be independent of each other such that the storage operations of the storage element 2305 are independent of the storage element 2306. For example the storage elements 2305 can store a first output signal from the source circuit 2310 while the storage element 2306 can simultaneously store a second output signal from the source circuit 2310.

Figure 24:
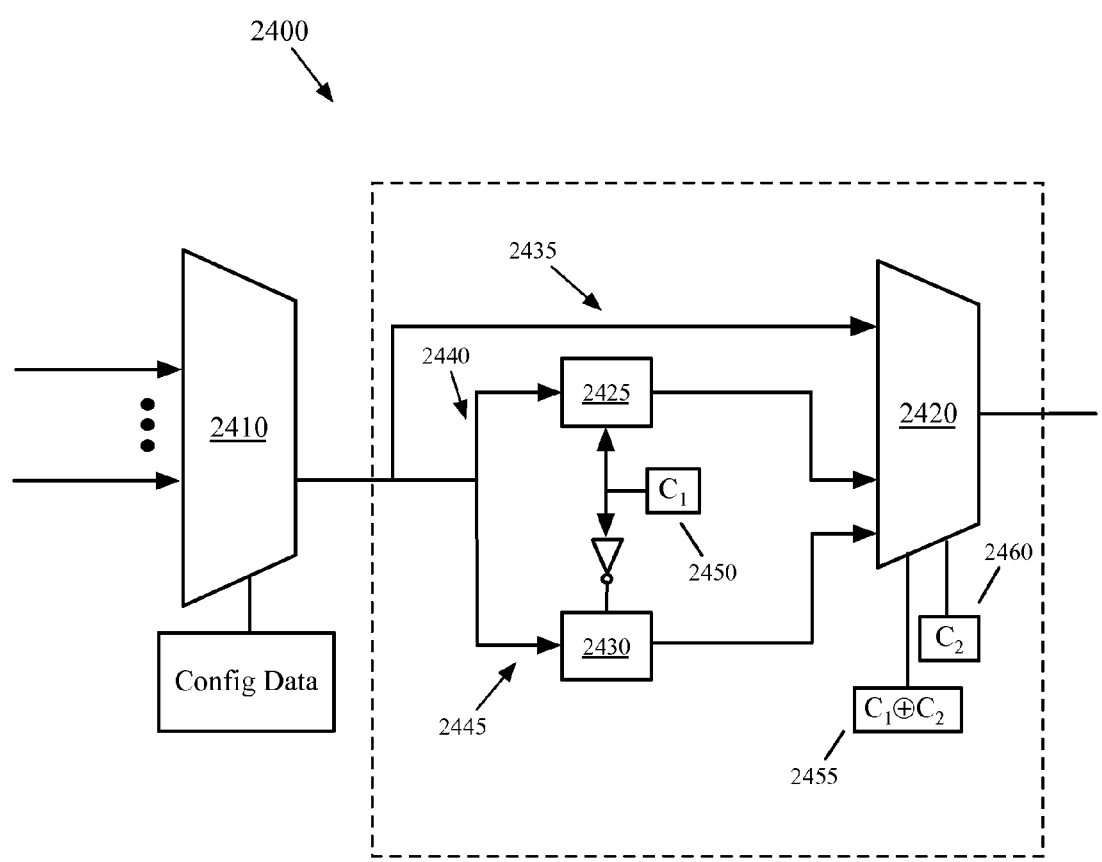
FIG. 24 illustrates a parallel distributed output path for configurably providing a pair of transparent storage elements and a bypass connection.

Some embodiments include a bypass path such the routing fabric section can pass a signal without having to go through a transparent storage element. For some of these embodiments, FIG. 24 illustrates an example routing fabric section (or routing circuit) 2400 that performs routing and storage operations by distributing an output signal of a source circuit 2410 through three parallel paths to inputs of a sub-cycle reconfigurable 3:1 output multiplexer 2420. The output multiplexer 2420 in turn feeds one or more destination circuits (not illustrated) in the routing fabric (e.g., RMUX) and/or in the configurable tiles (e.g., LUTs). The routing fabric section 2400 is called an MMUX in some embodiments. The source circuit 2410 can be a routing multiplexer (RMUX) or LUT in some embodiments.

The first path 2435 passes the output of the source circuit 2410 directly to a first input of the output multiplexer 2420. In some embodiments, the connection between the source circuit 2410 and the output multiplexer 2420 is a direct connection.

The second path 2440 runs in parallel with the first path 2435 and passes the output of the source circuit 2410 through a configurable storage element 2425, where the output may be optionally stored (e.g., when the storage element 2425 is enabled) before reaching a second input of the output multiplexer 2420. In some embodiments, the connection between the source circuit 2410 and the storage element 2425 and the connection between the storage element 2425 and the output multiplexer 2420 are direct connections.

The third path 2445 runs in parallel with the first and second paths 2435 and 2440, and passes the output of the source circuit 2410 through a configurable storage element 2430, where the output may be optionally stored (e.g., when the storage element 2430 is enabled) before reaching a third input of the output multiplexer 2420. In some embodiments, the connection between the source circuit 2410 and the storage element 2430 and the connection between the storage element 2430 and the output multiplexer 2420 are direct connections. In some embodiments, one or more of the connections between circuits 2410, 2425, 2430, and 2420 are configurable connections.

A first configuration bit $C_1$ 2450 controls both storage element 2425 and 2430. However, the original value of configuration bit $C_1$ 2450 controls storage element 2425 while the negative value of it controls storage element 2430. As a result, when one of the storage elements 2425 and 2430 is enabled (closed), the other one is disabled (open), and vice versa. A second configuration bit $C_2$ 2460 together with the first configuration bit $C_1$ controls the selection of inputs of the output multiplexer 2420. In some embodiments, the XOR of configuration bits $C_1$ and $C_2$ select one of the three inputs from the first path 2435, the second path 2440, and the third path 2445 as the output of output multiplexer 2420.

The routing fabric section 2400 acts as a transparent storage element when the output multiplexer 2420 selects an input from an open storage element. This will enable time borrowing by allowing signals to travel longer distance at slower clock rates. When the output multiplexer 2420 selects an input from the bypass path 2435, the routing fabric section 2400 behave as a transparent wire. In some embodiments, when the configuration bit $C_1$ 2450 and $C_2$ 2460 are different (i.e., the select signal 2455 is high), the input from first parallel path 2435 will be selected as the output of the output multiplexer 2420. When the select signal 2455 is low, the configuration signal $C_2$ 2460 will selects one of the inputs from the second path 2440 and the third path 2445 that has a closed storage element as the output of the output multiplexer 2420. When the output multiplexer 2420 selects a closed storage element and switching the configuration signals $C_1$ 2450 and $C_2$ 2460 simultaneously, the routing fabric section 2400 acts as a double edge triggered (DET) flip-flop.

The output multiplexer 2420 is illustrated as a 3:1 multiplexer requiring two configuration bit. However, in some embodiments, the output multiplexer 2420 receives two or more configuration bits for selecting from among four or more paths.

In some embodiments, the configuration bit $C_1$ 2450 and $C_2$ 2460 are derived at least partly from configuration data storage of the IC. In addition, the controls for the circuit 2410 are also derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 2410, 2420, 2425, 2430 during different clock cycles. These different clock cycles might be different user design clock cycles, or different sub-cycles of a user design clock cycle or some other clock cycle. In other words, the circuits 2410, 2420, 2425, 2430 can be reconfigured to perform a different operation in every clock cycle of a set (e.g., 3 or more) of consecutive clock cycles.

Figure 25:
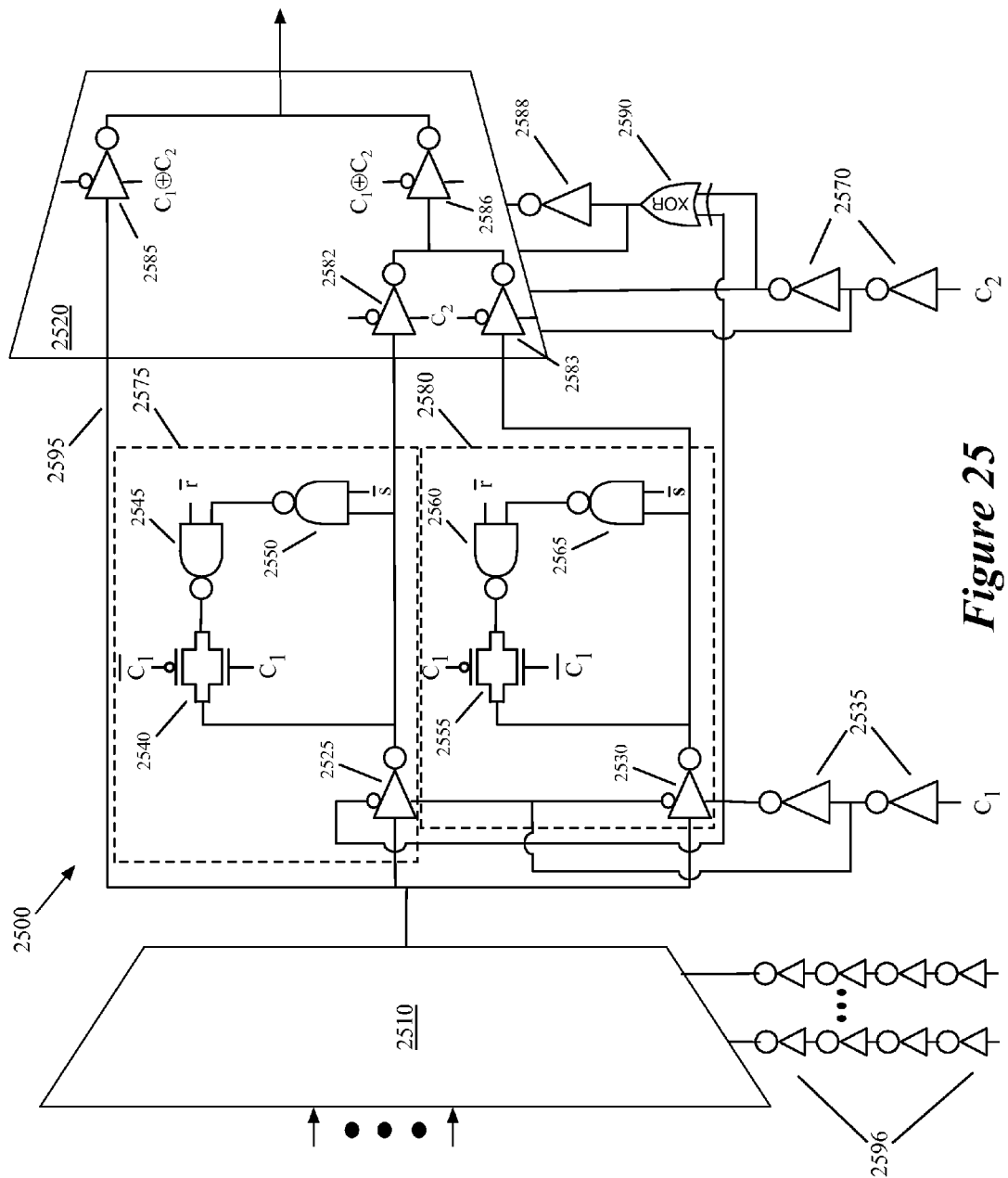
FIG. 25 illustrates an example implementation for the circuit of FIG. 24 of some embodiments.

For some embodiments, FIG. 25 illustrates an example implementation of the routing fabric section 2400 of FIG. 24. As shown in this figure, the circuit 2500 includes (1) a source circuit 2510, (2) a 3:1 output multiplexer 2520, (3) tri-state inverters 2525 and 2530, (4) a first inverter pair 2535, (5) a first transmission gate 2540, (6) a first pair of NAND gates 2545 and 2550, (7) a second transmission gate 2555, (8) a second pair of NAND gates 2560 and 2565, (9) a second inverter pair 2570, (10) an inverter 2588, (11) an XOR gate 2590, (12) a direct connection 2595, and (13) a delay chain 2596. In some embodiments, the source circuit 2510 can be a routing multiplexer (RMUX) or a LUT.

The sections 2575 and 2580 implement the configurable storage elements 2425 and 2430 on the second and third paths of circuit 2400 of FIG. 24. Specifically, the configurable storage element 2425 of FIG. 24 is implemented via the tri-state inverter 2525, the first transmission gate 2540, and the first pair of NAND gates 2545 and 2550. Similarly, the configurable storage element 2430 of FIG. 24 is implemented via the tri-state inverter 2530, the second transmission gate 2555, and the second pair of NAND gates 2560 and 2565.

In the section 2575, the tri-state inverter 2525 drives the output of the source circuit 2510 to one of the inputs of NAND gate 2550, which in turn drives it to NAND gate 2545. The NAND gate 2550 has another input that is driven by an active-low set signal, while the NAND gate 2545 has another input that is driven by an active-low reset signal. The NAND gate 2545 in turn drives the transmission gate 2540. The output of transmission gate 2540 shares the same wire as the output of tri-state inverter 2525 to form an input of the NAND gate 2550.

The first inverter pair 2535 supply the original and the negative value of a configuration signal $C_1$ to the circuits in sections 2575 and 2580. The transmission gate 2540 is enabled by the configuration signal $C_1$. When the signal $C_1$ is high, the transmission gate 2540 conducts current. When the signal $C_1$ is low, the transmission gate 2540 is in high impedance state, effectively removing the output from the transmission gate 2540. The negative value of configuration signal $C_1$ controls tri-state inverter 2525. When the signal $C_1$ is low, the tri-state inverter 2525 is turned on. When the signal $C_1$ is high, the tri-state inverter 2525 is turned off.

Because the original value of $C_1$ enables the transmission gate 2540 while the negative value of $C_1$ enables tri-state inverter 2525, the transmission gate 2540 and the tri-state inverter 2525 will not conduct current at the same time.

The section 2575 includes a storage element that is controlled by set and reset signals. When the set and reset signals are both high (i.e., de-asserted, since set and reset are both active low signals in this example), whatever value comes in as input of NAND gate 2550 will reach the input of transmission gate 2540. So for the configurable storage element in section 2575 to function normally (i.e., storing or passing signals from source to destination), the set and reset signals must remain high (i.e., inactive).

In section 2580, the tri-state inverter 2530 drives the output of the source circuit 2510 to one of the inputs of NAND gate 2565, which in turn drives it to NAND gate 2560. The NAND gate 2565 has another input that is driven by an active low set signal, while the NAND gate 2560 has another input that is driven by an active low reset signal. The NAND gate 2560 in turn drives the transmission gate 2555. The output of transmission gate 2555 shares the same wire as the output of tri-state inverter 2530 to form an input of the NAND gate 2565.

The transmission gate 2555 is enabled by the negative value of configuration signal $C_1$. When the signal $C_1$ is low, the transmission gate 2555 conducts current. When the signal $C_1$ is high, the transmission gate 2555 is in high impedance state, effectively removing the output from the transmission gate 2555. The original value of configuration signal $C_1$ controls tri-state inverter 2530. When the signal $C_1$ is high, the tri-state inverter 2530 is turned on. When the signal $C_1$ is low, the tri-state inverter 2530 is turned off.

Because the negative value of $C_1$ enables the transmission gate 2555 while the original value of $C_1$ enables tri-state inverter 2530, the transmission gate 2555 and the tri-state inverter 2530 will not conduct current at the same time.

The section 2580 also includes a storage element that is controlled by set and reset signals. When the set and reset signals are both high (i.e., de-asserted, since set and reset are both active low signals in this example), whatever value comes in as input of NAND gate 2565 will reach the input of transmission gate 2555. So for the configurable storage element in section 2580 to function normally (i.e., storing or passing signals from source to destination), the set and reset signals must remain high.

When the configuration signal $C_1$ is changed to high, the tri-state inverter 2530 is enabled while the transmission gate 2555 is disabled. At the same time, the tri-state inverter 2525 is disabled while the transmission gate 2540 is enabled. As a result, the current output of the source circuit 2510 passes transparently through the circuit section 2580 and drives one input of the output multiplexer 2520, while the previous output (the one before $C_1$ turned high) of the source circuit 2510 is stored in the configurable storage element described by section 2575 and drives another input of the output multiplexer 2520.

Similarly, when the configuration signal $C_1$ is changed to low, the tri-state inverter 2525 is enabled while the transmission gate 2540 is disabled. At the same time, the tri-state inverter 2530 is disabled while the transmission gate 2555 is enabled. As a result, the current output of the source circuit 2510 passes transparently through the circuit section 2575 and drives one input of the output multiplexer 2520, while the previous output (the one before $C_1$ turned low) of the source circuit 2510 is stored in the configurable storage element described by section 2580 and drives another input of the output multiplexer 2520.

The output multiplexer 2520 is a 3:1 multiplexer that includes four tri-state inverters 2582-2586. The second inverter pair 2570 supply a configuration signal $C_2$ to the output multiplexer 2520. The original value of $C_2$ enables the tri-state inverter 2582 while the negative value of $C_2$ enables the tri-state inverter 2583. So at any given time, only one of the tri-state inverters 2582 and 2583 is enabled to pass its value on. This circuit in effect selects either the input from section 2575 or the input from section 2580 and passes it to the next tri-state inverter 2586.

The inverter 2588 and the XOR gate 2590 supply a configuration signal $C_1 \oplus C_2$ to the output multiplexer 2520. The original value of $C_1 \oplus C_2$ enables the tri-state inverter 2585 while the negative value of $C_1 \oplus C_2$ enables the tri-state inverter 2586. So at any given time, only one of the tri-state inverters 2585 and 2586 is enabled to pass its value on. When the value of $C_1 \oplus C_2$ is high, the input from the bypass wire 2595 is selected as the output of multiplexer 2520. When the value of $C_1 \oplus C_2$ is low, the input selected by configuration signal $C_2$ is passed on as the output of multiplexer 2520. By design, when the value of $C_1 \oplus C_2$ is low (i.e., when configuration signals $C_1$ and $C_2$ have the same value), the input selected by $C_2$ will be the one coming from a closed storage element, not the one from the transparent storage element. The bypass path 2595, when selected, makes the circuit 2500 act as a transparent wire.

It will be evident to one of ordinary skill in the art that the various components and functionality of FIG. 25 may be implemented differently without diverging from the essence of the invention. For example, other implementations of a latch may replace the configurable storage elements described in sections 2575 and 2580.

In some ICs, the rising edge of the configuration signal $C_1$ is slower than its falling edge. For those ICs, closing the configurable storage element in section 2575 or 2580 on the rising edge of configuration signal $C_1$ will cause a hold time violation because the output of the source circuit 2510 would have already changed before the rising edge of $C_1$. Unfortunately, at any given time, one of the configurable storage elements in sections 2575 and 2580 will close on the rising edge of configuration signal $C_1$. In order to mitigate the potential hold time violation, a delay chain (e.g., one that includes one or more inverters) is inserted in some embodiments into the data path between the output of the source circuit 2510 and the inputs to tri-state inverters 2525 and 2530. In some embodiments, instead of inserting a delay chain into the data path following the output of the source circuit 2510, a delay chain 2596 is inserted into the configuration retrieval circuitry of the source circuit 2510.

Generally speaking, hold time problems can arise between a configurable transparent (or hybrid) storage element and its source or destination circuit (e.g., the RMUX that feeds it or the output multiplexer that receives the output of the storage element) if the configuration data retrieval path for the transparent/hybrid storage elements does not provide sufficient timing margins for its source or destination circuits. In order to mitigate possible hold time problems between transparent (or hybrid) storage elements and their source or destination circuits for routing fabric sections described throughout this section, some embodiments insert different timing delays in different configuration data retrieval paths.

Figure 26:
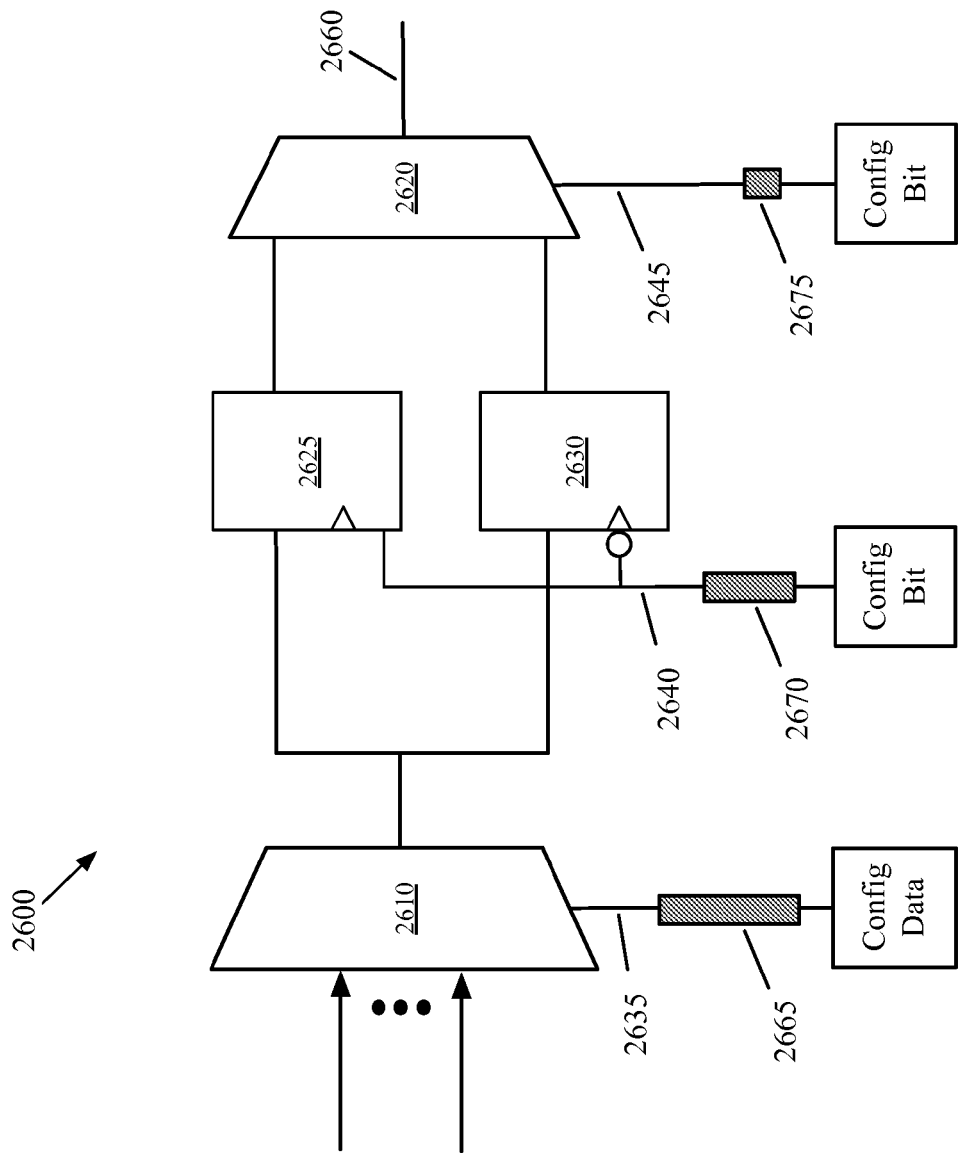
FIG. 26 illustrates an example in which different delays are introduced in different configuration data retrieval paths.

FIG. 26 illustrates an example circuit 2600 in which different delays are introduced at different configuration data retrieval paths. As shown in this figure, the circuit 2600 includes a source multiplexer 2610, a destination multiplexer 2620, a first configurable storage element 2625, and a second configurable storage element 2630. The source multiplexer 2610 receives its configuration data through a configuration retrieval path 2635 that includes a delay element 2665. The configurable storage elements 2625 and 2630 receive their configuration bit through a configuration retrieval path 2640 that includes a delay element 2670. The destination multiplexer 2620 receives its configuration bit through a configuration retrieval path 2645 that includes a delay element 2675.

To ensure that signals coming from the source multiplexer 2610 have sufficient hold time at the configurable storages 2625 and 2630, some embodiments make the configuration retrieval path 2635 slower than the configuration retrieval path 2640. In order to further ensure that the outputs of the first and second configurable storage elements 2625 and 2630 have sufficient hold time at the destination multiplexer 2620, some embodiments make the configuration retrieval path 2640 slower than the configuration retrieval path 2645. In some embodiments, the desired relative delay between the different configuration retrieval paths 2635, 2640, and 2645 is accomplished by insertion of delay elements (e.g., inverters) in these paths. Specifically, the configuration retrieval path 2635 have delay element 2665 that is longer than the delay element 2670 of the configuration retrieval path 2660. Thus the configuration retrieval path 2635 is slower than the configuration retrieval path 2640. Similarly, and the configuration retrieval path 2640 have delay element 2670 that is longer than the delay element 2675 of the configuration retrieval path 2645. Thus the configuration retrieval path 2640 is slower than the configuration retrieval path 2645.

Figure 38:
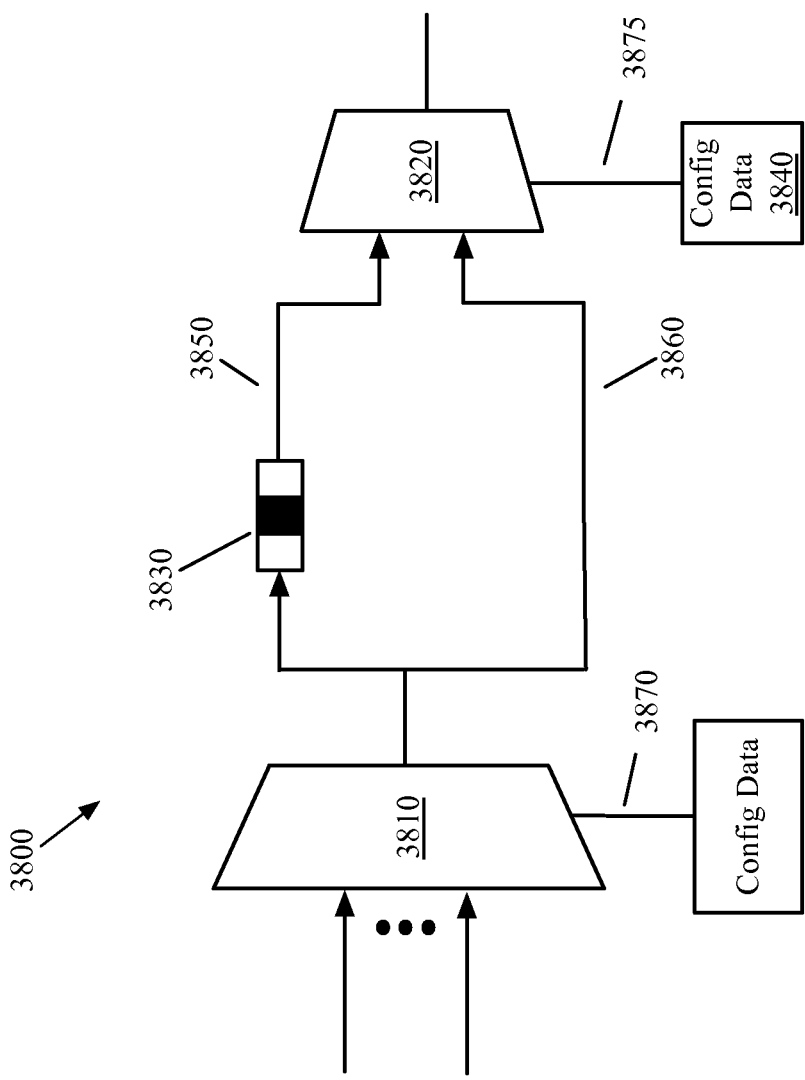
FIG. 38 illustrates a routing fabric section that performs routing and storage operations by parallel paths that includes a clocked storage element.

It will be evident to one of ordinary skill in the art that the principle illustrated in FIG. 26 may be applied to different types of hybrid storage elements such as those described above by reference to FIGS. 12-25 without diverging from the essence of the invention. For example, to ensure that signals having sufficient hold time at the configurable storage elements 2425 and 2430 and the output multiplexer 2420 as illustrated in FIG. 24, some embodiments of the routing fabric section 2400 have configuration retrieval path for the source circuit 2410 that is slower than the configuration retrieval path for the configurable storage elements 2425 and 2430, which is made slower than the configuration retrieval path for the output multiplexer 2420. Similarly, to ensure that signals having sufficient hold time at the destination circuit 3820 as illustrated in FIG. 38, some embodiments of the routing fabric section 3800 have configuration retrieval path 3870 for the source circuit 3810 (which can be a RMUX) that is slower than the configuration retrieval path 3875 for the output multiplexer circuit 3820.

The operations of various types of interconnect circuits (e.g., RMUXs) and storage circuits (e.g., PDPs, YMUXs and MMUXs) discussed above by reference by FIGS. 13-26 are determined by configuration data or configuration bits. In some embodiments, the configuration data or configuration bits come at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the storage elements, source circuits, and output multiplexers during differing clock cycles. These differing clock cycles might be different user design clock cycles, or different sub-cycles of a user design clock cycle or some other clock cycle.

IV. Clocked Storage Elements within the Routing Fabric

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes non-transparent (i.e., clocked) storage elements, also referred to as "conduits." Although the examples shown below are all driven by clock signals, one of ordinary skill in the art will also recognize that the clocked storage elements can also be driven otherwise (e.g., by configuration data, user data, etc.).

Having clocked storage elements is highly advantageous. For instance, such storage elements allow data to be stored every clock cycle (or sub-cycle, configuration cycle, reconfiguration cycle, etc.). In addition, new data may be stored at the input during the same clock cycle that stored data is presented at the output of the storage element. These clocked storage elements may be placed within the routing fabric or elsewhere on the IC.

In much of the discussion above, transparent or hybrid storage elements driven by configuration data were introduced and described. In this section, we introduce and describe clocked storage elements. A clocked storage element is one where a clock signal directly drives the storage operation, whereas a transparent or hybrid storage element is one where the configuration signal directly drives the storage operation. In some cases a transparent or hybrid storage element is synchronous with the clock because the configuration data is received synchronously with the clock. However, a clocked storage circuit necessarily changes at transitions in the clock, whereas, with a transparent or hybrid storage circuit, the transitions are driven by the state of supplied configuration data. Thus, in many cases a transparent or hybrid storage circuit can change its output when its configuration data is held constant (i.e., when a latch is configured to operate in pass-through mode and its input is changing). Configuration data may be maintained differently for different sequences of configuration cycles. Thus the transparent or hybrid storage circuit can behave in a more arbitrary manner than a clocked storage circuit.

In addition, some embodiments discussed below use a hybrid of clock and configuration signals. These are called either a "hybrid conduit" or a "programmable conduit", because their storage operations are directly driven both by a clock signal and configuration signal.

Figure 27A:
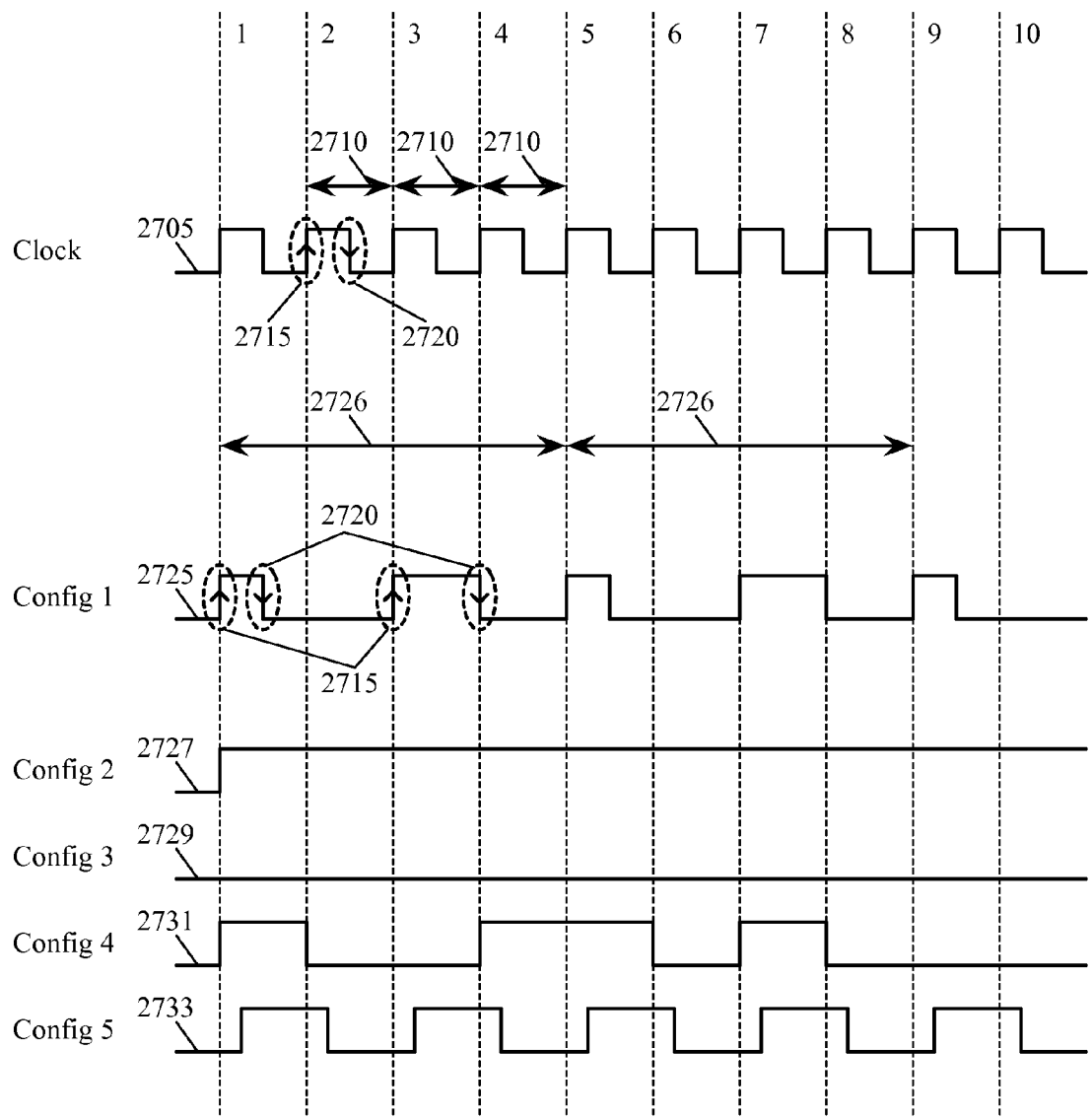
FIG. 27A illustrates different examples of clock and configuration data signals that may be used to drive circuits of the IC.

FIG. 27A illustrates different examples of clock and configuration data signals 2700 that may be used to drive circuits described herein. As shown, a typical clock signal 2705 is periodic. Thus, the clock signal continuously repeats the pattern of one period 2710, which, typically, has one rising edge 2715 and one falling edge 2720 of the clock signal. In addition, a clock signal typically has a duty cycle of 50% (i.e., the clock is at logic high for 50% of its period and logic low for 50% of the period). In contrast, the example configuration data signals 2725-2733 may or may not be periodic, may have multiple rising and falling edges during any identified period or cycle, and do not typically have any particular duty cycle.

For instance, the configuration signal 2725 is an example of a four-loopered configuration, inasmuch as the signal repeats every four clock cycles (i.e., the configuration signal 2725 is periodic, with a period of four clock cycles 2726). However, as shown, the signal has multiple rising 2715 and falling 2720 edges in one cycle (two of each in this example), and its duty cycle is not 50% in this example. The example configuration signal 2727 is simply at a logic high level for the entire period of operation illustrated by FIG. 27A. Thus, the configuration signal 2727 is not periodic, and does not transition from either high to low or low to high in this example. Likewise, the configuration signal 2729 is not periodic, and also does not transition during the period of operation shown in the example of FIG. 27A, however this signal is at a logic low instead of a logic high In other cases, configuration data may not be periodic (i.e., repeating) at all. For example, the signal 2731 does not repeat during the period of operation illustrated in FIG. 27A. In some instances the configuration data may repeat, as in the four-loopered example 2725 described above. However, in other cases, the configuration data provided to the storage element (or other circuit) may be based on computations, user data, or other factors, that cause the configuration data to be non-repeating. Finally, as illustrated by the signal 2733, configuration data does not necessarily have to correspond to changes in the clock signal. Although in many cases configuration data will be provided in relation to a clock signal, the configuration data is not required to be synchronous with the clock in order to operate the configurable circuits described herein.

One of ordinary skill in the art will recognize that FIG. 27A is provided for descriptive purposes only, and does not depict any particular clock or configuration signals. Nor does FIG. 27A show accurate setup and hold times, rise and fall time requirements, etc.

Figure 27B:
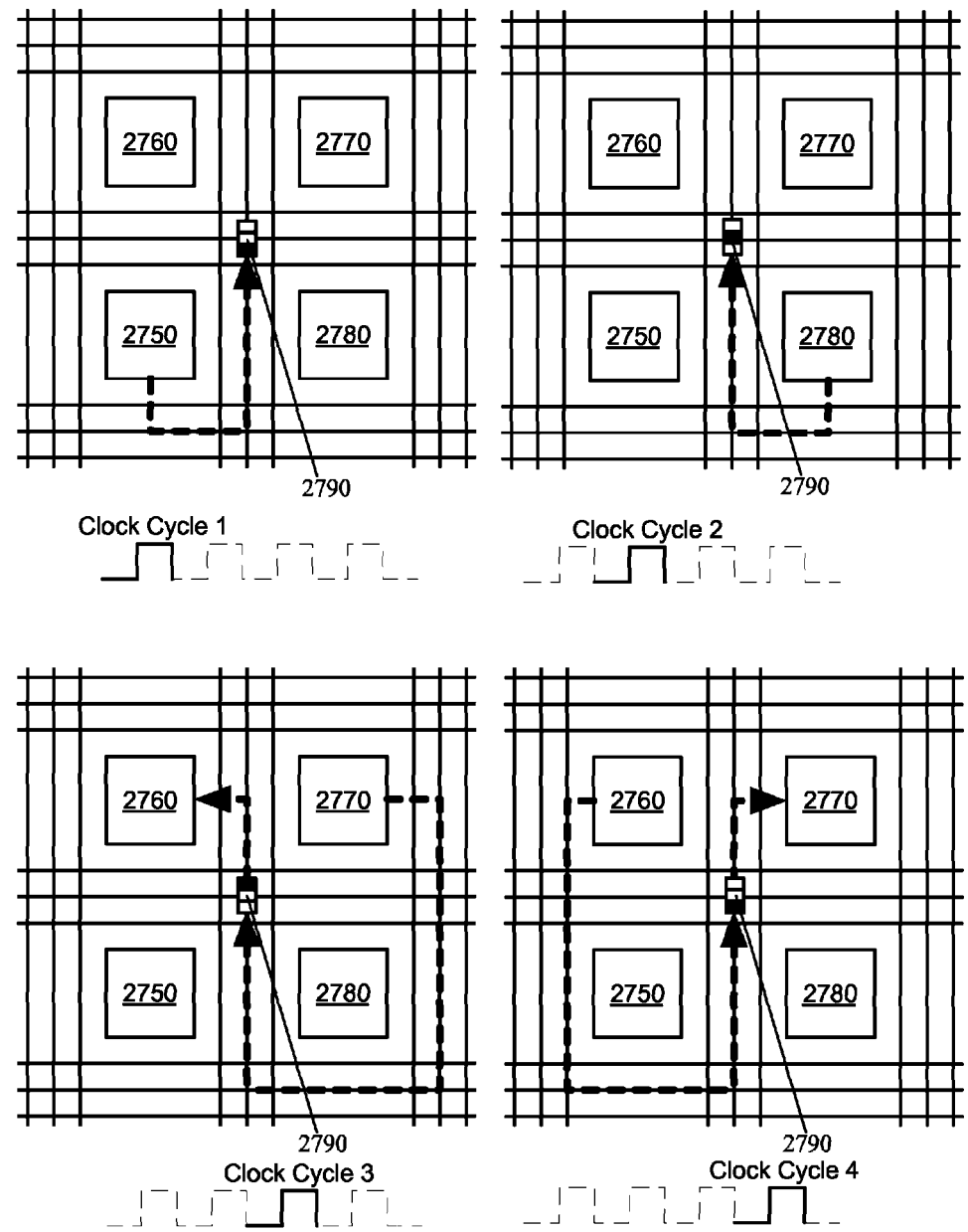
FIG. 27B illustrates the operations of clocked storage elements within the routing fabric of a configurable IC of some embodiments.

FIG. 27B illustrates the operations of clocked storage elements within the routing fabric of a configurable IC. In FIG. 27B, a component 2750 is outputting a signal for processing by component 2760 at clock cycle 3. Therefore, the signal from 2790 must be stored until clock cycle 3. Hence, the signal is stored within the storage element 2790 located within the routing fabric. By storing the signal from 2750 within the routing fabric during clock cycles 1 and 2, components 2750 and 2760 remain free to perform other operations during this time period. At clock cycle 2, component 2780 is outputting a signal for processing by component 2770 at clock cycle 4. At clock cycle 2, storage element 2790 is storing the value received at clock cycle 1, and receiving a value from component 2780 for storage as well.

At clock cycle 3, 2760 is ready to receive the first stored signal (from cycle 1) and therefore the storage element 2790 passes the value. At clock cycle 3, storage element 2790 continues to store the value received in clock cycle 2. Further, at clock cycle 3, storage element 2790 receives a value from component 2770 for future processing. At clock cycle 4, component 2730 is ready to receive the second stored signal (from clock cycle 2) and therefore the storage element 2790 passes the value. Further, at clock cycle 4, storage element 2790 continues to store the value received during clock cycle 3, while also receiving a new value from component 2760. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

Figure 28:
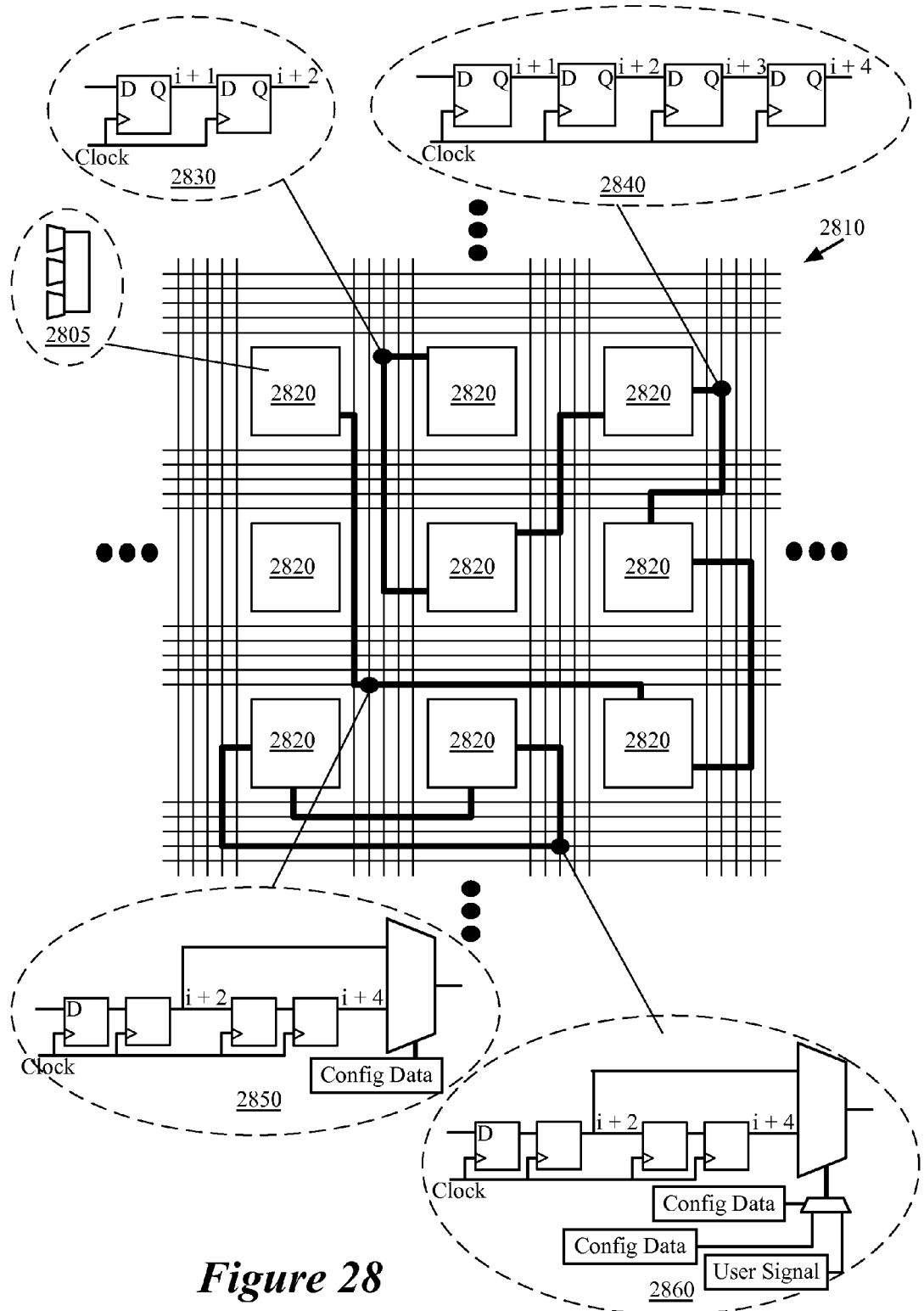
FIG. 28 illustrates placement of clocked storage elements within the routing fabric of a configurable IC of some embodiments.

FIG. 28 illustrates several examples of different types of controllable storage elements 2830-2860 that can be located throughout the routing fabric 2810 of a configurable IC. Each storage element 2830-2860 stores a series of output signals from a source component or components that are to be routed through the routing fabric to some destination component or components.

As illustrated in FIG. 28, outputs are generated from the circuit elements 2820. The circuit elements 2820 are configurable logic circuits (e.g., 3-input LUTs and their associated IMUXs as shown in expansion 2805), while they are other types of circuits in other embodiments. In some embodiments, the outputs from the circuit elements 2820 are routed through the routing fabric 2810 where the outputs can be stored within the storage elements 2830-2860 of the routing fabric. In other embodiments, the storage elements 2830-2860 are placed within the configurable logic circuits 2805. Storage element 2830 is a storage element including two clocked flip flops (also referred to as a "clocked delay element"). This storage element will be further described below by reference to FIG. 29, element 2940. Storage element 2840 is a storage element including four clocked flip flops. This storage element will be further described below by reference to FIG. 29, element 2950. Storage elements 2850 and 2860 include four clocked flip flops and an input select multiplexer that is controllable. Storage element 2850 will be further described below by reference to FIG. 29, element 2960 and storage element 2860 by reference to FIG. 29, element 2970.

One of ordinary skill in the art will realize that the depicted storage elements within the routing fabric sections of FIG. 28 only present some embodiments of the invention and do not include all possible variations. Some embodiments use all these types of storage elements, while other embodiments do not use all these types of storage elements (e.g., use one or two of these types). In addition, the storage elements may be placed at other locations within the IC.

Figure 29:
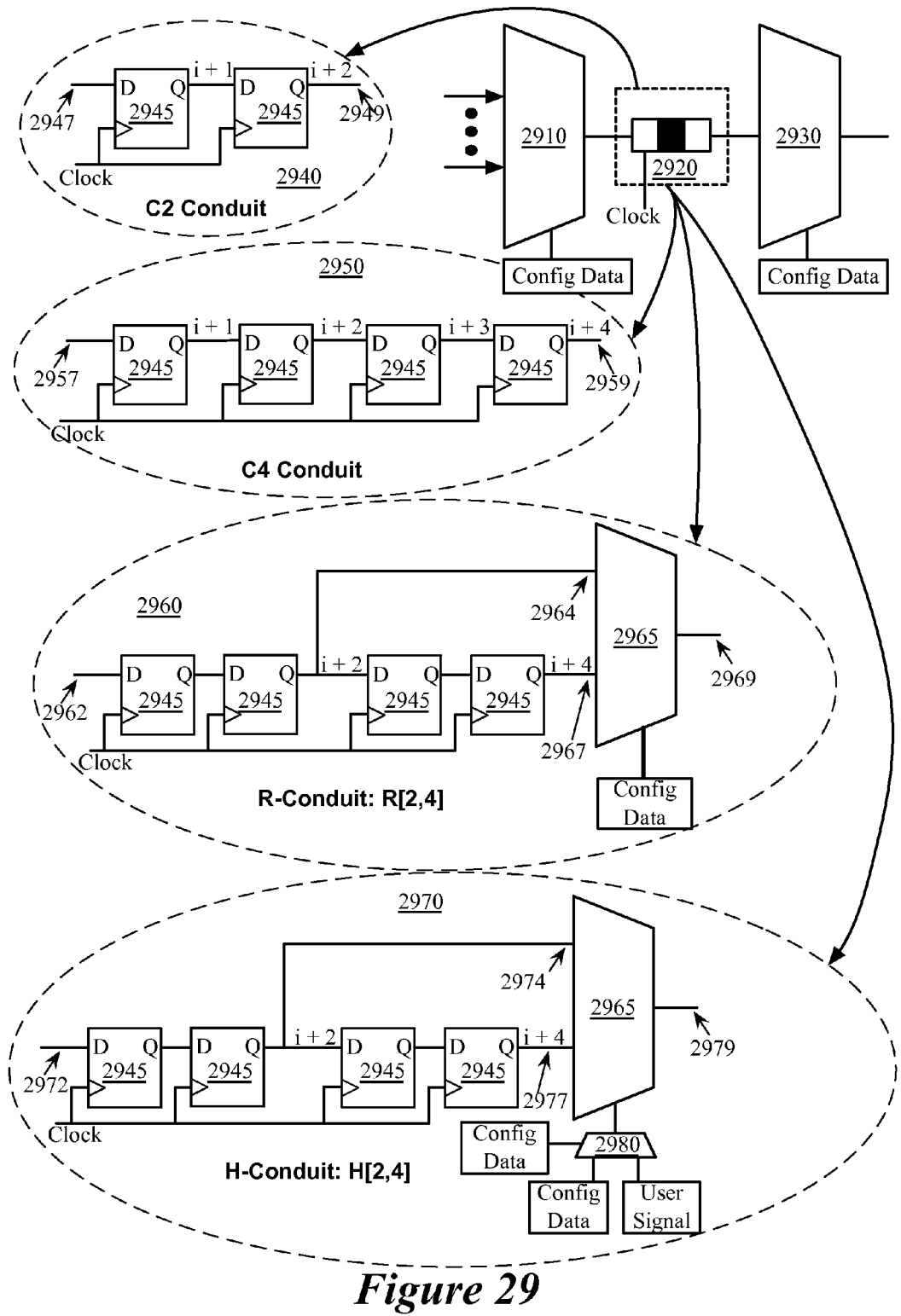
FIG. 29 illustrates alternative embodiments of clocked storage elements placed within the routing fabric of a configurable IC of some embodiments.

FIG. 29 illustrates several circuit representations of different embodiments of the storage element 2920. In some embodiments, the storage element 2920 is a shift register 2940 including two clocked delay elements (e.g., flip-flops) 2945, that is built in or placed at the routing fabric between a routing circuit 2910 and a first input of a destination 2930. The flip-flops, or clocked delay elements, are connected sequentially, such that the output of one clocked delay element drives the input of the next sequentially connected clocked delay element. In some embodiments, the flip-flops are clocked by the sub-cycle clock, such that the value at the input 2947 of the storage element 2940 is available at its output 2949 two sub-cycles later. Accordingly, when other circuits in later reconfiguration cycles (specifically, two sub-cycles later) need to receive the value of a circuit 2910 in earlier reconfiguration cycles (i.e., two sub-cycles earlier), the circuit 2940 can be used.

In some embodiments, the storage element 2920 is a shift register 2950 including four flip-flops 2945 that is built in or placed at the routing fabric between the routing circuit 2910 and a first input of a destination 2930. The flip-flops are clocked by the sub-cycle clock, such that the value at the input 2957 of the storage element 2950 is available at its output 2959 four sub-cycles later. Accordingly, when other circuits in later reconfiguration cycles (specifically, four sub-cycles later) need to receive the value of a circuit 2910 in earlier reconfiguration cycles (in this example, four sub-cycles earlier), the circuit 2950 can be used.

One of ordinary skill in the art will recognize that the embodiments shown in FIG. 29 are not exhaustive. For instance, storage elements 2940 and 2950 could be implemented with different number of flip-flops (e.g., 3, 5, or 8 flip-flops) in addition to the two embodiments shown, which utilize 2 and 4 flip-flops, respectively. Alternatively, the storage elements 2940 could be placed at the input or output of a LUT or between any other circuits of the IC.

A. Configurable Clocked Storage Elements within the Routing Fabric

In some embodiments, the configurable (or controllable) storage element 2920 is a shift register 2960 including four flip-flops 2945 and a 2:1 multiplexer 2965 that is built in or placed at the routing fabric between the routing circuit 2910 and a first input of a destination 2930. The flip-flops are clocked by the sub-cycle clock (or another clock signal), such that the value at the input 2962 of the storage element 2960 is available at a first multiplexer input 2964 two sub-cycles later, and is available at a second multiplexer input 2967 four sub-cycles later. The multiplexer 2965 is controlled by configuration data such that the value at its output 2969 may be selected from either the value at its first input 2964 or its second input 2967. In other embodiments, the multiplexer 2965 may have more than two inputs. Accordingly, when other circuits in later configuration cycles (in this example, two or four sub-cycles later) need to receive the value of a circuit 2910 in earlier configuration cycles (specifically, two or four sub-cycles earlier), the circuit 2960 can be used.

One of ordinary skill in the art will recognize that the circuit 2960 may be implemented with more sets of flip-flops than the two shown. In other words, the circuit may be implemented, for instance, with a three-input multiplexer and three sets of flip-flops, where each set of flip-flops has its output connected to each input of the multiplexer. In this example, the circuit would be capable of producing three different delays from input to output.

In some embodiments, the storage element 2920 is a shift register 2970 including four flip-flops 2945 and two 2:1 multiplexers 2965 and 2980 that are built in or placed at the routing fabric between the routing circuit 2910 and a first input of a destination 2930. The flip-flops are clocked by the sub-cycle clock, such that the value at the input 2972 of the storage element 2970 is available at a first multiplexer input 2974 two sub-cycles later, and is available at a second multiplexer input 2977 four sub-cycles later. The multiplexer 2965 is controlled by a user signal or configuration data such that the value at its output 2979 may be selected from either the value at its first input 2974 or its second input 2977. In other embodiments, the multiplexer 2965 may have more than two inputs. The 2:1 multiplexer 2980 selects between the user signal or configuration data based on another configuration data. In some embodiments, the configuration data for selection and control may be provided by the same configuration data. Accordingly, when other circuits in later configuration cycles (specifically, two or four sub-cycles later) need to receive the value of a circuit 2910 in earlier configuration cycles (specifically, two or four sub-cycles earlier), the circuit 2970 can be used.

Figure 30:
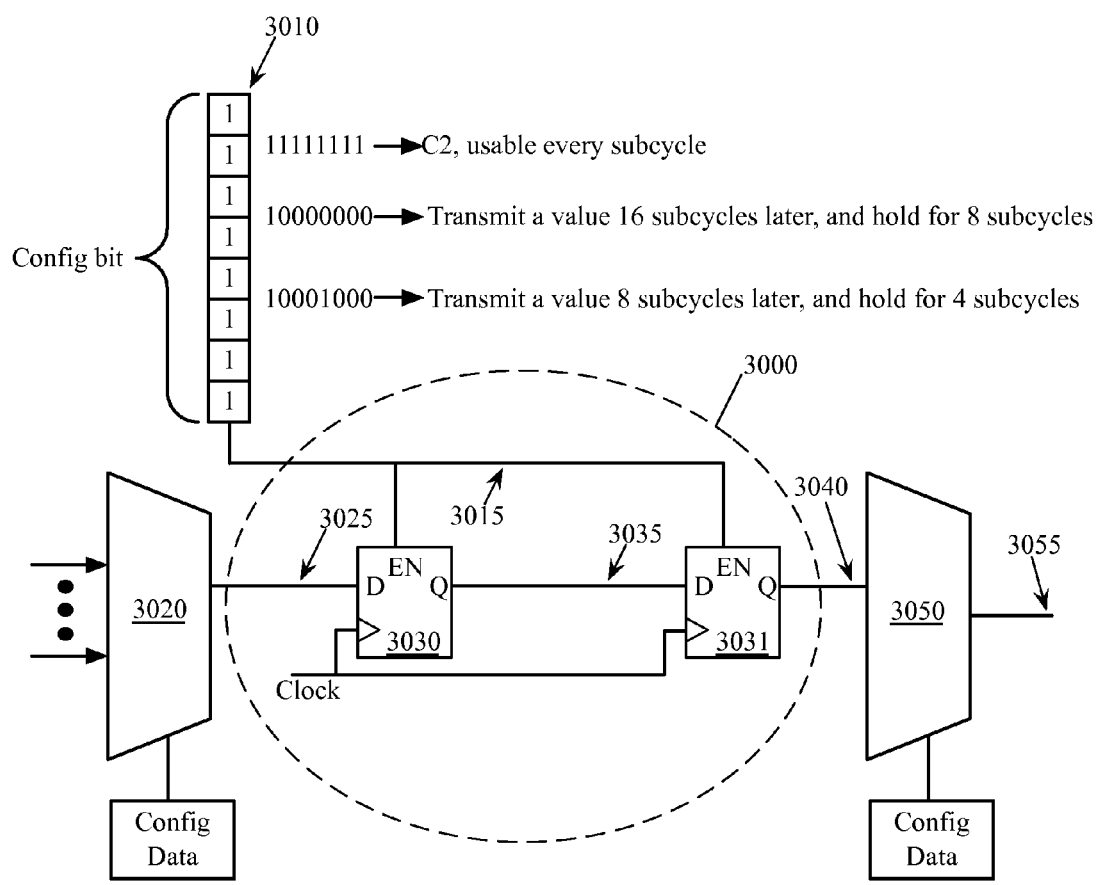
FIG. 30 illustrates the configuring of a configurable clocked storage element of some embodiments.

FIG. 30 illustrates the configuring of a configurable, non-transparent (i.e., clocked) storage element (also referred to as a "programmable conduit"). In some embodiments, the storage element 3000 is a configurable shift register including two flip-flops 3030 and 3031 that is built in or placed at the routing fabric between a routing circuit 3020 and a first input of a destination 3050. The flip-flops are clocked by the sub-cycle clock, such that the value at the input 3025 of the storage element 3000 is available at its output 3045 in a later sub-cycle. Accordingly, when other circuits in later configuration cycles need to receive the value of a circuit 3020 in earlier configuration cycles, the circuit 3000 can be used.

The configurable storage element 3000 functions in the same manner as storage element 2940 of FIG. 29 while the configuration bit 3010 is held in a logic high state. When the configuration bit 3010 is held in a logic high state, each flip flop (3030 and 3031) of the configurable storage element 3000 is enabled during each clock cycle, so that its input 3025 is available at its output 3040 two clock cycles later, and the value is held at the output for one clock cycle.

When different configuration data is presented to the configurable storage element 3000, multiple variations of delay from input to output and of the hold time at the output may be achieved. For instance, if the configuration data 3010 provided is logic high for 1 clock cycle, and logic low for 7 clock cycles, in an 8-loopered scheme, the input flip flop 3030 is enabled during the first clock cycle, and stores the data at its input 3025. Although the second flip flop 3031 is also enabled, the data at its input 3035 is not valid, so neither is the data at its output 3045 valid. During the second through eighth clock cycles, neither flip flop (3030 and 3031) is enabled, so no new data is stored by either flip flop. During the ninth clock cycle, both flip flops are enabled, so the first flip flop 3030 stores the data at its input 3025, while presenting its stored data at its output 3035. The second flip flop 3031 is enabled and stores the data from the output of the first flip-flop 3035, while the data at its output 3045 is still invalid. During the tenth to sixteenth clock cycles, neither flip flop (3030 and 3031) is enabled, so no new data is stored or passed by either flip flop. During clock cycle 17, both flip flops (3030 and 3031) are enabled, and the first flip flop 3030 again stores the data at its input 3025, and presents its stored data at its output 3035. The second flip flop 3031 again stores the data at its input 3035 and also presents its stored data at its output 3045, where the data is now valid, and will be held until the next enable signal and clock edge.

One of ordinary skill in the art will recognize that other embodiments of the configurable clocked storage element 3000 may include more flip flops, or configuration data greater than one byte. Furthermore, the storage element may be placed at different locations within the IC. In addition, the various examples of configuration data are for illustrative purposes only, and any combination of bits may be used.

B. Timing of Storage Elements

Figure 31A:
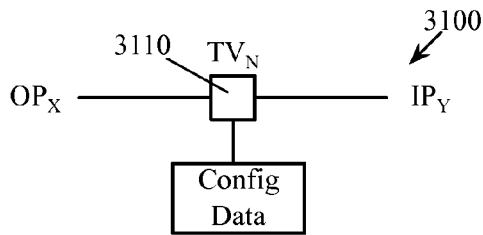
FIG. 31A illustrates a transparent storage element placed between a first circuit's output and a second circuit's input of some embodiments.

FIG. 31A illustrates one embodiment of a configurable, transparent (i.e., unclocked) storage element. In some embodiments, the storage element is a latch 3110 which may be placed between two other circuit elements. In some embodiments, the latch 3110 is implemented as shown in FIG. 18, element 1805. This latch is said to be transparent because it does not receive a clock signal. In FIG. 31A, $OP_X$ represents the output of some upstream circuitry, for instance, the output of an R-MUX. The input of the latch 3110 is driven by $OP_X$. Similarly, $IP_Y$ represents the input of some downstream circuitry that will be driven by the output of the latch 3110. The downstream circuitry could be an R-MUX, an I-MUX, or any other element of the configurable IC.

Figure 31B:
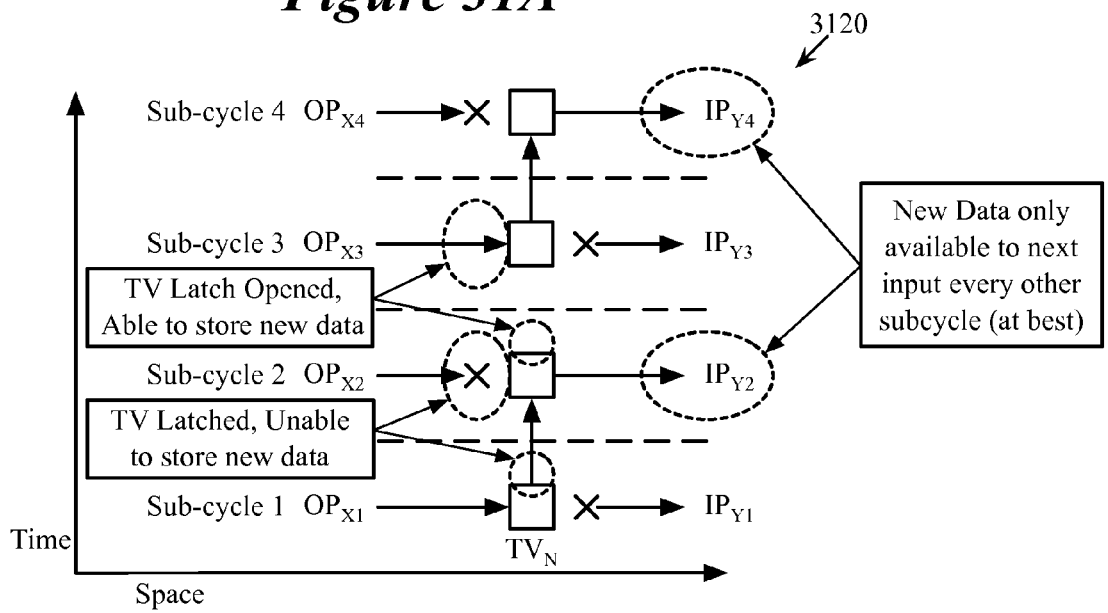
FIG. 31B illustrates the operation of the circuit from FIG. 31A where the output is latched and unlatched in alternating reconfiguration cycles of some embodiments.

FIG. 31B illustrates the use of the storage element 3110 to pass values from an earlier sub-cycle (or clock cycle) to a later sub-cycle. As shown, if a value from $OP_X$ is latched during sub-cycle 1, that value is then held in sub-cycle 2, where it is available to be read at $IP_Y$. During sub-cycle 2, the storage element 3110 is unable to store a new value from $OP_X$ because the latch is unable to read new data while data is being stored. As further illustrated, the storage element 3110 is ready to store new data from $OP_X$ during sub-cycle 3. The data stored during sub-cycle 3 is then available to be read at $IP_Y$ during sub-cycle 4. This same process can be repeated in subsequent sub-cycles.

Figure 32:
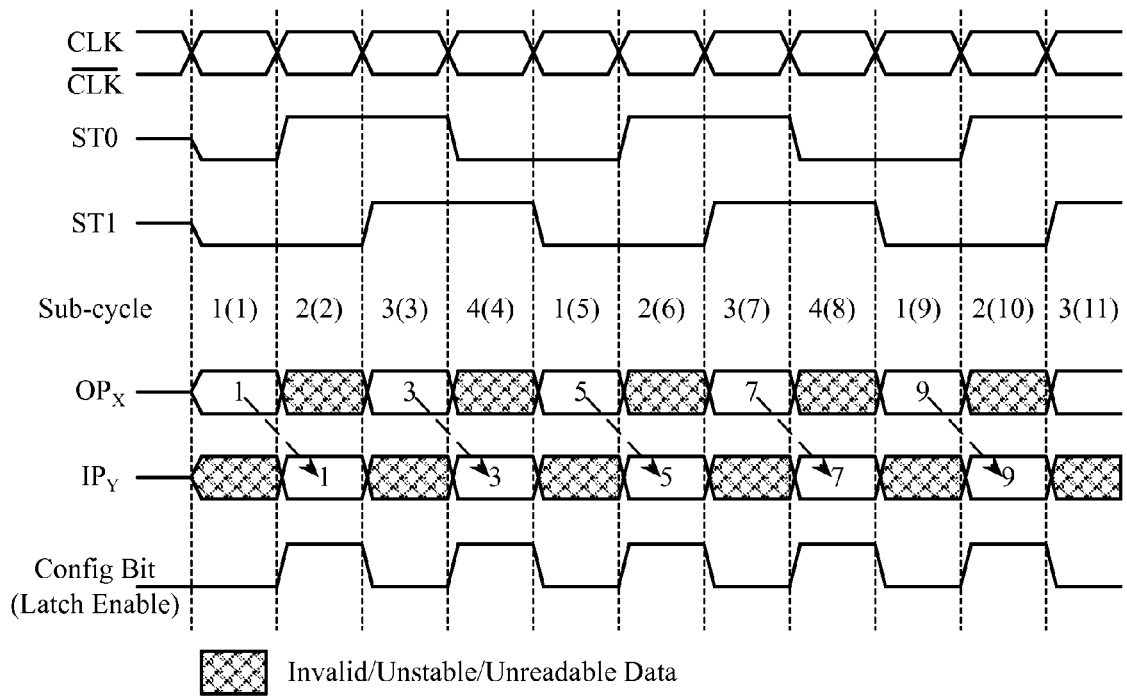
FIG. 32 illustrates the timing of the circuit from FIG. 31A under the operating conditions described by FIG. 31B of some embodiments.

FIG. 32 illustrates the operation of the storage element 3210 through the use of a timing diagram. Note that FIG. 32 is meant for illustrative purposes only, and is not meant to accurately reflect setup and hold times, rise times, etc. FIG. 32 corresponds to the example shown in FIG. 31B. In this example, there are four sub-cycles during each user cycle, and the four sub-cycles continuously repeat (4-loopered). During sub-cycle 1, the latch enable signal is inactive (low), and the storage element 3110 is available to store data from $OP_X$. During this time, storage element 3110 acts as a routing circuit, and the output of storage element 3110 is unstable at $IP_Y$. During sub-cycle 2, the latch enable signal is active (high), and the value stored during sub-cycle 1 is presented by the storage element 3110 to $IP_Y$, and the storage element is not able to read new data from $OP_X$. During sub-cycle 3, the storage element 3110 again reads data from $OP_X$, while the output of storage element 3110 is not stable at $IP_Y$. During sub-cycle 4, the value stored during sub-cycle 3 is presented by the storage element 3110 to $IP_Y$. This process is repeated in this example, with the values read from $OP_X$ at sub-cycles 1, 3, 5, etc. available for the element at $IP_Y$ during sub-cycles 2, 4, 6, etc.

Figure 31C:
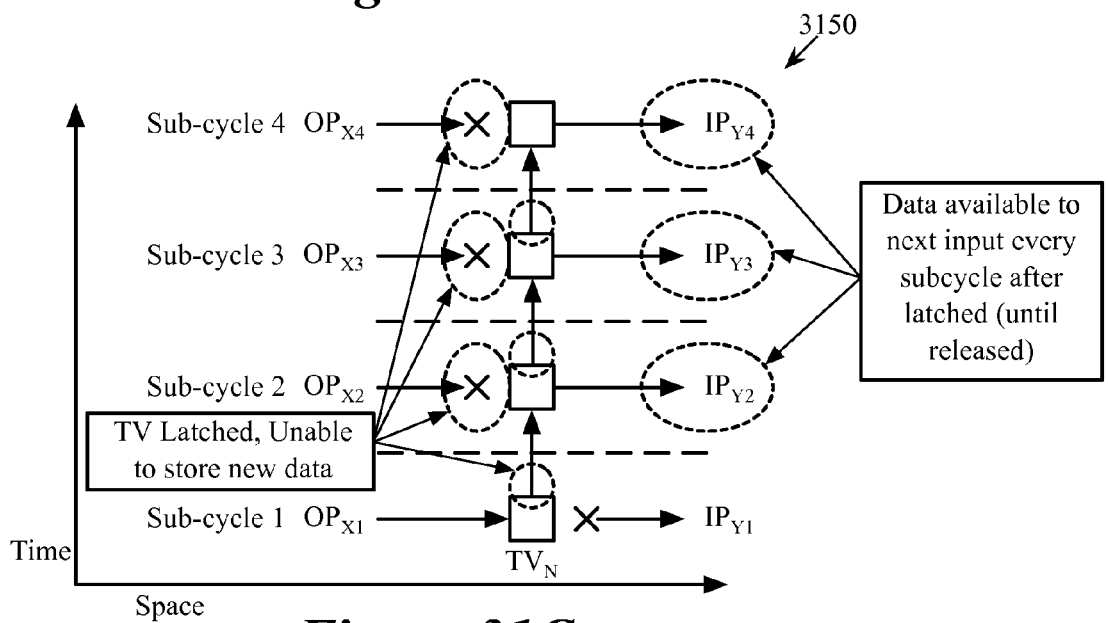
FIG. 31C illustrates the operation of the circuit from FIG. 31A where the output is latched for multiple reconfiguration cycles of some embodiments.

FIG. 31C illustrates the use of the storage element 3110 to hold and pass values for multiple-cycles. As shown in this example, a value is read and latched from $OP_X$ at sub-cycle 1. After the data is latched at sub-cycle 1, the storage element 3110 is unable to store new data during sub-cycles 2, 3, and 4. During sub-cycles 2, 3, and 4, the data stored by storage element 3110 is continuously available at $IP_Y$.

Figure 33:
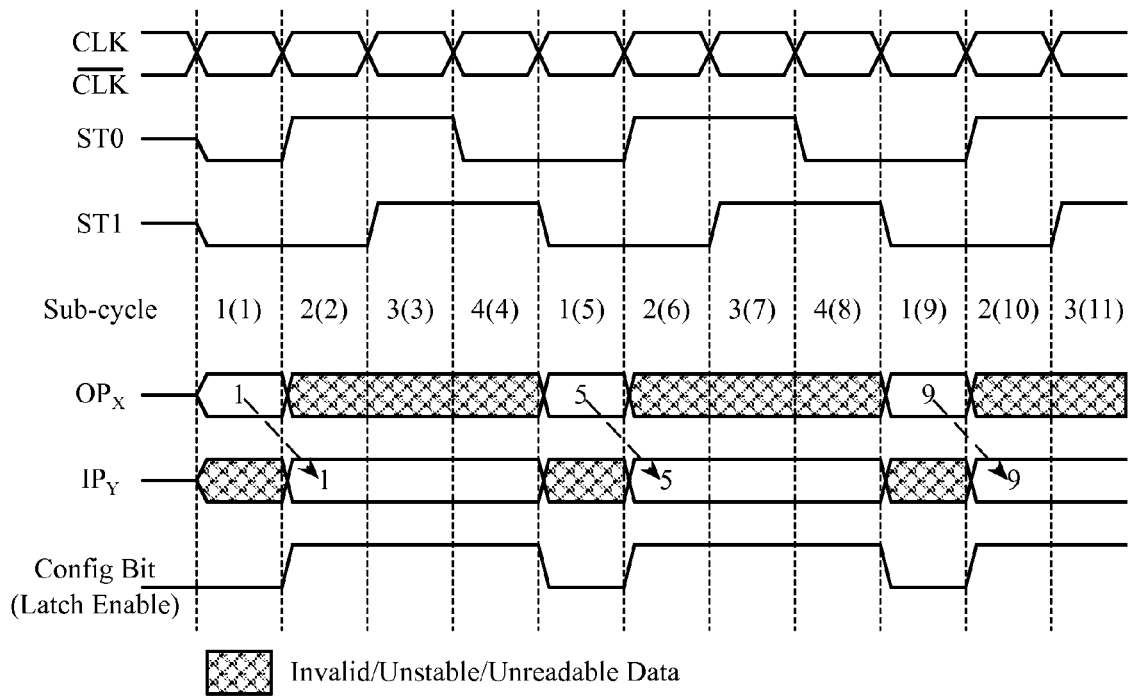
FIG. 33 illustrates the timing of the circuit from FIG. 31A under the operating conditions described by FIG. 31C of some embodiments.

FIG. 33 illustrates the operation of storage element 3110 through the use of a timing diagram. FIG. 33 corresponds to the example shown in FIG. 31C. During sub-cycle 1, the storage element 3110 is able to store data from $OP_X$. During this time, the output of storage element 3110 is unstable and not available to be read at $IP_Y$. During sub-cycles 2-4, the value stored during sub-cycle 1 is presented by the storage element 3110 to $IP_Y$, and the storage element is not able to read new data from $OP_X$. This timing is repeated every four sub-cycles, as shown. Thus, the value stored from $OP_X$ during sub-cycle 5 is available at $IP_Y$ during sub-cycles 6-8, etc.

Use of configurable transparent storage elements also allows operational time extension. In some embodiments, a circuit will not finish performing its operations within one sub-cycle. In these instances, a configurable transparent storage element may be used to hold the value at the input of the circuit for a subsequent sub-cycle so that the circuit can complete its operations. Operational time extension is further described in U.S. Pat. No. 7,496,879 and U.S. Pat. No. 8,166,435.

One of ordinary skill in the art will recognize that the two examples shown above are not exhaustive and are meant for illustrative purposes only. For instance, other implementations may have 8-loopered instead of 4-loopered schemes. Other embodiments will hold the data in the storage element 3110 for longer than 3 sub-cycles, etc.

Figure 34A:
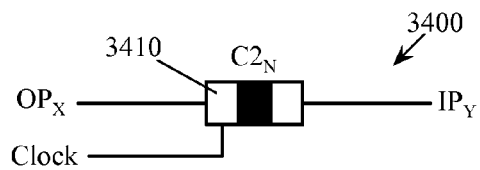
FIG. 34A illustrates a clocked storage element placed between a first circuit's output and a second circuit's input of some embodiments.

FIG. 34A illustrates one embodiment of a non-configurable, non-transparent (i.e., clocked) storage element 3410. In some embodiments, the storage element 3410 is the same element described by FIG. 29, element 2940. This storage element is said to be non-transparent because it requires a clock signal. This storage element 3410 is non-configurable because there is no configuration data passed to the storage element. In FIG. 34A, $OP_X$ represents the output of some upstream circuitry, for instance, the output of an R-MUX. The input of the storage element 3410 is driven by $OP_X$. Similarly, $IP_Y$ represents the input of some downstream circuitry that will be driven by the output of the storage element 3410. The downstream circuitry could be an R-MUX, an I-MUX, or any other element of the configurable IC.

Figure 34B:
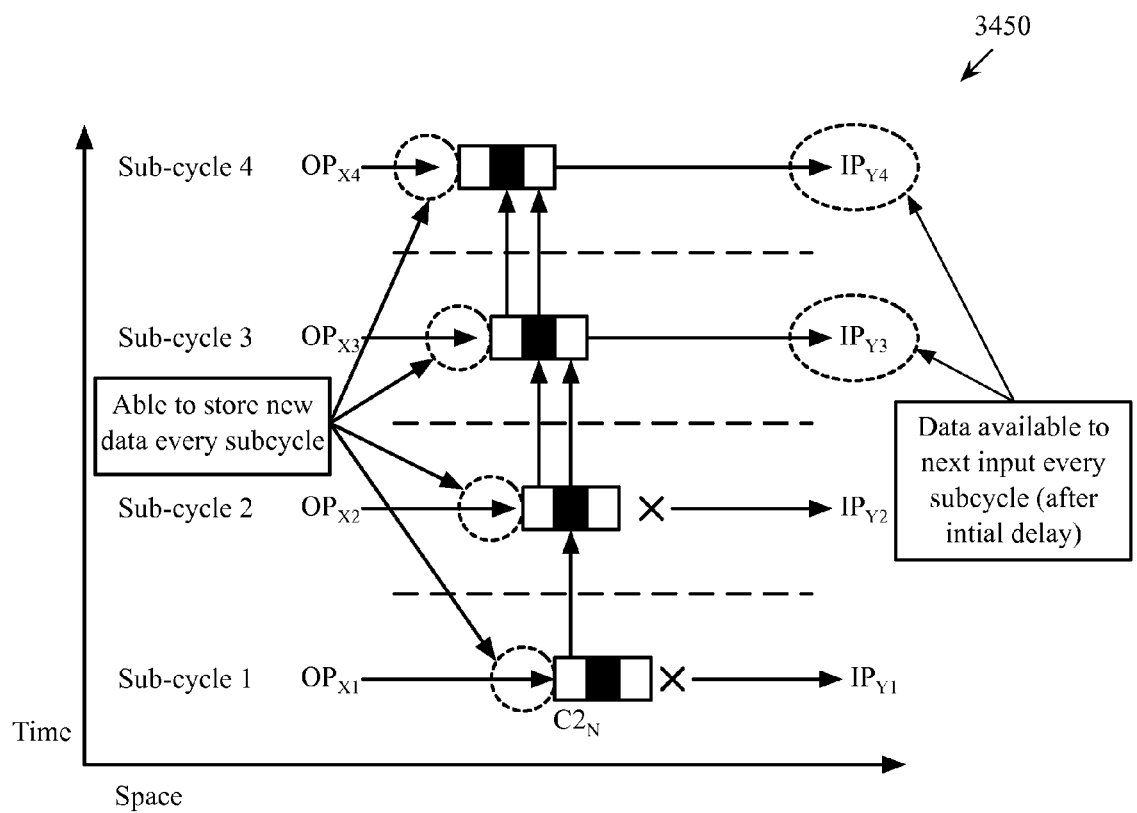
FIG. 34B illustrates the operation of the circuit from FIG. 34A of some embodiments.

As shown in FIG. 34B, the storage element 3410 is able to store data from $OP_X$ at every sub-cycle. After an initial delay (dependent on the number of flip flops in storage element 3410), the storage element 3410 is able to present its stored data to $IP_Y$ every sub-cycle. Unlike the storage element 3110 described above, storage element 3410 cannot hold a value at its output (i.e., at $IP_Y$) for more than one sub-cycle.

Figure 35:
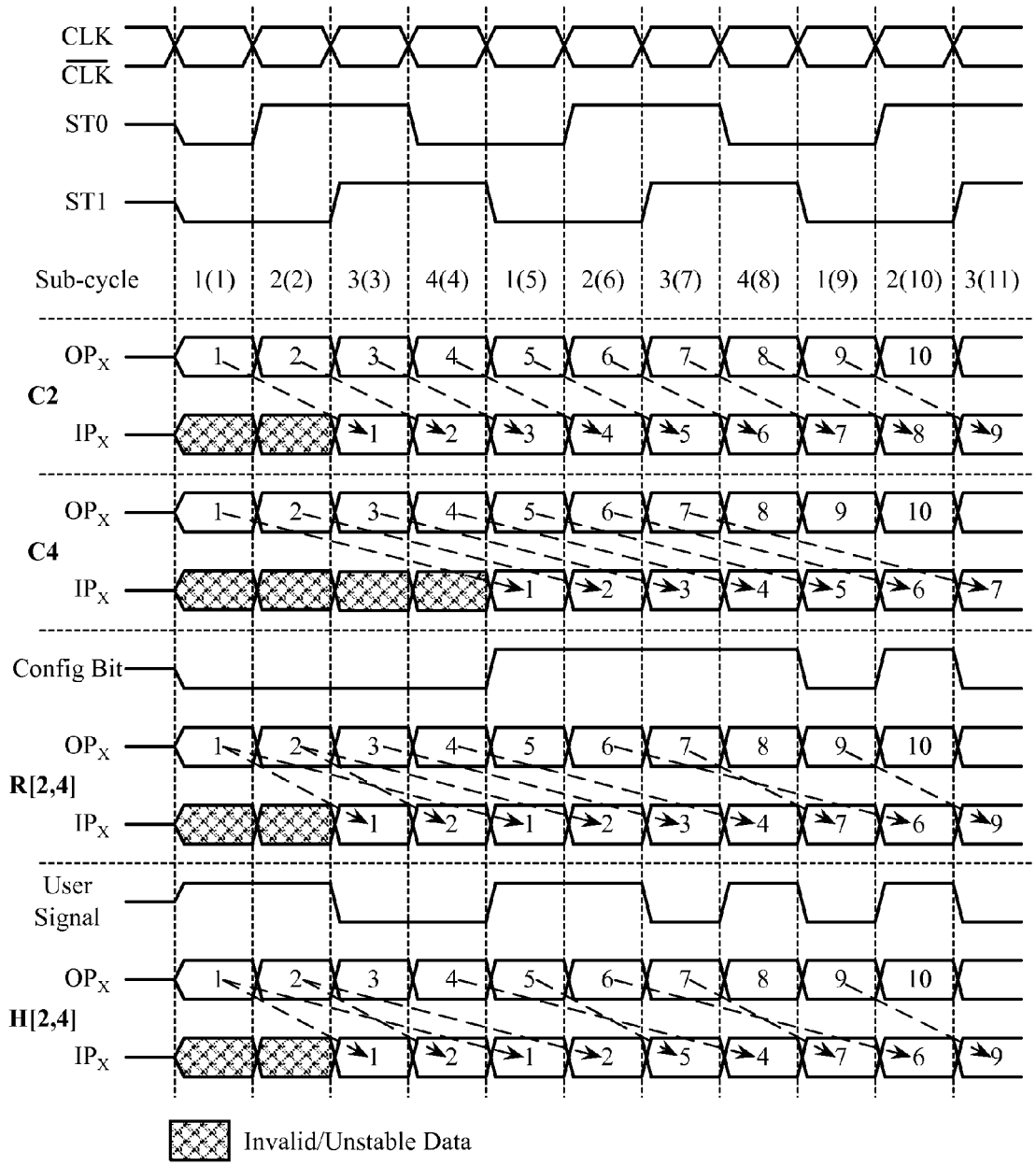
FIG. 35 illustrates the timing using different embodiments of the circuit from FIG. 34A of some embodiments.

FIG. 35 illustrates the operation of storage element 3410 through the use of a timing diagram. FIG. 35 corresponds to storage element 2940 (i.e., element C2) using the example shown in FIG. 34B. During sub-cycle 1, storage element 3410 stores the data presented to it at $OP_X$. During sub-cycle 2, storage element 3410 again stores the data presented to it at $OP_X$, while also internally shifting the data stored during sub-cycle 1. During sub-cycle 3, storage element 3410 again stores the data presented to it at $OP_X$, while also internally shifting the data stored during sub-cycle 2, and presenting the data stored during sub-cycle 1 at its output to $IP_Y$. The steps of sub-cycle 3 are then repeated in each subsequent sub-cycle. Thus, new data is stored, the data stored during the previous sub-cycle is shifted internally within storage element 3410, and the data stored two sub-cycles earlier is presented at the output of the storage element to $IP_Y$.

FIG. 35 also shows the operation of storage element 3410 when implemented as shown in FIG. 29, element 2950 (i.e., element C4). During sub-cycle 1, storage element 3410 stores the data presented to it at $OP_X$. During sub-cycle 2, storage element 3410 again stores the data presented to it at $OP_X$, while also internally shifting the data stored during sub-cycle 1. During sub-cycle 3, storage element 3410 again stores the data presented to it at $OP_X$, while also internally shifting the data stored during sub-cycles 1 and 2. During sub-cycle 4, storage element 3410 again stores the data presented to it at $OP_X$, while also internally shifting the data stored during sub-cycles 1, 2, and 3. During sub-cycle 5, storage element 3410 again stores the data presented to it at $OP_X$, internally shifts the data stored during sub-cycles 2, 3, and 4, and presents the data stored during sub-cycle 1 at its output to IPY. The steps of sub-cycle 5 are then repeated in each subsequent sub-cycle. Thus, new data is stored, the data stored during the previous 3 sub-cycles is internally shifted within storage element 3410, and the data stored four sub-cycles earlier is presented at the output of the storage element to $IP_Y$.

One of ordinary skill in the art will recognize that the examples given above are for illustrative purposes only. Other embodiments may include more or fewer flip-flops than the two and four flip-flop circuits described in relation to FIGS. 29 and 35.

Figure 36:
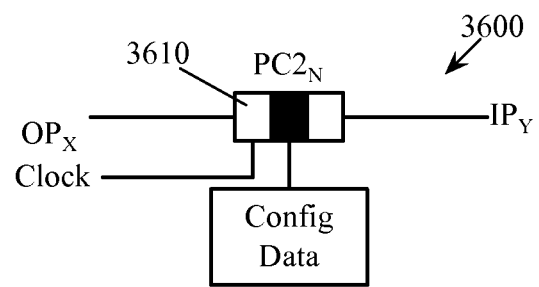
FIG. 36 illustrates a configurable clocked storage element placed between a first circuit's output and a second circuit's input of some embodiments.

FIG. 36 illustrates one embodiment of a configurable, non-transparent (i.e., clocked) storage element 3610. In some embodiments, the storage element 3610 is the same element described by FIG. 30, element 3000. This storage element is said to be non-transparent because it requires a clock signal. This storage element 3610 is also configurable because there is configuration data passed to the storage element. In FIG. 36, $OP_X$ represents the output of some upstream circuitry, for instance, the output of an R-MUX. The input of the storage element 3610 is driven by $OP_X$. Similarly, $IP_Y$ represents the input of some downstream circuitry that will be driven by the output of the storage element 3610. The downstream circuitry could be an R-MUX, an I-MUX, or any other element of the configurable IC.

Figure 37:
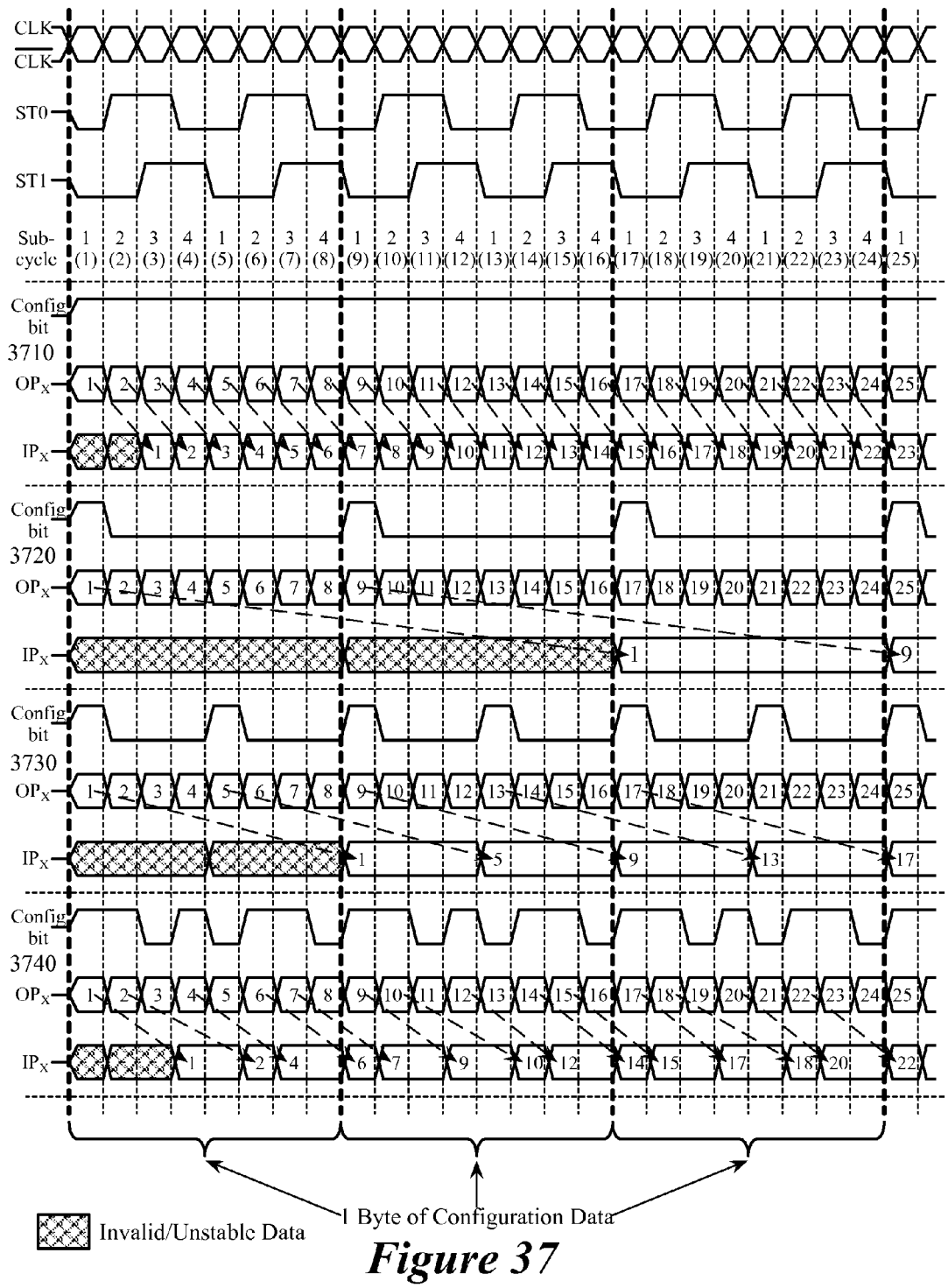
FIG. 37 illustrates the timing of the circuit from FIG. 36 using different configuration data of some embodiments.

FIG. 37 illustrates the operation of storage element 3610 through the use of a timing diagram. FIG. 37 shows timing signals 3710 that illustrate the operation of storage element 3000 (i.e., element P2) using the first example configuration data shown in FIG. 30 (i.e., configuration data is all 1s). Since the flip flop enable bit is always enabled, the storage element 3000 provides the same functionality as storage element 2940. During sub-cycle 1, storage element 3610 stores the data presented to it at $OP_X$. During sub-cycle 2, storage element 3610 again stores the data presented to it at $OP_X$, while also internally shifting the data stored during sub-cycle 1. During sub-cycle 3, storage element 3610 again stores the data presented to it at $OP_X$, while also internally shifting the data stored during sub-cycle 2, and presenting the data stored during sub-cycle 1 at its output to $IP_Y$. The steps of sub-cycle 3 are then repeated in each subsequent sub-cycle. Thus, new data is stored, the data stored during the previous sub-cycle is shifted internally within storage element 3610, and the data stored two sub-cycles earlier is presented at the output of the storage element to $IP_Y$.

FIG. 37 further shows timing signals 3720 that illustrate the operation of storage element 3000 (i.e., element P2) using the second example configuration data shown in FIG. 30 (i.e., configuration data is a 1 followed by all 0s). During sub-cycle 1, the enable signal is high (i.e., the flip flops 3030 are both enabled), and storage element 3610 stores the data presented to it at $OP_X$. During sub-cycles 2-8, the enable signal is low (i.e., the flip flops 3030 are not enabled) and the storage element 3610 does not store new data or internally pass data.

During sub-cycle 9, the enable bit is high, and storage element 3610 again stores the data presented to it at $OP_X$, while also internally shifting the data stored during sub-cycle 1. During sub-cycles 10-16, the enable signal is low (i.e., the flip flops 3030 are not enabled) and the storage element 3610 does not store new data or internally pass data.

During sub-cycle 17, the enable bit is high, and storage element 3610 again stores the data presented to it at $OP_X$, while also internally shifting the data stored during sub-cycle 9, and presenting the data stored during sub-cycle 1 at its output to $IP_Y$. The stored data from sub-cycle 1 is held at the output until sub-cycle 24. The steps of sub-cycle 17 are then repeated every eighth subsequent sub-cycle, while no data is stored or internally transferred during the intervening seven sub-cycles. Thus, new data is stored, the data stored during the previous enabled sub-cycle (i.e., eight sub-cycles earlier) is shifted internally within storage element 3610, and the data stored sixteen sub-cycles earlier is presented for eight sub-cycles at the output of the storage element to $IP_Y$.

FIG. 37 further shows timing signals 3730 that illustrate the operation of storage element 3000 (i.e., element P2) using the third example configuration data shown in FIG. 30 (i.e., configuration data is a 1 followed by three 0s followed by a 1 followed by three 0s). During sub-cycle 1, the enable signal is high (i.e., the flip flops 3030 are both enabled), and storage element 3610 stores the data presented to it at $OP_X$. During sub-cycles 2-4, the enable signal is low (i.e., the flip flops 3030 are not enabled) and the storage element 3610 does not store new data or internally pass data.

During sub-cycle 5, the enable bit is high, and storage element 3610 again stores the data presented to it at $OP_X$, while also internally shifting the data stored during sub-cycle 1. During sub-cycles 6-8, the enable signal is low (i.e., the flip flops 3030 are not enabled) and the storage element 3610 does not store new data or internally pass data.

During sub-cycle 9, the enable bit is high, and storage element 3610 again stores the data presented to it at $OP_X$, while also internally shifting the data stored during sub-cycle 5, and presenting the data stored during sub-cycle 1 at its output to $IP_Y$. The stored data from sub-cycle 1 is held at the output until sub-cycle 12. The steps of sub-cycle 9 are then repeated every fourth subsequent sub-cycle, while no data is stored or internally transferred during the intervening 3 sub-cycles. Thus, new data is stored, the data stored during the previous enabled sub-cycle (i.e., four sub-cycles earlier) is shifted internally within storage element 3610, and the data stored eight sub-cycles earlier is presented for four sub-cycles at the output of the storage element to $IP_Y$.

FIG. 37 further shows timing signals 3740 that illustrate the operation of storage element 3000 (i.e., element P2) using another example set of configuration data. As shown, when the enable signal is active (i.e., high), storage element 3000 stores the data at its input, internally passes data (if available) and presents the data at its output. When the enable signal is inactive (i.e., low), storage element 3000 does not store the data at its input, does not internally pass data, and hold the value that was presented at its output during the previous sub-cycle.

One of ordinary skill in the art will recognize that the examples given above are for illustrative purposes only. Other embodiments may include more or fewer flip-flops than the two flip-flop circuit described in relation to FIGS. 30 and 37. Other embodiments may also use more or fewer configuration bits, or be implemented in a 4-loopered scheme, etc.

C. Clocked Storage Elements in Parallel Distributed Path

In some embodiments, clocked storage elements (i.e., conduits or flip-flops), rather than latches, perform some of the storing operations in the routing fabric. For some of these embodiments, FIG. 38 illustrates an example routing fabric section (or a routing circuit) 3800 for some embodiments that performs routing and storage operations by parallel paths that includes a clocked storage element. The routing fabric section 3800 distributes an output signal of a source circuit 3810 through a parallel path to inputs of a 2:1 output multiplexer 3820. The output multiplexer 3820 in turn feeds one or more destination circuits (not illustrated) in the routing fabric (e.g., RMUX) and/or in the configurable tiles (e.g., LUTs). The parallel path includes a first path 3850 and a second path 3860. The source circuit 3810 can be an input-select circuit for a logic circuit, a routing multiplexer (RMUX), or some other type of circuit.

The first path 3850 passes the output of the source circuit 3810 through a clocked storage element (i.e., conduit) 3830, where the output will be stored every clock cycle (or sub-cycle, configuration cycle, reconfiguration cycle, etc.) before reaching a first input of the output multiplexer 3820. In some embodiments, the connection between the source circuit 3810 and the conduit 3830 and the connection between the conduit 3830 and the output multiplexer 3820 are direct connections.

The second parallel path 3860 runs in parallel with the first path 3850 and passes the output of the source circuit 3810 directly to a second input of the output multiplexer 3820. In some embodiments, the connection between the source circuit 3810 and the output multiplexer 3820 is a direct connection.

A clock signal controls the conduit 3830. A configuration bit 3840 controlling the 2:1 output multiplexer 3820 that selects from either the first path 3850 or the second path 3860 as the output of the routing fabric section 3800. The source circuit 3810 receives its configuration data through a configuration retrieval path 3870. The output multiplexer 3820 receives the configuration bit 3840 through a configuration retrieval path 3875.

The routing fabric section or the routing circuit 3800 is transparent when the second path 3860 (the direct connection path) is selected. This enables time borrowing by allowing signals to travel longer distance at slower clock rates. The routing fabric section 3800 behaves like a conduit when the first parallel path 3850 (the conduit path) is selected. In some embodiments, the parallel paths 3850, 3860 and the output 2:1 multiplexer are jointly referred to as a KMUX in some embodiments.

In some embodiments, the routing fabric section 3800 includes a feedback path (not shown) that sends the output of the output multiplexer 3800 back as one of the inputs of the source circuit 3810 (which can be a routing multiplexer RMUX). By selecting this feedback path after receiving a value from the source circuit 3810, the routing circuit 3800 forms a latch that can be used to hold the received value for multiple sub-cycles. In some embodiments, such a latch formed by the feedback path is also used to prevent bit flickering. In some embodiments, the routing fabric section 3800 does not hold a value for multiple clock cycles or sub-cycles.

The output multiplexer 3820 is illustrated as a 2:1 multiplexer requiring only one configuration bit. However, in some embodiments, the output multiplexer 3820 receives two or more configuration bits for selecting from among three or more paths.

In some embodiments, the configuration data 3840 comes at least partly from configuration data storage of the IC. In addition, the operation of the source circuit 3810 is also controlled by configuration signals derived at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 3810 and 3820 during different clock cycles. These different clock cycles might be different user design clock cycles, or different sub-cycles of a user design clock cycle or some other clock cycle. In other words, the circuits 3810 and 3820 can be reconfigured to perform a different operation in every clock cycle of a set (e.g., 3 or more) of consecutive clock cycles.

Figure 39:
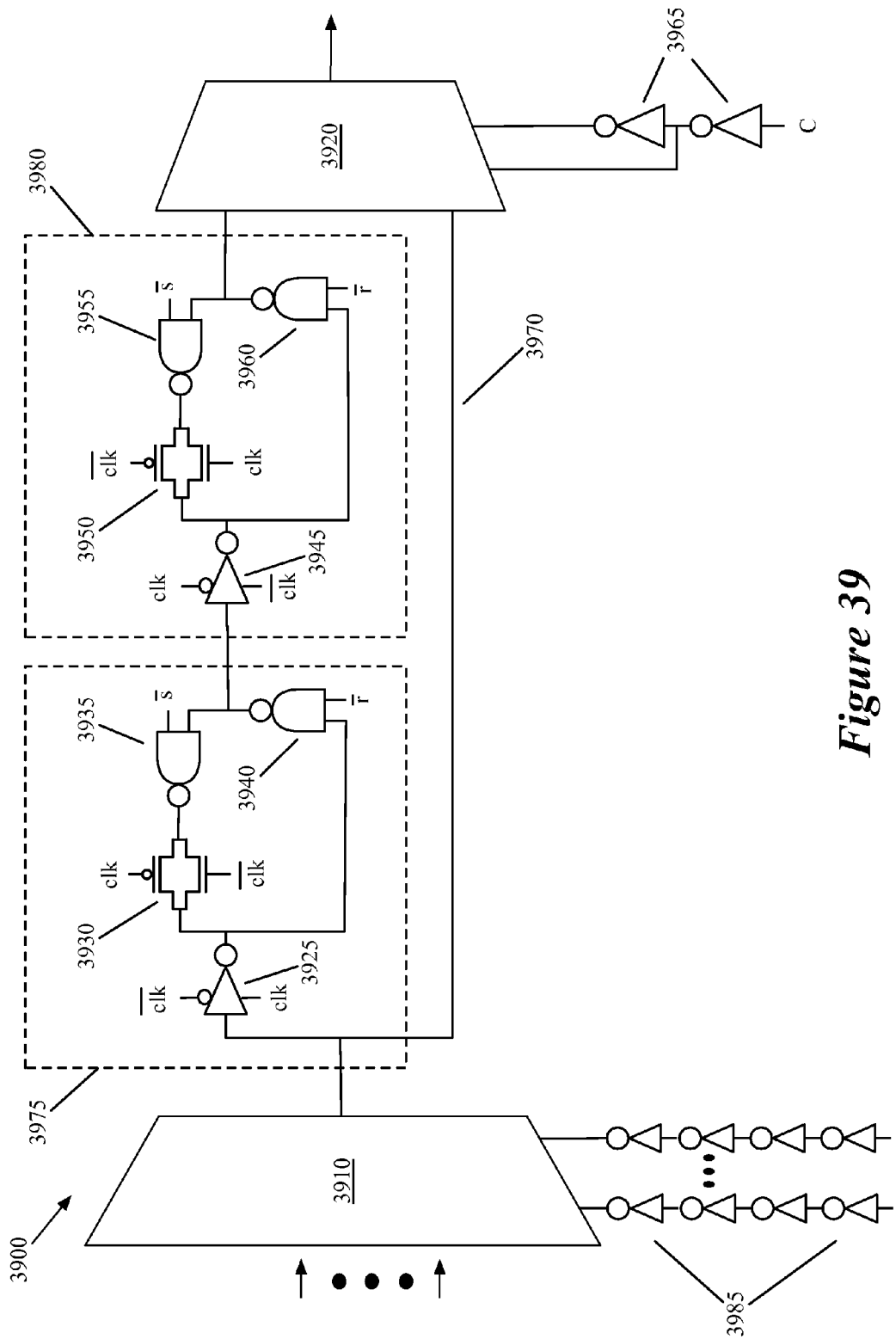
FIG. 39 illustrates an example implementation for the circuit of FIG. 38.

For some embodiments, FIG. 39 illustrates a circuit 3900 that is an example implementation of the routing fabric section 3800 of FIG. 38. As shown in this figure, the circuit 3900 includes a source circuit 3910, a 2:1 output multiplexer 3920, a direct connection 3970 and latches 3975 and 3980, and a delay chain 3985. The latch 3975 includes a tri-state inverters 3925 and 3945, a first transmission gate 3930, a first pair of NAND gates 3935 and 3940. The latch 3980 includes a second transmission gate 3950, a second pair of NAND gates 3955 and 3960, and an inverter pair 3965.

The source circuit 3910 acts as the source of data to the direct connection 3970 and the latch 3975 and provides the input to the rest of the circuit 3900. The source circuit can be a RMUX, a LUT, or some other types of circuit.

The latches 3975 and 3980 are connected in series to form a master-slave flip-flop that corresponds to the conduit 3830 in FIG. 38. In the latch 3975, the tri-state inverter 3925 drives the output of source circuit 3910 to one of the inputs of NAND gate 3940, which in turn drives it to NAND gate 3935. The NAND gate 3940 has another input that is driven by an active low set signal, while the NAND gate 3935 has another input that is driven by an active low reset signal. The NAND gate 3935 in turn drives the transmission gate 3930. The output of transmission gate 3930 shares the same wire as the output of tri-state inverter 3925 to form an input of the NAND gate 3940.

The transmission gate 3930 is enabled by the negative clock signal. When the clock signal is low, the transmission gate 3930 conducts current. When the clock signal is high, the transmission gate 3930 is in a high impedance state, effectively removing the output from the transmission gate 3930. The positive value of clock signal controls tri-state inverter 3925. When the clock signal is high, the tri-state inverter 3925 is turned on. When the clock signal is low, the tri-state inverter 3925 is turned off.

Because the negative value of clock signal enables the transmission gate 3930 while the positive value of clock signal enables tri-state inverter 3925, the transmission gate 3930 and the tri-state inverter 3925 will not conduct current at the same time. So there will not be any short circuit even though their outputs share the same wire.

When the set and reset signals are both high (i.e., de-asserted, since set and reset are both active low signals in this example), whatever value comes in as input of NAND gate 3940 will reach the input of transmission gate 3930. So for the latch 3975 to function normally (i.e., storing or passing signals from source to destination), the set and reset signals must remain high (i.e., inactive).

In the latch 3980, the tri-state inverter 3945 drives the output of NAND gate 3940 to one of the inputs of NAND gate 3960, which in turn drives it to NAND gate 3955. The NAND gate 3955 has another input that is driven by an active-low set signal, while the NAND gate 3960 has another input that is driven by an active-low reset signal. The NAND gate 3955 in turn drives the transmission gate 3950. The output of transmission gate 3950 shares the same wire as the output of tri-state inverter 3945 to form an input of the NAND gate 3960.

The transmission gate 3950 is enabled by the positive value of clock signal. When the clock signal is high, the transmission gate 3950 conducts current. When the clock signal is low, the transmission gate 3950 is in a high impedance state, effectively removing the output from the transmission gate 3950. The negative value of clock signal controls tri-state inverter 3945. When the clock signal is low, the tri-state inverter 3945 is turned on (i.e., conducts current). When the clock signal is high, the tri-state inverter 3945 is turned off.

Because the positive value of the clock signal enables the transmission gate 3950 while the negative value of the clock signal enables tri-state inverter 3945, the transmission gate 3950 and the tri-state inverter 3945 will not conduct current at the same time. So there will not be any short circuit even though their outputs share the same wire.

When the set and reset signals are both high, whatever value comes in as input of NAND gate 3960 will reach the input of transmission gate 3950. So for the latch 3980 to function normally, the set and reset signals must remain high.

When the clock signal is changed to high, the tri-state inverter 3925 is enabled while the transmission gate 3930 is disabled. At the same time, the tri-state inverter 3945 is disabled while the transmission gate 3950 is enabled. As a result, the current output of source circuit 3910 passes transparently through the circuit section 3975 but stops at the tri-state inverter 3945.

When the clock signal is changed from high to low, the tri-state inverter 3925 is disabled while the transmission gate 3930 is enabled. At the same time, the tri-state inverter 3945 is enabled while the transmission gate 3950 is disabled. As a result, the first latch 3975 stores the output value of the source circuit 3910 when the clock signal transitions from high to low, while the second latch 3980 passes the value stored by the first latch transparently to an input of the output multiplexer 3920.

When the clock signal returns to high, the tri-state inverter 3925 is enabled while the transmission gate 3930 is disabled. At the same time, the tri-state inverter 3945 is disabled while the transmission gate 3950 is enabled. As a result, the current output of the source circuit 3910 passes transparently through the circuit section 3975 and stops at the tri-state inverter 3945. The value previously stored in the first latch 3975 is now stored in the second latch 3980 and continue to drive one input of the output multiplexer 3920.

The output multiplexer 3920 is a 2:1 multiplexer. A configuration signal C is supplied by the inverter pair 3965 and controls the output of the output multiplexer 3920. The output of 3920 is either the current output of source circuit 3910 passed directly through the direct connection 3970, or the output of source circuit 3910 at the previous clock cycle stored in the master-slave flip flop described in sections 3975 and 3980.

In some ICs, the rising edge of the clock signal is slower than its falling edge. For those ICs, closing the latch 3975 or 3980 on the rising edge of clock signal will cause a hold time violation because the output of the source circuit 3910 would have already changed before the rising edge of clock signal. Unfortunately, at any given time, one of the latches in sections 3975 and 3980 will close on the rising edge of clock signal. In order to mitigate the potential hold time violation, a delay chain (e.g., one that includes one or more inverters) is inserted in some embodiments into the data path between the output of the source circuit 3910 and the input to tri-state inverter 3925. In some embodiments, instead of inserting a delay chain into the data path following the output of the source circuit 3910, a delay chain 3985 is inserted into the configuration retrieval circuitry of the source circuit 3910.

It will be evident to one of ordinary skill in the art that the various components and functionality of FIG. 39 may be implemented differently without diverging from the essence of the invention. For example, other implementations of conduit may replace the implementation of master-slave flip-flop in sections 3975 and 3980 with another type of flip-flop.

Figure 40:
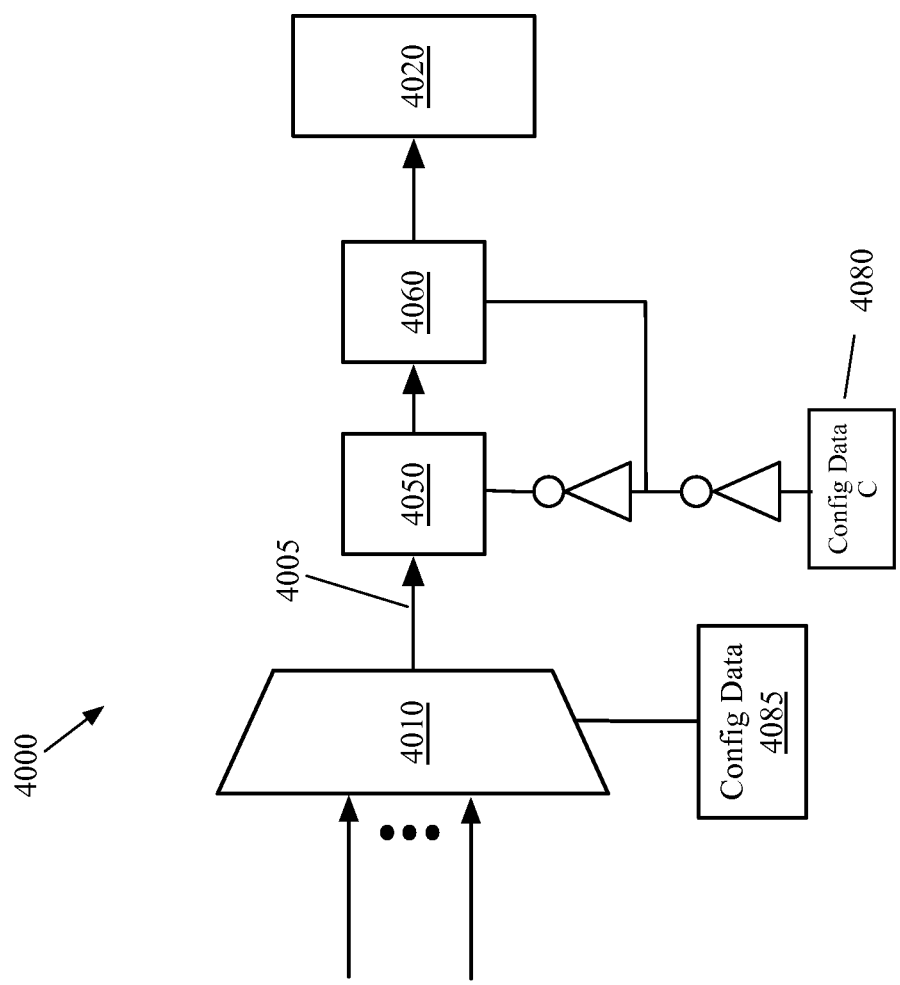
FIG. 40 illustrates a routing fabric section that includes a pair of configurable master-slave latches as its clocked storage.

In some embodiments, the clocked storage element in the KMUX is implemented by a pair of configurable master-slave latches. In some of these embodiments, the 2:1 output multiplexer (such as 3820) as well as the direct connection (such as 3860) connecting the source multiplexer with the output multiplexer are not needed. FIG. 40 illustrates such an alternative embodiments of the KMUX.

FIG. 40 illustrates a routing fabric section 4000 that includes a pair of configurable master-slave latches 4050 and 4060 as its clocked storage. The routing fabric section 4000 distributes an output signal of a source circuit 4010 through a path 4005 to a destination circuit 4020. The source circuit 4010 can be an input-select circuit for a logic circuit, a routing multiplexer (RMUX), or some other type of circuit. The path 4005 includes the first (master) latch 4050 and the second (slave) latch 4060. The operations of the latches 4050 and 4060 are controlled by a configuration signal C from configuration data 4080. The source circuit 4010 is controlled configuration signal from a configuration data 4085.

The routing fabric section 4000 performs the same functionality as the routing fabric section 3800 described above by reference to FIG. 38. However, as illustrated in this figure, the configuration signal C has been moved to control the latches 4050 and 4060. When the configuration signal C is set to one value, the latches 4050 and 4060 act as a master-slave flip-flop and are controlled by a clock signal. When the configuration signal C is switched to another value, the output signal of the source circuit 4010 passes transparently through the latches 4050 and 4060. As a result, there is no need to have a separate transparent or bypass wire for the routing fabric section 4000 in order to provide a transparent path from the source circuit 4010 to the destination circuit 4020. In addition, the routing fabric section 4000 does not need a destination multiplexer to select between two output paths, thus removes the delay caused by the multiplexer. In some embodiments, the master-slave latches 4050 and 4060 are jointly referred to as a KMUX.

In some embodiments, the configuration data controlling the source circuit 4010 as well as the latches 4050 and 4060 comes at least partly from a configuration data storage of the IC (such as the configuration data storage 4080 and 4085). In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the circuits 4010, 4050, and 4060 during different clock cycles. These different clock cycles might be different user design clock cycles, or different sub-cycles of a user design clock cycle or some other clock cycle. In other words, the circuits 4010, 4050, and 4060 can be reconfigured to perform a different operation in every clock cycle of a set (e.g., 3 or more) of consecutive clock cycles.

Figure 41:
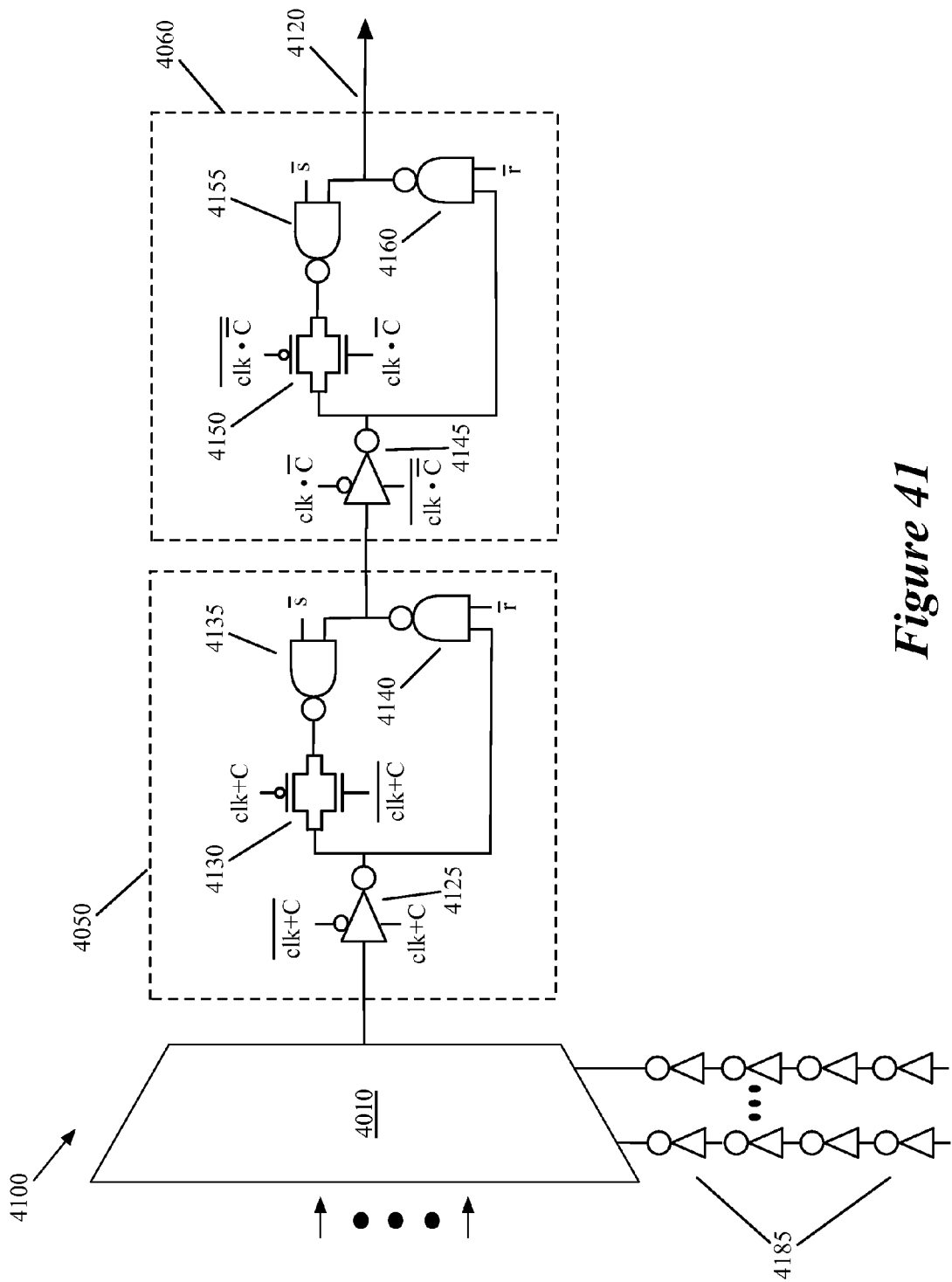
FIG. 41 illustrates an example implementation of the circuit of FIG. 40.

For some embodiments, FIG. 41 illustrates an example implementation of the routing fabric section 4000 of FIG. 40. As shown in this figure, the circuit 4100 includes the source circuit 4010, a delay chain 4185, and the master latch 4050 and the slave latch 4060. The master latch 4050 includes a tri-state inverter 4125, a first transmission gate 4130, a first pair of NAND gates 4135 and 4140. The slave latch 4060 includes a tri-state inverter 4145, a second transmission gate 4150, and a second pair of NAND gates 4155 and 4160.

The latches 4050 and 4060 are two latches connected in series to form a master-slave flip flop that perform similar function as the conduit 3830 in FIG. 38. In master latch 4050, the tri-state inverter 4125 drives the output of the source circuit 4010 to one of the inputs of NAND gate 4140, which in turn drives it to NAND gate 4135. The NAND gate 4140 has another input that is driven by an active low set signal, while the NAND gate 4135 has another input that is driven by an active low reset signal. The NAND gate 4135 in turn drives the transmission gate 4130. The output of transmission gate 4130 shares the same wire as the output of tri-state inverter 4125 to form an input of the NAND gate 4140.

The transmission gate 4130 is enabled by the negative value of clk+C, where clk is the clock signal and C is a configuration signal. When both the clock signal and the configuration signal C are low, the transmission gate 4130 conducts current. When the clock signal is high, the transmission gate 4130 is in a high impedance state, effectively removing the output from the transmission gate 4130. The positive value of clk+C controls tri-state inverter 4125. When the clock signal is high, the tri-state inverter 4125 is turned on. When both the clock signal and the configuration signal C are low, the tri-state inverter 4125 is turned off.

Because the negative value of clk+C enables the transmission gate 4130 and the positive value of clk+C enables tri-state inverter 4125, the transmission gate 4130 and the tri-state inverter 4125 will not conduct current at the same time. So there will not be any short circuit even though their outputs share the same wire.

When the set and reset signals are both high (i.e., deasserted, since set and reset are both active low signals in this example), whatever value comes in as input of NAND gate 4140 will reach the input of transmission gate 4130. So for the latch 4050 to function normally (i.e., storing or passing signals from source to the output 4120 of the circuit 4100), the set and reset signals must remain high (i.e., inactive).

In the slave latch 4060, the tri-state inverter 4145 drives the output of NAND gate 4140 to one of the inputs of NAND gate 4160, which in turn drives it to NAND gate 4155. The NAND gate 4155 has another input that is driven by an active-low set signal, while the NAND gate 4160 has another input that is driven by an active-low reset signal. The NAND gate 4155 in turn drives the transmission gate 4150. The output of transmission gate 4150 shares the same wire as the output of tri-state inverter 4145 to form an input of the NAND gate 4160.

The transmission gate 4150 is enabled by the positive value of clk·$\overline{C}$. When the clock signal is high and the configuration signal C is low, the transmission gate 4150 conducts current. When the clock signal is low, the transmission gate 4150 is in high impedance state, effectively removing the output from the transmission gate 4150. The negative value of clk·$\overline{C}$ controls tri-state inverter 4145. When the clock signal is low, the tri-state inverter 4145 is turned on (i.e., conducts current). When the clock signal is high and the configuration signal C is low, the tri-state inverter 4145 is turned off.

Because the positive value of clk·$\overline{C}$ enables the transmission gate 4150 while the negative value of clk·$\overline{C}$ enables tri-state inverter 4145, the transmission gate 4150 and the tri-state inverter 4145 will not conduct current at the same time. So there will not be any short circuit even though their outputs share the same wire.

When the set and reset signals are both high, whatever value comes in as input of NAND gate 4160 will reach the input of transmission gate 4150. So for the latch 4060 to function normally, the set and reset signals must remain high.

When the configuration signal C is low and the clock signal is changed to high, the tri-state inverter 4125 is enabled while the transmission gate 4130 is disabled. At the same time, the tri-state inverter 4145 is disabled while the transmission gate 4150 is enabled. As a result, the current output of source circuit 4010 passes transparently through the circuit section 4050 but stops at the tri-state inverter 4145.

When the configuration signal C is low and the clock signal is changed from high to low, the tri-state inverter 4125 is disabled while the transmission gate 4130 is enabled. At the same time, the tri-state inverter 4145 is enabled while the transmission gate 4150 is disabled. As a result, the first latch 4050 stores the output value of the source circuit 4010 when the clock signal transitions from high to low, while the second latch 4060 passes the value stored by the first latch transparently to output 4120 of the circuit 4100.

When the configuration signal C is low and the clock signal returns to high, the tri-state inverter 4125 is enabled while the transmission gate 4130 is disabled. At the same time, the tri-state inverter 4145 is disabled while the transmission gate 4150 is enabled. As a result, the current output of source circuit 4010 passes transparently through the first latch 4050 and stops at the tri-state inverter 4145. The value previously stored in the first latch 4050 is now stored in the second latch 4060 and provided as the output 4120 of the circuit 4100.

When the configuration signal C is high, the transmission gates 4130 and 4150 are disabled and the tri-state inverters 4125 and 4145 are turned on. As a result, the current output of source circuit 4010 passes transparently through the circuit sections 4050 and 4060 to reach the output 4120 of the circuit 4100. The configuration signal C controls the behavior of the circuit 4100. The output 4120 of the circuit 4100 is either the current output of source circuit 4010 passed transparently through the circuit sections 4050 and 4060 when the configuration signal C is high, or the output of the source circuit 4010 at the previous clock cycle stored in the master-slave flip flop described in sections 4050 and 4060 when the configuration signal C is low.

In some ICs, the rising edge of the clock signal is slower than its falling edge. For those ICs, closing the latch 4050 or 4060 on the rising edge of clock signal will cause a hold time violation because the output of the source circuit 4010 would have already changed before the rising edge of clock signal.

Unfortunately, at any given time, one of the latches in sections 4050 and 4060 will close on the rising edge of clock signal. In order to mitigate the potential hold time violation, a delay chain (e.g., one that includes one or more inverters) is inserted in some embodiments into the data path between the output of source circuit 4010 and the input to tri-state inverter 4125. In some embodiments, instead of inserting a delay chain into the data path following the output of the source circuit 4010, a delay chain 4185 is inserted into the configuration retrieval circuitry of source circuit 4010.

Figure 42:
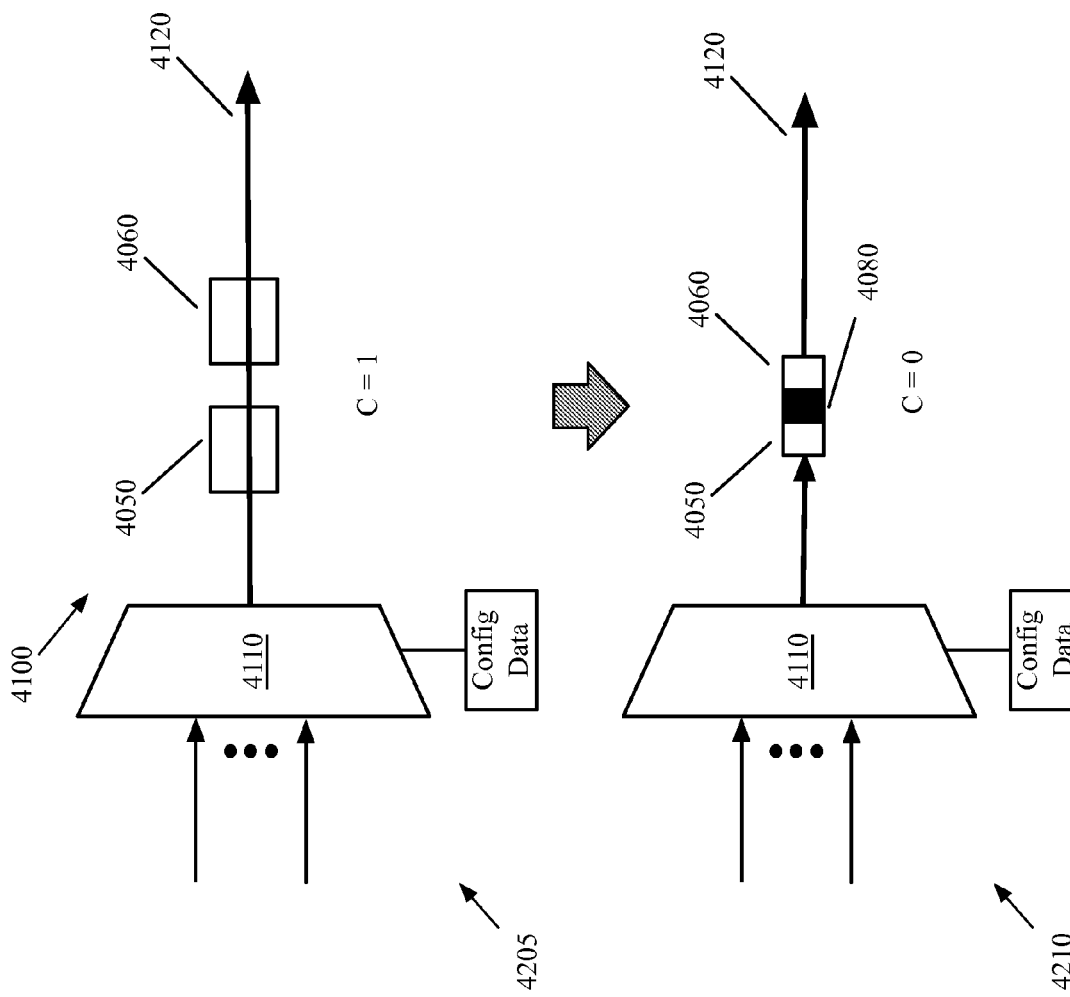
FIG. 42 conceptually illustrates the operations of the circuit of FIG. 41 based on the value of configuration signal.

FIG. 42 conceptually illustrates the operations of the circuit 4100 based on the value of the configuration signal C. Specifically, this figure illustrates in two operational stages 4205 and 4210 how different values of configuration signal C affect the behavior of the circuit 4100. In this example, the circuit 4100 is the same one described above by reference to FIG. 41. As shown in this figure, the circuit 4100 includes a source circuit 4110 and the two latches 4050 and 4060.

In the first stage 4205, the configuration signal C is high. As a result, the latches 4050 and 4060 pass the output of the source circuit 4110 transparently to the output 4120 of the circuit 4100. In the second stage 4210, the configuration signal C is low. Consequently, the latches 4050 and 4060 act as a master-slave flip flop 4080 (i.e., a conduit). Thus the output of source circuit 4110 received at the previous clock cycle is stored in the mater-slave flip flop 4080 and is provided as the output 4120 of the circuit 4100.

The configuration signal C can be used to change the behavior of the circuit 4100 based on design needs. If a transparent connection is desirable, the configuration signal C will be set to high. This enables time borrowing by allowing signals to travel longer distance at slower clock rates. If a conduit is desirable, the configuration signal C will be set to low to turn the circuit 4100 into a master-slave flip flop. The circuit 4100 performs essentially the same functionality as the routing fabric section 3900 described above by reference to FIG. 39. However, the circuit 4100 does not include an output multiplexer, thus removing delay caused by the output multiplexer 3920 at the output of the routing fabric section 3900.

The operations of various types of interconnect circuits (e.g., RMUXs) and storage circuits (e.g., conduits and KMUXs) discussed above by reference by FIGS. 39-42 are determined by configuration data or configuration bits. In some embodiments, the configuration data or configuration bits come at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the storage elements, source circuits, and output multiplexers during differing clock cycles. These differing clock cycles might be different user design clock cycles, or different sub-cycles of a user design clock cycle or some other clock cycle.

D. Time Borrowing

The technique of completing an operation of a longer computational path by borrowing time from an adjacent or neighboring shorter computational path is called time-borrowing. The longer computational path can complete its operation by a particular clock cycle as if it is able to start its computation at an earlier clock cycle. One way this can be done is if the longer computational path is able to receive its required input from the adjacent or neighboring shorter computational path before the start of the current clock cycle. This cannot be done if the storage element storing and supplying the required input from the adjacent shorter computational path is a conventional clocked storage element. Such a conventional clocked storage element is incapable of making the required input available to the longer computational path ahead of time.

Unlike a conventional clocked storage element, a configurable clocked storage element, i.e., KMUX as described above by reference to FIGS. 38-42 can support time borrowing. This is so because a KMUX can be configured in each clock cycle to either serve as a conduit or a transparent data passage, thereby allowing the longer computational path to receive its required input from the adjacent shorter computational path before the start of the current clock cycle.

Figure 43:
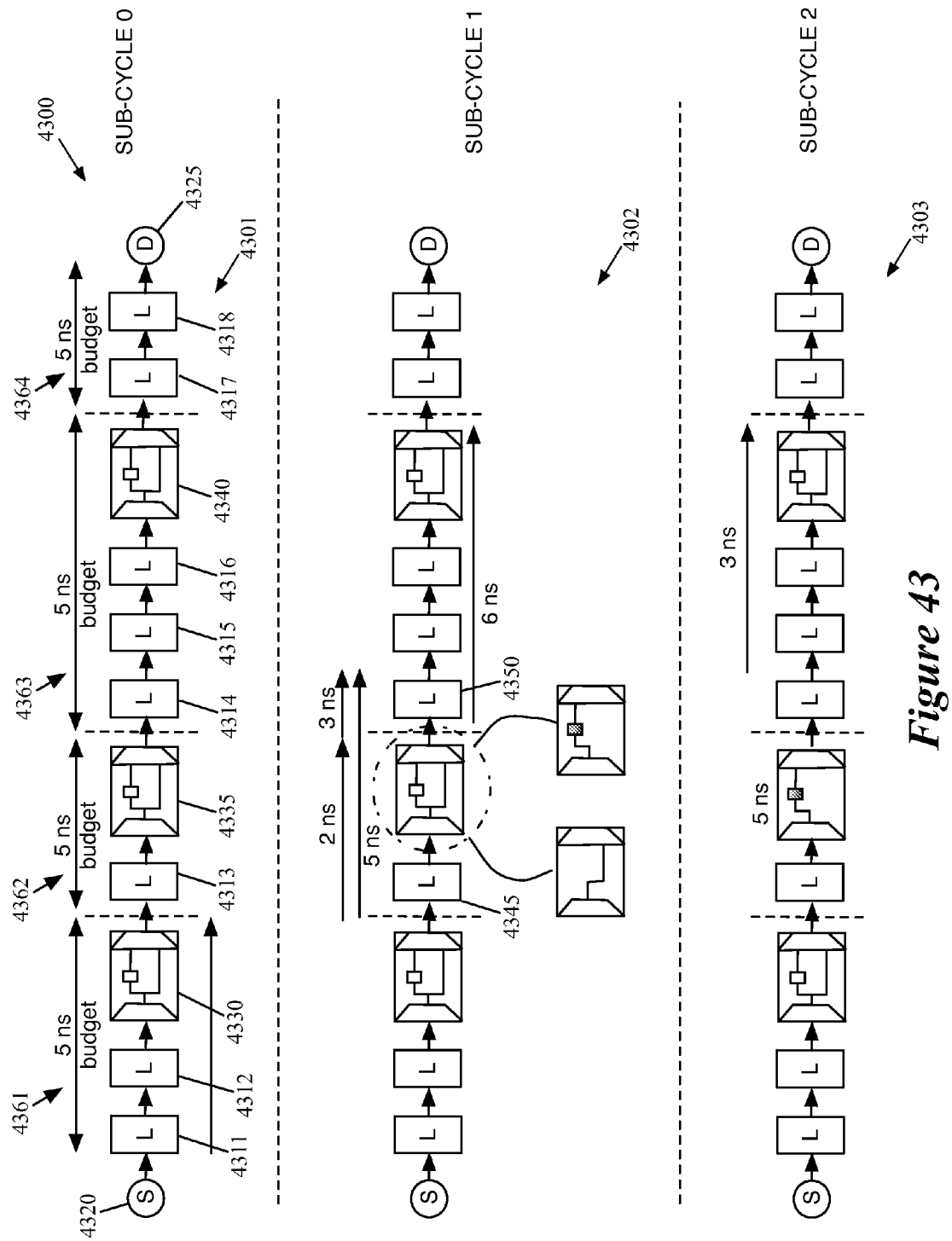
FIG. 43 illustrates an example of using KMUX to implement time borrowing.

FIG. 43 illustrates an example of using KMUX to implement time borrowing in three operational stages 4301-4303. The three operational stages correspond to three consecutive sub-cycles from sub-cycle 0 to sub-cycle 2. The figure illustrates a data path 4300 between a source circuit 4320 and a destination circuit 4325. The data path includes eight computational or logic elements 4311-4318 and three storage elements 4330, 4335, and 4340. The three storage elements 4330, 4335, and 4340 are KMUXs that can be configured in each sub-cycle to either serve as a conduit or a transparent data passage.

The three KMUXs 4330, 4335, and 4340 divide the data path 4300 into four computational paths 4361-4364. The first computational path 4361 starts at the source circuit 4320 and ends at the KMUX 4330 while including the logic elements 4311 and 4312. The second computational path 4362 starts at the KMUX 4330 and ends at the KMUX 4335 while including the logic elements 4313. The third computational path 4363 starts at the KMUX 4335 and ends at the KMUX 4340 while including the logic elements 4314-4316. The fourth computational path 4364 starts at the KMUX 4340 and ends at the destination circuit 4325 while including the logic elements 4317-4318. The computational path 4361 is therefore adjacent to the computation path 4362, and the computation path 4362 is adjacent to the computation path 4363, etc. Either or both source circuit 4320 and destination circuit 4325 are storage elements.

In the example of FIG. 43, the clock signal used to operate the storage elements (i.e., KMUXs) in the path 4300 is a sub-cycle clocks with a period of 5 ns. In other words, a computation path between two storage element has a 5 ns budget to complete its operation. A particular computation that exceeds its 5 ns budget within a given sub-cycle will not yield correct computational result unless it is able to borrow time from an adjacent computational path. Some embodiments therefore configure the KMUX feeding the particular computation path to operate as a transparent data passage to allow time borrowing from the adjacent computational path.

Time borrowing operation will now be described by reference to the three stages 4301-4303. At the first stage 4301 (sub-cycle 0), the logic elements 4311 and 4312 in the first computational path 4361 is performing a computation that is within its budget of 5 ns. The result of this computation will be successfully stored by the KMUX 4330 at the end of sub-cycle 0.

At the second stage 4302 (sub-cycle 1), the second computational path 4362 is performing a computation that takes only 2 ns by using its logic element 4313. This means that it has a surplus of 3 ns available for borrowing by a subsequent operation performed in an adjacent computational path. In this instance, the third computation path 4363 will have to perform an operation that takes 6 ns before the end of the next sub-cycle (sub-cycle 2), which is 1 ns over the 5 ns budged for the sub-cycle. The third computation path 4363 therefore has to borrow time from the second computation path 4362 during the current sub-cycle (sub-cycle 1). The configuration data controlling the KMUX 4335 allows this to happen by supplying configuration data to configure the KMUX 4335 to act as a transparent data passage during sub-cycle 1.

When the KMUX 4335 is acting as a transparent data passage, the result of the computation performed by the second computation path 4362 become available to the third computation path 4363 during sub-cycle 1. The computation of the third computational path 4363 that is slotted to take place in sub-cycle 2 is thus able to start computation at sub-cycle 1, i.e., borrow time from sub-cycle 1. Since the computation performed by the second computation path 4362 takes only 2 ns of sub-cycle 1, the third computation path 4362 will able to receive its input 3 ns before the start of sub-cycle 2. With the extra 3 ns, the third computation path 4363 will have a budget of 8 ns to complete its 6 ns operation using the logic elements 4314-4316. In order to start the computation of the third computation path 4363 ahead of time, some or all of the logic elements 4314-4316 must be identically configured to perform the same 6 ns operation in both sub-cycle 1 and sub-cycle 2.

At the third stage 4303 (sub-cycle 2), the third computation path 4363 uses the 5 ns of sub-cycle 2 to complete its computation that started in sub-cycle 1. With 3 ns worth of computation already taken place, the third computation path 4363 will complete its 6 ns operation before the end of sub-cycle 2. The KMUX 4335 is configured to be a conduit in this stage to hold the data from the previous sub-cycle such that the required input for the third computation path 4363 remain available. The second computation path 4362 is free to perform other operations in this third stage 4303 and will not affect the operation of the third computation path 4363.

The KMUXs illustrated in FIG. 43 is similar to the KMUX 3800 illustrated in FIGS. 38-39. One of ordinary skill in the art would realize that the KMUXs of FIG. 43 can also be implemented according to KMUX 4000 of FIGS. 40-42, which is without a destination multiplexer but yet still capable of configurably performing either storage or transparent operations according configuration data.

FIG. 43 also illustrates a routing multiplexer (RMUX) at the input of each of the KMUXs 4330, 4335, and 4340. In some embodiments, the routing multiplexer is for purpose of illustrating a source circuit for the KMUX and not considered as part of the KMUX. As described above, the input RMUXs are the source circuit that feeds the two inputs of a KMUX in some embodiments. In some embodiments, these input RMUXs are 16-to-1 input RMUXs, while the KMUX output RMUXs (for the KMUX embodiments that have such RMUXs) are 2-to-1 RMUXs. As further described below by reference to FIG. 66, the routing fabric of some embodiments includes local-area routing circuits and macro-level routing circuits that are formed by pairing RMUXs with KMUXs. In some of these embodiments, each RMUX/KMUX pair has one input 16-to-1 RMUX paired with one KMUX, as further described below.

One of ordinary skill in the art would realize that the time borrowing example provided above by reference to the data path 4300 is purely exemplary. In some embodiments, each sub-cycle operate at much shorter period (or faster rate) than 5 ns such as 500 ps or less. Moreover, the datapath that traveres the LUTs and the KMUXs include other circuits in some embodiments. For example, as further described below by reference to FIG. 66, the tile architecture of some embodiments includes a YMUX at the output of each LUT. Accordingly, in these embodiments, a YMUX is between each LUT and KMUX. These YMUX can also be used to facilitate time borrowing operations. They are not illustrated in FIG. 43 because this figure illustrates an example of using KMUXs for time borrowing. One advantage of using KMUXs for time borrowing is that KMUXs use less configuration bits than YMUX. However, the time borrowing example provided in FIG. 43 can be equally performed with YMUX.

In the time borrowing example illustrated in FIG. 43, both configurable logic and routing circuits that are needed in sub-cycle 2 are defined in sub-cycle 1 to perform their operation in sub-cycle 2. Other than KMUX 4335, other configurable routing circuits might be used to route the output of LUT 4313 to LUT 4314 in sub-cycle 1, and then in sub-cycle 2. Accordingly, in this example, both routing and logic resources are redundantly defined in sub-cycles 1 and 2 to allow the displayed path to borrow time for sub-cycle 2 from sub-cycle 1.

However, other embodiments might not both configurable logic and routing circuits in an earlier sub-cycle to facilitate time borrowing by a later sub-cycle. For instance, some embodiments place a premium on the configurable logic circuits (e.g., configurable LUTs) and do not burn in an earlier sub-cycle a LUT for use in the earlier processing of a signal for a later sub-cycle. If such an approach is used in the example of FIG. 43, the LUT 4314 would not be defined in sub-cycle 1 to operate the function that it performs in sub-cycle 2. Instead, some embodiments simply redundantly define the configurable routing circuits that are needed in sub-cycle 2 to route an input to LUT 4314 during sub-cycle 1. This latter approach wastes less of the configurable logic circuits by redundantly defining them in subsequent sub-cycles, but it is not as aggressive in allocating redundant resources to ensure that critical timing paths are met. Other embodiments might use a hybrid approach, which does not redundantly define configurable logic circuits in subsequent sub-cycles for most paths, but does do so for the most critical paths that have to meet timing.

E. Low Power Sub-Cycle Reconfigurable Conduit

The clocked storage elements described above operate at the rate of sub-cycle clock. These clocked storage elements consume power unnecessarily when performing operations that does not require data throughput at sub-cycle rate. There is therefore a need for a clocked storage element that consumes less power when performing low-throughput operations that do not require sub-cycle rate. In some embodiments, such low power sub-cycle reconfigurable conduits operate on two different clocks with different clock rates: a first, faster clock rate that is the rate of the sub-cycle clock, and a second, slower clock rate that is the rate of the user-design clock.

Figure 44:
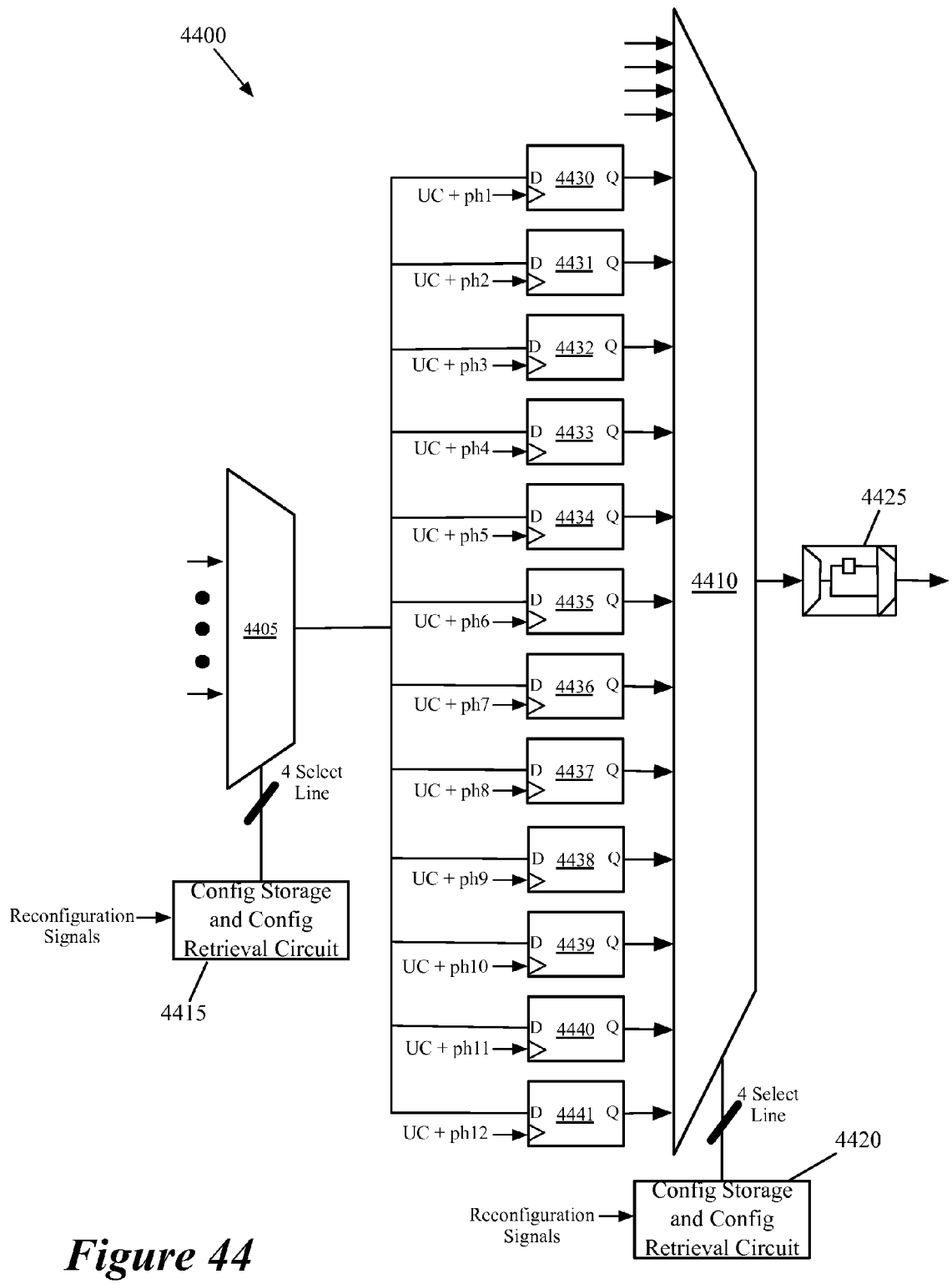
FIG. 44 illustrates an example of a low power sub-cycle reconfigurable conduit.

FIG. 44 illustrates an example of such low power sub-cycle reconfigurable conduit. As shown in this figure, the circuit 4400 includes a source multiplexer 4405, a destination multiplexer 4410, a KMUX 4425, twelve registers 4430-4441, and two configuration storage and configuration retrieval circuits 4415 and 4420.

In some embodiments, the source multiplexer 4405 is a sixteen-to-one multiplexer that receives sixteen inputs and selects one of them to send to the registers 4430 in every sub-cycle. The selection is based on a 4-bit select signal provided by the configuration storage and configuration retrieval circuit 4415. In some embodiments, the configuration storage and configuration retrieval circuit 4415 provides the 4-bit select signal according to the reconfiguration signals it receives at the rate of sub-cycle clock.

The twelve registers 4430-4441 of some embodiments are master-slave flip-flops. An example implementation of master-slave flip-flop is described above by reference to circuit sections 3975 and 3980 of FIG. 39. Each of the twelve registers 4430-4441 operates at the rate of the user clock, but at different phase. At each sub-cycle, one of the registers 4430-4441 is enabled by its clock signal to saves the signal received from the source multiplexer 4405 and holds it for a duration equals to one user clock cycle before providing the signal to the destination multiplexer 4410. In some embodiments, the registers 4430-4441 rotate and take turn at every sub-cycle to save the signal coming from the source multiplexer 4405. The low power conduit 4400 of some embodiments allows using user signal to enable the registers 4430-4441 so that each of the registers can hold a value for more than one user clock cycle.

In some embodiments, the destination multiplexer 4410 is a sixteen-to-one multiplexer that receives twelve of its inputs from the registers 4430-4441. The destination multiplexer 4410 selects one of its inputs to send to the KMUX 4425 in every sub-cycle. This allows the circuit 4400 to look backwards in time for one or more user cycles. The selection is based on a 4-bit select signal provided by the configuration storage and configuration retrieval circuit 4420. In some embodiments, the configuration storage and configuration retrieval circuit 4420 provides the 4-bit select signal according to the reconfiguration signals it receives at the rate of sub-cycle clock.

The KMUX 4425 receives the output of the destination multiplexer 4410 and stores it for one sub-cycle before sending it to some other circuits (not shown). The inclusion of the KMUX 4425 ensures that the path that goes from the registers 4430-4441 through the multiplexer 4410 meet the timing requirement by providing a wait station of yet another storage element.

In some embodiments, the configuration data provided by the configuration storage and configuration retrieval circuits 4415 and 4420 comes at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the multiplexers 4405 and 4410 during different clock cycles. These different clock cycles might be different user design clock cycles, or different sub-cycles of a user design clock cycle or some other clock cycle. In other words, the circuits 4405 and 4410 can be reconfigured to perform a different operation in every clock cycle of a set (e.g., 3 or more) of consecutive clock cycles.

In some embodiments, almost every multiplexer in the routing fabric is followed by a timing adjustment storage elements, which is one of the storage elements described above by reference to FIGS. 21-25 and 38-41. The low power sub-cycle reconfigurable conduit 4400 is also a timing adjustment storage element. A timing adjustment storage element allows time borrowing and ensures time requirement being met. A timing adjustment storage element can also be used to handle clock skewing.

The low power sub-cycle reconfigurable conduit 4400 is a clocked storage element. Because a user clock cycle is much longer than a sub-cycle and a substantial portion of the components of the circuit 4400 operates at the rate of the user clock cycle, the low power sub-cycle reconfigurable conduit 4400 can efficiently hold a value for several sub-cycles while consuming very little power.

In some embodiments, there is a low power sub-cycle reconfigurable conduit 4400 for every physical LUT. So almost all LUT outputs can be stored in a low power sub-cycle reconfigurable conduit by consuming little power and space. Since the low power sub-cycle reconfigurable conduit 4400 is placed throughout the routing fabric, a rich resource is available for implementing sub-cycle reconfigurable circuits at a very low cost.

The low power sub-cycle reconfigurable conduit 4400 can also provide an inexpensive way to do clock domain crossing in a sub-cycle reconfigurable environment. The low power sub-cycle reconfigurable conduit 4400 acts as the landing pad for the clock crossing and handles the clock synchronization. For example, a signal from clock domain A can be put into one of the registers 4430 and wait as many sub-cycles as needed to be synchronized with clock domain B before being outputted by the low power sub-cycle reconfigurable conduit 4400.

Figure 45:
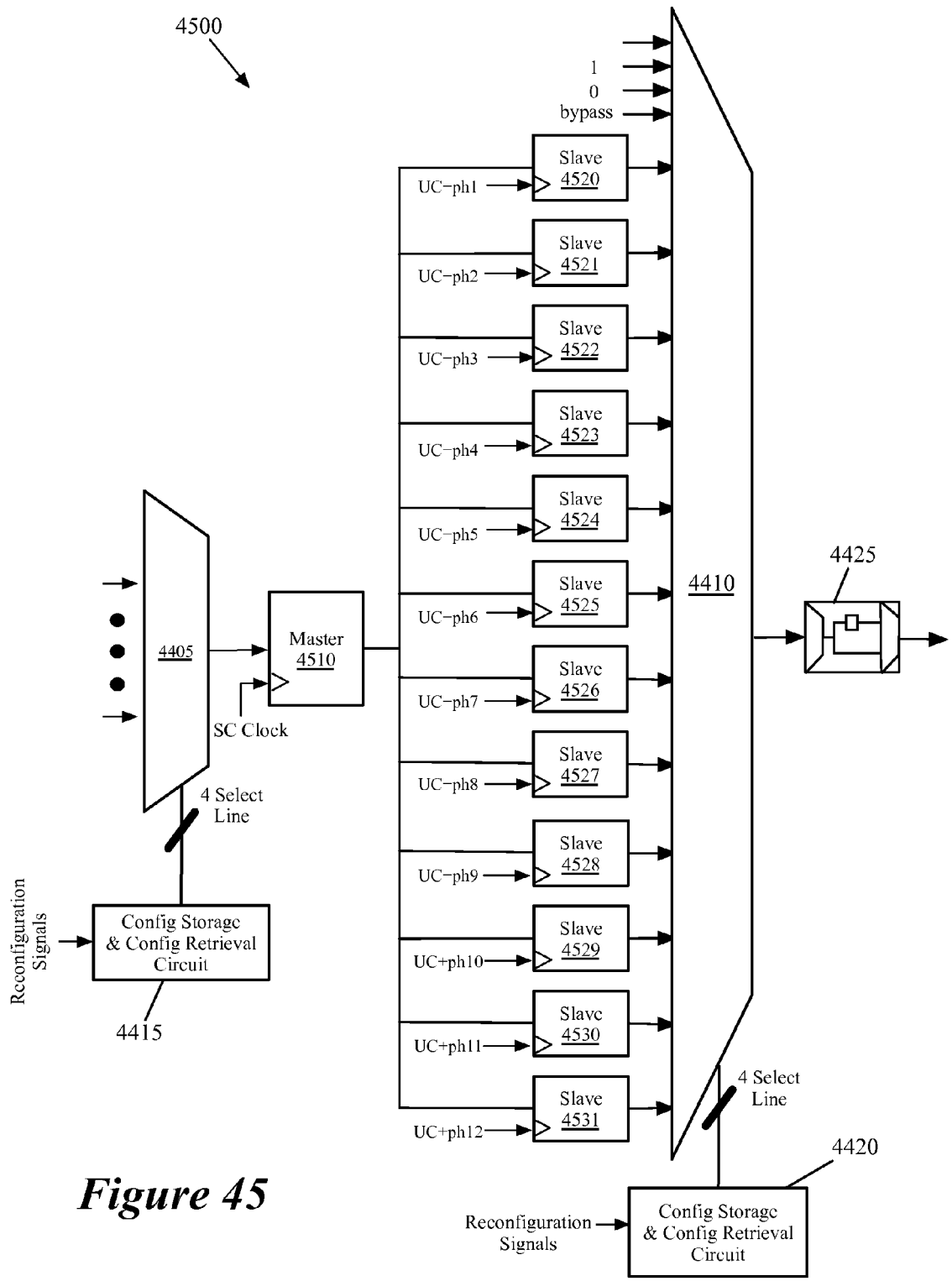
FIG. 45 illustrates an alternative low power sub-cycle reconfigurable conduit for some embodiments.

FIG. 45 illustrates an alternative low power sub-cycle reconfigurable conduit 4500 for some embodiments. As shown in this figure, the circuit 4500 includes a source multiplexer 4405, a destination multiplexer 4410, a KMUX 4425, a master latch 4510, twelve slave latches 4520-4531, and two configuration storage and configuration retrieval circuits 4415 and 4420. The one master latch 4510 and the twelve slave latches 4520-4531 effectively form twelve master-slave flip-flops. An example implementation of master-slave flip-flop is described above by reference to circuit sections 3975 and 3980 of FIG. 39.

The source multiplexer 4405, the destination multiplexer 4410, the KMUX 4425, and the configuration storage and configuration retrieval circuits 4415 and 4420 all perform the same operations as describe above by reference to FIG. 44. In some embodiments, twelve of the sixteen inputs of the destination multiplexer 4410 come from outputs of the slave latches 4520-4531. The other four inputs are a bypass enable signal, a constant "0" value, a constant "1" value, and an additional input, e.g., the "init" input of the multiplexer 4410.

The master latch 4510 operates at the rate of the sub-cycle clock. At each sub-cycle, the master latch 4510 saves a signal received from the source multiplexer 4405 and sends it to one of its slave latches. Each of the twelve slave latches 4520-4531 operates at the rate of the user clock, but at different phase. At each sub-cycle, one of the slave latches 4520 is enabled by its clock signal to saves the signal received from the shared master latch 4510 and holds it for a duration equals to one user clock cycle before providing the signal to the destination multiplexer 4410. In some embodiments, the slave latches 4520-4531 rotate and take turn at every sub-cycle to save the signal coming from the master latch 4510. The low power conduit 4500 of some embodiments allows using user signal to enable the slave latches 4520-4531 so that each of the slave latches can hold a value for more than one user clock cycle. In some embodiments, each slave latch has a feedback path to send its output back to its input in order to prevent bit flickering.

The circuit 4500 can perform all the features of the circuit 4400 described above. Moreover, because the low power sub-cycle reconfigurable conduit 4500 have a shared master latch 4510 for the twelve slave latches 4520, it saves space on the reconfigurable IC. In addition, because the slave latches 4520-4531 operate at the rate of the user clock cycle, the low power sub-cycle reconfigurable conduit 4500 can efficiently hold a value for several sub-cycles while consuming very little power.

V. Arithmetic Elements within the Routing Fabric

In addition to having storage elements, the configurable routing fabric of some embodiments further includes arithmetic elements that can configurably perform arithmetic operations such as add and compare.

Figure 46:
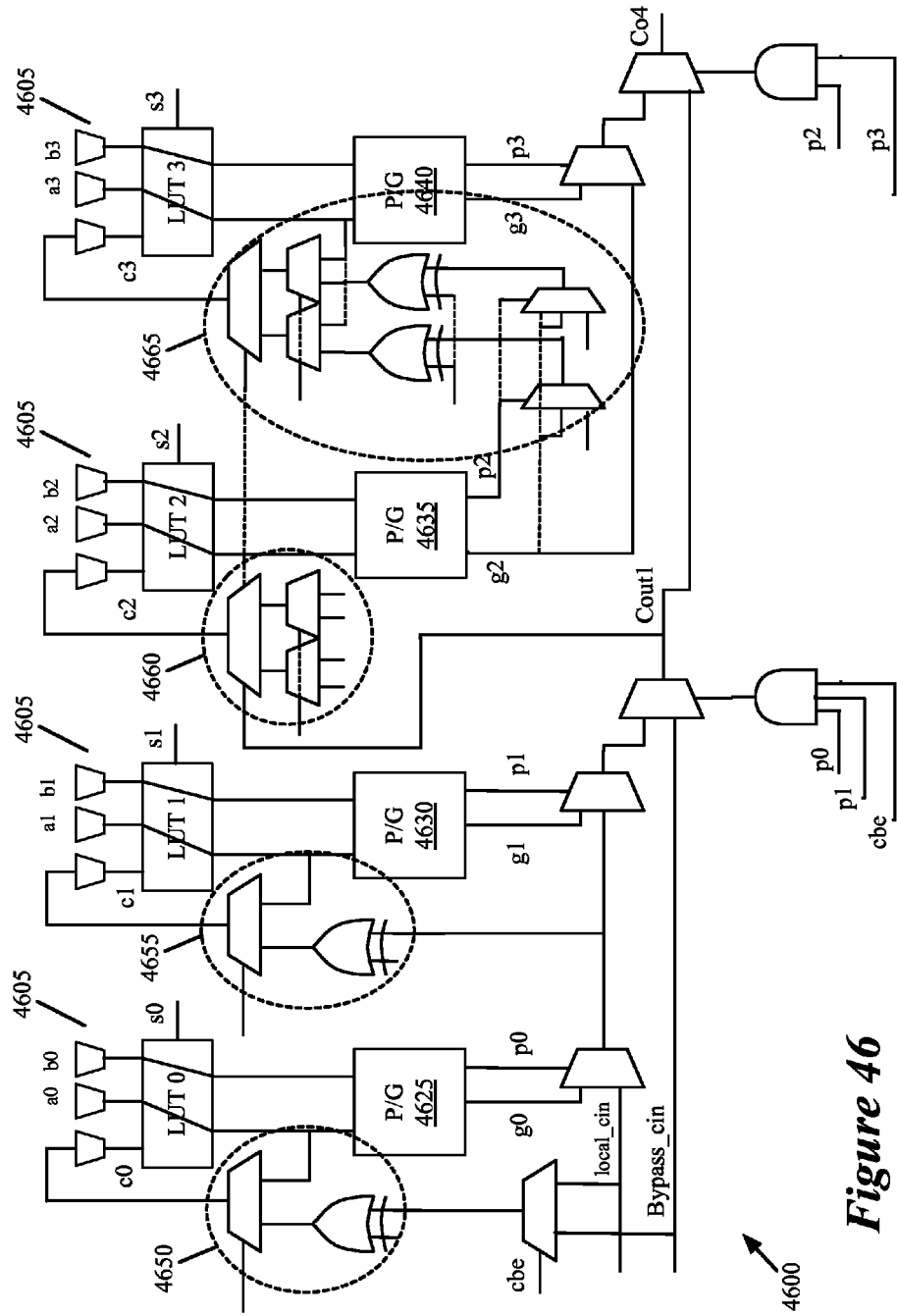
FIG. 46 illustrates an arithmetic element that uses LUTs in the arithmetic operations.

FIG. 46 illustrates an arithmetic element 4600 that uses LUTs in the arithmetic operations. As illustrated in this figure, the arithmetic element 4600 is a 4-bit adder that operates through LUTs 0-3. The circuit 4600 includes the LUT 0-3, four propagate/generate circuits 4625, 4630, 4635, and 4640, and four carry look-ahead logic blocks 4650, 4655, 4660, and 4665. The propagate/generate circuits 4625, 4630, 4635, and 4640 produces the propagate (p) and generate (g) values for propagating and generating carry signals. The carry look-ahead logic blocks 4650, 4655, 4660, and 4665 calculates carry input for each bit position without having to wait for carry bit to propagate from less significant bit positions. The LUTs 0-3 are used to compute the sum bits (s).

The LUTs 0-3 receive inputs from IMUXs 4605, 4606, 4607, and 4608, respectively. Each LUT receives three inputs a, b, and c through its associated IMUX, where a and b are one-bit binary values from each operand and c is a carry signal. The LUT then performs an add operation on a, b, and c, and generates a sum s, which is equal to a⊕b⊕c. Each of the four propagate/generate circuits 4625-4640 receives a and b as inputs and produces the propagate and generate values accordingly. Each carry look-ahead logic block 4650 calculate a carry signal for use by a LUT of the next more significant bit to calculate a sum s. Because the carry look-ahead logic blocks 4650 calculate its own carry bits without waiting for carry bits to propagate from less significant bits, the wait time to calculate the result of the larger value bits is reduced.

Since LUTs are used for the arithmetic operations of the logic block 4600 (i.e., for generating sum bits s), the arithmetic operations have to go through the LUTs and their associated IMUXs. This requires the arithmetic element 4600 to be placed near the LUTs involved in the arithmetic operations in order to minimize propagation delay. Furthermore, the LUTs, when configured to generate the sum bits, cannot perform other operations. In order to allow LUTs to freely perform other functions during the arithmetic operations and to place arithmetic elements in the routing fabric, some embodiment provides an arithmetic element that does not involve LUTs in its arithmetic operations and can be placed in the routing fabric.

Figure 47:
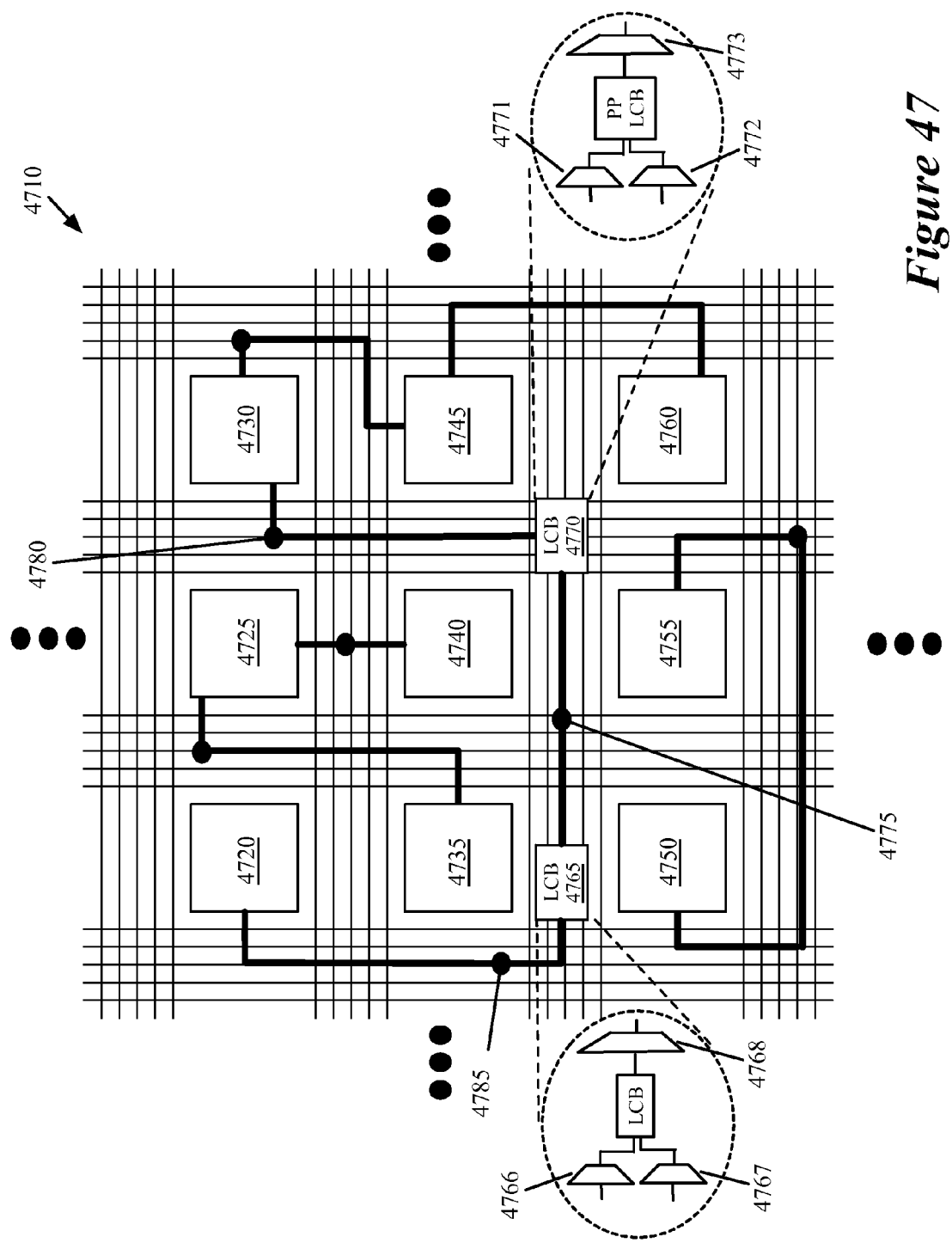
FIG. 47 illustrates an example of a routing fabric that includes logic carry block (LCB).

FIG. 47 illustrates an example of a routing fabric 4710 that includes arithmetic elements 4765 and 4770 that do not involve LUTs in their arithmetic operations. Some embodiments refer to the arithmetic elements 4765 and 4770 as logic carry blocks (LCB). As illustrated, LCBs 4765 and 4770 are located in the routing fabric 4710 of a configurable IC. LCBs 4765 and 4770 perform arithmetic operations without using LUTs.

As illustrated in FIG. 47, the circuit elements 4720-4760 include configurable logic circuits, which in some embodiments include LUTs and their associated IMUXs. The outputs from the circuit elements 4720-4760 are routed through the routing fabric 4710 where the outputs can be stored within the storage elements of the routing fabric or be stored within the circuit elements 4720-4760. In some embodiments, the storage elements 4775-4780 can be transparent storage elements, clocked storage elements, or hybrid storage elements described in previous sections.

The LCBs 4765 and 4770 are located in the routing fabric 4710 and can perform arithmetic operations without involving any LUT. In some embodiments, the LCB 4765 is a 4-bit LCB that receives its inputs (i.e., operands) from multiple RMUXs such as RMUXs 4766 and 4767 and outputs the result of its arithmetic operation through RMUX 4768. The LCB 4770 is an 8-bit parallel prefix LCB that receives its inputs (i.e., operands) through multiple RMUXs such as RMUXs 4771 and 4772 and outputs the result of its arithmetic operation through RMUX 4773. In some embodiments, each bit of input to a LCB comes from a different RMUX.

Because LUTs are not involved in the arithmetic operations of the LCBs, the LCBs 4765 and 4770 do not have be closed coupled with any LUT. Furthermore, since LUTs are not involved in the arithmetic operations of the LCBs, the LUTs are free to perform other operations while the LCBs are performing the arithmetic operations. As illustrated in FIG. 47, the LCB 4765 and the LCB 4770 are performing a particular arithmetic operation, while the closest configurable logic circuits to these LCBs (the configurable logic circuits 4735, 4740, 4745, 4750, 4755, and 4760) are performing operations that are independent of the arithmetic operations. This is because LUTs in configurable logic circuits are not required for arithmetic operation performed by the LCBs.

A. Logic Carry Block (LCB)

Figure 48:
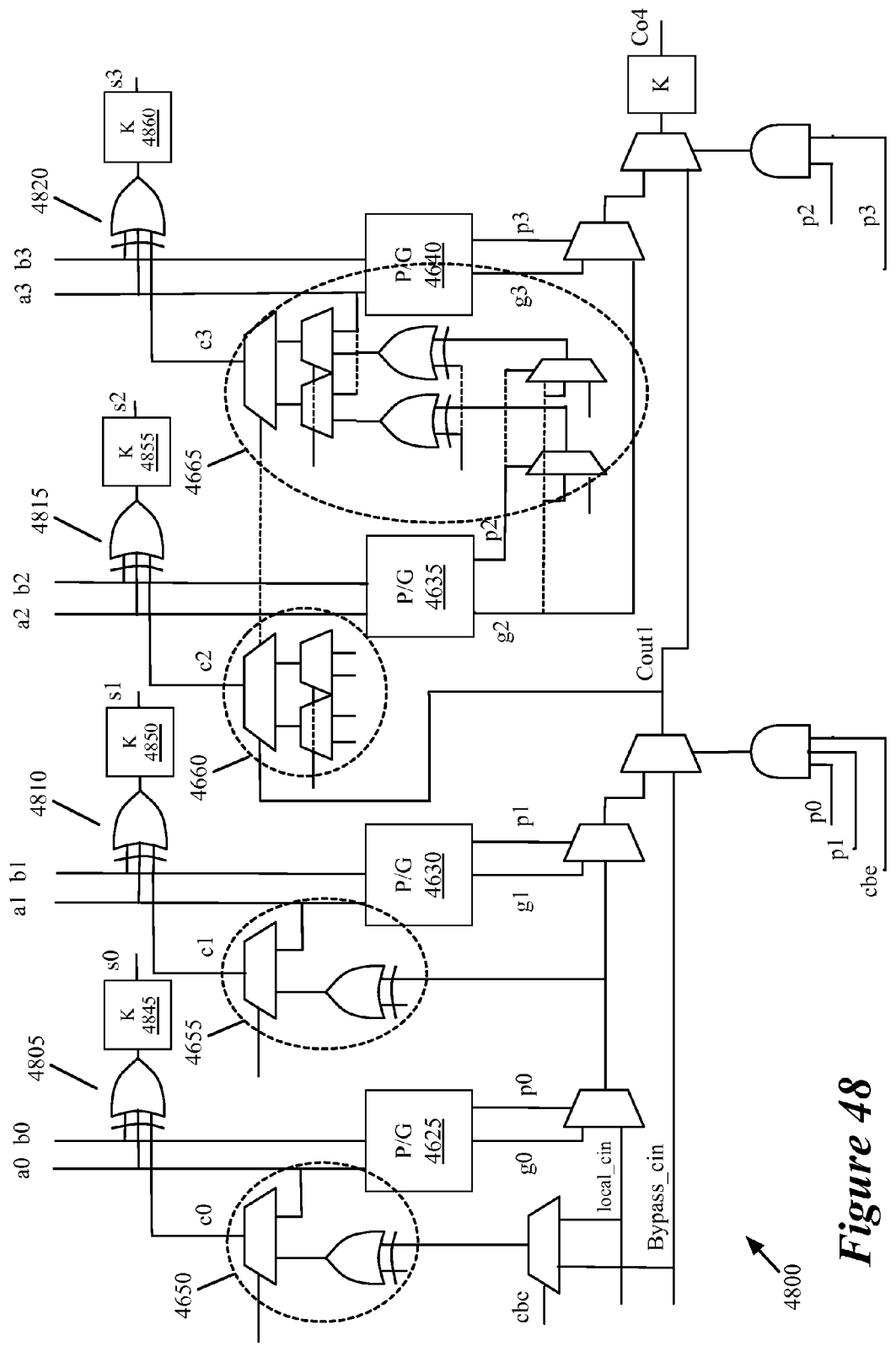
FIG. 48 illustrates a LCB that does not use LUTs in its arithmetic operations.

FIG. 48 illustrates an arithmetic element 4800 that does not involve LUTs in its arithmetic operations (i.e., an LCB). The arithmetic element 4800 is similar to the arithmetic element 4600. The LCB 4800 is also a 4-bit adder that includes the four propagate/generate circuits 4625-4640 and the four carry look-ahead logic blocks 4650-4665. The propagate/generate circuits 4625, 4630, 4635, and 4640 produces the propagate (p) and generate (g) values for propagating and generating carry signals. The carry look-ahead logic blocks 4650, 4655, 4660, and 4665 calculates carry input for each bit position without having to wait for carry bit to propagate from less significant bit positions. However, instead of LUTs, the LCB 4800 includes four XOR gates 4805-4820 and four KMUXs 4845-4860 for computing and producing sum bits s.

Each XOR gate receives three inputs a, b, and c, where a and b are one-bit from each operand and c is a carry signal. Each XOR gate generates a sum s, which is equal to a⊕b⊕c. Each sum s is stored in one of the KMUXs 4845-4860 before being provided as the summation result of the LCB 4800. Because the summation outputs s0-s3 of circuit 4800 go through KMUXs rather than latches, the LCB 4800 is able to provide its output in every clock cycle rather than every other clock cycle. This doubles the output bandwidth of the LCB circuit. The four propagate/generate circuits 4625-4640, the four carry look-ahead logic blocks 4870, and the rest of the circuit 4800 behave exactly the same way as in circuit 4600 described above by reference to FIG. 46.

Because the arithmetic operations of the LCB 4800 do not go through LUTs and their associated IMUXs, the performance of the arithmetic operations by LCB 4800 is faster than those performed by the logic block 4600 described above in FIG. 46. Because the LUTs are not involved in the arithmetic operations of the LCB 4800, the LCB 4800 does not have to be closely coupled with the LUTs and therefore can be placed in the routing fabric of the configurable IC. Moreover, the configurable IC becomes more efficient as the LUTs that would have otherwise been assigned to perform arithmetic operations become available to perform other functions.

Figure 49:
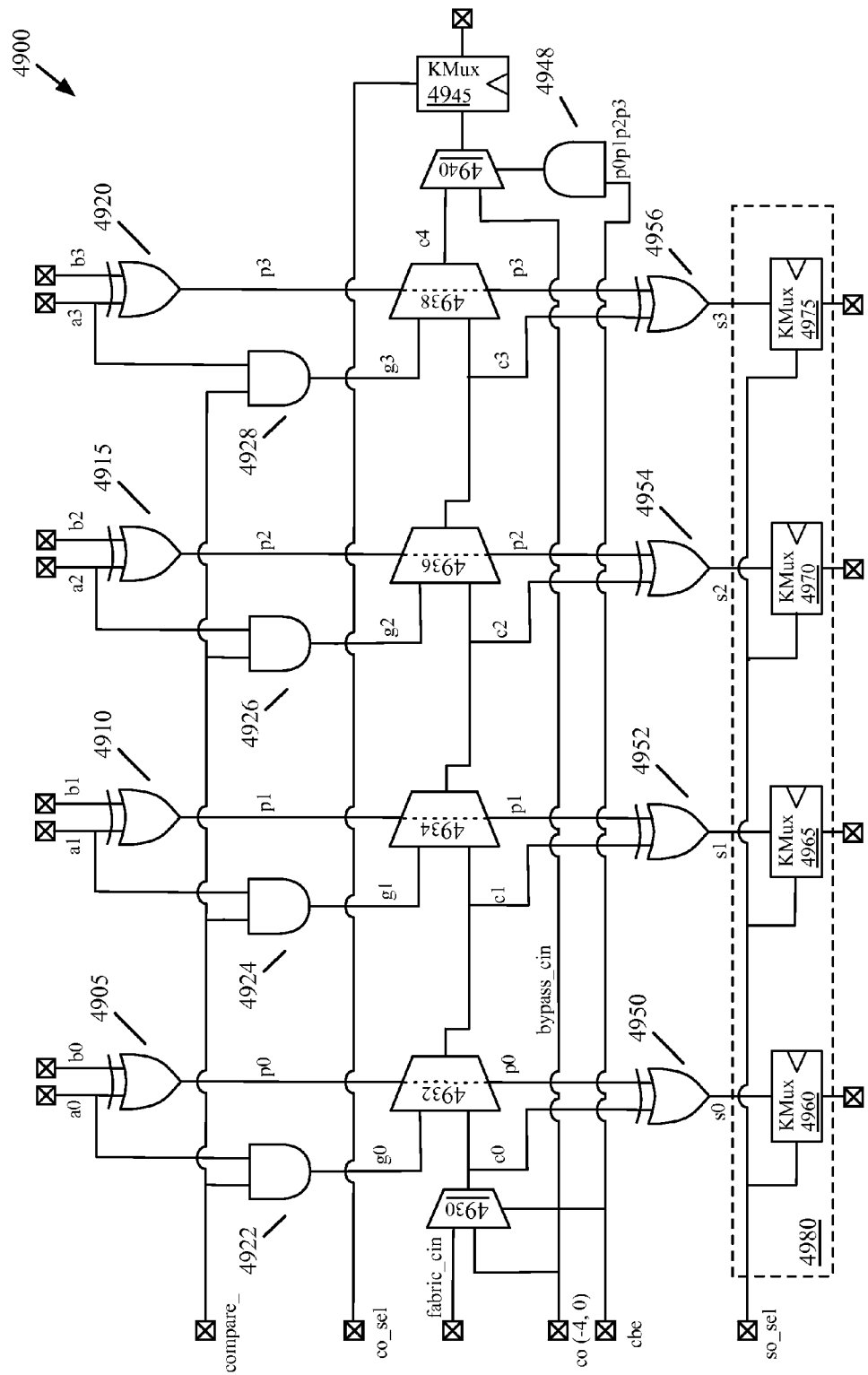
FIG. 49 illustrates a LCB that does not include carry look-ahead logic.

Because the removing of LUTs from the arithmetic operations improves the performance of the LCB, it becomes less important to include carry look-ahead logic, which improves speed by consuming more power and area. FIG. 49 illustrates a LCB 4900 without any carry look-ahead logic for some embodiments. The LCB 4900 is a 4-bit ripple carry adder for performing addition or comparison on a pair of 4-bit binary numbers. As illustrated in this figure, the circuit 4900 includes (1) a first set of four XOR gates 4905-4920 for generating propagate signals, (2) a second set of four XOR gates 4950-4956 for producing summation results, (3) a set of four AND gates 4922-4928 for producing generate signals, (4) a set of four two-to-one multiplexers 4932-4938 for generating carry signals, (5) two two-to-one multiplexers 4930 and 4940, (6) a set of four KMUXs 4960-4975 for storing/outputting summation results, (7) an AND gate 4948 for generating bypass control signal, and (8) a KMUX 4945 for storing/outputting a carry out signal.

Each of the first set of XOR gates 4905-4920 receives two inputs a and b, each of which is a single bit of the pair of 4-bit binary numbers for addition/comparison. The four XOR gates 4905-4920 then generate four propagate signals p0-p3. The propagate signal p equals to a⊕b. Each of the four propagate signals p0-p3 serves as a control signal for one of the set of four two-to-one multiplexers 4932-4938 and also as an input to one of the second set of four XOR gates 4950-4956.

Each of the set of four AND gates 4922-4928 receives two inputs, one of which is a and the other is the complement of a compare enable signal compare. The positive value of the compare enable signal forces the circuit 4900 to perform comparison rather than addition. As a result, the KMUX 4945 will output a compare out rather than a carry out. When the compare enable signal is negative, the set of four AND gates 4922-4928 performs regular addition operation by producing four generate signals g0-g3. The generate signal g equals to a. Each of the four generates signals g0-g3 serves as an input to one of the set of four two-to-one multiplexers 4932-4938.

Each of the second set of XOR gates 4950-4956 receives two inputs p and c, where p is a propagate signal generated by a corresponding XOR gate in the first set of XOR gates 4905-4920 and c is a carry signal that comes from the next less significant bit. The second set of XOR gates 4950-4956 then generate four summation results s0-s3. Each bit of the summation result s equals to p⊕c, which is essentially a⊕b⊕c. The four-bit summation result s0-s3 is then sent to the set of four KMUXs 4960-4975.

Each of the set of four two-to-one multiplexers 4932-4938 receives two input g and c and is controlled by p, where g is a generate signal produced by a corresponding AND gate in the set of AND gates 4922-4928, c is a carry signal that comes from the next less significant bit, and p is a propagate signal generated by a corresponding XOR gate in the first set of XOR gates 4905-4920. The set of four two-to-one multiplexers 4932-4938 then produces four carry signals c1-c4. Each of the produced carry signal c equals to (a·b)+(c·(a⊕b)). Each produced carry signal is provided as the carry in signal for the next two-to-one multiplexer and as an input for an XOR gate of the second set of four XOR gates 4950-4956 that is for the next more significant bit.

The set of four KMUXs 4960-4975 receives summation outputs s0-s3 from the second set of XOR gates 4950-4956 and outputs them as the summation results of the adder 4900. The four KMUXs 4960-4975 are controlled by the same select signal so_sel, thus form a bussed KMUX block 4980. As a result, the four KMUXs 4960-4975 either all act as transparent wires or all act as master-slave flip flops in transmitting the summation results. Because the four KMUXs 4960-4975 share the same configuration signal rather than each of them having its own configuration signal, significant saving is achieved by eliminating three configuration signals. For the same reason, bussed KMUXs occupy less physical area and consume less power. In addition, bussed KMUXs maintain the same performance advantage achieved by individual KMUXs, i.e., transmitting data in every clock cycle rather than in every other clock cycle.

The two-to-one multiplexer 4930 selects either a global carry signal fabric_cin or a local carry signal co(−4, 0) as the initial carry in signal cO, which is provided as an input to the XOR gate 4950 and as an input to the multiplexer 4932. The two-to-one multiplexer 4930 makes its selection based on a carry bypass enable signal cbe. When the carry bypass enable signal is positive, the local carry signal is selected. When the carry bypass enable signal is negative, the global carry signal is selected.

The AND gate 4948 receives the carry bypass enable signal and propagate signals p0-p3 as inputs and generates a bypass control signal based on them. The two-to-one multiplexer 4940 determines whether this carry logic block should be bypassed based on the bypass control signal generated by the AND gate 4948. When the bypass control signal is positive, the current carry logic is bypassed and the multiplexer 4940 selects the local carry in signal from the previous carry block. When the bypass control signal is negative, the multiplexer 4940 selects the carry signal c4 produced by the multiplexer 4938. The KMUX 4945 received the carry signal produced by the multiplexer 4940 and outputs it as the carry out signal for the adder 4900.

The adder 4900 receives a pair of 4-bit operands and performs bit-wise XOR operations through the first set of XOR gates 4905-4920 to generate and propagate signals. Each bit of one of the operands is goes through one of the set of AND gates 4922-4928 to produce generate signals. Each generate signal produced by the set of AND gates 4922-4928 severs as an input to one of the set of two-to-one multiplexers 4932-4938. Each of the set of two-to-one multiplexers 4932-4938 takes a carry signal from the next less significant bit as another input and makes a selection based on a propagation signal generated by the first set of XOR gates 4905-4920. The selection result is provided as a carry signal to the next more significant bit. Each of the second set of XOR gates 4950-4956 receives two inputs, one of which is a carry signal from the next less significant bit and the other is a propagation signal generated by the first set of XOR gates 4905-4920. The second set of XOR gates 4950-4956 produce a 4-bit summation result s0-s3 and sends it to the set of KMUXs 4960-4975 for storing/outputting as summation result of the adder 4900.

The two-to-one multiplexer 4940 determines whether this carry logic block should be bypassed based on the bypass control signal generated by the AND gate 4948. When the carry bypass enable (cbe) signal is asserted and all the propagate signals p0-p3 have positive values, the current carry logic is bypassed and the multiplexer 4940 selects the local carry in signal from a previous carry block. When the bypass control signal is not asserted, the multiplexer 4940 selects the carry signal c4 produced by the multiplexer 4938. The KMUX 4945 received the carry signal produced by the multiplexer 4940 and outputs it as the carry out signal for the adder 4900.

The LCBs describe thus far are 4-bit LCBs. To create a LCB or an arithmetic element in the routing fabric wider than 4-bits, some embodiments cascade multiple 4-bit LCBs together by linking their carry chains (e.g., by linking their carry-in/carry-out ports). In some embodiments, such links are provided by routing multiplexers in the routing fabric. In some embodiments, the carry-out signals linking LCBs in the fabric are intermediately stored in storage elements of the routing fabric as those described above in Sections III and IV.

B. Parallel Prefix Adders

The LCB 4900 is a 4-bit ripple carry adder. It is a serial adder that is efficient in gate usage, but its performance is limited by the propagation delay from the least significant bit position to the most significant bit position. In order to provide arithmetic elements with less propagation delay, the routing fabric of some embodiments includes at least some LCBs that are parallel prefix adders. Parallel prefix adders require more logic gates per bit position, but they are faster performing and thus capable of supporting wider LCBs.

In some embodiments, at least some of the arithmetic elements in the routing fabric are implemented as 8-bit parallel prefix adders. Parallel prefix adders offer a highly efficient solution to the binary addition problem that involves larger number of bits. Assume that $A = a_{n-1} a_{n-2} \ldots a_0$ and $B = b_{n-1} b_{n-2} \ldots b_0$ represent the two numbers to be added and $S = s_{n-1} s_{n-2} \ldots s_0$ denotes their sum. An adder can be considered as a three-stage circuit. The preprocessing stage computes the carry-generate bits $g_i$, the carry-propagate bits $p_i$, and the half-sum bits $d_i$, for every i, $0 \le i \le n-1$, according to: $g_i = a_i \cdot b_i$, $p_i = a_i + b_i$, and $d_i = a_i \oplus b_i$. The second stage of the adder computes the carry signals $c_i$ using the carry generate and propagate bits $g_i$ and $p_i$, while the final stage computes the sum bits according to, $s_i = d_i \oplus c_{i-1}$.

A parallel prefix circuit with n inputs $x_1, x_2, \ldots, x_n$ computes, in parallel, n outputs $y_1, y_2, \ldots, y_n$ using an arbitrary associative operator $\circ$ as follows:

$$y_1 = x_1,$$
$$y_2 = x_1 \circ x_2,$$
$$y_3 = x_1 \circ x_2 \circ x_3,$$
$$\ldots$$
$$y_n = x_1 \circ x_2 \circ \ldots \circ x_n.$$

Carry computation can be transformed to a prefix problem using the associative operator $\circ$, which associates pairs of generate and propagate bits as follows:

$$(g, p) \circ (g', p') = (g + p \cdot g', p \cdot p').$$

In a series of consecutive associations of generate and propagate pairs (g, p), the notation $(G_{k:j}, P_{k:j})$ is used to denote the group generate and propagate term produced out of bits k, k−1, . . . , j, that is, $$(G_{k:j}, P_{k:j}) = (g_k, p_k) \circ (g_{k-1}, p_{k-1}) \circ \ldots \circ (g_{j+1}, p_{j+1}) \circ (g_j, p_j).$$

Following the above definition, each carry $c_i$ is equal to $G_{i:0}$.

The prefix operator $\circ$ is idempotent, i.e., $(g,p) \circ (g,p) = (g,p)$. The generalization of the idempotency property allows a group term $(G_{i:j}, P_{i:j})$ to be derived by the association of two overlapping terms, $(G_{i:k}, P_{i:k})$ and $(G_{m:j}, P_{m:j})$, with $i \ge m \ge k > j$, since $$(G_{i:j}, P_{i:j}) = (G_{i:k} P_{i:k}) \circ (G_{m:j} P_{m:j}).$$

There are many ways to perform the prefix computation. Serial-prefix structures such as ripple carry adders are compact but have a latency of O(N). Parallel prefix circuits use a tree network to reduce the latency to O(log N) and are widely used in circuits that perform prefix computations. An ideal prefix network has $\log_2 N$ stages of logic, a fan-out never exceeding 2 at each stage, and no more than one horizontal track of wire at each stage.

Figure 50:
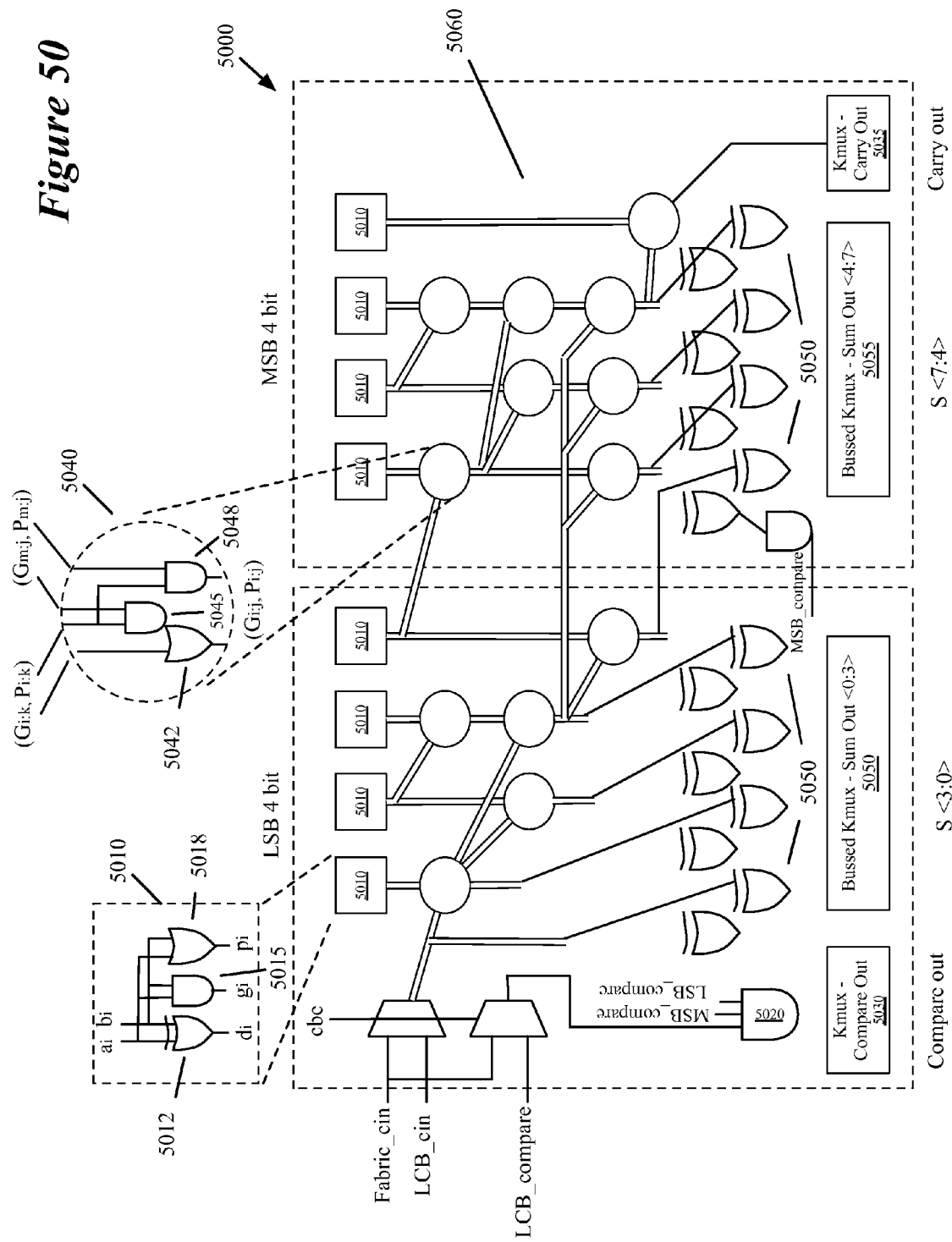
FIG. 50 illustrates an 8-bit LCB.
Figure 51:
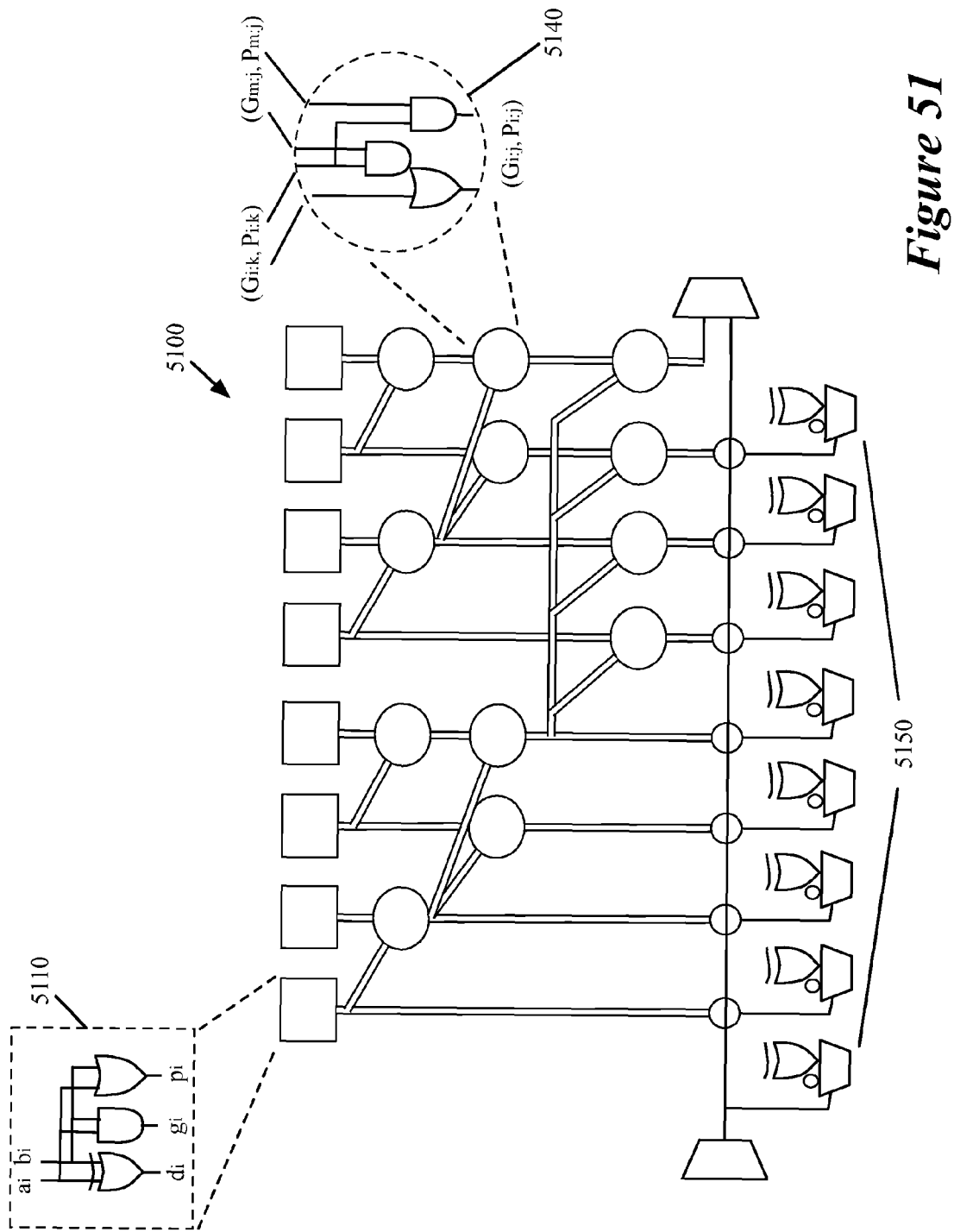
FIG. 51 illustrates an alternative 8-bit LCB.

There are many different types of parallel prefix networks. Different embodiments use different arrangements of prefix cells to implement its parallel prefix network based LCB. FIGS. 50 and 51 illustrate two LCBs based on different parallel prefix networks. FIG. 50 illustrates a LCB 5000 that is implemented as an 8-bit "Sklansky" parallel prefix adder for some embodiments. As shown in this figure, the circuit 5000 includes eight boxes 5010 at the top, thirteen circles 5040 in the middle, eight XOR gates 5050 at the bottom, two bussed KMUX block 5050 and 5055 for outputting summation result, an AND gate 5020 for generating a compare out signal, a KMUX 5030 for outputting the compare out signal, and a KMUX 5035 for outputting a carry out signal.

The boxes 5010 at the top perform the preprocessing stage computation. Each box 5010 includes an XOR gate 5012, an AND gate 5015, and an OR gate 5018, each of which takes $a_i$ and $b_i$ as inputs and produces $d_i$, $g_i$, and $p_i$, respectively. The XOR gates 5050 at the bottom perform the final stage computation. Each XOR gate 5050 takes $d_i$ and $c_{i-1}$ as inputs and produces $s_i$ as the summation result.

In the middle, the circles 5040 perform the second stage computation. The prefix network 5060 comprises the circles 5040. Each circle 5040 includes an OR gate 5042, two AND gates 5045 and 5048. The AND gate 5045 receives $P_{i:k}$ and $G_{m:j}$ as inputs and sends its output to the OR gate 5042. The OR gate 5042 receives the output of the AND gate 5045 and $G_{i:k}$ as inputs and produces $G_{i:j}$. The AND gate 5048 receives $P_{i:k}$ and $P_{m:j}$ as inputs and generates $P_{i:j}$.

The LCB 5000 generates 8-bit of summation output that are outputted by the bussed KMUX blocks 5050 and 5055. Details of the bussed KMUX blocks are described above by reference to FIG. 49. There are separate outputs 5035 and 5030 for outputting the carry out and compare out signals, in contrast to sharing the same output for carry out and compare out signals in previous LCB examples.

Each connection between any of the boxes 5010, circles 5040, and XOR gates 5050 represents a dependency between two nodes. For any two nodes, as long as there is no dependency between them, their computations can be performed in parallel. That is the reason the parallel prefix adders are more efficient than those traditional ripple carry adders in terms of performance.

FIG. 51 illustrates a LCB 5100 that is implemented as a 8-bit "Ladner-Fisher" adder. As shown in this figure, the LCB 5100 includes eight boxes 5110 at the top, twelve circles 5140 in the middle, and eight XOR gates with carry select 5150 at the bottom.

The boxes 5110, the circle 5140, and the XOR gates 5150 are the same as the ones described above by reference to FIG. 50. However, the prefix network 5160 is different from the prefix network 5050 in FIG. 50. The connections between nodes (circles) in the prefix network are different. As a result, the LCB 5100 requires different area and/or timing than the LCB 5000.

Different types of parallel prefix adders manifest trade-offs among factors such as number of logic levels, fan-out, and horizontal wiring tracks. Any trade-off between these factors impact performance as well as area. Although the above-described parallel prefix networks generally make reasonable tradeoffs between logic levels, fan-out and number of horizontal wiring tracks between logic levels, they do not cover all possible points in the design space. Hence, they are not necessarily the optimal parallel prefix networks under certain assumptions for relative costs between logic levels, fan-out and wiring tracks.

As mentioned above, 4-bit LCBs can be cascaded together by linking their carry-in/carry-out terminals to form arithmetic elements in the routing fabric that are than 4-bits. Parallel prefix LCBs as described above can likewise be cascaded together and form arithmetic elements in the routing fabric that are wider than 8-bits. One of ordinary skill would realize that, for embodiments with both 4-bit LCBs and 8-bit parallel prefix LCBs in the routing fabric, a wider arithmetic element can be created by linking both 4-bit LCBs and 8-bit parallel prefix LCBs. In some embodiments, the carry-out signals linking LCBs in the fabric are intermediately stored in storage elements of the routing fabric as those described above in Sections III and IV.

C. Wide XOR Output

Figure 52:
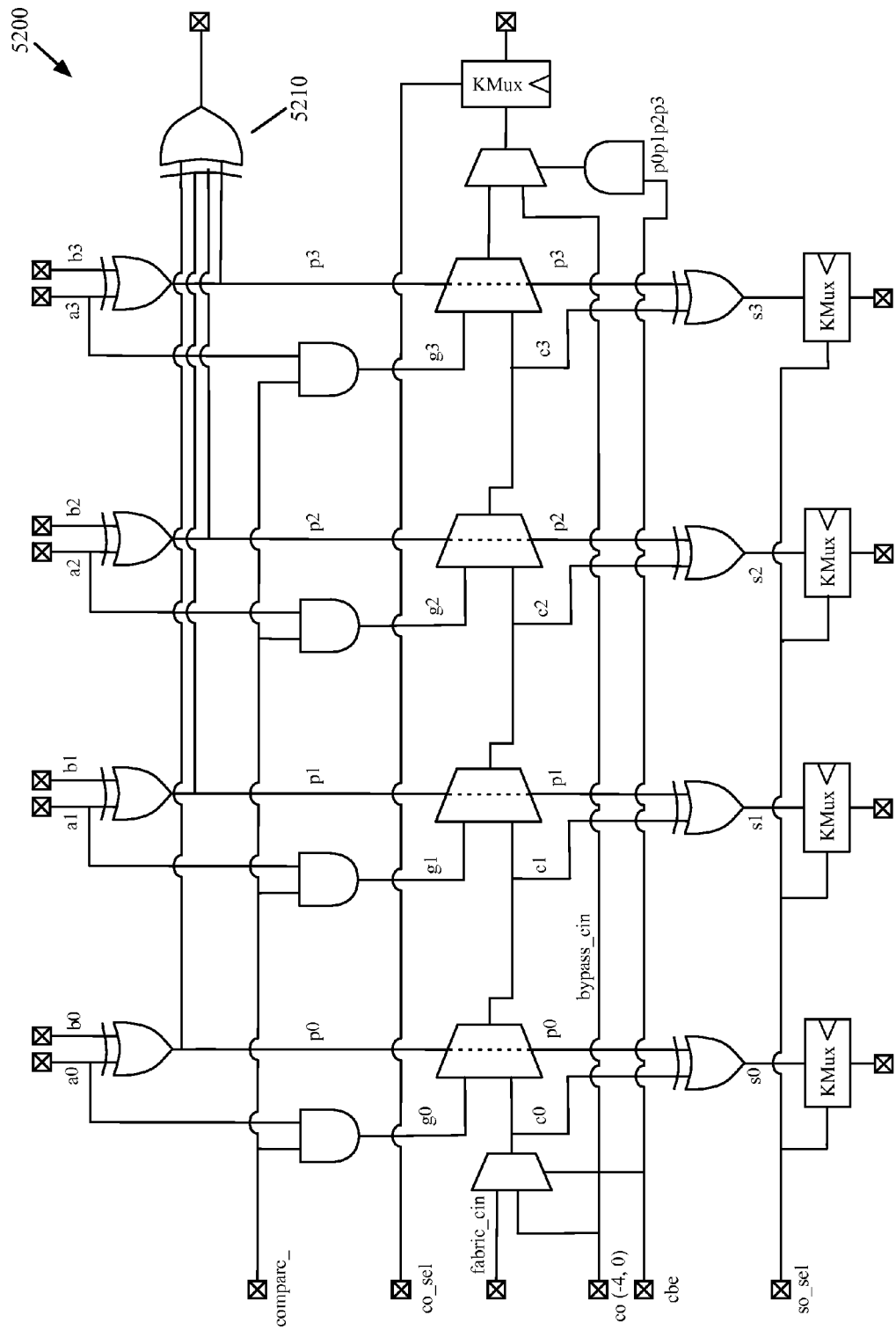
FIG. 52 illustrates a LCB circuit that provides a wide XOR output by using a dedicated XOR gate.
Figure 53:
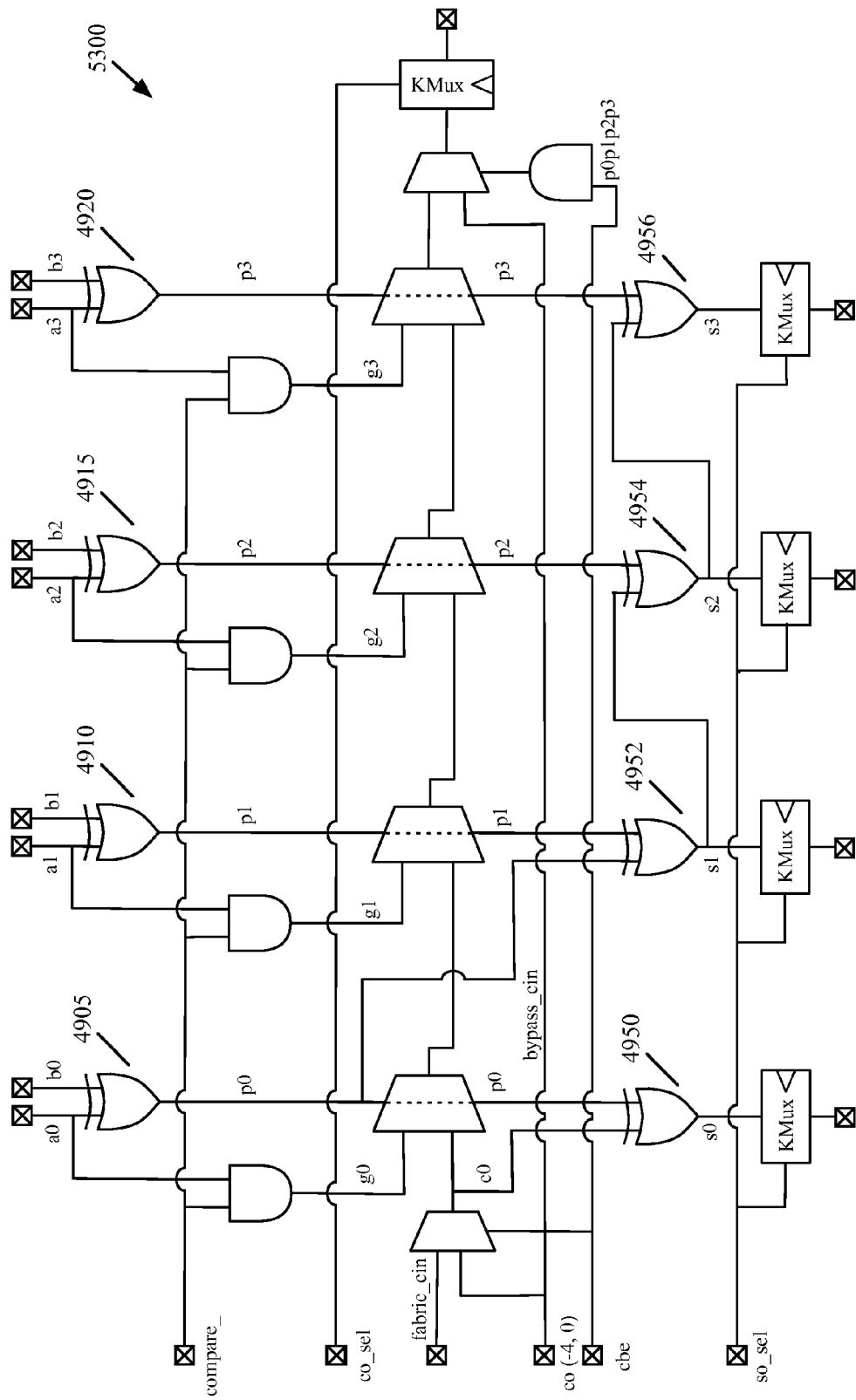
FIG. 53 illustrates a LCB circuit that provides a wide XOR output by reusing XOR gates that are also used for performing the arithmetic operations.

Some embodiments of LCB produce a wide XOR output that is the XOR of all input bits (8-bit total, 4 from each operand). FIG. 52 illustrates an LCB 5200 that provides the wide XOR output by using a dedicated XOR gate 5210, the operation of which will not interfere with add or compare operation of the LCB. FIG. 53 illustrates an LCB 5300 that provides the wide XOR output by reusing XOR gates that are also used for performing the arithmetic operations. As illustrated in FIG. 53, the wide XOR output is provided at the output of XOR gate 4956 and is generated by using XOR gates 4905, 4952, 4954, and 4956.

The LCBs 5200 and 5300 are similar to the LCB 4900 of FIG. 49 except for the inclusion of the wide XOR outputs. It should be apparent to one of ordinary skill in the art that the wide XOR output illustrated in FIGS. 52 and 53 can also be applied to other embodiments of LCBs, e.g., to a parallel prefix LCB as illustrated in FIGS. 50 and 51.

D. Using Different Elements in the Routing Fabric

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. The routing fabric of some embodiments further includes configurable transparent (i.e., unclocked) storage elements, as well as configurable and non-configurable non-transparent (i.e., clocked) storage elements. In some embodiments, the routing fabric further includes arithmetic elements.

Having a mixture of configurable storage elements and arithmetic element in the routing fabric is highly advantageous. For instance, clocked storage elements allow data to be stored every reconfiguration cycle (or sub-cycle), while transparent storage elements can store data for multiple reconfiguration cycles. In addition, clocked storage elements allow new data to be stored at the input during the same clock cycle (or sub-cycle) that stored data is presented at the output of the clocked storage element. Furthermore, arithmetic element allows arithmetic computation to take place as between storage elements of the routing fabric as well as between configurable tiles.

Figure 54:
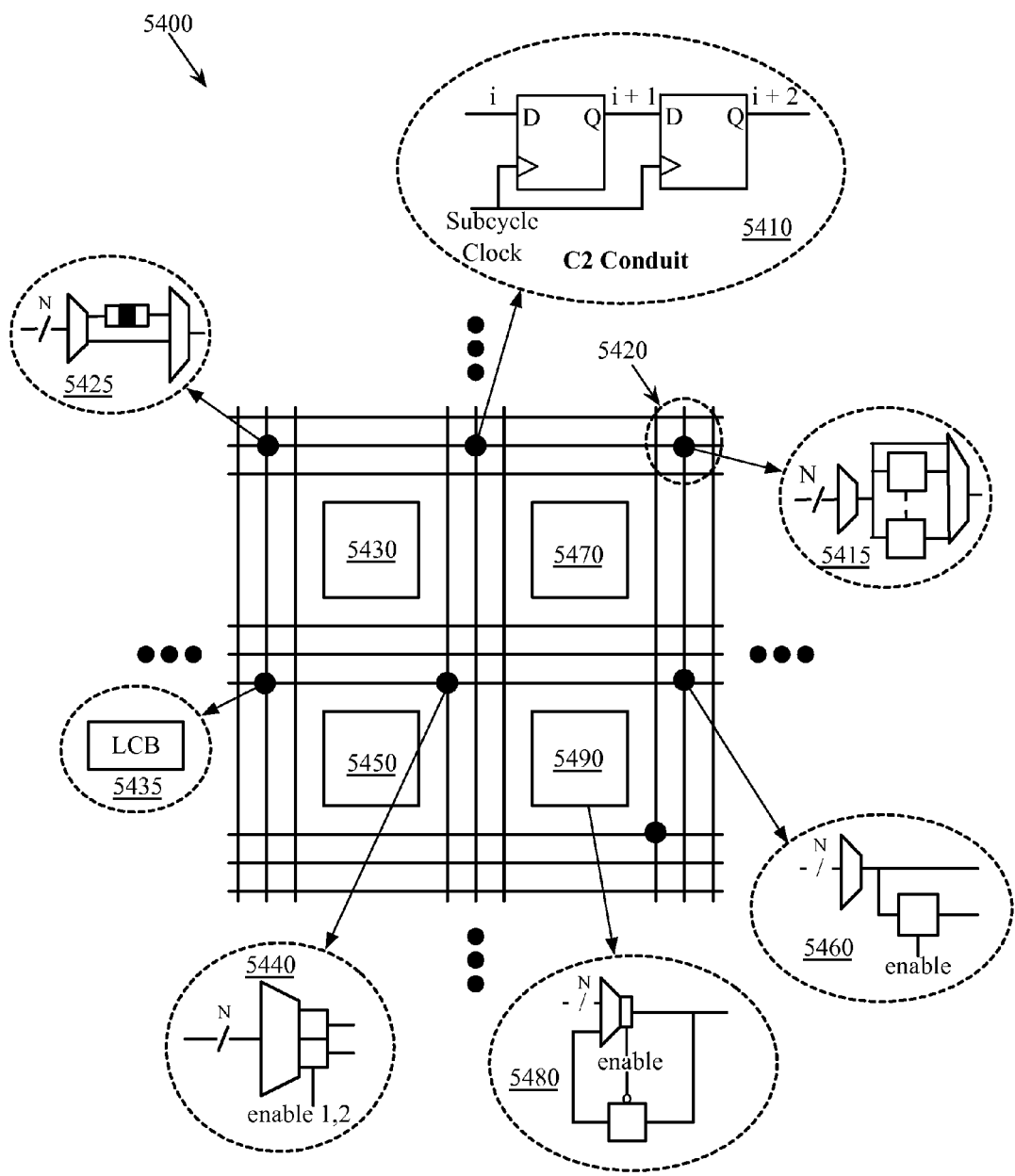
FIG. 54 illustrates placements of storage elements and arithmetic elements within the routing fabric or within the reconfigurable tile structure of some embodiments.

FIG. 54 illustrates placements of some embodiments of the storage elements and arithmetic elements described above. For instance, in some embodiments, clocked storage element 5410 may be placed within the routing fabric 5420 of the IC. Likewise, in some embodiments, unclocked storage element 5440 may be placed within the routing fabric 5420 of the IC. In some embodiments, unclocked storage element 5460 may be placed within the routing fabric 5420 of the IC. Similarly, in some embodiments, unclocked storage element 5480 may be placed within the routing fabric 5420 of the IC.

In some embodiments, hybrid storage element 5415, which is described in detail above by reference to FIGS. 21-25, may be placed within the routing fabric 5420 of the IC. Likewise, in some embodiments, hybrid storage element 5425, which is described in detail above by reference to FIGS. 38-42, may be placed within the routing fabric 5420 of the IC. In some embodiments, arithmetic element 5435, which is described in detail above by reference to FIGS. 48-53, may be placed within the routing fabric 5420 of the IC. In some embodiments, multiple storage elements may be placed within the routing fabric 5420 of the IC. In some embodiments, multiple types of storage elements may be placed within the routing fabric 5420 of the IC.

In addition to alternative placement of storage elements, while many examples given above were shown with certain sub-elements (e.g., the flip-flops 2945 of storage element 2940, or the cross-coupled inverters 1970 of storage element 1920, etc.), one of ordinary skill in the art will recognize that other sub-elements may be used. For example, in other embodiments of storage element 2940, the flip-flops 2945 could be replaced with storage elements that are controlled by configuration data, or in other embodiments of the storage element 1920 the cross-coupled inverters 1970 could be replaced by cross-coupled pull-down transistors.

One of ordinary skill in the art will recognize that the examples given above are for illustrative purposes only. For example, other embodiments may place the storage elements in other locations within the IC (e.g., memory, at the input and/or output stages, etc.).

VI. Power Reduction in Configurable Integrated Circuits

In some configurable ICs, configurable interconnect and configurable logic circuits are arranged in an array with multiple configurable interconnects and/or multiple configurable logic circuits in a given section of the array. These sections can draw power even when some of the configurable circuits in the section are not in use. These sections draw even larger amounts of power when they are being reconfigured. Therefore it's useful to reduce the amount of power drawn by these configurable ICs.

A. Using Storage Elements to Prevent Bit Flicker

Figure 55:
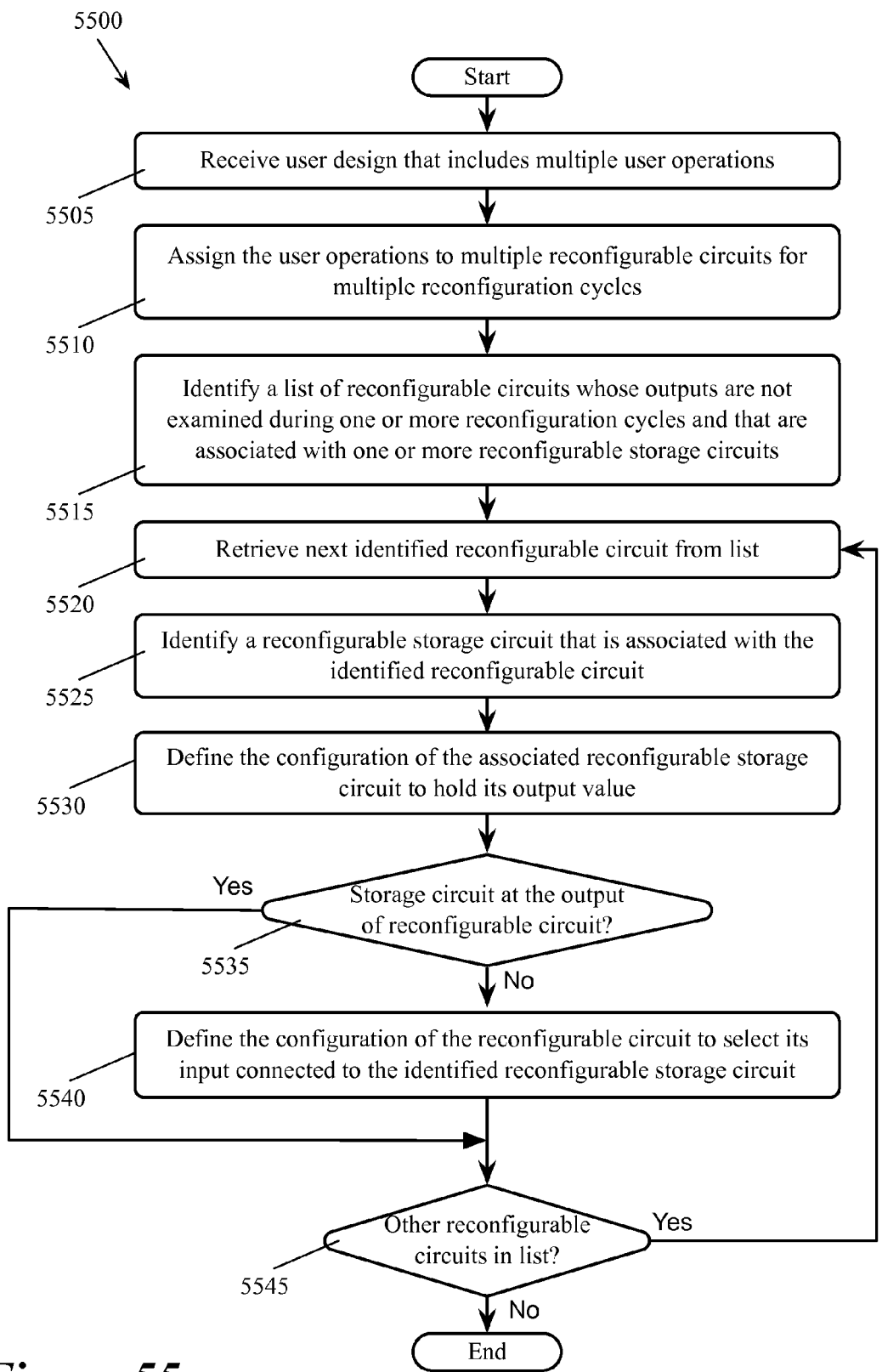
FIG. 55 illustrates a process for using the storage element in the routing fabric to prevent bit flicker.

Some embodiments use a combination of storage and interconnect circuits to perform functions other than storage operations. For instance, FIG. 55 illustrates a process 5500 for using the storage element in the routing fabric to prevent bit flicker, thus reducing power consumption. As shown, the process receives (at 5505) a user design that includes multiple user operations. The process next assigns (at 5510) user operations to the reconfigurable circuits of the IC (for example, the reconfigurable circuits 1810 and 1820 of FIG. 18). Next, the process 5500 identifies (at 5515) a list of any reconfigurable circuits that have unexamined outputs during particular reconfiguration cycles (e.g., the circuits 1810 and 1820 from the example of FIG. 18) and that are associated with one or more reconfigurable storage circuits (e.g., the circuit 1805 from the example of FIG. 18). A storage element is defined to have an association with a reconfigurable circuit when an output of the reconfigurable circuit is directly connected to an input of the reconfigurable storage circuit, or when an output of the reconfigurable storage circuit is directly connected to an input of the reconfigurable circuit.

The process then retrieves (at 5520) the first reconfigurable circuit in the list and identifies (at 5525) a storage circuit that is associated with the retrieved reconfigurable circuit. The process 5500 next defines (at 5530) a configuration for the associated storage circuit such that it holds the value that it was outputting in a reconfiguration cycle prior to the particular reconfiguration cycle. The storage circuit may be configured to either pass-through a value from its input to its output during a particular reconfiguration cycle, or hold a value that it was outputting during a previous reconfiguration cycle. This prevents unnecessary transitions at the output of the identified storage element, for instance at the output of storage circuit 1805 from the example of FIG. 18. In some cases, the load presented by the section of wire leading from the output of the latch 1805 to the input 1830 of the next circuit 1820 is significant, and thus eliminating unnecessary transitions can produce substantial power savings.

The process 5500 next determines (at 5535) whether the storage circuit is at the output of the reconfigurable circuit at an input of the reconfigurable circuit. When the process 5500 determines that the storage circuit is connected to the output of the reconfigurable circuit, the process proceeds to 5545. When the process 5500 determines that the storage circuit is connected to the input of the reconfigurable circuit, the process defines (at 5540) a configuration for the reconfigurable circuit to select the input that is connected to the storage circuit's output. As such, bit flicker at the output of the reconfigurable circuit is prevented because the value latched by the storage circuit is selected as the input of the reconfigurable circuit.

Finally, the process 5500 determines (at 5545) whether there are any other reconfigurable circuits in the list. If so, the process repeats the operations 5520-5545 until all the reconfigurable circuits in the list have been addressed, at which point the process ends.

B. Sub-Cycle Reconfiguration Signal Gating

Figure 56:
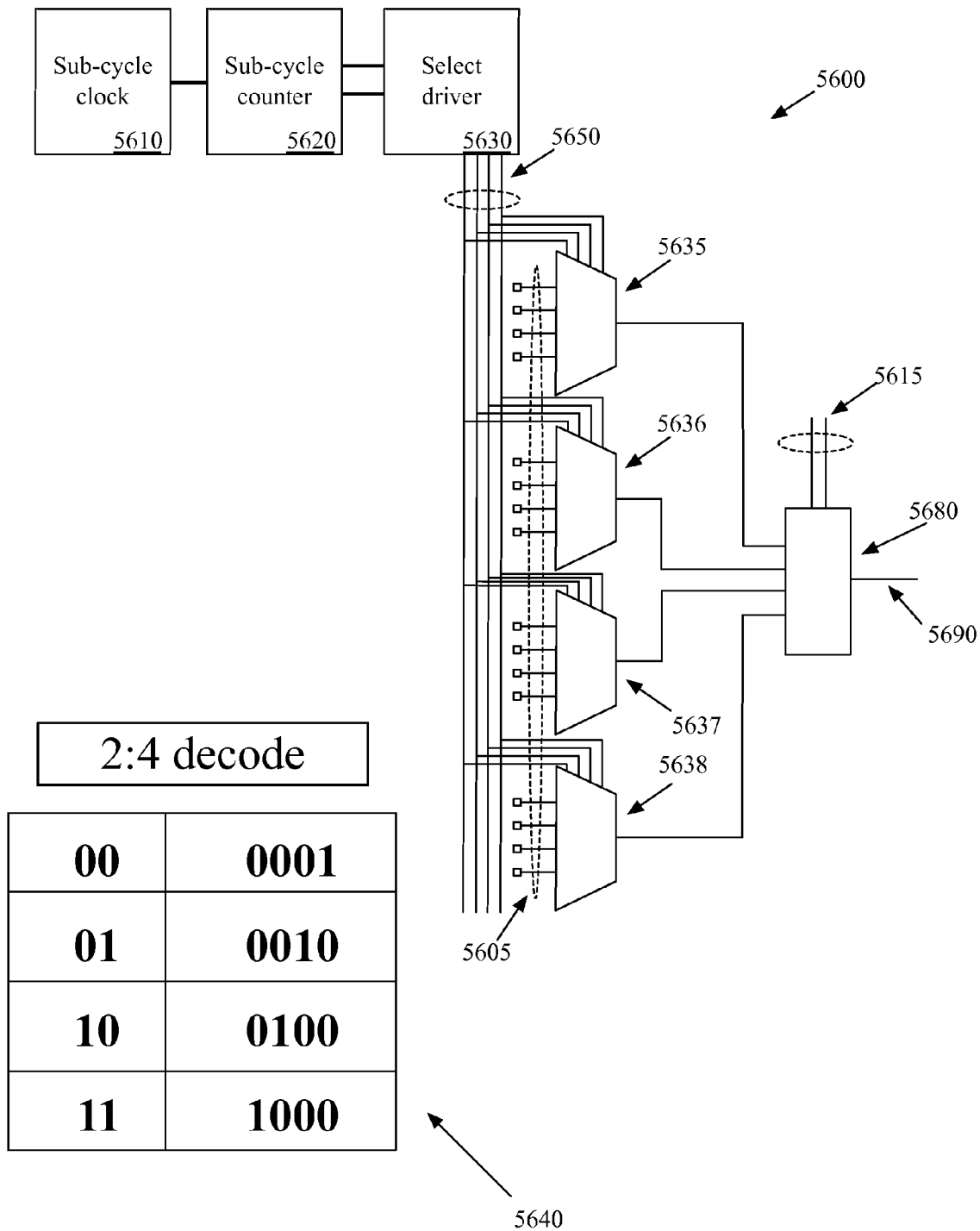
FIG. 56 conceptually illustrates a sub-cycle reconfigurable circuit that is controlled by a set of select lines.

The ICs of different embodiments implement the reconfiguration process in different ways. FIG. 56 conceptually illustrates a sub-cycle reconfigurable circuit 5600 that is controlled by a set of select lines 5650 of multiplexers 5635-5638 for supplying configurable circuit data. As shown, the configuration circuits are implemented as the set of 4 to 1 multiplexers 5635-5638. The group of circuits 5600 includes 16 configuration cells 5605, a set of four select lines 5650 that feed into the selects terminals of the four multiplexers 5635-5638, and a set of two input lines 5615 for a LUT 5680 with one output line 5690.

Each of the configuration cells 5605 stores one bit of configuration data. In some embodiments, the select lines 5650 receive a selection of a new active input for the multiplexers 5635 in each sub-cycle. Based on the select lines 5650, the multiplexers 5635-5638 selectively connect the 16 configuration cells 5650 to the configurable LUT 5680. That is, the multiplexers 5635 sequentially provide four sets of configuration data to the LUT 5680, one set of four bits per sub-cycle. LUT 5680 provides the value of one of the four configuration bits supplied in a given sub-cycle as output on output line 5690. The input lines 5615 provide the input data for the LUT 5680. The input data on lines 5615 determine which of the supplied configuration values will be supplied as the output of the LUT 5680.

A one-hot multiplexer with four select lines can be driven by a select driver that switches the appropriate line to "hot" for each of four sub-cycles. The figure shows sub-cycle clock 5610, sub-cycle counter 5620, select driver 5630, and logic table 5640. The sub-cycle clock 5610 provides a sub-cycle clock signal. The sub-cycle counter 5620 keeps track of which sub-cycle is the reconfigurable circuit 5610 currently operating in. The select driver 5630 drives the appropriate signal line 5650 in each sub-cycle. Table 5640 shows one implementation of a logic table that translates sub-cycle numbers to active select lines.

For each sub-cycle, the sub-cycle clock 5610 provides a signal that tells clocked circuits when to perform whatever functions they are designed to perform upon the changing of a sub-cycle (e.g., the sub-cycle clock signal could switch from "0" to "1" and back again each sub-cycle). The sub-cycle counter 5620 keeps track of what the present sub-cycle is. In some embodiments, the sub-cycle counter 5620 keeps track by incrementing a binary counter once per sub-cycle. The counter goes through binary values 00, 01, 10, and 11 before returning to 00 and starting the count over. In embodiments with different loopered numbers, the binary values of the count will be different. In some embodiments the counter will use different numbers of binary digits or even use non-binary values. The select driver 5630 receives a signal from the sub-cycle counter corresponding to the present sub-cycle (e.g., a signal of "00" in sub-cycle 0, "11" in sub-cycle 3, etc.). The select driver 5630 then activates whichever select line (among select lines 5650) corresponds to the present sub-cycle. The select driver 5630 may be described as "driving" the active select line 5650, or even "driving" one or more reconfigurable circuits. For example, the select line 5630 can be described as driving LUT 5680.

Table 5640 shows a logical conversion of binary values from the counter 5620 to active select line 5650. The left column of table 5640 shows sub-cycles from 0-3 (in binary); while the right column of the table indicates which select line is "hot" in that sub-cycle. A value of logic "1" on a select line selects a corresponding configuration cell 5605 for each multiplexer 5635 to connect to the output of that multiplexer. If a configuration cell 5605 of one multiplexer 5635 in one cycle stores a different bit value (e.g., "0" in sub-cycle 1 and "1" in sub-cycle 2) than the configuration cell 5605 of the previous sub-cycle, then changing the "hot" select line changes the output of that multiplexer 5635 from one sub-cycle to the next. Changing the output of the multiplexer changes the value of the configuration bit presented to reconfigurable LUT 5680.

If a configuration cell 5605 of one multiplexer 5635 in one cycle happens to store the same bit value (e.g., "1" in sub-cycle 2 and "1" in sub-cycle 3) as the configuration cell 5605 of the previous sub-cycle, then changing the "hot" select line does not change the output of that multiplexer 5635 from one sub-cycle to the next. Therefore, the value of the configuration bit presented to reconfigurable LUT 5680 by that multiplexer 5635 would not change.

The sub-cycle reconfigurable circuit 5600 of FIG. 56 is a four sub-cycle system having a logic circuit with four configuration bits in any given sub-cycle. Four configuration bits are enough bits to configure the two-input LUT 5680. However, the ICs of other embodiments use different numbers of sub-cycles and different numbers of configuration bits in configurable circuits. For example, the ICs of some embodiments use six or eight sub-cycles instead of four and/or LUTs with other numbers of configuration bits per sub-cycle instead of four configuration bits per sub-cycle. Like the ICs of the embodiments illustrated in FIG. 56, the ICs some embodiments with other number of sub-cycles and/or configuration bits per sub-cycle also use multiplexers to provide different configuration data to configurable circuits in each sub-cycle. The reconfigurable circuit in FIG. 56 is shown as a LUT; however, any reconfigurable circuit can receive configuration data from such a circuit arrangement or other circuit arrangements.

During the sub-cycle reconfiguration, the fewer configuration bits of a configurable circuit that are changed from one sub-cycle to the next, the less energy is used. In some embodiments, a configurable circuit that does not have any configuration bits changed in a given sub-cycle presents an opportunity for saving even more energy.

Extra energy is required to change from one active select line to another, even if the end result is a configuration bit with the same value as in the previous cycle. In cases where a configuration bit is supposed to change values from one sub-cycle to the next, the next select line of the configuration selecting multiplexer (e.g., multiplexer 5635) is activated to produce that change. For example, if a configuration bit is supposed to be "0" in sub-cycle 1 and "1" in sub-cycle 2, then the select line connecting to the sub-cycle 1 configuration cell (that stores a "0") is turned off and the select line connecting to the sub-cycle 2 configuration cell (that stores a "1") is turned on. In that example, leaving the select line for sub-cycle 1 on instead of switching to the select line for sub-cycle 2 would result in the configuration bit being incorrect in sub-cycle 2 (i.e., still "0" instead of changed to "1").

However, in configurations where a configuration bit is not supposed to change from one sub-cycle to the next, keeping the same select line active does not produce the wrong configuration bit in sub-cycle 2. For example, if a configuration bit is "1" in both sub-cycle 1 and sub-cycle 2, then the configurable circuit would receive the correct bit "1" in sub-cycle 2, whether the multiplexer supplied a connection to the sub-cycle 1 configuration cell (that stores a "1") or a connection to the sub-cycle 2 configuration cell (that also stores a "1"). Therefore, switching the select line (or not switching the select line) from sub-cycle 1 to sub-cycle 2 would make no difference to the configuration of that particular bit of the configurable circuit. Accordingly, some embodiments provide circuitry that maintains the same active select line as long as none of the configuration values driven by a particular select driver change from one sub-cycle to the next. Maintaining the same active select line through a sub-cycle (for a particular set of circuits) is sometimes referred to herein as "skipping the sub-cycle". For example, if the select line for sub-cycle 0 is kept hot through sub-cycle 1, for brevity that may be described as "skipping SC1".

There are three circumstances in which none of the configuration values driven by a particular select driver change. The first circumstance is if each configurable circuit driven by that select driver uses the same configuration in both sub-cycles. In that case, the configuration doesn't need to change when the sub-cycle changes because the configuration is already set to what it is supposed to be in the second sub-cycle. The second circumstance is if each configurable circuit driven by that select driver is unused in a particular sub-cycle. If a configurable circuit is unused in a sub-cycle, the configurable circuit doesn't have a configuration that it is supposed to be in that sub-cycle, so any configuration can be provided without affecting the user design. For an unused configurable circuit, the output of the configurable circuit is irrelevant. Accordingly, the configuration which affects that output is also irrelevant. The third circumstance is if all configurable circuits driven by a particular select driver either use the same configuration as in the previous sub-cycle or are unused. In such a case, some configurations don't need to change because the circuits are unused, and some don't need to change because the circuits are already configured correctly.

Figure 57:
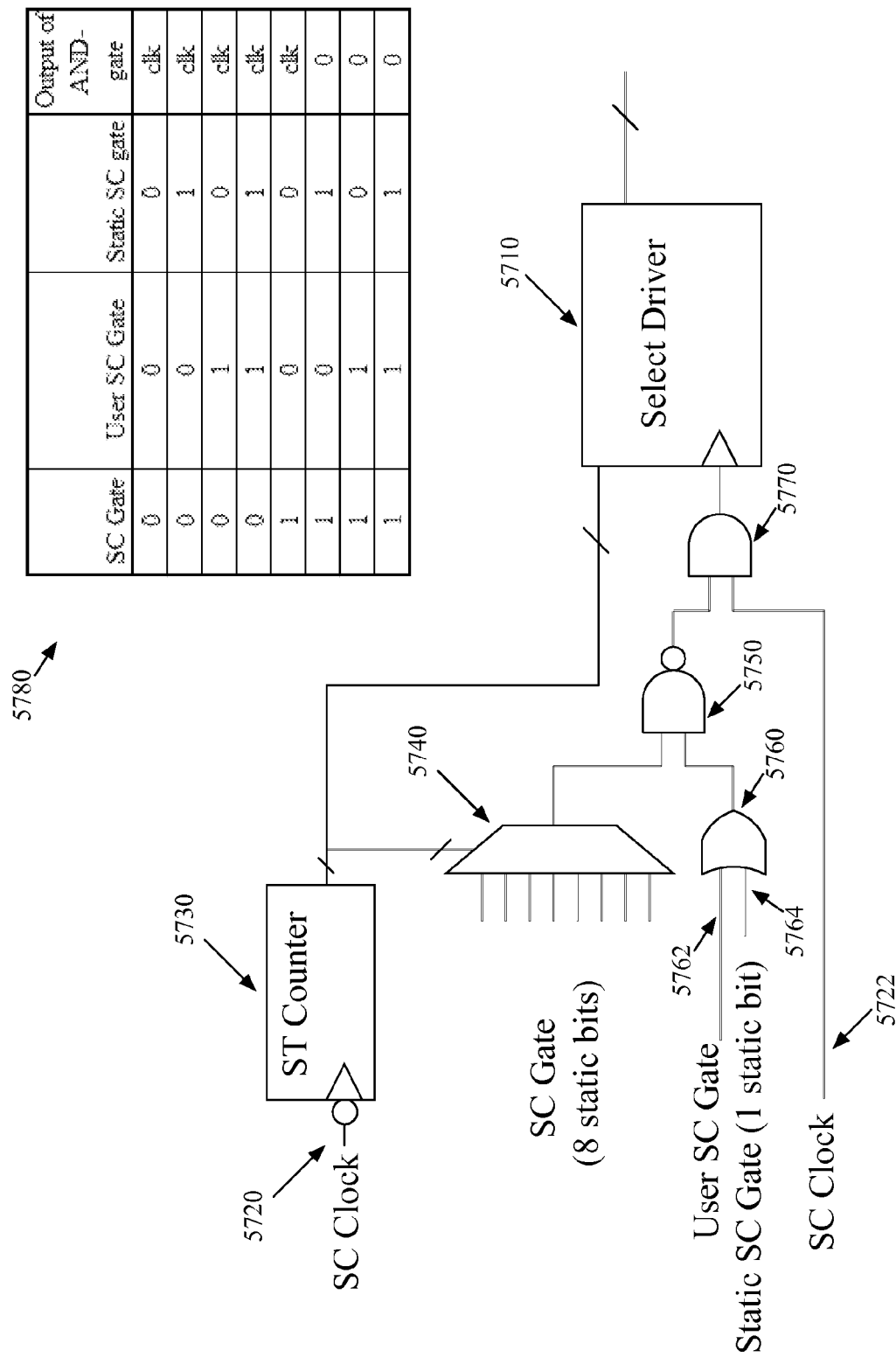
FIG. 57 illustrates a gating circuit that selectively maintains the select line of a previous sub-cycle.

In some embodiments, when no circuits in a row are due to change configuration, the select driver for that row maintains the same select line as active. FIG. 57 illustrates a gating circuit that selectively maintains the select line of a previous sub-cycle. As shown in this figure, the circuitry 5700 includes a select driver 5710, input lines 5720 and 5722, a space-time (ST) counter 5730, a sub-cycle (SC) gate 5740, a NAND-gate 5750, an OR-gate 5760 with inputs 5762 and 5764, an AND-gate 5770, and a logic table 5780.

The select driver 5710 drives select lines for selecting among the pre-loaded configurations of its associated reconfigurable circuits (e.g., configurable LUTs, RMUXs, etc.) during specific sub-cycles. The input lines 5720 and 5722 receive signals from a sub-cycle clock. The ST Counter 5730 keeps track of which sub-cycle the IC is implementing. The SC gate 5740 is a multiplexer connected to data storage units that store data relating to the configuration in each sub-cycle. NAND-gate 5750 outputs a negative result when both of its inputs are positive and a positive result otherwise. OR-gate 5760 outputs a positive result if either of its inputs is positive and a negative result if neither of its inputs is positive. Input 5762 receives a signal from a user sub-cycle gate and input 5764 receives a signal (e.g., a configuration bit value) from a static sub-cycle gate. AND-gate 5770 outputs a positive result if both its inputs are positive and a negative result otherwise. Logic table 5780 shows which sets of inputs from various sources will allow or block the sub-cycle clock signal on input line 5722.

During sub-cycles in which no configuration of any configurable circuit driven by a particular select driver is changed, the illustrated circuitry saves power by not changing select lines during that sub-cycle. In some embodiments, a set of configurable circuits driven by a select driver is used in some instances of a sub-cycle, but not in other instances of that sub-cycle. For example, a set of circuits could be configured in the layout as an adder in sub-cycle 3. During runtime of the IC, the adder may not be used in sub-cycle 3 of every user design clock cycle. A program running on the user design implemented by the IC may identify times when the adder is not used. The circuitry in this figure can receive a user signal that indicates that the select driver doesn't need to change select lines for a particular instance of sub-cycle 3 (or any particular sub-cycle). The circuitry can also receive a signal from a static SC gate to tell the circuitry that the select driver doesn't need to change select lines for any instance of sub-cycle 3.

Like select driver 5630 in FIG. 56, the select driver 5710 receives signals from an ST counter 5730 that identifies the current sub-cycle. The select driver 5710 drives select lines, each of which corresponds to a particular sub-cycle. For brevity, the select line that corresponds to sub-cycle 0 will be referred to as select line 0, and so forth. However, unlike the select driver 5630 in FIG. 56, the select driver 5710 is gated. That is, rather than always switching from driving the select line corresponding to the previous sub-cycle to the select line corresponding to the current sub-cycle, the select driver 5710 changes the active select line only when it also receives a clock signal through AND-gate 5770.

For example, if the ST counter 5730 sends a signal indicating that the current sub-cycle has changed from sub-cycle 4 to sub-cycle 5 and the AND-gate 5770 passes a clock signal to select driver 5710 in that sub-cycle, then the select driver 5710 will switch from driving select line 4 to driving select line 5. In contrast, if the ST counter 5730 indicates a change from sub-cycle 4 to sub-cycle 5, but AND-gate 5770 does not pass a clock signal in that sub-cycle, then the select driver will continue to drive the same select line (select line 4) as in the previous sub-cycle. That is, the select driver 5710 will continue to drive the same select line until it receives a clock signal through AND-gate 5770. Once the select driver 5710 receives a clock signal through AND-gate 5770, the select driver 5710 will switch the active select line to the select line for the then current sub-cycle. So, if the clock is blocked in sub-cycles 5-6 and unblocked in sub-cycle 7, then select line 4 will be active during sub-cycles 4-6 and select line 7 will be active in sub-cycle 7.

The circuitry connecting to the upper input of the AND-gate 5770 ensures that the clock signal passes through AND-gate 5770 in sub-cycles in which the configuration bits controlled by the select driver 5710 are supposed to change. The circuitry also ensures that the clock signal does not pass through the AND-gate 5770 in sub-cycles in which the configuration bits controlled by the select driver 5710 are not supposed to change. Configuration cells (not shown) connected to the inputs of SC gate 5740 store data for each sub-cycle. The data identify sub-cycles in which no circuits driven by select driver 5710 need a change of configuration. This figure illustrates an SC gate 5740 with eight inputs for an eight loopered system. However, SC gates for systems with other looper numbers may have other numbers of inputs. The placement and routing processes of some embodiments identify the sub-cycles in which no reconfiguration of circuits driven by select driver 5710 is needed. The placement and routing processes of some embodiments define configuration values to store in the configuration cells of SC gate 5740 based on the identified sub-cycles. For example, in the embodiment of FIG. 57, the placement and routing processes define the configuration values of the SC gate to be "1" when no reconfiguration of circuits driven by select driver 5710 is needed.

The gating circuitry of some embodiments uses an SC gate to determine in which sub-cycles to skip reconfiguration by blocking the clock signal without a NAND gate 5750 or OR gate 5760. However, the gating circuitry illustrated in FIG. 57 uses other inputs in combination with the data in the SC gate 5740 to determine whether to block the clock signal. Here, the SC gate 5740 and at least one of the inputs 5764 and 5762 of OR-gate 5760 must cooperate to block the clock signal. This is shown in logic table 5780. The clock signal passes through AND gate 5770 unless the output of the SC gate 5740 is "1" and at least one of the User SC gate (input 5762) and the Static SC gate (input 5764) is "1".

If the SC gate 5740 is set to "1" for a particular set of sub-cycles, then it is possible to block the clock signal from reaching the select driver 5710 in that particular set of sub-cycles. The clock signal of some embodiments can be blocked at every instance of the sub-cycles in that particular set. The clock can be blocked at some instances of the sub-cycles in that particular set and allowed to pass in other instances of the sub-cycles of that particular set in some embodiments. The gating circuitry illustrated in FIG. 57 allows the clock to be blocked either in every instance of any given sub-cycle or in instances selected by the user design.

In some embodiments, the Static SC gate on input 5764 will be defined to be "1" by the placement and routing program when there are no sub-cycles in which the clock input of the select driver 5710 needs to be blocked intermittently. If the static SC-gate is set to "1", then the configurable circuit will not be reconfigured in any sub-cycle in which the SC gate 5740 is set to "1". Alternatively, if there are sub-cycles in which the clock input of the select driver 5710 needs to be blocked intermittently, the Static SC gate 5764 will be defined to be "0" by the placement and routing program and the User SC gate will be set to "1" by a user-signal whenever the output of the configurable circuit is not relevant. For example, the User SC gate will be set to "1" when a program running on the configurable IC will be unaffected by the output of that configurable circuit, either because the circuit is never used in that particular sub-cycle or because the output happens to be irrelevant in a specific instance of that sub-cycle.

While the IC of some embodiments use the specific circuits shown in FIG. 57, in the IC of other embodiments, different arrangements of circuits are implemented to control when the clock input of the select driver will be blocked. This and other alternative set of circuits that implement sub-cycle reconfiguration signal gating are further described in International PCT Application WO 2011/123151.

C. Runtime Clock Gating

Bit flickering causes noise and consumes power. One can reduce power consumption within the IC by reducing bit flickering in the IC fabric. Bit flickering in the IC fabric can be reduced by closing storage elements that flickers so that the outputs of those closed storage elements neither flicker nor propagate flickers. This type of flicker prevention can be done at compile time by setting configuration bits to close the storage elements, as described above by reference to FIG. 55.

An alternative approach is to perform bit flicker prevention during runtime. One approach is to perform clock gating on storage elements that flickers. Clock gating saves power by disabling portions of the circuitry to prevent bit flickering. However, clock gating usually requires adding additional hardware to the IC and may introduce delay. Another approach is to force an output multiplexer of a KMUX or YMUX to select a quiet path (e.g., a path with storage elements that are closed) by having the configuration retrieval circuit of the output multiplexer supply a default value (e.g., 0) to the select line of this multiplexer. As a result, the signals outputted by the output multiplexers remain constant and power consumption of the circuit is reduced.

In some embodiments, a user signal is used to force the configuration retrieval circuit during runtime into supplying the default value in order to force the selection of the quiet path. In some embodiments, such a signal is referred to as the "consort" signal, and the configurable interconnect circuit (such as a KMUX or YMUX) being forced into the power saving mode in such a manner is referred to as being driven into the "consort" mode.

Figure 58:
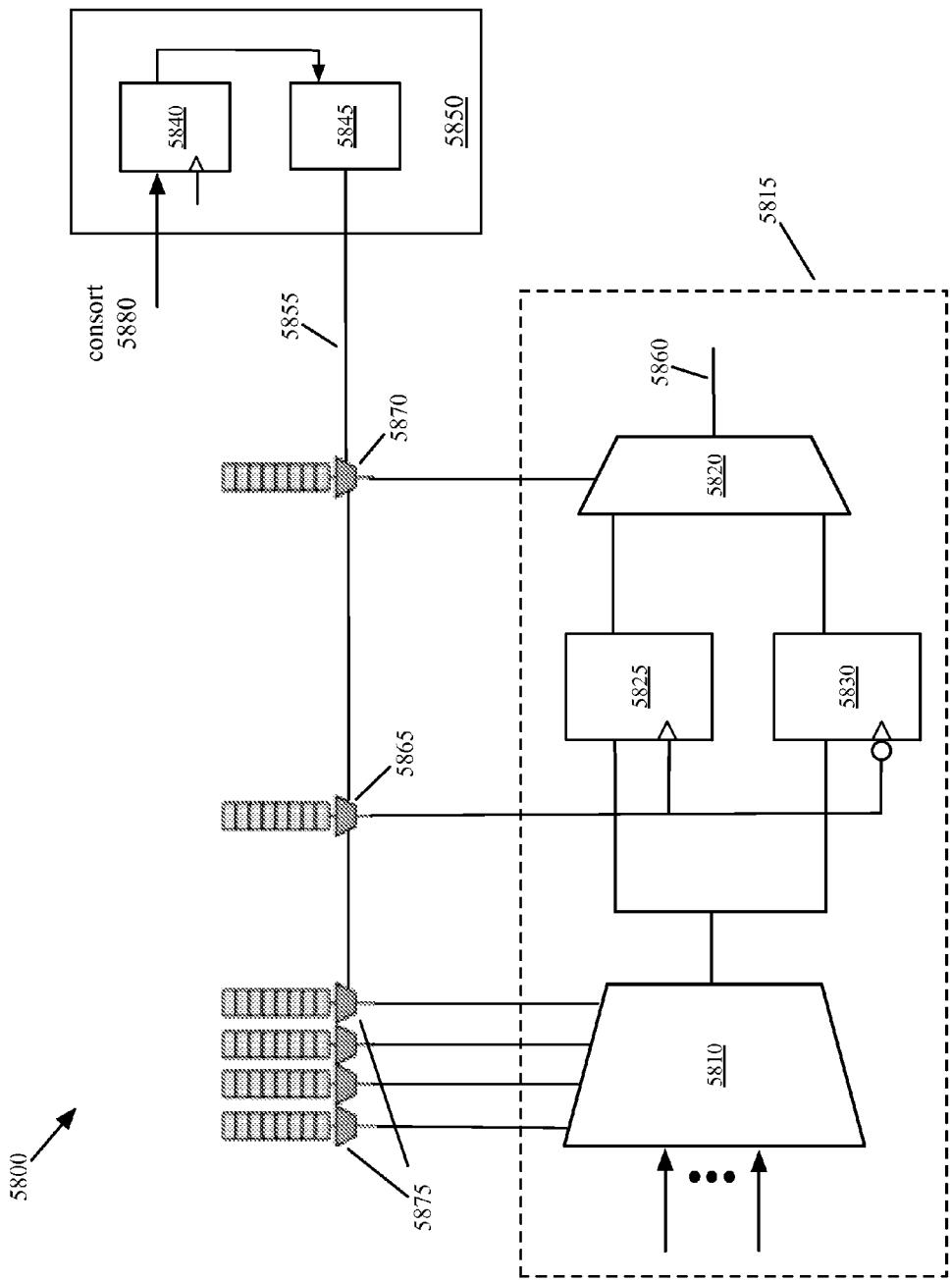
FIG. 58 illustrates an example runtime flicker prevention circuit that forces an RMUX/YMUX pair to select a quiet path.

FIG. 58 illustrates an example runtime flicker prevention circuit 5800 that forces a output multiplexer of a YMUX to select a quiet path. The YMUX includes a parallel distributed output path for configurably providing a pair of storage elements, in which one of the pair of storage element is closed and does not flicker. As shown in FIG. 58, the circuitry 5800 includes an RMUX/YMUX pair 5815, a row configuration controller 5850, and a set of configuration retrieval multiplexers 5875, 5865, and 5870 for selecting configuration data from associated configuration data storages.

The RMUX/YMUX 5815 performs routing and storage operations by distributing an output signal of a RMUX 5810 through a parallel path (including configurable storage elements 5825 and 5830) to inputs of a 2:1 output multiplexer 5820. The parallel path includes a first path and a second path. The first path passes the output of the RMUX 5810 through the configurable storage element 5825, where the output may be optionally stored (e.g., when the storage element 5825 is enabled) before reaching a first input of the output multiplexer 5820. The second path runs in parallel with the first path and passes the output of the RMUX 5810 through the configurable storage element 5830, where the output may be optionally stored (e.g., when the storage element 5830 is enabled) before reaching a second input of the output multiplexer 5820.

The same configuration bit retrieved from the configuration retrieval multiplexer 5865 controls both storage elements 5825 and 5830. The configuration bit controls storage element 5825 while the inverted version of the configuration bit controls storage element 5830. As a result, when one of the storage elements 5825 and 5830 is enabled (closed or storing a signal), the other one is disabled (open or passing a signal), and vice versa. A configuration bit retrieved from the configuration retrieval multiplexer 5870 selects either the output from storage element 5825 or the output from storage element 5830 as the output of the multiplexer 5820. The four configuration retrieval multiplexers 5875 provide configuration bits to the RMUX 5810 for selecting one of 16 inputs of the RMUXS 5810 as output to the parallel path that includes 5825 and 5830.

As illustrated in FIG. 58, each of the configuration retrieval multiplexers is associated with eight configuration data storages. Each of the eight associated configuration data storages stores a configuration data bit for a particular reconfiguration sub-cycle. The configuration retrieval multiplexers receive a set of select lines 5855 from the row configuration controller 5850. Based on the received select lines 5855, each of the configuration retrieval multiplexers (5875, 5865, and 5870) selects one of the associated configuration bits as its output. In some embodiments, each of the configuration retrieval multiplexers is associated with more than eight configuration data storages (e.g., 12 or 16), and each of those associated configuration data storages stores a configuration data bit for a particular reconfiguration sub-cycle.

The row configuration controller 5850 includes a select driver 5845 and a consort processor 5840. The select driver 5845 drives select lines 5855 for selecting among the stored configuration bits (e.g., configuration bits 1-8) for the configuration retrieval multiplexers 5875, 5865, and 5870. Runtime flicker prevention is accomplished by the consort signal 5880. When the consort signal 5880 is asserted, the consort processor 5840 drives the select driver 5845 into the consort mode. The consort processor 5840 receives the consort signal 5880 and decides whether to pass on the consort signal to the select driver 5845 based on one or more configuration and/or status bits.

The select driver 5845 in consort mode drives the select lines 5855 so the configuration retrieval multiplexers 5865 and 5870 each select their "init" inputs. An "init" input is an input that is hardwired to a default value (e.g., ground) rather than from a loadable configuration data storage circuit. In some embodiments such as the example circuit 5800 in which there are 8 associated configuration data storages for each of configuration retrieval multiplexers 5865 and 5870, the init inputs are the $9^{th}$ input of the configuration retrieval multiplexers. In some embodiments in which there are different number of associated configuration data storages for each of the configuration retrieval multiplexers (e.g., 12 or 16), the init inputs can be another input of the configuration retrieval multiplexer.

The init inputs of configuration retrieval multiplexers keep storage elements in the routing fabric at a known state before the chip is configured. When the init inputs of configuration retrieval multiplexers 5865 and 5870 are selected during runtime (i.e., consort mode), zeros are outputted as the configuration bits to the RMUX/YMUX 5815. The zeroed configuration bits under consort mode force the storage circuit 5825 to be open and the storage circuit 5830 to be closed. The zeroed configuration bits also force the output multiplexer 5820 to select the closed storage elements 5830 as its output 5860. Consequently, the output 5860 remains stable and bit flicker is prevented. The consort signal 5880 essentially forces zeros out of the configuration retrieval multiplexers without actually having zeros stored in their associated configuration data storages.

In some embodiments, further power saving at the RMUX/YMUX pair 5815 can be accomplished by selecting the init inputs of the configuration during certain sub-cycles. Some of these embodiments make compile time determination as to during which sub-cycles the init inputs is to be selected. For several consecutive sub-cycles that the RMUX/YMUX pair 5815 needs to be put into sleep to save power consumption, the init inputs of configuration retrieval multiplexers 5865 and 5870 are selected in the first of the consecutive sub-cycle to force the output multiplexer to select the closed storage element 5830. The select lines 5855 are then frozen in the subsequent consecutive sub-cycles to further save power.

The consort signal 5880 is a signal that is identified and routed by a placement and route software. The software determines which logic circuits can be put to power saving mode (i.e., consort mode) together as a group during certain sub-cycles and identifies the consort signal accordingly. Unlike compile time flicker prevention which control flicker prevention at component level by setting specific configuration bits, the consort signal 5880 in some embodiments overrides the stored configuration bits to an entire row of components. This is because the select signals from the select lines 5855 are generated for the entire row of configuration retrieval multiplexers 5875, 5865, and 5870. Anytime the consort signal 5880 is asserted, the entire row of configuration retrieval multiplexers 5875, 5865, and 5870 are forced to select their init inputs. The routing of the consort signal 5880 is thus constrained by hardware architecture that determines which components are in the same row. In some embodiments, the placement and route software also makes sure that a circuit that generates the consort signal to put a group of circuits into sleep cannot itself be put into sleep by another consort signal.

Figure 59:
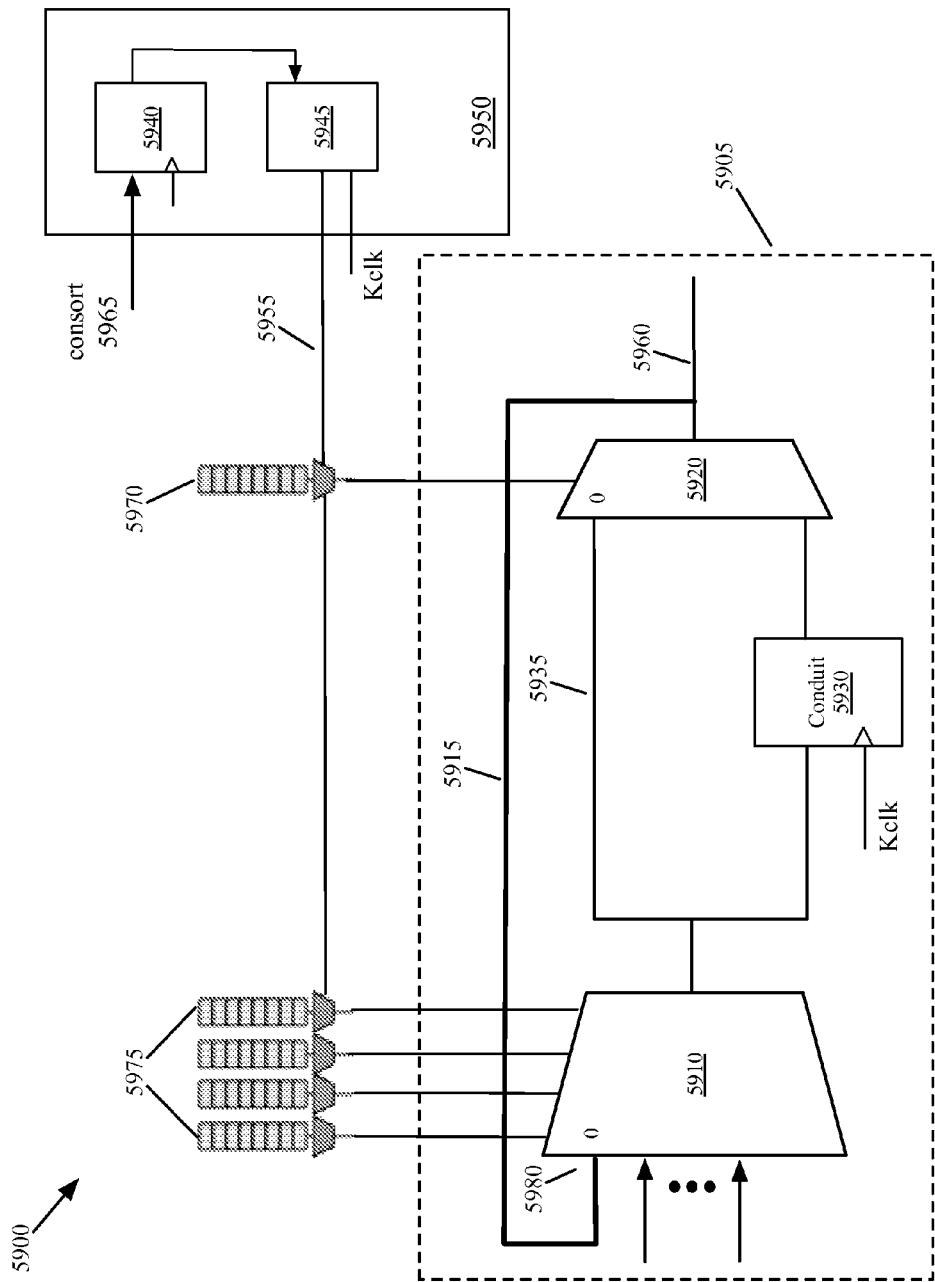
FIG. 59 illustrates another example runtime flicker prevention circuit that forces a RMUX/KMUX pair to select a quiet path.

FIG. 59 illustrates another example runtime flicker prevention circuit that forces an output multiplexer of a KMUX to select a quiet path. The KMUX includes a parallel distributed output path for controllably providing a clocked storage element and a direct connection. As shown in FIG. 59, the circuitry 5900 includes a RMUX/KMUX pair 5905, a row configuration controller 5950, and a set of configuration retrieval multiplexers 5975 and 5970 for selecting configuration data from associated configuration data storages.

The RMUX/KMUX pair 5905 performs routing and storage operations by distributing an output signal of a RMUX 5910 through a parallel path (including a clocked storage element 5930 and a direction connection 5935) to inputs of a 2:1 output multiplexer 5920. The parallel path includes a first path and a second path. The first path passes the output of the RMUX 5910 through the clocked storage element (i.e., conduit) 5930, where the output will be stored every clock cycle (or sub-cycle, configuration cycle, reconfiguration cycle, etc.) before reaching a first input of the output multiplexer 5920. The second parallel path 5935 runs in parallel with the first path and passes the output of the RMUX 5910 directly to a second input of the output multiplexer 5920.

A clock signal controls the conduit 5930. A configuration bit retrieved from the configuration retrieval multiplexer 5970 selects from either the first path or the second path as the output 5960 of the multiplexer 5920.

The four configuration retrieval multiplexers 5975 provide configuration bits to the RMUX 5910 for selecting one of 16 inputs of the RMUX 5910 as output to the parallel path (5930 and 5935). The configuration retrieval multiplexer 5970 provides configuration bit to the output multiplexer 5920 for selecting a signal from either the direction connection 5935 or the conduit 5930 as the output 5960 of the output multiplexer 5920.

As illustrated in FIG. 59, each of the configuration retrieval multiplexers has eight configuration data storages associated with it. Each of the eight associated configuration data storages stores a configuration data bit for a particular reconfiguration sub-cycle. The configuration retrieval multiplexers receive a set of select lines 5955 from the row configuration controller 5950. Based on the received the select lines 5955, each of the configuration retrieval multiplexers (5970 and 5975) selects one of the associated configuration bits as its output. In some embodiments, each of the configuration retrieval multiplexers is associated with more than eight configuration data storages (e.g., 12 or 16), and each of those associated configuration data storages stores a configuration data bit for a particular reconfiguration sub-cycle.

The row configuration controller 5950 includes a select driver 5945 and a consort processor 5940. The select driver 5945 drives select lines 5955 for selecting among the stored configuration bits (e.g., configuration bits 1-8) for the configuration retrieval multiplexers 5975 and 5970. The consort processor 5940 receives a consort signal 5965 as input. When the consort signal 5965 is asserted, the consort processor 5940 determines whether to drive the select driver 5945 into consort mode based on one or more configuration and/or status bits.

Runtime flicker prevention is accomplished by the consort signal 5965. When the consort signal 5965 is asserted, the consort processor 5940 drives the select driver 5945 into the consort mode. The select driver 5945 in consort mode drives the select lines 5955 so the configuration retrieval multiplexers 5975 and 5970 each select their "init" inputs. An "init" input is an input that is hardwired to a default value (e.g., ground) rather than from a loadable configuration data storage circuit. In some embodiments such as the example circuit 5900 in which there are 8 associated configuration data storages for each of the configuration retrieval multiplexers 5975 and 5970, the init inputs are the $9^{th}$ input of the configuration retrieval multiplexers. In some embodiments in which there are different number of associated configuration data storages for each of the configuration retrieval multiplexers (e.g., 12 or 16), the init inputs can be another input of the configuration retrieval multiplexer.

The init inputs of configuration retrieval multiplexers keep storage elements in the routing fabric at a known state before the chip is configured. When the init inputs of configuration retrieval multiplexers 5975 and 5970 are selected during runtime (i.e., consort mode), zeros are outputted as the configuration bits to the routing circuit 5910 and the output multiplexer 5920. The zeroed configuration bits under consort mode forces the RMUX 5910 to select input 5980 as its output and the output multiplexer 5920 to select input from the direct connection 5935 as its output 5960. The output 5960 of the output multiplexer 5920 feeds back to the input 5980 of the routing circuit 5910 through a feedback path 5915 to form a latch function. This latch ensures that the RMUX/KMUX pair 5905 will not propagate flicker from the RMUX 5910. Consequently, the output 5960 remains stable and bit flickering is prevented. The consort signal 5965 essentially forces zeros out of the configuration retrieval multiplexers without actually having zeros stored in their associated configuration data storages.

In some embodiments, further power saving at the RMUX/KMUX pair 5905 can be accomplished by selecting the init inputs of the configuration during certain sub-cycles. Some of these embodiments make compile time determination as to during which sub-cycles the init inputs is to be selected. For several consecutive sub-cycles that the RMUX/KMUX pair 5905 needs to be put into sleep to save power consumption, the init inputs of configuration retrieval multiplexers 5975 and 5970 are selected in the first of the consecutive sub-cycles to force the RMUX/KMUX pair 5905 to form a latch to prevent new data from coming out of the RMUX/KMUX pair 5905. The select lines 5955 are then frozen in the subsequent consecutive sub-cycles to further save power. In some embodiments, the clocked storage element 5930 is frozen (e.g., withholding clocking) to further save power.

Figure 60:
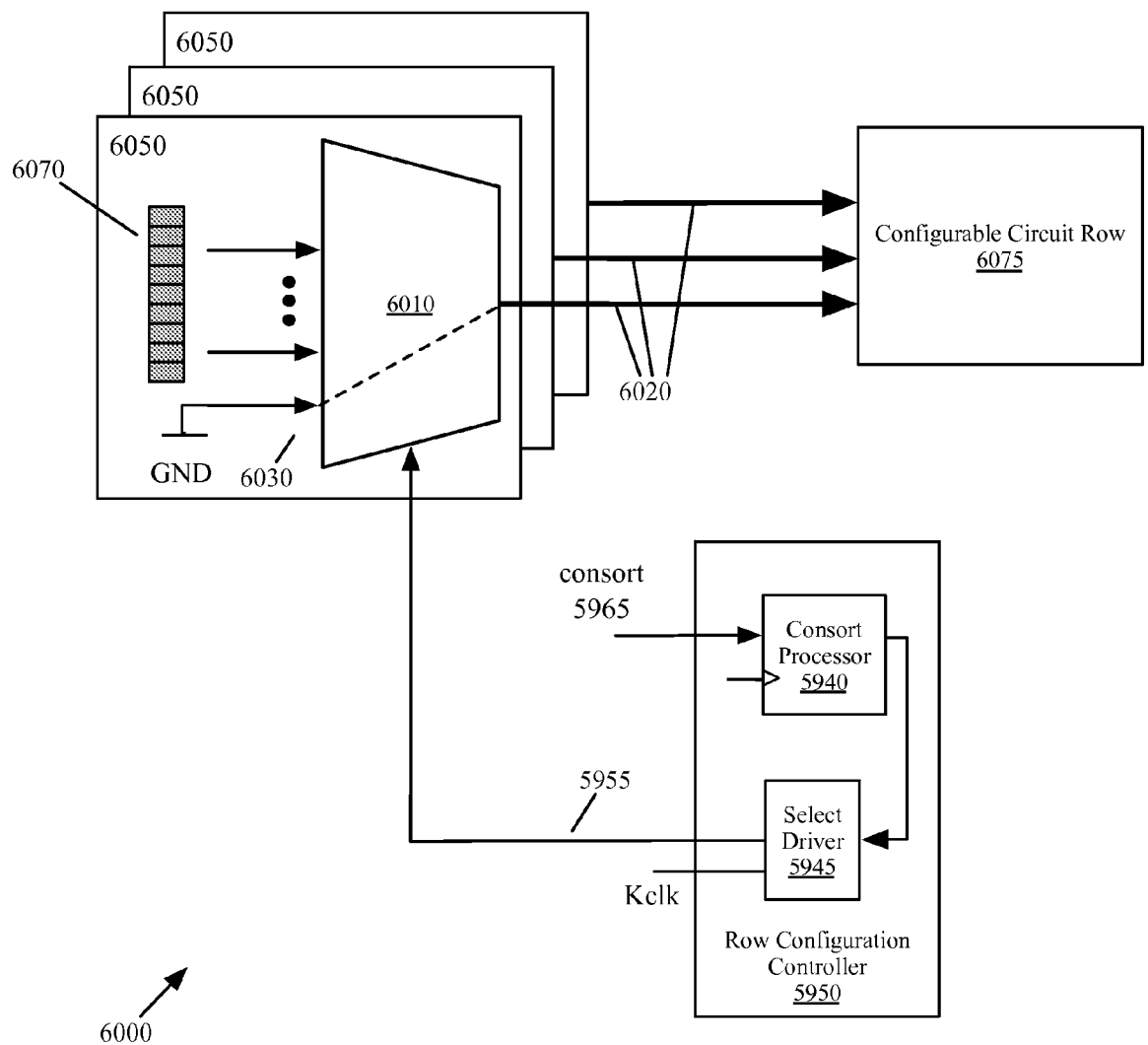
FIG. 60 conceptually illustrates forcing a configuration retrieval circuit to output zero for a configurable circuit row.

FIG. 60 conceptually illustrates forcing a configuration retrieval circuit 6010 to output zero for a configurable circuit 6075. As illustrated in this figure, the circuit 6000 includes a row configuration controller 5950, several configuration retrieval circuits 6050, and a configurable circuit row 6075.

The configuration retrieval circuits 6050 are all controlled by the same row configuration controller 5950 through the same set of select lines 5955. Each configuration retrieval circuit 6050 provides a configuration signal 6020 to a configurable circuit in the configurable circuit row 6075. Each configuration retrieval circuit 6050 includes a configuration retrieval multiplexer 6010 for selecting configuration data from associated configuration data storages 6070. The configuration retrieval multiplexer 6010 provides a configuration signal 6020 to a configurable circuit on the configurable circuit row 6075. The configuration retrieval multiplexer 6010 has eight configuration data storages 6070 associated with it. Each of the eight associated configuration data storages 6070 stores a configuration data bit for a particular reconfiguration sub-cycle. The configuration retrieval multiplexer 6010 receives a set of select lines 5955 from the row configuration controller 5950. Based on the received select lines 5955, the configuration retrieval multiplexer 6010 selects one of the associated configuration bits as its output.

The row configuration controller 5950 includes a select driver 5945 and a consort processor 5940. The select driver 5945 drives select lines 5955 for selecting among the stored configuration bits for the configuration retrieval multiplexer 6010. The consort processor 5940 receives a consort signal 5965 as input. Based on the received consort signal 5965, the consort processor 5940 determines whether to drive the select driver 5945 into consort mode.

When the consort signal 5965 is asserted, the consort processor 5940 drives the select driver 5945 into the consort mode. The select driver 5945 in consort mode drives the select lines 5955 to generate a select signal that will select the "init" input 6030 of the configuration retrieval multiplexer 6010 of each configuration retrieval circuit 6050. An "init" input is an input that is hardwired to a default value (e.g., ground) rather than from a loadable configuration data storage circuit. When the "init" inputs of configuration retrieval multiplexers 6010 are selected during runtime (i.e., consort mode), zeros are outputted as the configuration bit. The consort signal 5965 essentially forces zeros out of the configuration retrieval multiplexers 6010 without actually having zeros stored in their associated configuration data storages.

Figure 61:
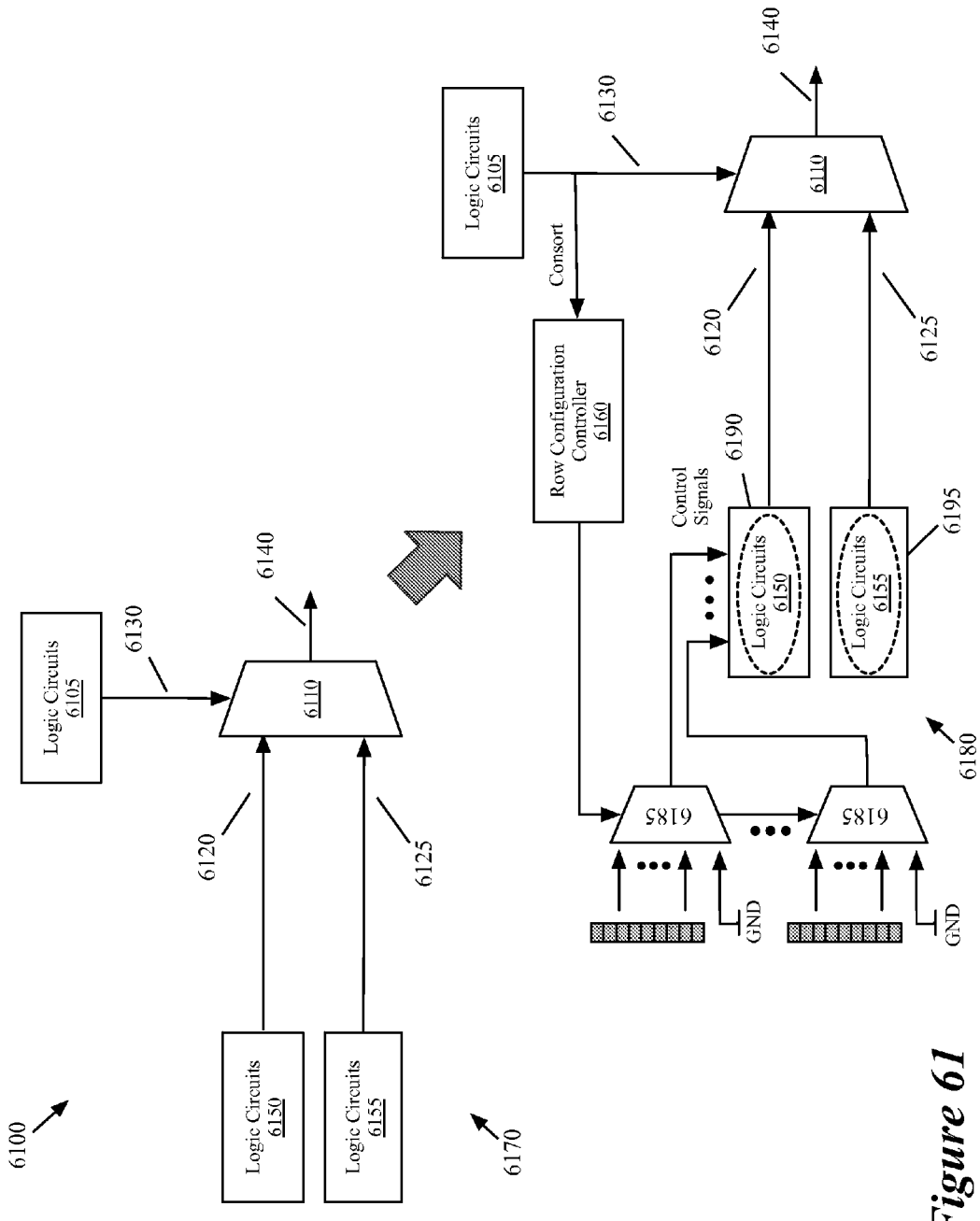
FIG. 61 illustrates identifying and routing a user signal for forcing configuration retrieval circuits to output zero for a row of configurable circuits.

In some embodiments, consort signals such as the consort signal 5880 in FIG. 58 and the consort signal 5965 in FIG. 59 come from existing user signals in the user design. In some embodiments, the routing and placement software identifies and routes the existing signal to the consort processor as the consort signal. FIG. 61 illustrates identifying and routing a user signal 6130 in a user design 6100 for forcing configuration retrieval circuits to output zero for a row of configurable circuits. Specifically, FIG. 61 illustrates two stages 6170 and 6180 of identifying and routing a consort signal during logic synthesis or placement and route of the user design 6100. The first stage 6170 shows a two-to-one multiplexer 6110 that has two inputs 6120 and 6125 and one output 6140. A user signal 6130 from logic circuits 6105 selects one of the two inputs 6120 and 6125 as output 6140 of the multiplexer 6110. A first set of logic circuits 6150 provides the input 6120 to the multiplexer 6110 and a second set of logic circuits 6155 provides the input 6125 to the multiplexer 6110.

At some point during the execution of the software tool (for logic synthesis or placement and route), if it is determined that in a number of sub-cycles the user signal 6130 is always going to select input 6125 (from the second set of logic circuits 6155) as the output of the multiplexer 6110, the software tool would know that the first set of logic circuits 6150 can be put to sleep during those sub-cycles because the input 6120 is not needed in those sub-cycles.

Once software tool identifies the user signal 6130 as being capable of indicating when the first set of logic circuit 6150 can be put into power saving mode, the software tool places the first set of logic circuit 6150 in a same row of configurable circuit 6190. The configurable circuit row 6190 is controlled by the row configuration controller 6160. The second set of logic circuit 6155 is placed in another the configurable circuit row 6195 that is controlled by another row configuration controller (not illustrated).

The user signal 6130 determines when to select the second set of logic circuits 6155 instead of the first set 6150 and is therefore able to determine the appropriate time for the first set of logic circuits 6150 to go to sleep. Specifically, the set of logic circuits 6150 should be put to sleep together when the user signal 6130 does not select the input 6120. Thus the user signal 6130 is chosen to be the consort signal to the row configuration controller 6160.

The routing and placement software needs to identify the signal 6130, route it to the row configuration controller 6160, and meet the timing requirement. As illustrated in the second stage 6180, the user signal 6130 is identified as the consort signal 6130 for the row of logic circuit 6150. When the consort signal 6130 is asserted, the row configuration controller 6160 generates select signals that force the configuration retrievals multiplexers 6185 to select their init inputs and output zeros as configuration bits for the logic circuit 6150. Consequently, the row of logic circuit 6150 enters into the consort mode to save power. In some embodiments, the user signal 6130 is routed to the row configuration controller 6160 through one or more configurable routing circuits that are configured by configuration data bits generated by the placement and routing software. In some embodiments, the placement and route software also makes sure that a circuit that generates the consort signal to put a group of circuits into sleep cannot itself be put into sleep by another consort signal.

Figure 62:
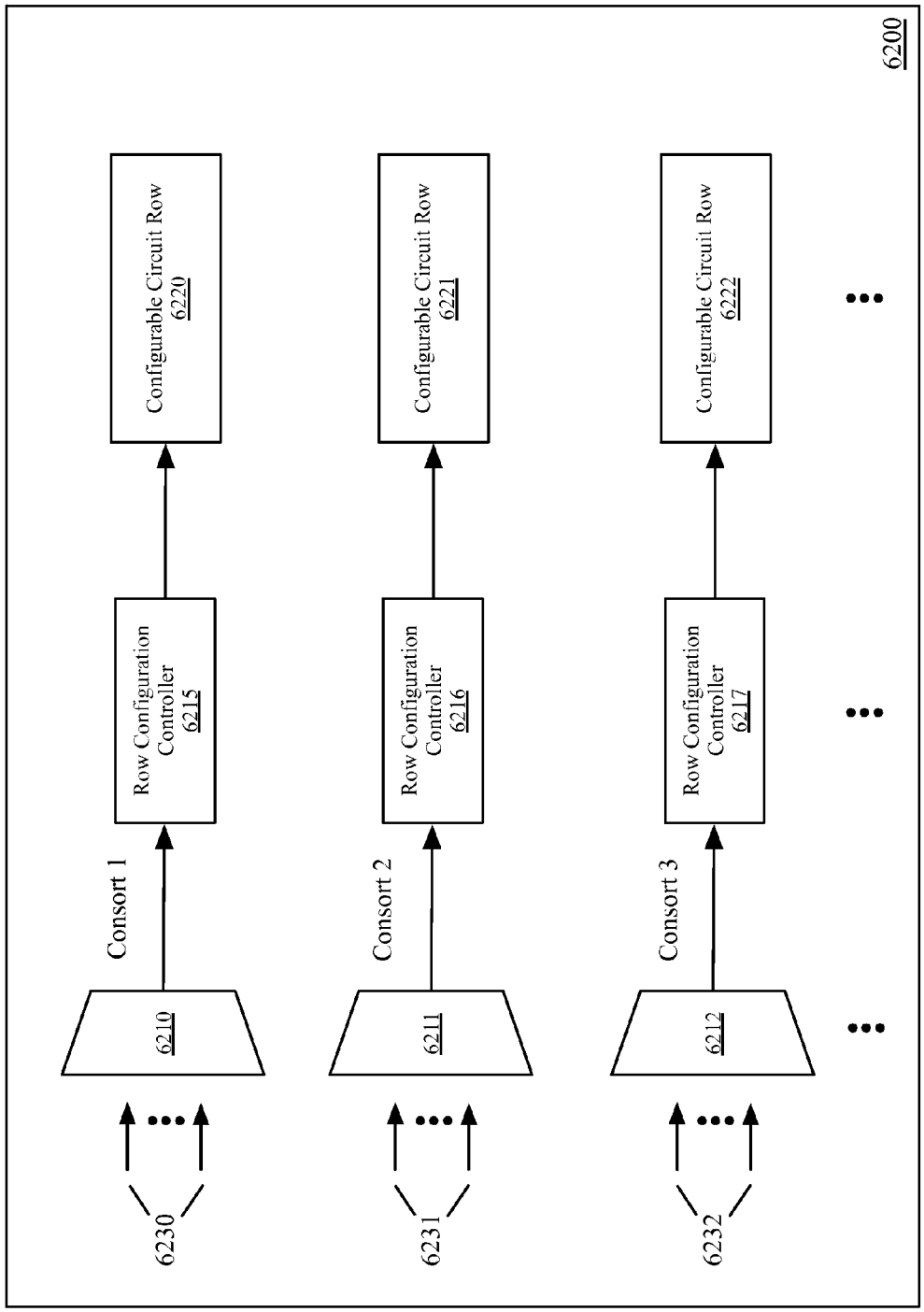
FIG. 62 illustrates a configurable IC in which different rows of configurable circuits are controlled by different consort signals.

FIG. 62 illustrates a configurable IC 6200 in which different rows of configurable circuits are controlled by different consort signals. As illustrated, the configurable IC includes routing circuits 6210-6212, row configuration controller 6215-6217, and rows of configurable circuits 6220-6222. The routing circuit 6210 receives a set of user signals 6230 and routes one of them as consort signal 1 to the row configuration controller 6215. The routing circuit 6211 receives a set of user signals 6231 and routes one of them as consort signal 2 to the row configuration controller 6216. The routing circuit 6212 receives a set of user signals 6232 and routes one of them as consort signal 3 to the row configuration controller 6217. Therefore, each of the row configuration controllers 6215, 6216, and 6217 receives its own consort signal to controls its own row of configuration circuits (respectively 6220, 6221, and 6222).

Figure 63:
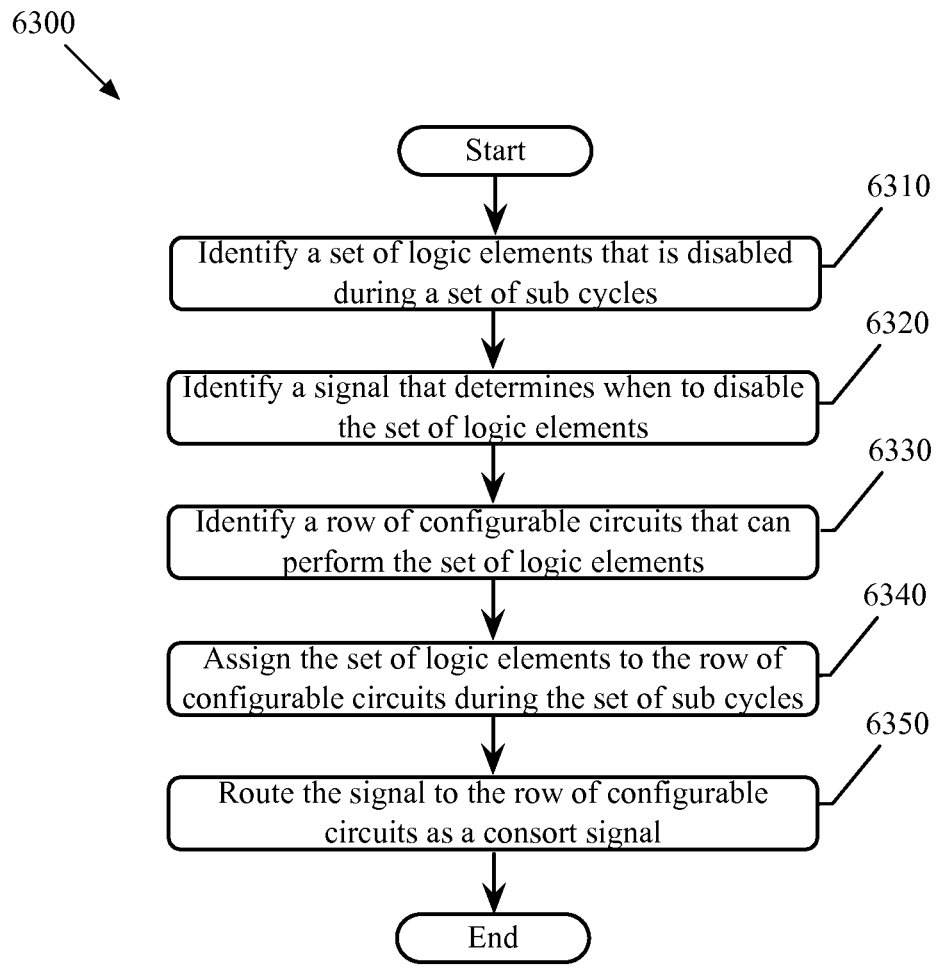
FIG. 63 illustrates a process for identifying and routing a user signal as a "consort" signal.

FIG. 63 conceptually illustrates a process 6300 for identifying and routing a user signal as a "consort" signal. Specifically, the process 6300 identifies a set of logic elements as being logically safe to be assigned to the same row of configurable circuits to enable the consort mode. In some embodiments, this process is performed by a computer program that compiles and maps a user design into configurable circuits in the IC (e.g., a placement and routing software tool).

As shown, the process 6300 identifies (at 6310) a set of logic elements that are disabled during a same set of sub-cycles. In some embodiments, logic elements that are disabled during the same set of sub-cycles can be put to sleep together during those sub-cycles. In some embodiments, the set of sub-cycles are consecutive sub-cycles. The process then identifies (at 6320) a signal that determines when (e.g., during which sub-cycles) to disable the identified set of logic elements. In some embodiments, this signal is an existing signal in the user design that can determine the timing of disabling the identified set of logic elements. For example, the user signal 6130 in FIG. 61 determines when the logic circuit 6150 can be disabled. Because the signal can determine the timing of disabling the identified set of logic elements, it can be used as the consort signal to put the row of circuits that perform the set of identified logic elements to sleep.

Next, the process identifies (at 6330) a row of configurable circuits that can perform the identified set of logic elements. This row of configurable circuits is hard wired on the IC in a way that all configurable circuits in the row can be put into sleep at the same time by asserting a consort signal for the entire row. For example, each of the configurable circuits rows 6220 in FIG. 62 can be put into sleep at the same time by asserting a consort signal for the row.

The process 6300 then assigns (at 6340) the identified set of logic elements to the identified row of configurable circuits. The identified row of configurable circuits will be configured to function as the identified set of logic elements. In addition, the identified row of configurable circuits can be disabled to save power at the identified set of sub-cycles for the identified logic elements.

Finally, the process routes (at 6350) the identified signal to the identified row of configurable circuits as the consort signal for that row. Because the identified signal determines when to disable the identified set of logic elements, it can force the identified row of configurable circuits to sleep (i.e., into consort mode) when the identified set of logic elements is disabled. In some embodiments, the process makes sure that a circuit that generates the consort signal to put a group of circuits into sleep cannot itself be put into sleep by another consort signal. Since an configurable IC implementing a user design would function correctly even if some or all of the consort signal cannot be routed successfully (albeit consuming more power), the process in some embodiments would give up routing the identified consort signal if other constraints (e.g., timing) cannot be met.

Figure 64:
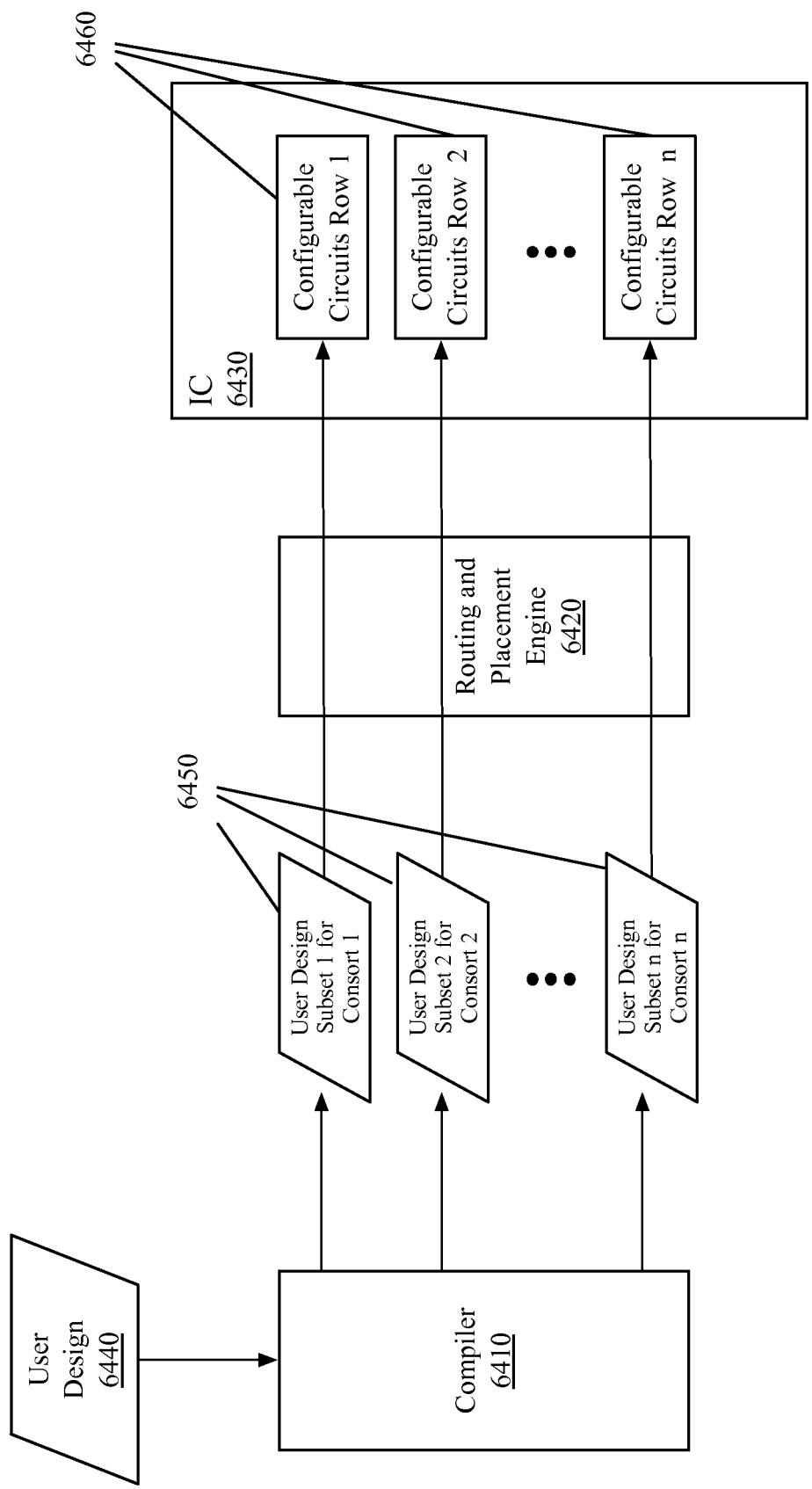
FIG. 64 illustrates assigning subsets of a user design to different rows of configurable circuits according to assignment of "consort" signals.

When the identified row of configurable circuits is put into sleep, the output of the identified set of logic elements is held stable. Consequently, bit flickering is prevented and power consumption is reduced. In order to implement the consort mode to save power consumption on an IC, portions of user design that can be put into sleep at the same time need to be identified and placed accordingly. In addition, signals or combinations of signals that can be used to put these portions of the user design to sleep needs to be identified as consort signals. FIG. 64 illustrates the assignment different subsets of a user design to different rows of configurable circuits and the identification of the consort signals for those different subsets of the user design.

The user design 6440 specifies the functionalities and/or components the IC that is to be design. In some embodiments, the user design 6440 is in the form of a hardware description language (e.g., VHDL and Verilog) code. The user design 6440 is submitted to the compiler 6410 in order to be mapped into configurable circuits in an IC.

In order to implement the consort mode, logic elements in the user design 6440 that can be disabled during the same sub-cycles need to be identified and assigned to the same row of configurable circuits. As shown in FIG. 64, this task of identifying and assigning logic elements is accomplished by a compiler 6410 and a routing and placement engine 6420. The compiler 6410 analyses the user design 6440 and divides it into several user design subsets 6450, which are then assigned to several configurable circuits rows 6460 in an IC 6430 by the routing and placement engine 6420.

The compiler 6410 receives a user design 6440 and translates it into logic elements by performing some or all of the following operations: lexical analysis, preprocessing, parsing, semantic analysis (Syntax-directed translation), netlist generation, and netlist optimization. The compiler 6410 identifies logic elements that are disabled during the same sub-cycles and puts them into the same subset. For example, logic elements in user design subset 1 can be disabled in the same sub-cycles together; logic elements in user design subset 2 can be disabled in the same sub-cycles together, etc. Consequently, the user design is divided into several user subsets of logic elements 6450, each of which contains a set of logic elements that can be disabled during the same sub-cycles by a corresponding consort signal.

In some embodiments, the compiler breaks the user design into subsets by recognizing and analyzing if-then-else logical structures in the user design. An if-then-else logical structure includes three parts: (1) a predicate (i.e., the "if"), (2) a consequent (i.e., the "then"), and (3) an alternative (i.e., the "else"). The predicate decides whether the consequent or the alternative is to be executed. In other words, when the predicate selects the consequent, the alternative is not executed and vice versa. In some embodiments, a compiler recognize a set of logic elements in the user design as corresponding to the alternative (or the consequent) of an "if-then-else" structure and assigns a user signal (or its logical complement) that correspond to the predicate as the consort signal for that set of logic elements. In the example of FIG. 61, the multiplexer 6110 implements the if-then-else logic structure, with the logic circuits 6105 providing the predicate (i.e., the user signal 6130 that is used as the consort signal) and the logic circuits 6150 and 6155 providing the consequent and the alternative.

The routing and placement engine 6420 of some embodiments assigns elements of the user design to different configurable circuits by generating the configuration data for the different configurable logic circuits. The routing and placement engine 6420 of some embodiments routes signals between logic elements by generating configuration data for configurable routing circuits. In some embodiments, the routing and placement engine 6420 receives a netlist that contains several user design subsets 6450 and assigns each user design subset to a row of configurable circuits on the IC 6430. There are several rows of configurable circuits 6460 in the IC 6430. Each user design subset is assigned to one of those rows of configurable circuits 6460 so that the row of configurable circuits can be put to sleep during the same sub-cycles by a consort signal that controls the configuration controller for that row.

While the invention has been described with reference to numerous specific details, one of ordinary skill in the art will recognize that the invention can be embodied in other specific forms without departing from the spirit of the invention. For example, the number of data storages associated with each configuration retrieval multiplexer can be 12, 16, or some other numbers instead of 8. The init input can be the $13^{th}$, $17^{th}$, or some other input instead of being the $9^{th}$ input of the configuration retrieval multiplexer. Thus, one of ordinary skill in the art would understand that the invention is not to be limited by the foregoing illustrative details, but rather is to be defined by the appended claims.

VII. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

A. Reconfiguration Timing Offset

As mentioned above by reference to FIGS. 25-26 and 39, some embodiments introduce different delays in configuration retrieval paths of multiplexers and of configurable storage elements in order to avoid hold time violations. Hold time violation occurs when signal at the input of the storage element fails to hold steady for sufficient amount of time in order for it to be correctly sampled and stored. For a reconfigurable storage element that receives data from a source reconfigurable circuit (such as a RMUX, LUT, IMUX, or another reconfigurable storage element), hold time violation can occur if the source reconfigurable circuit reconfigures too quickly and cause data at the input of the reconfigurable storage element to change too quickly. In order to prevent this, some embodiments reconfigure storage circuits slightly ahead of other types of reconfigurable circuits (such as RMUXs, LUTs, and IMUXs). In other words, some embodiments prevent hold time violation by applying a slight offset in timing between the reconfiguration of storage circuit and the reconfiguration of other types of circuit feeding the storage circuits.

Figure 65A:
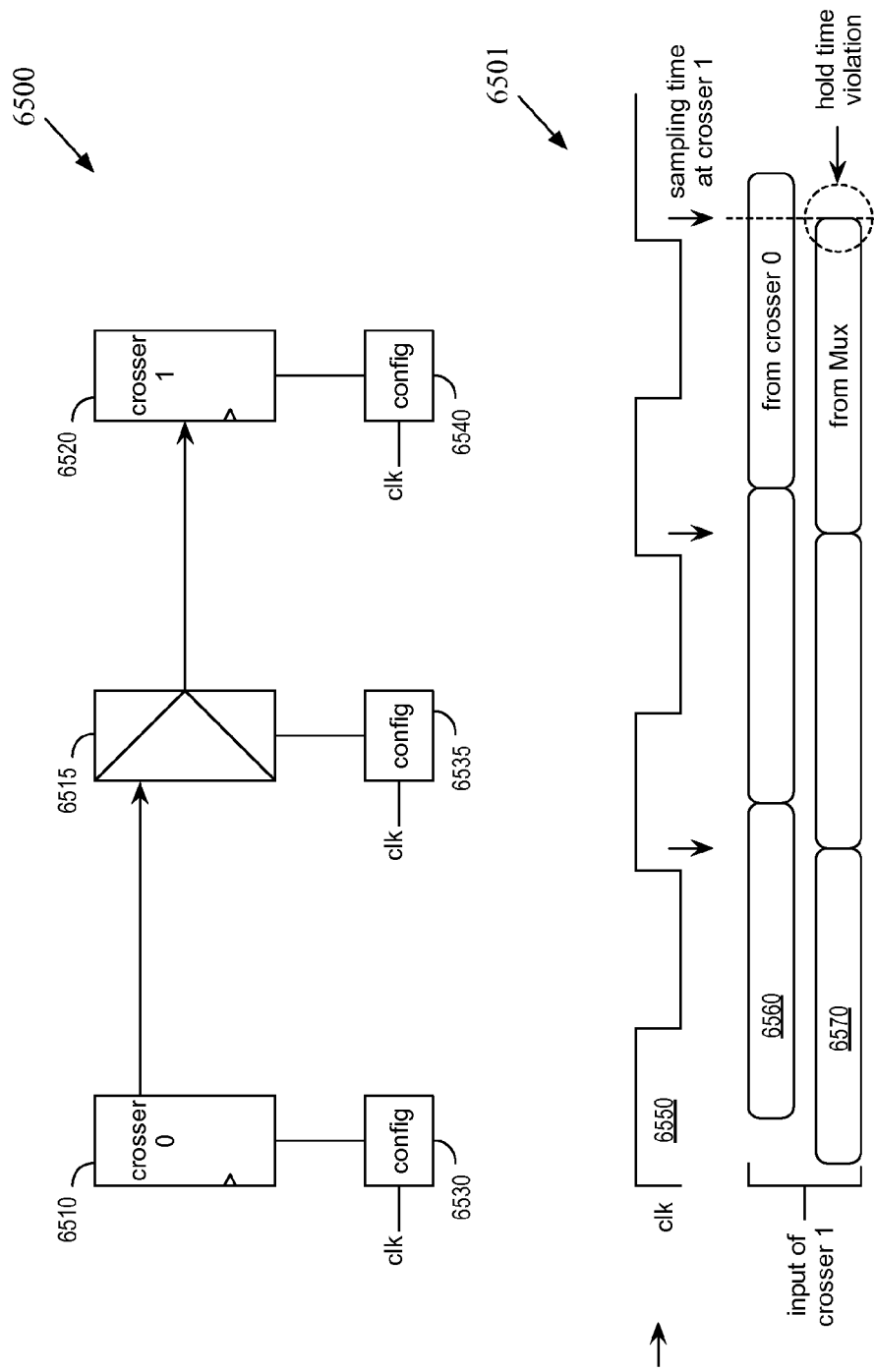
FIGS. 65A and 65B illustrate the prevention of hold time violation by offsetting reconfiguration timing.
Figure 65B:
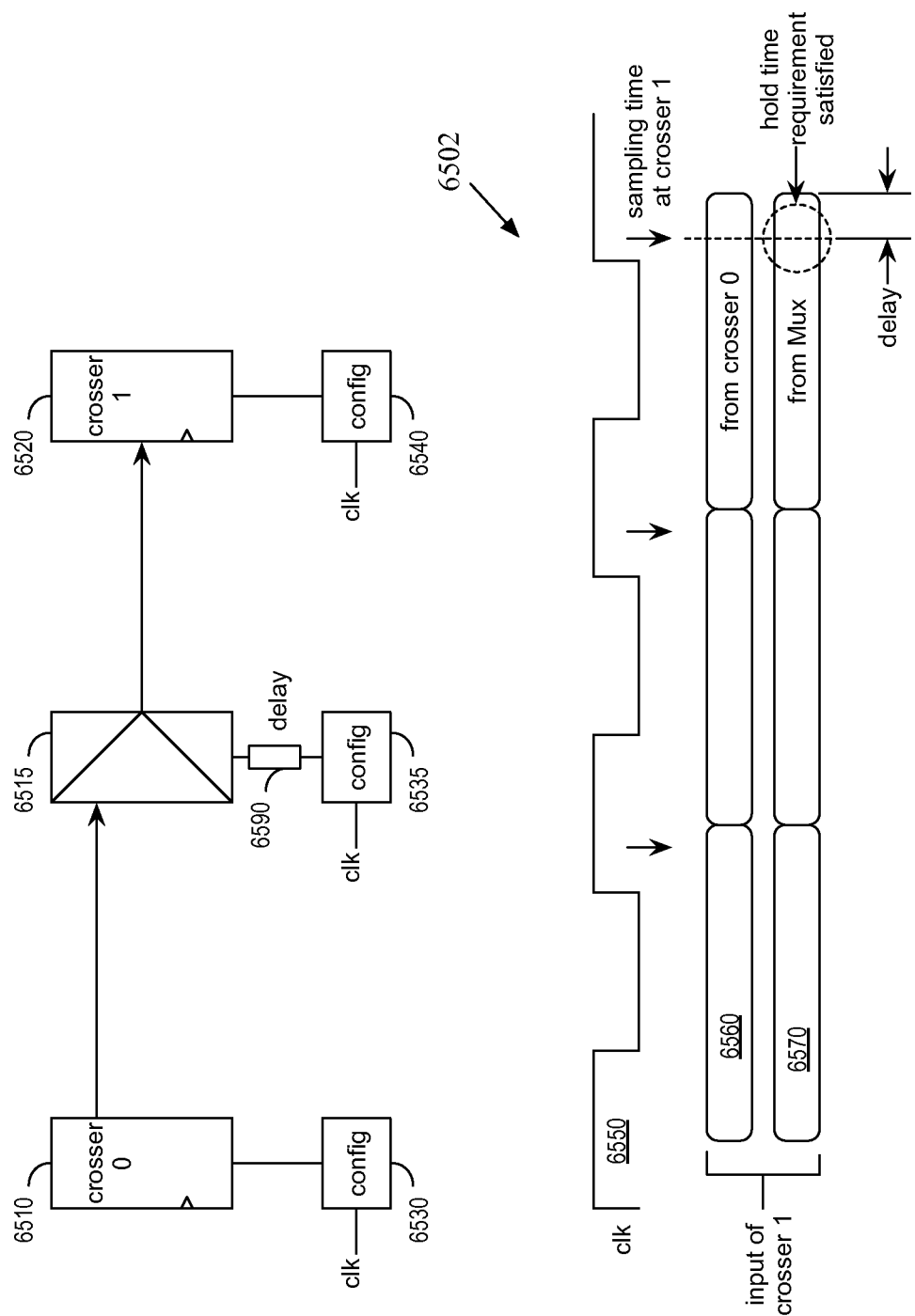

FIGS. 65A and 65B illustrate the prevention of hold time violation by offsetting reconfiguration timing. The figures illustrate a section 6500 of a configurable IC. The section 6500 includes a multiplexer 6515 between two storage elements 6510 and 6520. The output of the storage element 6510 propagates through the multiplexer 6515 in order to reach the input of the storage element 6520. The storage elements 6510, 6520 and the multiplexer 6515 are reconfigurable circuits that retrieve configuration data from configuration storages 6530, 6540, and 6535, respectively. The retrieval of configuration data from the configuration storages is based on the clock 6550, which can be a sub-cycle clock of a user design clock or a reconfiguration clock. The sampling and storing of data at the storage element 6520 is determined by the retrieved configuration data from the configuration storage 6540.

The reconfigurable storage elements 6510 and 6520 are also referred to as "crossers" in some embodiments for reasons that will be further elaborated by reference to FIG. 66 below. The crossers can be clocked storage elements such as in KMUXs or configurable transparent or hybrid storage elements such as YMUXs and MMUXs.

FIG. 65A illustrates a timing diagram 6501 for the configurable IC section 6500 when there is no timing offset between the reconfiguration of the crossers 6510 and 6520 and the reconfiguration of the multiplexer 6515. As illustrated, the crosser 6520 samples at a certain point in time following each rising edge of the clock 6550. The data 6560 from the crosser 6510 arriving at the input of the crosser 6520 would have sufficient hold time because there are logic and routing elements (such as the multiplexer 6515) delaying the propagation of data from the crosser 6510 to the crosser 6520. However, there is very little that delays the propagation of data from the multiplexer 6515 to the crosser 6520. In such instances, the reconfiguration of the multiplexer 6515 can cause the input data at the crosser 6520 to change too quickly and violate hold time requirement.

FIG. 65B illustrates a timing diagram 6502 for when there is a timing offset between the reconfiguration of the crossers 6510 and 6520 and the reconfiguration of the multiplexer 6515. As illustrated, the reconfiguration of the multiplexer 6515 is delayed slightly relative to the reconfiguration of the crosser 6510 and 6520, and the hold time requirement of the crosser 6520 is met as a result. In the example of FIG. 65B, the offset in reconfiguration timing is accomplished by adding a delay element 6590 to the configuration retrieval path of the multiplexer 6515.

In some embodiments, possible hold time violations for all crossers are resolved by systematically delaying the reconfiguration of all configurable circuits (except crossers) directly feeding the crossers. In some embodiments, this is accomplished by adding a delay element into the configuration retrieval path of each of such configurable circuits. In some other embodiments, timing offset between the reconfiguration of the crossers and the configurable circuits (except crossers) are accomplished by delaying the clock signals feeding the configurable circuits relative to the clock signals feeding the crossers. However, some embodiments limit the amount of delay inserted in order to prevent set up time violations at the crossers.

B. Configurable Tile

Figure 66:
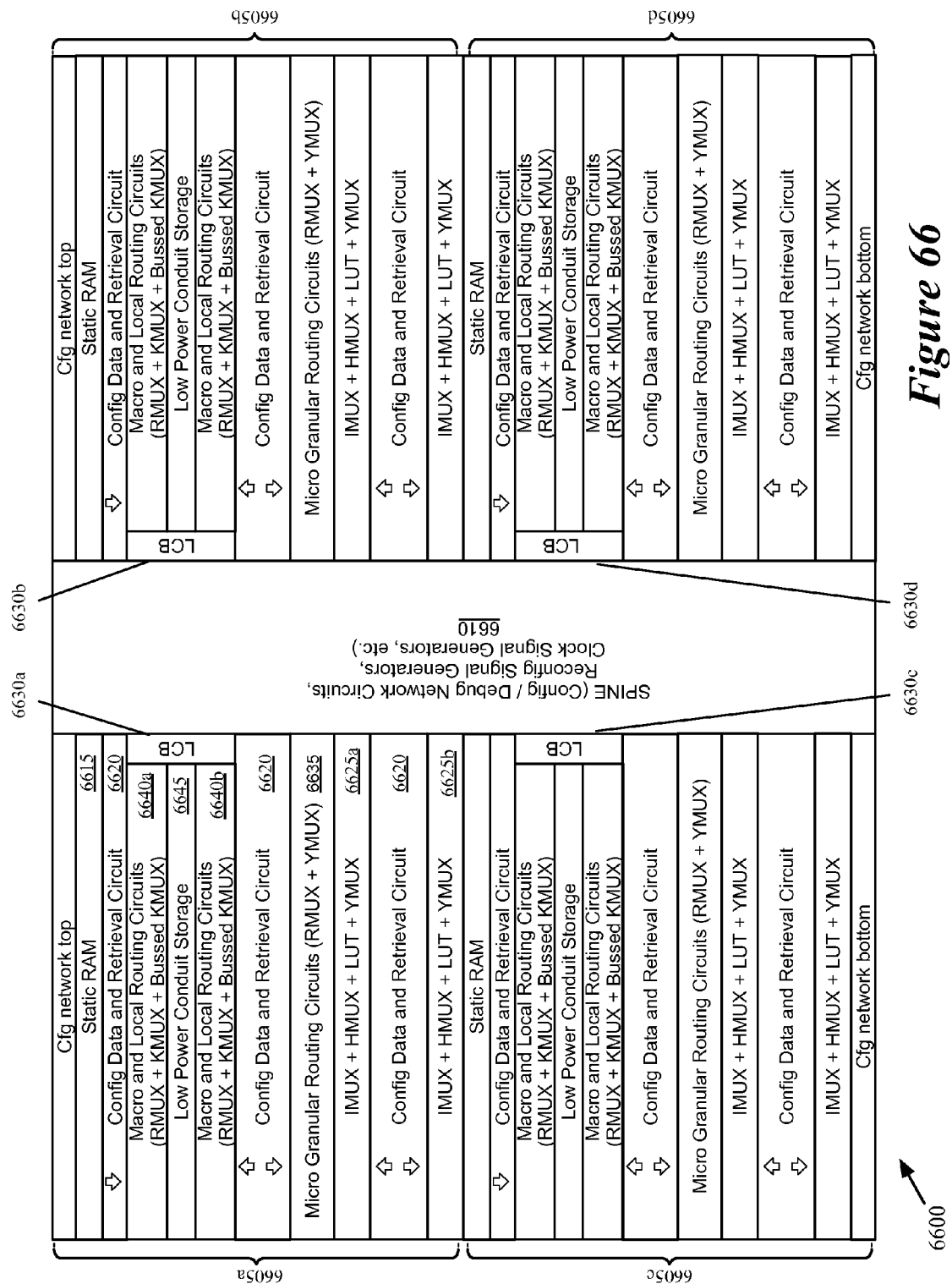
FIG. 66 illustrates a configurable tile that is used by the integrated circuit of some embodiments.

FIG. 66 illustrates a configurable tile 6600 that is used by the integrated circuit of some embodiments. In some embodiments, the configurable tile 6600 is defined in a configurable tile array on the integrated circuit with other identical tiles or similar tiles. The configurable tile array includes multiple rows and multiple columns, with the intersection of each row and column being a configurable tile that is identical to tile 6600 or similar to it.

This configurable tile is a 16-LUT configurable tile that includes four 4-LUT tiles 6605*a-d* that are placed about a common spine 6610. Each 4-LUT tile includes (1) a static RAM block 6615 for storing data, and (2) three sets 6620 of configuration data storages for storing configuration data and their associated configuration retrieval circuits for retrieving the configuration data on a sub-cycle basis and supplying the configuration data to nearby configurable circuits.

Each 4-LUT tile is topologically viewed as a 4×1 nibble wide set of LUTs. However, each topological nibble wide set of LUTs is physically arranged into two pairs of LUTs, with one pair defined in configurable logic group 6625*a* and another pair defined in configurable logic group 6625*b*. Each configurable logic group includes routing fabric resources as further described below. Each 4-LUT tile also has a logic carry block (LCB) 6630, which will be further described below.

To facilitate communication between the configurable LUTs of the same 16-LUT tile or between the configurable LUTs of different 16-LUT tiles, the tile 6600 in some embodiments employs three different types of configurable storage elements and three different sets of routing circuits (e.g., RMUXs) and wiring. The three different types of configurable storage elements are YMUXs, KMUXs, and low power conduits. The three different sets of routing circuits/wiring are (1) a micro-level routing fabric, (2) a local-area routing fabric, and (3) a macro-level routing fabric. The YMUX is described above by reference to FIGS. 21-23. The KMUX is described above by reference to FIGS. 38-43.

As shown in FIG. 66, each 4-LUT tile has one area 6635 in which the micro-level routing fabric circuits are placed, and two areas 6640*a* and 6640*b* in which the local-area and marco-level routing fabric circuits are placed. Each 4-LUT tile also has one area 6645 in which the low power conduits are placed. The other configurable storage elements, the KMUX and the YMUX, are placed in several other areas. For instance, the KMUXs are placed in the local-area and macro-level regions 6640a and 6640b as they are part of these routing resources. The YMUXs are placed in the micro-level routing region 6635, as they form micro-level routing fabric with RMUXs as further described below. Also, as further described below, the YMUXs are placed in the configurable logic groups 6625. Other arrangements of these circuits are also possible. For instance, in some embodiments, RMUXs that are associated with the micro-level routing fabric or local-area routing fabric are placed in the area that also contains the configurable logic groups when additional space is needed for these RMUXs.

The micro-level routing fabric provides local neighboring interconnect for each nibble wide set of LUTs (i.e., each 4-LUT tiles 6605). Specifically, in some embodiments, the micro-level routing fabric provides direct connections between each 4-LUT tile and the other 4-LUT tiles that are a topological distance of one away from it in the north, south, east and west directions. In other words, the micro-level routing resources of one particular 4-LUT tile connect this tile's circuits (e.g., LUTs) with the circuits (e.g., RMUXs, IMUXs, etc.) of the 4-LUT tiles that are one away and immediately to the north, south, east and west of the particular tile.

In some embodiments, the micro-level routing fabric includes several pairs of RMUXs and YMUXs. For instance, in some embodiments, the micro-level routing fabric of a particular 4-LUT tile includes four RMUX/YMUX pairs for each of its 4 LUTs. For each LUT, the four RMUX/YMUX pairs traverse in the four directions (i.e., north, south, east and west) serviced by this fabric. In other words, for one LUT, these embodiments have an A-north RMUX that provides the north topological 1 connection, an A-north YMUX for the north RMUX, an A-south RMUX that provides the south topological 1 connection, an A-south YMUX for the A-south RMUX, and so on.

As mentioned above, YMUXs are one type of configurable storage elements. They can capture and hold a signal indefinitely, while allowing the RMUXs that they are a part of to be used for other routing operations. They can also be used to prevent signal flicker (and thereby to prevent unnecessary power consumption) as mentioned above. For instance, when their corresponding direction of routing is not needed (e.g., when the unit north topological connection is not needed), the YMUX can be set to prevent signal flicker along that direction (e.g., along the unit north topological connection provided by the A-north RMUX).

In addition to providing unit north topological connections, the micro-level routing fabric also provides connections between some of the LUTs in a 4-LUT tile in some embodiments. In some of these embodiments, the output of one or more of the LUTs in the 4-LUT tile connect directly to the IMUXs of one or more LUTs in the same 4-LUT tile. In other words, some embodiments connect some of the LUTs in a 4-LUT tile through the micro-level routing fabric, while connecting other LUTs in a 4-LUT tile through direct connection.

As mentioned above, YMUXs are also used at the output of the LUTs in some embodiments. In some embodiments, these YMUXs are viewed as being part of the routing fabric as they are neither LUTs nor IMUXs. In some embodiments, four YMUXs are provided at the output of each LUT. These four YMUX are for the north, south, east and west directions for routing the output of each LUT. When a LUT's output does not need to be routed in a particular direction, the YMUX latching function is used to prevent signal flicker in that particular direction in order to reduce power consumption.

The local-area routing fabric provides local neighboring and non-neighboring interconnect for each nibble wide set of LUTs (i.e., each 4-LUT tiles 6605). Specifically, in some embodiments, the local-area routing fabric provides direct connections between each 4-LUT tile and the other 4-LUT tiles that are a topological distance of 1, 2, and 3 away from it in the north, south, east and west directions. In other words, the local-area routing resources of one particular 4-LUT tile connect this tile's circuits (e.g., LUTs) with the circuits (e.g., RMUXs, IMUXs, etc.) of the 4-LUT tiles that are 1-, 2-, and 3-hops way and to the north, south, east and west of the particular tile, where each hop is one nibble wide (i.e., is expressed in terms of one 4-LUT tile). In some embodiments, the local-area routing fabric includes one or more topologically diagonal connections for each nibble wide set of LUTs. Such diagonal connections are used in some embodiments to perform bit shift operations.

In some embodiments, the local-area routing fabric includes several pairs of RMUXs and KMUXs. For instance, the local-area routing fabric of some embodiments includes four RMUX/KMUX pairs for each LUT of a 4-LUT tile, with each RMUX of each RMUX/KMUX pair (1) servicing a particular direction (i.e., north, south, east, or west), (2) receiving signals from circuits of 4-LUT tiles that are 1-, 2-, and 3-hops away, and (3) supplying signals to circuits of 4-LUT tiles that are 1-, 2-, and 3-hops away along the particular direction serviced by the RMUX/KMUX pair. In other words, for one LUT, these embodiments have a P-north RMUX that provides the north topological 1-, 2- and 3-connections, a KMUX for the P-north RMUX, a P-south RMUX that provides the south topological 1-, 2-, and 3-connections, a KMUX for the P-south RMUX, and so on. As further described below, the local-area routing fabric circuits (e.g., RMUXs, etc.) are used in some embodiments to route signals between the top two pairs of LCBs 6630a-b and the bottom two pairs of LCBs 6630c-d.

The micro-level and local-area routing fabric provide bit-wide direct connections between the 4-LUT tiles. The macro-level routing fabric, on the other hand, provides bus-wide direct connections between neighboring and non-neighboring 4-LUT tiles. Specifically, in some embodiments, the macro-level routing fabric provides direct connections between each 4-LUT tile and the other 4-LUT tiles that are a topological distance of 1, 2, 3, 4, and 5 away from it in the north, south, east and west directions.

In some embodiments, the macro-level routing fabric includes several pairs of RMUXs and KMUXs. For instance, the macro-area routing fabric of some embodiments includes four RMUX/KMUX pairs for each LUT of a 4-LUT tile, with each RMUX of each RMUX/KMUX pair (1) servicing a particular direction (i.e., north, south, east, or west), (2) receiving signals from circuits of 4-LUT tiles that are 1-, 2-, 3-, 4-, and 5-hops away, and (3) supplying signals to circuits of 4-LUT tiles that are 1-, 2-, 3-, 4-, and 5-hops away along the particular direction serviced by the RMUX/KMUX pair. In other words, for one LUT, these embodiments have a F-north RMUX that provides the north topological 1-, 2-3-, 4-, and 5-connections, a KMUX for the F-north RMUX, a F-south RMUX that provides the south topological 1-, 2-, 3-, 4-, and 5-connections, a KMUX for the F-south RMUX, and so on. Because the macro-level routing fabric includes busses, several RMUXs that traverse along the same direction (e.g., in the north direction) are controlled by the same configuration data. For instance, the four F-north RMUXs for the four LUTs that form a nibble are controlled by the same configuration data set in each sub-cycle, the four F-south RMUXs for these four LUTs are controlled by the same configuration data set in each sub-cycle, and so on.

The macro-level routing fabric in some embodiments is used to cross from one clock domain to another clock domain. Specifically, the macro-level routing fabric is used to traverse a signal from one part of the IC that has configurable circuits operating at a first clock rate and a second part of the IC that has configurable circuits operating at a second clock rate. At times, such traversal entails taking the signal through a third part of the IC that has configurable circuits operating at a third clock rate.

When the macro-level routing fabric is used to cross clock domains, this fabric is configured to terminate at one or more low power conduit storages. Such storage are ideal for serving as the landing circuit for receiving a signal from another clock domain, as they include many storage elements that open in different sub-cycles to receive new data. They also provide a mechanism for transferring a signal from one clock domain to another in less than one user cycle, as a received signal can be synchronously output into the new clock domain at the start of the sub-cycle after it has been received by a storage element of the conduit.

As mentioned above, the low power conduits along with the KMUXs and YMUXs are the three different types of storage elements that are used by the configurable tile 6600. These storage elements (low power conduits, KMUXs, and YMUXs) are space time crossing devices as they allow signals to traverse from one sub-cycle to another. In order for signals arriving at these crossing devices to meet the hold time requirements, some embodiments reconfigure some or all of the RMUXs, LUTs and IMUXs later than the crossing devices so the signals provided by the RMUXs, LUTs and IMUX would not change before the crossing devices reconfigures.

As described above by reference to FIGS. 44 and 45, the low power conduits provide an efficient way of holding a value for several sub-cycles, because each low power conduit has several registers that operate at the user design clock rate instead of the sub-cycle rate. Because of this, the IC of some embodiments uses these conduits to hold the majority of the values that are held for three or more sub-cycles, while using the YMUXs and KMUXs to hold values that need to be stored for one and at time two sub-cycles.

In some embodiments, the configurable tile 6600 includes one low power conduit for each LUT in the tile. This allows the IC to store the output of each LUT in each sub-cycle of a twelve loopered device in a twelve-register low power conduit for a duration of a user design cycle. Accordingly, the low power conduits provide the ability to look back into all the signals that are produces for the duration of one user cycle.

The LCB blocks perform arithmetic operations. Each LCB of some embodiments performs 4-bit add operations. Therefore, each LCB has four sum outputs and one carry output. The carry output travels horizontally to feed the next LCB. The LCBs on the same row are chained up through the carry signal so that they can collaborate in performing arithmetic operations on 8-bit, 16-bit, or any larger value. The sum outputs of LCB travel vertically. The LCB of some embodiments also perform compare operations. The compare result is provided through the carry output of the LCB and travels horizontally.

In some embodiments, each pair of horizontally aligned LCBs (e.g., 6630*a-b* or 6630*c-d*) is directly connected (i.e., are connected through direct connections that do not traverse RMUXs) in order to form a fast 8-bit LCB. There are no direct connection between the top and bottom LCBs (e.g., between 6630*a* and 6630*c*). Vertically aligned LCBs communicate with each other (e.g., the top LCB block 6630*a* communicates with the bottom LCB block 6630*c*) through RMUXs and KMUXs of the local area routing fabric. In addition, a first LCB in one tile can communicate vertically with a second LCB in another tile through the local area routing fabric.

As mentioned above, the LCBs of some embodiments include bussed KMUXs in order to receive and output the sums of the LCB. Also, as mentioned above, the LCBs in some embodiments are part of the routing fabric. Accordingly, the input to the LCBs that is provided by the LUTs or other circuits are provided to the LCBs by the RMUXs, while the outputs of the LCBs are provided to the LUTs or other circuits that need such data through the RMUXs.

The configurable tile 6600 also includes configuration network circuitry at the boundary of each 4-LUT tile and within the spine. Examples of such circuitry are described in U.S. Pat. No. 7,788,478 and U.S. Pat. No. 8,069,425. The spine also includes reconfiguration signal generation and clock signal generation circuitry.

While the tile arrangement 6600 was described by reference to numerous details, one of ordinary skill will realize that other embodiments might define this arrangement differently. For instance, this arrangement uses YMUXs to facilitate communication between configurable circuits. In some embodiments, MMUXs are used instead of YMUX, or MMUX are used with YMUX. The MMUX is described above by reference to FIGS. 24 and 25.

C. IC with Configurable Circuits

Figure 67:
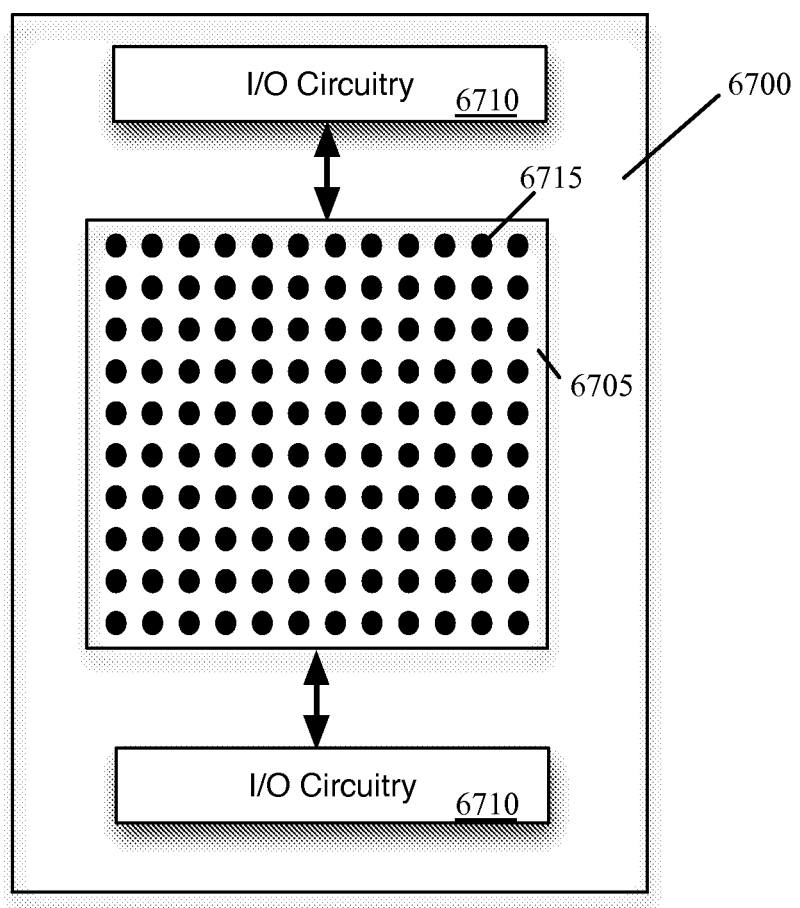
FIG. 67 illustrates a portion of a configurable IC of some embodiments.

FIG. 67 illustrates a portion of an IC 6700 of some embodiments of the invention. As shown in this figure, this IC has a configurable tile arrangement 6705 and I/O circuitry 6710. The configurable tile arrangement 6705 can include any of the above described circuits, storage elements, and routing fabric of some embodiments of the invention. The tiles in this arrangement are illustrated as nodes and are referred to as configurable nodes in some of the discussion below.

The I/O circuitry 6710 is responsible for routing data between the configurable nodes 6715 of the configurable circuit arrangement 6705 and circuits outside of this arrangement (i.e., circuits outside of the IC, or within the IC but outside of the configurable circuit arrangement 6705). As further described below, such data includes data that needs to be processed or passed along by the configurable nodes.

Figure 68:
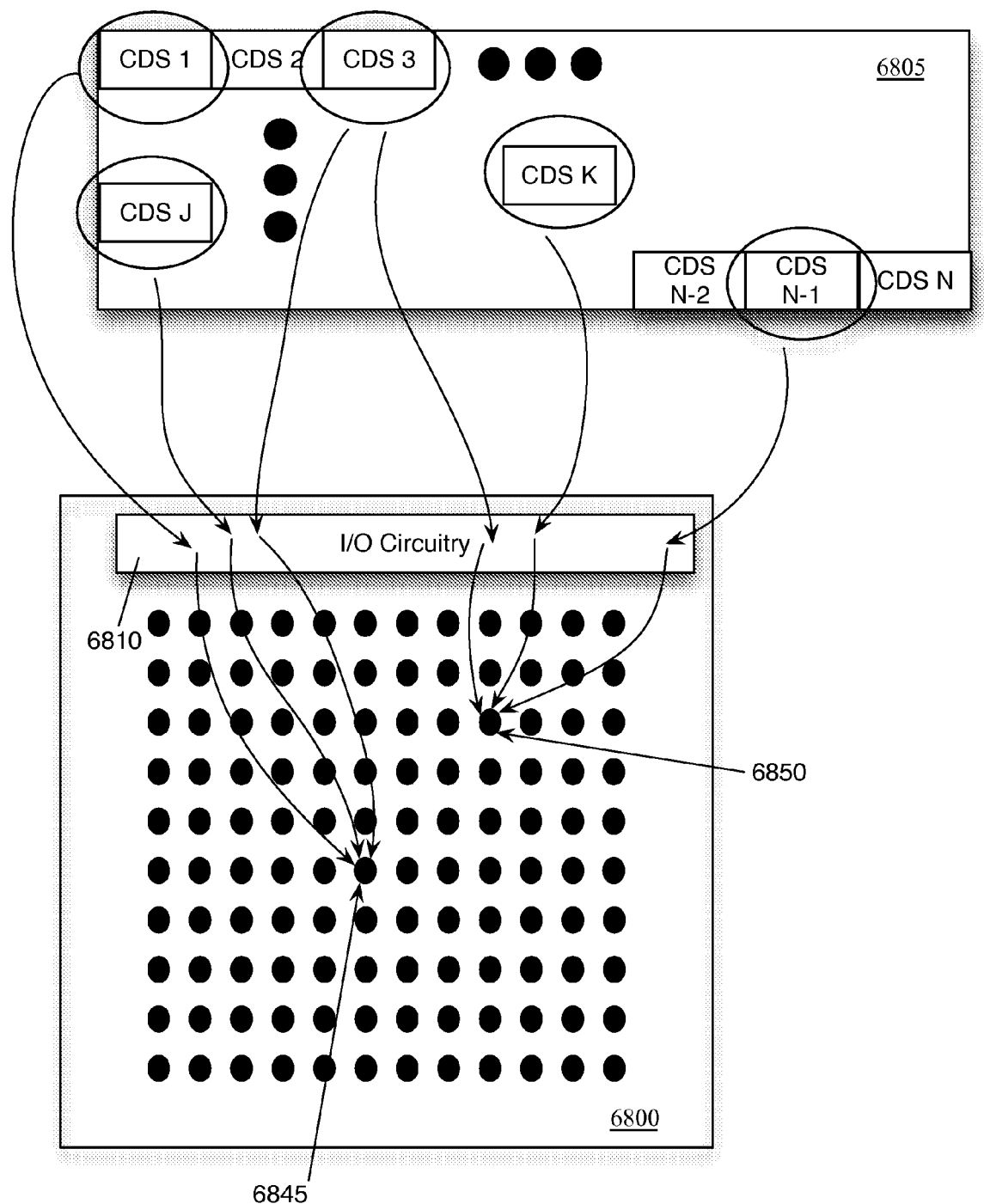
FIG. 68 illustrates a more detailed example of data between a configurable node and a configurable circuit arrangement that includes configuration data that configures the nodes to perform particular operations of some embodiments.

The data also includes in some embodiments a set of configuration data that configures the nodes to perform particular operations. FIG. 68 illustrates a more detailed example of this. Specifically, this figure illustrates a configuration data pool 6805 for the configurable IC 6800. This pool includes N configuration data sets ("CDS"). As shown in FIG. 68, the input/output circuitry 6810 of the configurable IC 6800 routes different configuration data sets to different configurable nodes of the IC 6800. For instance, FIG. 68 illustrates configurable node 6845 receiving configuration data sets 1, 3, and J through the I/O circuitry, while configurable node 6850 receives configuration data sets 3, K, and N−1 through the I/O circuitry. In some embodiments, the configuration data sets are stored within each configurable node. Also, in some embodiments, a configurable node can store multiple configuration data sets for a configurable circuit within it so that this circuit can reconfigure quickly by changing to another configuration data set for a configurable circuit. In some embodiments, some configurable nodes store only one configuration data set, while other configurable nodes store multiple such data sets for a configurable circuit.

Figure 69:
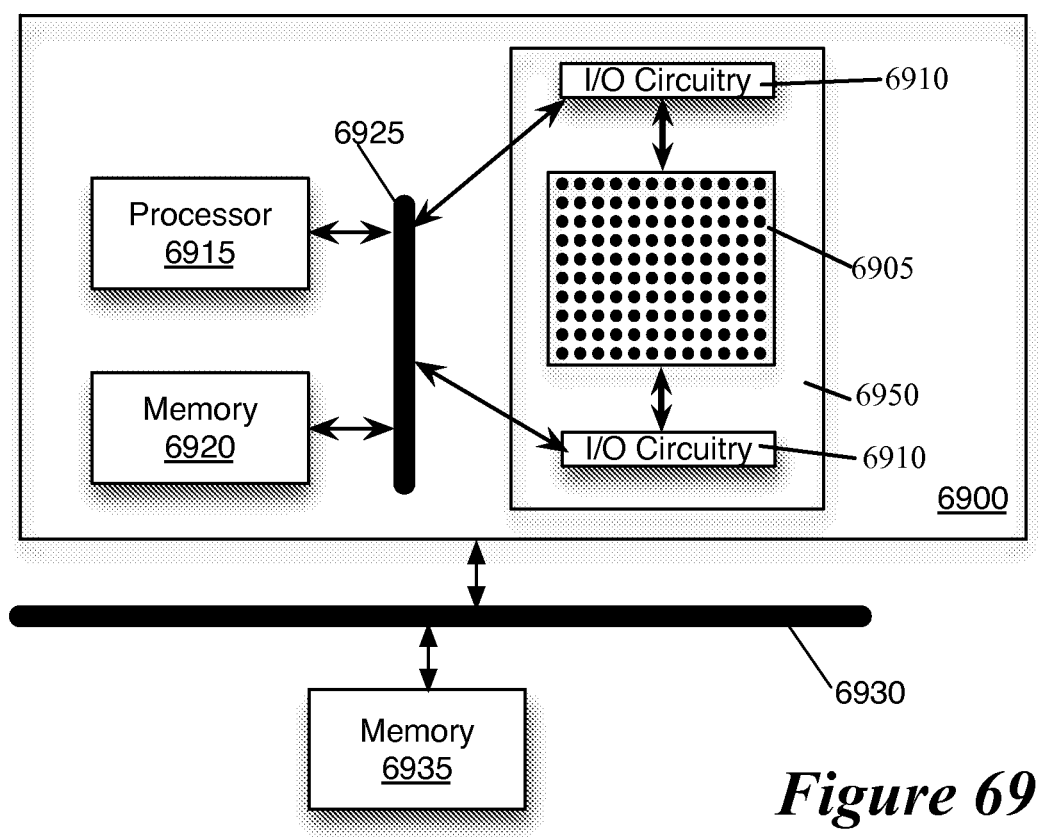
FIG. 69 illustrates a system on chip ("SoC") implementation of a configurable IC of some embodiments.

A configurable IC of the invention can also include circuits other than a configurable circuit arrangement and I/O circuitry. For instance, FIG. 69 illustrates a system on chip ("SoC") implementation of a configurable IC 6900. This IC has a configurable block 6950, which includes a configurable circuit arrangement 6905 and I/O circuitry 6910 for this arrangement. It also includes a processor 6915 outside of the configurable circuit arrangement, a memory 6920, and a bus 6925, which conceptually represents all conductive paths between the processor 6915, memory 6920, and the configurable block 6950. As shown in FIG. 69, the IC 6900 couples to a bus 6930, which communicatively couples the IC to other circuits, such as an off-chip memory 6935. Bus 6930 conceptually represents all conductive paths between the system components.

This processor 6915 can read and write instructions and/or data from an on-chip memory 6920 or an off-chip memory 6935. The processor 6915 can also communicate with the configurable block 6950 through memory 6920 and/or 6935 through buses 6925 and/or 6930. Similarly, the configurable block can retrieve data from and supply data to memories 6920 and 6935 through buses 6925 and 6930.

Figure 70:
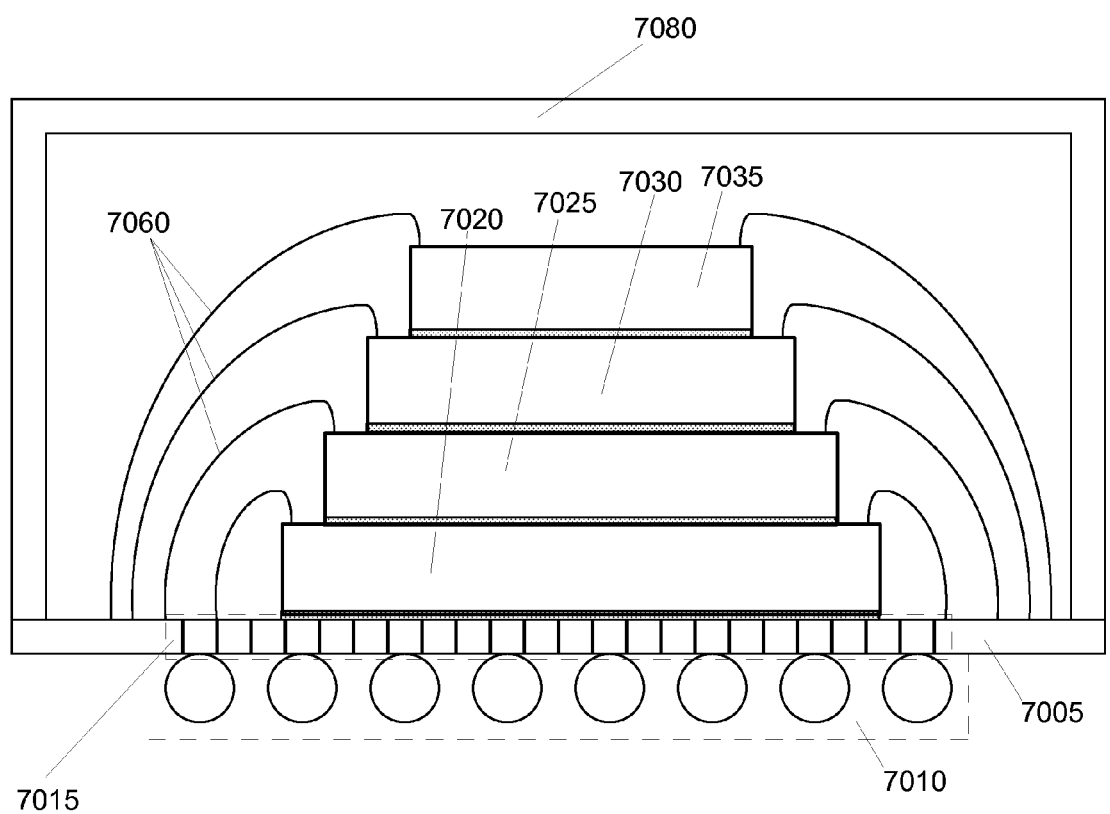
FIG. 70 illustrates an embodiment that employs a system in package ("SiP") implementation for a configurable IC of some embodiments.

Instead of, or in conjunction with, the system on chip ("SoC") implementation for a configurable IC, some embodiments might employ a system in package ("SiP") implementation for a configurable IC. FIG. 70 illustrates one such SiP 7000. As shown in this figure, SiP 7000 includes four ICs 7020, 7025, 7030, and 7035 that are stacked on top of each other on a substrate 7005. At least one of these ICs is a configurable IC that includes a configurable block, such as the configurable block 6950 of FIG. 69. Other ICs might be other circuits, such as processors, memory, etc.

As shown in FIG. 70, the IC communicatively connects to the substrate 7005 (e.g., through wire bondings 7060). These wire bondings allow the ICs 7020-6935 to communicate with each other without having to go outside of the SiP 7000. In some embodiments, the ICs 7020-6935 might be directly wire-bonded to each other in order to facilitate communication between these ICs. Instead of, or in conjunction with the wire bondings, some embodiments might use other mechanisms to communicatively couple the ICs 7020-6935 to each other.

As further shown in FIG. 70, the SiP includes a ball grid array ("BGA") 7010 and a set of vias 7015. The BGA 7010 is a set of solder balls that allows the SiP 7000 to be attached to a printed circuit board ("PCB"). Each via connects a solder ball in the BGA 7010 on the bottom of the substrate 7005, to a conductor on the top of the substrate 7005.

The conductors on the top of the substrate 7005 are electrically coupled to the ICs 7020-6935 through the wire bondings. Accordingly, the ICs 7020-6935 can send and receive signals to and from circuits outside of the SiP 7000 through the wire bondings, the conductors on the top of the substrate 7005, the set of vias 7015, and the BGA 7010. Instead of a BGA, other embodiments might employ other structures (e.g., a pin grid array) to connect a SiP to circuits outside of the SiP. As shown in FIG. 70, a housing 7080 encapsulates the substrate 7005, the BGA 7010, the set of vias 7015, the ICs 7020-6935, the wire bondings to form the SiP 7000. This and other SiP structures are further described in U.S. Pat. No. 7,530,044.

Figure 71:
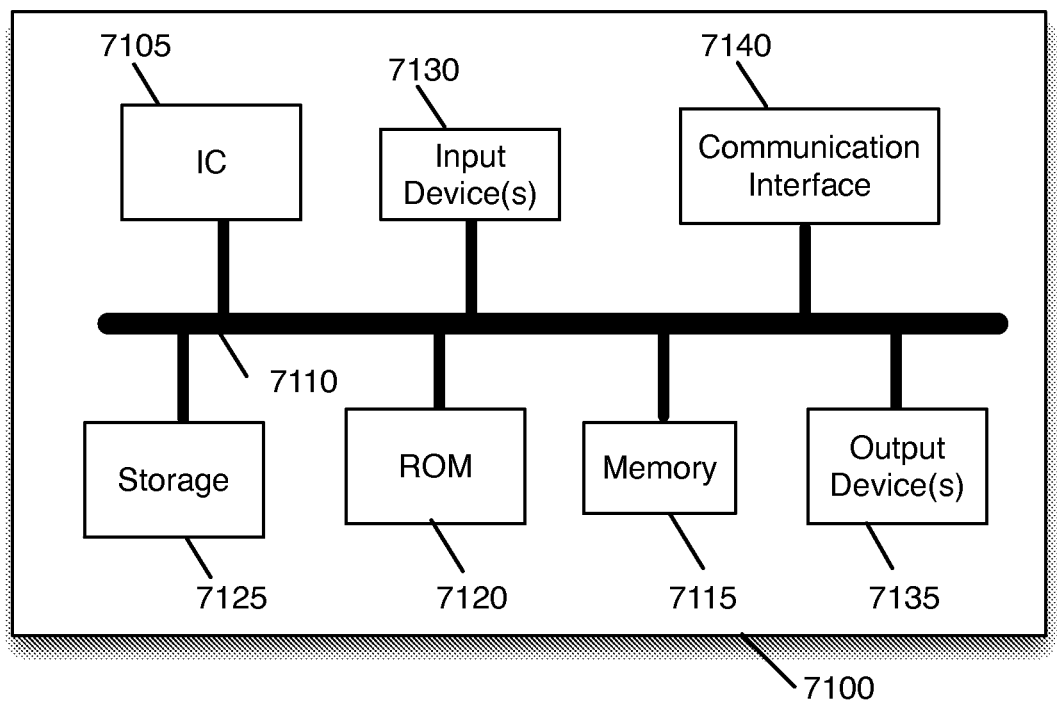
FIG. 71 conceptually illustrates a more detailed example of a computing system that has an IC, which includes one of the invention's configurable circuit arrangements of some embodiments.

FIG. 71 conceptually illustrates a more detailed example of a computing system 7100 that has an IC 7105, which includes a configurable circuit arrangement with configurable circuits, storage elements, and routing fabric of some embodiments of the invention that were described above. The system 7100 can be a stand-alone computing or communication device, or it can be part of another electronic device. As shown in FIG. 71, the system 7100 not only includes the IC 7105, but also includes a bus 7110, a system memory 7115, a read-only memory 7120, a storage device 7125, input device(s) 7130, output device(s) 7135, and communication interface 7140.

The bus 7110 collectively represents all system, peripheral, and chipset interconnects (including bus and non-bus interconnect structures) that communicatively connect the numerous internal devices of the system 7100. For instance, the bus 7110 communicatively connects the IC 7110 with the read-only memory 7120, the system memory 7115, and the permanent storage device 7125. The bus 7110 may be any of several types of bus structure including a memory bus or memory controller, a peripheral bus, and a local bus using any of a variety of conventional bus architectures. For instance, the bus 7110 architecture may include any of the following standard architectures: PCI, PCI-Express, VESA, AGP, Microchannel, ISA and EISA, to name a few.

From these various memory units, the IC 7105 receives data for processing and configuration data for configuring the ICs configurable logic and/or interconnect circuits. When the IC 7105 has a processor, the IC also retrieves from the various memory units instructions to execute. The read-only-memory (ROM) 7120 stores static data and instructions that are needed by the IC 7105 and other modules of the system 7100.

Some embodiments of the invention use a mass-storage device (such as a magnetic disk to read from or write to a removable disk or an optical disk for reading a CD-ROM disk or to read from or write to other optical media) as the permanent storage device 7125. Other embodiments use a removable storage device (such as a flash memory card or memory stick) as the permanent storage device. The drives and their associated computer-readable media provide non-volatile storage of data, data structures, computer-executable instructions, etc. for the system 7100. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 7125, the system memory 7115 is a read-and-write memory device. However, unlike storage device 7125, the system memory is a volatile read-and-write memory, such as a random access memory. Typically, system memory 7115 may be found in the form of random access memory (RAM) modules such as SDRAM, DDR, RDRAM, and DDR-2. The system memory stores some of the set of instructions and data that the processor needs at runtime.

The bus 7110 also connects to the input and output devices 7130 and 7135. The input devices enable the user to enter information into the system 7100. The input devices 7130 can include touch-sensitive screens, keys, buttons, keyboards, cursor-controllers, touch screen, joystick, scanner, microphone, etc. The output devices 7135 display the output of the system 7100. The output devices include printers and display devices, such as cathode ray tubes (CRT), liquid crystal displays (LCD), organic light emitting diodes (OLED), plasma, projection, etc.

Finally, as shown in FIG. 71, bus 7110 also couples system 7100 to other devices through a communication interface 7140. Examples of the communication interface include network adapters that connect to a network of computers, or wired or wireless transceivers for communicating with other devices. Through the communication interface 7140, the system 7100 can be a part of a network of computers (such as a local area network ("LAN"), a wide area network ("WAN"), or an Intranet) or a network of networks (such as the Internet). The communication interface 7140 may provide such connection using wireless techniques, including digital cellular telephone connection, Cellular Digital Packet Data (CDPD) connection, digital satellite data connection or the like.

When the IC 7105 is replaced by a general purpose processor, the system 7100 is also representative of a general purpose computer system that is used in some embodiment to define the configuration data sets for configuring the reconfigurable circuits (e.g., the LUTs, RMUXs, IMUXs, KMUXs, YMUXs, conduits, etc.) of the IC of some embodiments of the invention. This computer would perform place and/or route operations that define the configuration data sets for the logic and/or routing resources, and for the configurable storage elements of the IC.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.).

Also, although some embodiments were discussed above by reference to reconfiguration cycles and circuits, some embodiments may use configurable circuits and cycles to implement these embodiments. In addition, while the embodiments were described with reference to particular circuits and specific combinations or arrangements of these circuits, some embodiments may be implemented with different combinations or arrangements of the circuit elements. Thus, one of ordinary skill in the art would understand that the invention is not to be limited by the foregoing illustrative details, but rather is to be defined by the appended claims.

What is claimed is:

1. A routing circuit comprising:
   a first configurable routing multiplexer that is reconfigurable to select one of a plurality of inputs at a first clock rate;
   a plurality of storage elements for storing output data from the configurable routing multiplexer at the first clock rate, each storage element in the plurality of storage elements operate at a second clock rate that is slower than the first clock rate, wherein the each storage element receives a different phase of a clock that operate at the second clock rate; and
   a second configurable routing multiplexer that is reconfigurable to select from the plurality of storage elements at the first clock rate.

2. The routing circuit of claim 1, wherein each storage element in the plurality of storage elements is a flip-flop that operate at the second clock rate.

3. The routing circuit of claim 1, wherein the output of the second configurable routing multiplexer is connected to an input of a configurable storage element that can be configured to act as a flip-flip or a transparent wire.

4. The routing circuit of claim 1, wherein the first clock rate is an integer multiple of the second clock rate.

5. A routing circuit comprising:
   a first configurable routing multiplexer that is reconfigurable to select one of a plurality of inputs at a first clock rate;
   a master clocked storage element for storing output data from the configurable routing multiplexer at the first clock rate;
   a plurality of slave clocked storage elements for storing output data from the master clocked storage element at the first clock rate, each slave clocked storage element in the plurality of slave clocked storage elements operate at a second clock rate that is slower than the first clock rate, wherein the each slave clocked storage element receives a different phase of a clock that operate at the second clock rate; and
   a second configurable routing multiplexer that is reconfigurable to select from the plurality of slave clocked storage elements at the first clock rate.

6. The routing circuit of claim 5, wherein the master clocked storage element and at least one of the slave clocked storage elements form a master-slave flip-flop that operates at the second clock rate.

7. The routing circuit of claim 5, wherein the output of the second configurable routing multiplexer is connected to an input of a configurable storage element that can be configured to act as a flip-flip or a transparent wire.

8. The routing circuit of claim 5, wherein the first clock rate is an integer multiple of the second clock rate.

9. An integrated circuit ("IC") comprising:
   a plurality of configurable logic circuits for configurably performing a plurality of logic operations based on configuration data; and
   a configurable routing fabric for configurably routing signals among the configurable logic circuits, wherein a particular section of the configurable routing fabric comprises:
   a first configurable routing multiplexer that is reconfigurable to select one of a plurality of inputs at a first clock rate;
   a plurality of storage elements for storing output data from the configurable routing multiplexer at the first clock rate, each storage element in the plurality of storage elements operate at a second clock rate that is slower than the first clock rate, wherein the each storage element receives a different phase of a clock that operate at the second clock rate; and
   a second configurable routing multiplexer that is reconfigurable to select from the plurality of storage elements at the first clock rate.

10. The IC of claim 9, wherein each storage element in the plurality of storage elements is a flip-flop.

11. The IC of claim 9, wherein the output of the second configurable routing multiplexer is connected to an input of a configurable storage element that can be configured to act as a flip-flip or a transparent wire.

12. The IC of claim 9, wherein the first clock rate is an integer multiple of the second clock rate.

13. An integrated circuit ("IC") comprising:
   a plurality of configurable logic circuits for configurably performing a plurality of logic operations based on configuration data; and
   a configurable routing fabric for configurably routing signals among the configurable logic circuits, wherein a particular section of the configurable routing fabric comprises:
   a first configurable routing multiplexer that is reconfigurable to select one of a plurality of inputs at a first clock rate;
   a master clocked storage element for storing output data from the configurable routing multiplexer at the first clock rate;
   a plurality of slave clocked storage elements for storing output data from the master clocked storage at the first clock rate, each slave clocked storage element in the plurality of slave clocked storage elements operate at a second clock rate that is slower than the first clock rate, wherein the each slave clocked storage element receives a different phase of a clock that operate at the second clock rate; and a second configurable routing multiplexer that is reconfigurable to select from the plurality of slave clocked storage elements at the first clock rate.

14. The routing circuit of claim 13, wherein the master clocked storage element and at least one of the slave clocked storage elements form a master-slave flip-flop that operates at the second clock rate.

15. The routing circuit of claim 13, wherein the output of the second configurable routing multiplexer is connected to an input of a configurable storage element that can be configured to act as a flip-flip or a transparent wire.

16. The routing circuit of claim 13, wherein the first clock rate is an integer multiple of the second clock rate.

17. A method for operating a configurable routing fabric, the method comprising:

defining a first configuration data set for configuring a routing circuit in the configurable routing fabric, the routing circuit comprising (i) a first configurable routing multiplexer that is reconfigurable to select one of a plurality of inputs at a first clock rate, (ii) a plurality of storage elements for storing output data from the configurable routing multiplexer at the first clock rate, each storage element in the plurality of storage elements operating at a second clock rate that is slower than the first clock rate, wherein the each storage element receives a different phase of a user clock that operate at the second clock rate, and (iii) a second configurable routing multiplexer that is reconfigurable to select from the plurality of storage elements at the first clock rate, wherein each configuration data in the first configuration data set configures the first configurable routing multiplexer to select an input to route to the plurality of storage elements in different clock cycles; and defining a second configuration data set for configuring the second configurable routing multiplexer to select one of the plurality of storage elements as the output of the routing circuit in different clock cycles.

18. The method of claim 17, wherein the first configuration data set configures the first routing multiplexer to route a particular signal into the routing circuit at a first clock cycle and the second configuration data set configures the second routing multiplexer to output the particular signal at a second clock cycle.

19. The method of claim 18, wherein the first clock cycle and the second clock cycle correspond to different phases of the user clock.

\* \* \* \* \*